US009891985B1

(12) United States Patent
Lamb et al.

(10) Patent No.: US 9,891,985 B1
(45) Date of Patent: Feb. 13, 2018

(54) 256-BIT PARALLEL PARSER AND CHECKSUM CIRCUIT WITH 1-HOT STATE INFORMATION BUS

(71) Applicant: Netronome Systems, Inc., Santa Clara, CA (US)

(72) Inventors: Joseph M. Lamb, Hopkinton, MA (US); Benjamin D. Findlen, Shrewsbury, MA (US)

(73) Assignee: Netronome Systems, Inc., Santa Clara, CA (US)

(*) Notice: Subject to any disclaimer, the term of this patent is extended or adjusted under 35 U.S.C. 154(b) by 159 days.

(21) Appl. No.: 14/929,275

(22) Filed: Oct. 31, 2015

Related U.S. Application Data

(60) Provisional application No. 62/074,013, filed on Nov. 1, 2014.

(51) Int. Cl.
*G06F 11/10* (2006.01)
*H03M 13/09* (2006.01)

(52) U.S. Cl.
CPC ....... *G06F 11/1004* (2013.01); *H03M 13/096* (2013.01)

(58) Field of Classification Search
CPC .. H03M 13/096; H03M 13/091; G06F 11/004
See application file for complete search history.

(56) References Cited

U.S. PATENT DOCUMENTS 4,712,215 A * 12/1987 Joshi .................. H03M 13/091 714/776
5,155,487 A * 10/1992 Tanaka ............... H03M 13/091 341/100
5,619,516 A * 4/1997 Li ...................... H03M 13/091 714/757
8,051,359 B2 * 11/2011 Lin .................... H03M 13/091 714/757
8,225,187 B1 * 7/2012 Schultz .............. G06F 11/1004 714/807
8,607,129 B2 * 12/2013 Radhakrishnan ... G06F 11/1076 714/781
2002/0196782 A1 * 12/2002 Furukawa ........... H04Q 3/0025 370/352

* cited by examiner

*Primary Examiner* — Steve Nguyen
(74) *Attorney, Agent, or Firm* — Imperium Patent Works; T. Lester Wallace; Amir V. Adibi

(57) ABSTRACT

A parser and checksum circuit includes a 256-bit data bus, IPV4, IPV6, TCP, and UDP state signal buses, a checksum summer and compare circuit, four 64-bit parsing circuits, a V6 extension processor, and a parse state context circuit. Each of the 64-bit parsing circuits includes two 32-bit parsing circuits. The data bus receives a data signal that is part of a packet. IPV4, IPV6, TCP, and UDP state signals are each configurable into 1-hot states where at most 1-bit is digital logic high. Each of the 1-hot states corresponds to a segment of a packet header of one of the IPV4, IPV6, TCP, and UDP protocols. Each 32-bit parsing circuit receives a 1-bit shifted version of the state signals received by the adjacent 32-bit parsing circuit and receives a portion of the data signal. State signals and the data signal portion are received in parallel during a single clock cycle.

20 Claims, 133 Drawing Sheets

PARSER AND CHECKSUM CIRCUIT

INGRESS MAC ISLAND

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

PARSER AND CHECKSUM CIRCUIT

KEY TO FIG. 3

| | | | | | | | | | | | | | | | | |
|---|---|---|---|---|---|---|---|---|---|---|---|---|---|---|---|---|
| FIG. 3AA | FIG. 3AB | FIG. 3AC | FIG. 3AD | FIG. 3AE | FIG. 3AF | FIG. 3AG | FIG. 3AH | FIG. 3AI | FIG. 3AJ | FIG. 3AK | FIG. 3AL | FIG. 3AM | FIG. 3AN | FIG. 3AO | FIG. 3AP | FIG. 3AQ |
| FIG. 3AR | FIG. 3AS | FIG. 3AT | FIG. 3AU | FIG. 3AV | FIG. 3AW | FIG. 3AX | FIG. 3AY | FIG. 3AZ | FIG. 3BA | FIG. 3BB | FIG. 3BC | FIG. 3BD | FIG. 3BE | FIG. 3BF | FIG. 3BG | FIG. 3BH |
| FIG. 3BI | FIG. 3BJ | FIG. 3BK | FIG. 3BL | FIG. 3BM | FIG. 3BN | FIG. 3BO | FIG. 3BP | FIG. 3BQ | FIG. 3BR | FIG. 3BS | FIG. 3BT | FIG. 3BU | FIG. 3BV | FIG. 3BW | FIG. 3BX | FIG. 3BY |
| FIG. 3BZ | FIG. 3CA | FIG. 3CB | FIG. 3CC | FIG. 3CD | FIG. 3CE | FIG. 3CF | FIG. 3CG | FIG. 3CH | FIG. 3CI | FIG. 3CJ | FIG. 3CK | FIG. 3CL | FIG. 3CM | FIG. 3CN | FIG. 3CO | FIG. 3CP |
| FIG. 3CQ | FIG. 3CR | FIG. 3CS | FIG. 3CT | FIG. 3CU | FIG. 3CV | FIG. 3CW | FIG. 3CX | FIG. 3CY | FIG. 3CZ | FIG. 3DA | FIG. 3DB | FIG. 3DC | FIG. 3DD | FIG. 3DE | FIG. 3DF | FIG. 3DG |
| FIG. 3DH | FIG. 3DI | FIG. 3DJ | FIG. 3DK | FIG. 3DL | FIG. 3DM | FIG. 3DN | FIG. 3DO | FIG. 3DP | FIG. 3DQ | FIG. 3DR | FIG. 3DS | FIG. 3DT | FIG. 3DU | FIG. 3DV | FIG. 3DW | FIG. 3DX |
| FIG. 3DY | | | | | | | | | | | | | | | | |

PARSER AND CHECKSUM CIRCUIT

FIG. 3DY

PARSE32 CIRCUIT

PARSE32 CIRCUIT

PARSE32 CIRCUIT

PARSE32 CIRCUIT

PARSE32 CIRCUIT

PARSE32 CIRCUIT

PARSE32 CIRCUIT

PARSE32 CIRCUIT

PARSE32 CIRCUIT

PARSE32 CIRCUIT

PARSE32 CIRCUIT

PARSE32 CIRCUIT

PARSE32 CIRCUIT

PARSE32 CIRCUIT

PARSE32 CIRCUIT

L3 START CIRCUIT

L3 START CIRCUIT

L3 START CIRCUIT

L3 START CIRCUIT

L3 START CIRCUIT

L3 START CIRCUIT

L3 START CIRCUIT

KEY TO FIG. 5

| | | | |
|---|---|---|---|
| FIG. 5A | FIG. 5B | FIG. 5C | FIG. 5D |
| FIG. 5E | FIG. 5F | FIG. 5G | FIG. 5H |

L3 START CIRCUIT

ONE-HOT STATES OF IPV4 STATE SIGNAL

ONE-HOT STATES OF IPV6 STATE SIGNAL

ONE-HOT STATES OF TCP STATE SIGNAL

ONE-HOT STATES OF UDP STATE SIGNAL

256-BIT PARALLEL PARSER AND CHECKSUM CIRCUIT WITH 1-HOT STATE INFORMATION BUS

CROSS REFERENCE TO RELATED APPLICATIONS

This application claims the benefit under 35 U.S.C. § 119 from U.S. Provisional Patent Application Ser. No. 62/074,013, entitled "256-Bit Parallel Parser And Checksum Circuit With 1-Hot State Information Bus," filed on Nov. 1, 2014, the subject matter of which is incorporated herein by reference.

REFERENCE TO ASCII TEXT FILE APPENDIX

This application includes an ASCII text file appendix containing source code to software that embodies the inventions described herein. The software code is hardware description of an embodiment of a checksum and parsing circuit. A portion of the disclosure of this patent document contains material that is subject to copyright protection. All the material on the ASCII text file appendix is hereby expressly incorporated by reference into the present application. The copyright owner of that material has no objection to the facsimile reproduction by anyone of the patent document or the patent disclosure, as it appears in the Patent and Trademark Office patent files or records, but otherwise reserves all copyright rights. The ASCII text file appendix includes four text files created on Oct. 26, 2015 and readable in the MS-Windows operating system. The first file is named "parse32-circuit.txt", is 12.4 kilobytes large, and is an ASCII version of CDL code that generates and describes one of the parse32 circuits shown in FIG. 2. The second file is named "parse64-circuit.txt", is 13.9 kilobytes large, and is an ASCII version of CDL code that generates and describes one of the parse64 circuits shown in FIG. 2. The third file is named "V6-extension-processor-circuit.txt", is 40.6 kilobytes large, and is an ASCII version of CDL code that generates and describes V6 extension processor 45 shown in FIG. 2. The fourth file is named "parser-and-checksum-circuit.txt", is 58.2 kilobytes large, and is an ASCII version of CDL code that generates and describes parser and checksum circuit 12 shown in FIG. 2. A CDL compiler is available for download at http://cyclicity-cdl.sourceforge.net.

TECHNICAL FIELD

The described embodiments relate to circuitry for processing data in a network, and more particularly to parser and checksum circuitry.

BACKGROUND INFORMATION

A device connects to a network through an adapter that parses network packets received over the network. A network packet includes a header and data. Checksum processing is typically performed on each network packet to verify that the network packet has not been altered during transmission. However, checksum processing tends to be processor and time intensive, especially when multiple network protocols are involved. A robust solution that overcomes these challenges is desired.

SUMMARY

A parser and checksum circuit includes a 256-bit data bus, a plurality of protocol state signal buses, a checksum summer and compare circuit, four 64-bit parsing circuits, a V6 extension processor, and a parse state context circuit. Each of the 64-bit parsing circuits includes two 32-bit parsing circuits and an L3 start circuit. The 32-bit parsing circuits form a chain of eight 32-bit parsing circuits. The 32-bit parsing circuits are structurally identical to each other. The plurality of protocol state signal buses includes a IPV4 state bus, a IPV6 state bus, a TCP state bus, and a UDP state bus. The IPV4, IPV6, TCP, and UDP state signal buses extend through the chain of eight 32-bit parsing circuits.

The data bus receives a 256-bit data signal DATA[255:0] that is part of a frame of a packet. The parse state context circuit supplies a 16-bit IPV4 state signal V4_STATE[15:0] onto the IPV4 state bus, a 10-bit IPV6state signal V6_STATE[9:0] onto the IPV6state bus, a 7-bit TCP state signal TCP_STATE[6:0] onto the TCP state bus, and a 3-bit UDP state signal UDP_STATE[2:0] onto the UDP state bus. Each of the state signals is configurable into one of a plurality of 1-hot states in which at most 1-bit is a digital logic high level. Each of the 1-hot states corresponds to a segment of a packet header of one of the IPV4, IPV6, TCP, and UDP protocols. An IPV4 packet header includes sixteen 32-bit segments of data. The 16-bit IPV4state signal V4_STATE[15:0] has sixteen 1-hot states in which each 1-hot state corresponds to one of sixteen 32-bit segments of the IPV4 packet header. An IPV6 packet header includes ten 32-bit segments of data. The 10-bit IPV6 state signal V6_STATE[9:0] has ten 1-hot states in which each 1-hot state corresponds to one of ten 32-bit segments of the IPV6 packet header. A TCP packet header includes seven 32-bit segments of data. The 7-bit TCP state signal TCP_STATE[6:0] has seven 1-hot states in which each 1-hot state corresponds to one of seven 32-bit segments of the TCP packet header. A UDP packet header includes three 32-bit segments of data. The 3-bit UDP state signal UDP_STATE[2:0] has three 1-hot states in which each 1-hot state corresponds to one of three 32-bit segments of the UDP packet header. If all of the bits of the protocol state signal are at a digital logic low level, then this indicates that the parsing circuitry is not processing packet headers for the particular protocol.

In a single clock cycle, each of the 32-bit parsing circuits receives 1-bit shifted versions of the IPV4, IPV6, TCP, and UDP state signals received by the adjacent 32-bit parsing circuit. The state signals are hard-wire shifted and no sequential logic is involved in performing the 1-bit shifting operation. The IPV4, IPV6, TCP, and UDP state signals and portions of the data signal are received in parallel onto each of the 32-bit parsing circuits during the single clock cycle. In addition, the same parser and checksum circuit performs parsing and checksum processing across each of the IPV4, IPV6, TCP, and UDP protocols without involving additional hardware for each protocol. Consequently, the novel parser and checksum circuit results in faster and more efficient parsing and checksum processing than in conventional techniques.

Further details and embodiments and methods are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Reference will now be made in detail to some embodiments of the invention, examples of which are illustrated in the accompanying drawings.

Figure 1:
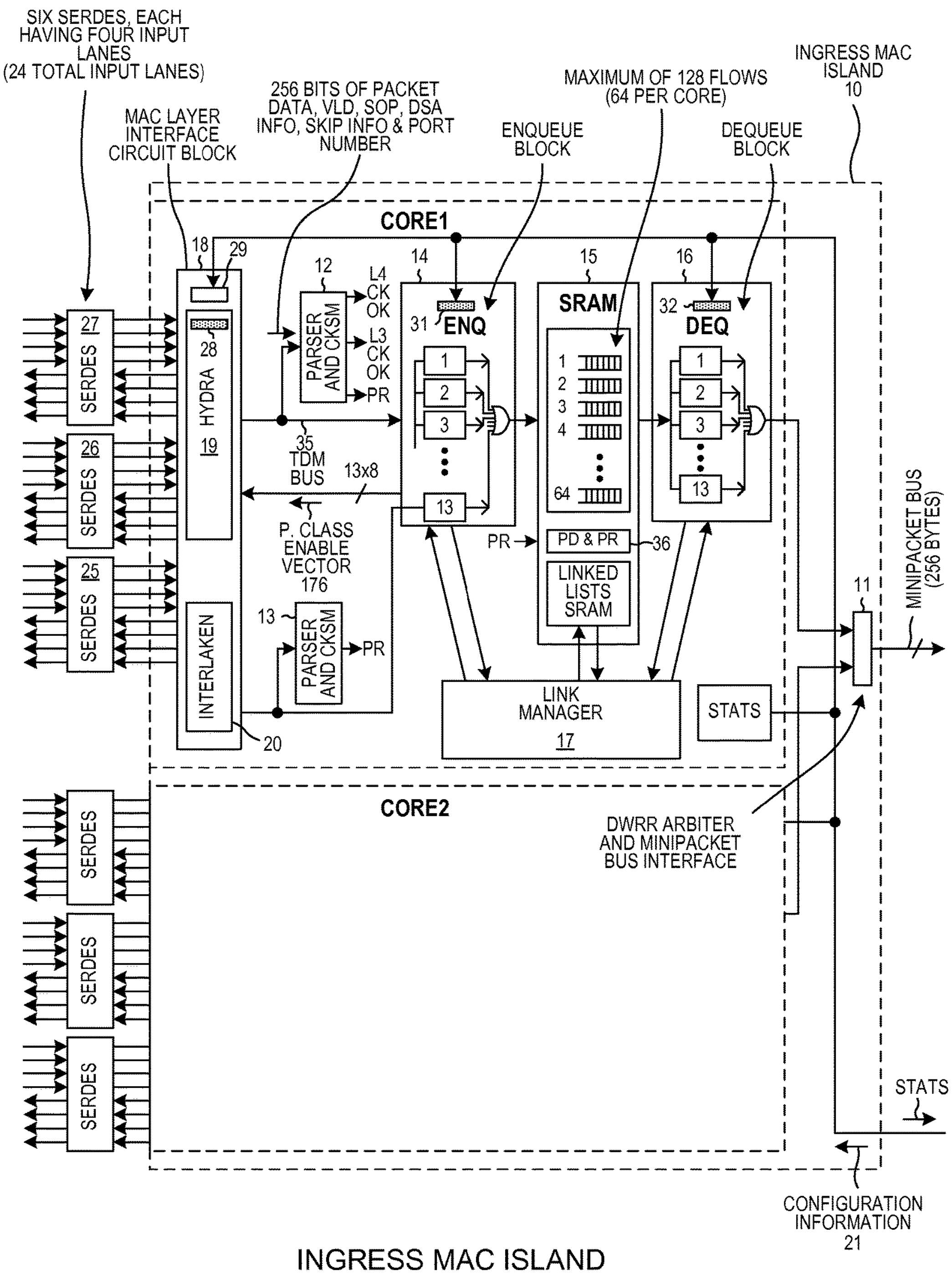
FIG. 1 is a block diagram of an ingress MAC island 10.

FIG. 1 is a block diagram of an ingress MAC island 10. Ingress MAC island 10 includes two cores, referred to here as CORE1 and as CORE2, and a DWRR (Deficit Weighted Round Robin) arbiter and minipacket bus interface 11. The two cores are structurally identical. CORE 1 comprises two parser and checksum circuits 12 and 13, port enqueue circuitry 14, SRAM 15, port dequeue circuitry 16, and link manager circuit 17, and a MAC layer interface circuit block 18. Three of six SerDes circuits that work with the ingress MAC island are coupled to CORE1, whereas the other three are coupled to CORE2. MAC layer interface circuit block 18 has an Ethernet MAC portion 19 and an InterLaken MAC portion 20. The Ethernet MAC portion 19 of block 18, in one example, is a commercially available IP core of the "Hydra" family, referred to as "Multi-Channel/Multi-Rate 12 Lane 1/10/40/100G Ethernet MAC/PCS Core", ordering code: MTIP-H12LANE1040100-lang-tech, available from MorethanIP GmbH, Muenchner Strasse 199, D-85757 Karlsfeld, Germany.

Based on configuration information 21, the Ethernet MAC portion 19, along with SerDes circuits 25-27, is configured into a desired number of "physical MAC ports". The Ethernet MAC portion 19 includes a configuration register 28 that is loaded with configuration information 21 for this purpose. Translation circuit 29 translates XPB bus communications into communications understood by the Ethernet MAC portion 19. The port enqueue circuitry 14 includes thirteen port enqueue engines. The port enqueue engines are labeled one through thirteen in the diagram of FIG. 1. The configuration register 31 of the port enqueue circuitry 14 is loaded with configuration information 21 such that one port enqueue engine is assigned to each of the physical MAC ports. Likewise, the port dequeue circuitry 16 includes thirteen port dequeue engines. The port dequeue engines are labeled one through thirteen in the diagram of FIG. 1. The configuration register 32 of the port dequeue circuitry 16 is loaded with configuration information 21 such that one port dequeue engine is assigned to each of the physical MAC ports.

In one example, ethernet frames are received on each of the physical MAC ports. Frame data of such an ethernet frame is output, 256 bits at a time, onto TDM (Time Division Multiplexed) bus 35. Each such 256-bit amount of packet data is accompanied by: 1) a value that indicates the physical MAC port that received the packet data, 2) a SOF (Start of Frame) bit that if asserted indicates that the 256-bit amount of packet data carries the first packet data of a frame, 3) an EOF (End of Frame) bit that if asserted indicates that the 256-bit amount of packet data carries the last packet data of a frame, 4) an error bit ERR, 5) a 5-bit MOD value that is valid if EOF is asserted and in that case indicates how many bytes of the 256-bit value are valid, 6) a port number, 7) a timestamp that is valid if SOF is asserted, and additional information shown in FIG. 1. This additional information about the 256-bit amount of packet data is generated by the Ethernet MAC portion 19 of the MAC layer interface circuit 18. These 256-bit values along with their accompanying descriptive information are supplied one after another, in time division multiplexed fashion, from the various physical MAC ports onto TDM bus 35.

A 256-bit value is supplied to parser and checksum circuit 12, and is also supplied to the port enqueue circuitry 14. One of the port enqueue engines of the port enqueue circuitry 14 is hardcoded with the number of the physical MAC port. Each such port enqueue engine receives the physical MAC number and determines, using its hardcoded number, if the 256-bit value is for the port handled by the port enqueue engine. The proper port enqueue engine (the one whose hardcoded number matches the port number of the incoming 256-bit value) receives the 256-bit value, and loads the value into a buffer for the appropriate one of virtual channels. The buffer is in SRAM 15. Eight such 256-bit writes are required to fill the buffer. The port enqueue engine operates atomically, one frame at a time, loading buffers with frame data from SOF to EOF, to a single channel. The Ethernet MAC portion 19 (the "Hydra") presents 256-bit frame data for each port atomically. Frame data for multiple ports may be interleaved on the TDM bus (e.g., Port 1 SOF, Port 2

SOF, . . . , Port 1 EOF, Port 2 EOF), but each enqueue engine only takes the data for its assigned port, so each enqueue engine reads frames atomically. At the time of loading the last 256-bit word of a frame, the parser and checksum circuit 12 has finished generating the "parser result" (PR) value. The PR value is then written into a PD and PR memory 36 in the SRAM 15, where the result value (PR) written is stored so that it is indexed by the buffer ID of the first buffer that stores the first 256-bit value of the frame. In addition to the parse result (PR) value, the timestamp value is also written into this PD and PR memory 36, indexed to the buffer ID of the first buffer that stores the first 256-bit value of the frame.

Figure 2:
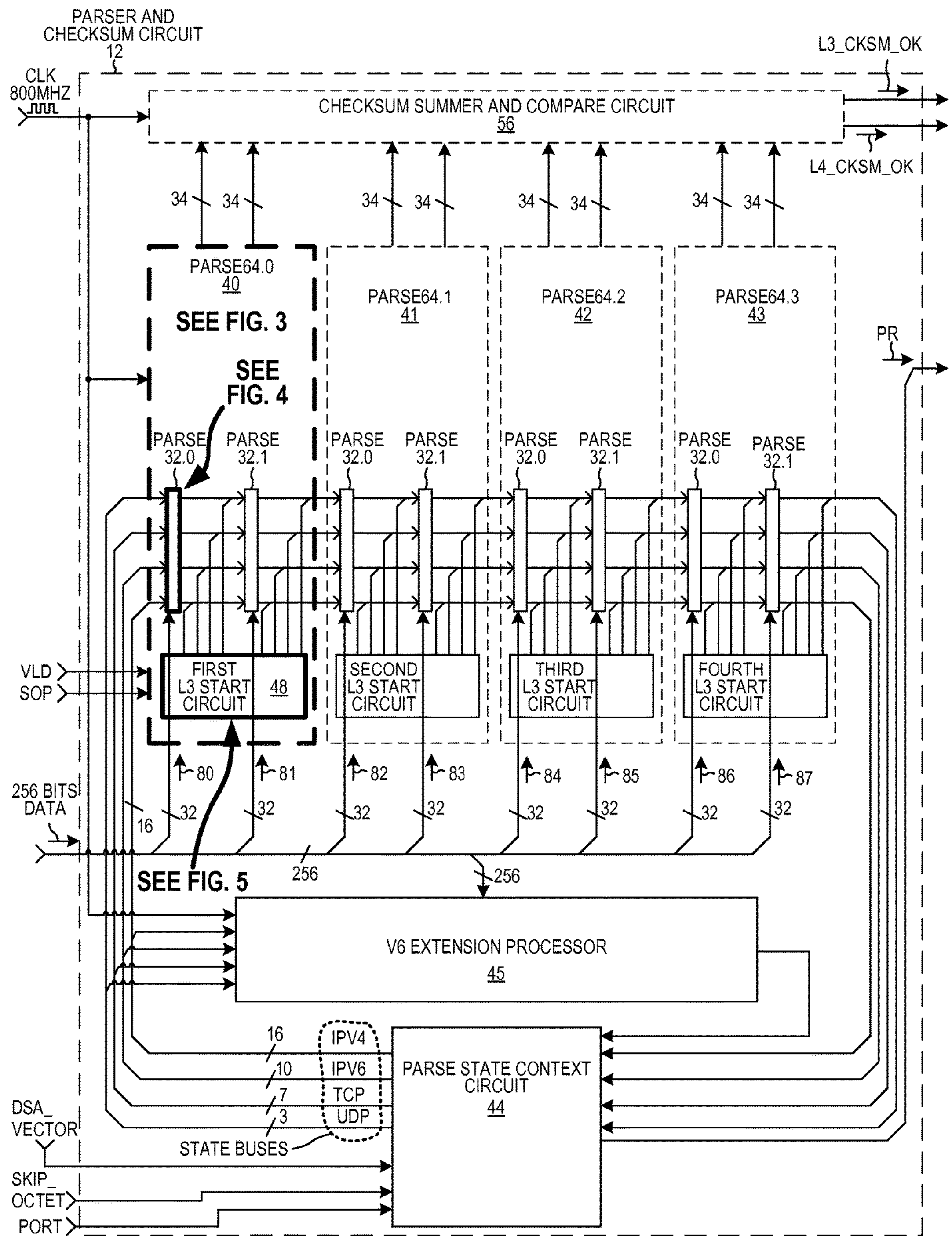
FIG. 2 is a high-level block diagram of the parse and checksum circuit 12.
Figure 3A:
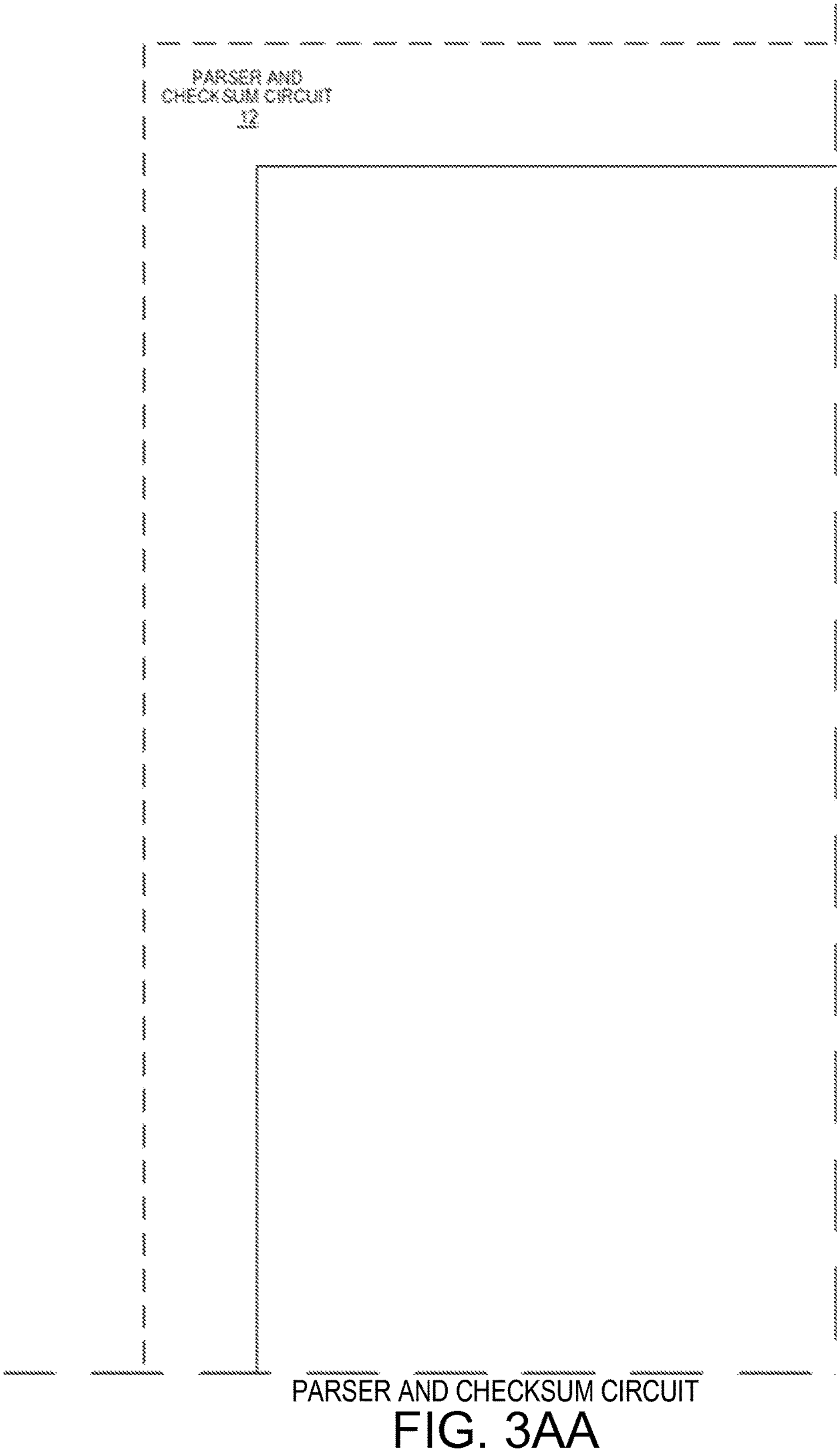
FIG. 3 includes FIG. 3AA, FIG. 3AB, FIG. 3AC, FIG. 3AD, FIG. 3AE, FIG. 3AF, FIG. 3AG, FIG. 3AH, FIG. 3AI, FIG. 3AJ, FIG. 3AK, FIG. 3AL, FIG. 3AM, FIG. 3AN, FIG. 3AO, FIG. 3AP, FIG. 3AQ, FIG. 3AR, FIG. 3AS, FIG. 3AT, FIG. 3AU, FIG. 3AV, FIG. 3AW, FIG. 3AX, FIG. 3AY, FIG. 3AZ, FIG. 3BA, FIG. 3BB, FIG. 3BC, FIG. 3BD, FIG. 3BE, FIG. 3BF, FIG. 3BG, FIG. 3BH, FIG. 3BI, FIG. 3BJ, FIG. 3BK, FIG. 3BL, FIG. 3BM, FIG. 3BN, FIG. 3BO, FIG. 3BP, FIG. 3BQ, FIG. 3BR, FIG. 3BS, FIG. 3BT, FIG. 3BU, FIG. 3BV, FIG. 3BW, FIG. 3BX, FIG. 3BY, FIG. 3BZ, FIG. 3CA, FIG. 3CB, FIG. 3CC, FIG. 3CD, FIG. 3CE, FIG. 3CF, FIG. 3CG, FIG. 3CH, FIG. 3CI FIG. 3CJ, FIG. 3CK, FIG. 3CL, FIG. 3CM, FIG. 3CN, FIG. 3CO, FIG. 3CP, FIG. 3CQ, FIG. 3CR, FIG. 3CS, FIG. 3CT, FIG. 3CU, FIG. 3CV, FIG. 3CW, FIG. 3CX, FIG. 3CY, FIG. 3CZ, FIG. 3DA, FIG. 3DB, FIG. 3DC, FIG. 3DD, FIG. 3DE, FIG. 3DF, FIG. 3DG, FIG. 3DH, FIG. 3DI, FIG. 3DJ, FIG. 3DK, FIG. 3DL, FIG. 3DM, FIG. 3DN, FIG. 3DO, FIG. 3DP, FIG. 3DQ, FIG. 3DR, FIG. 3DS, FIG. 3DT, FIG. 3DU, FIG. 3DV, FIG. 3DW, FIG. 3DX, and FIG. 3DY, which together form a detailed diagram of the parse and checksum circuit 12.
Figure 3A:
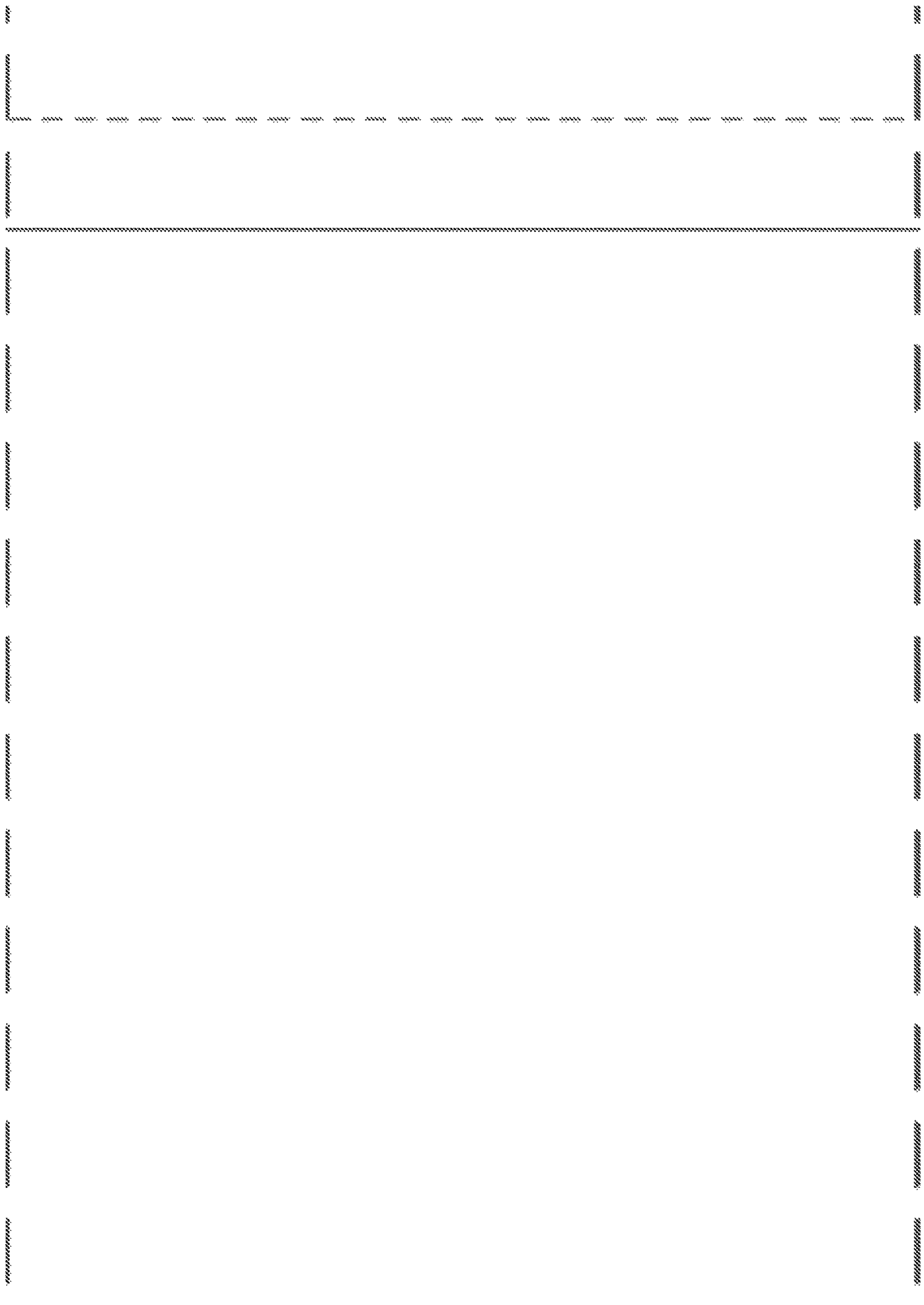
Figure 3A:
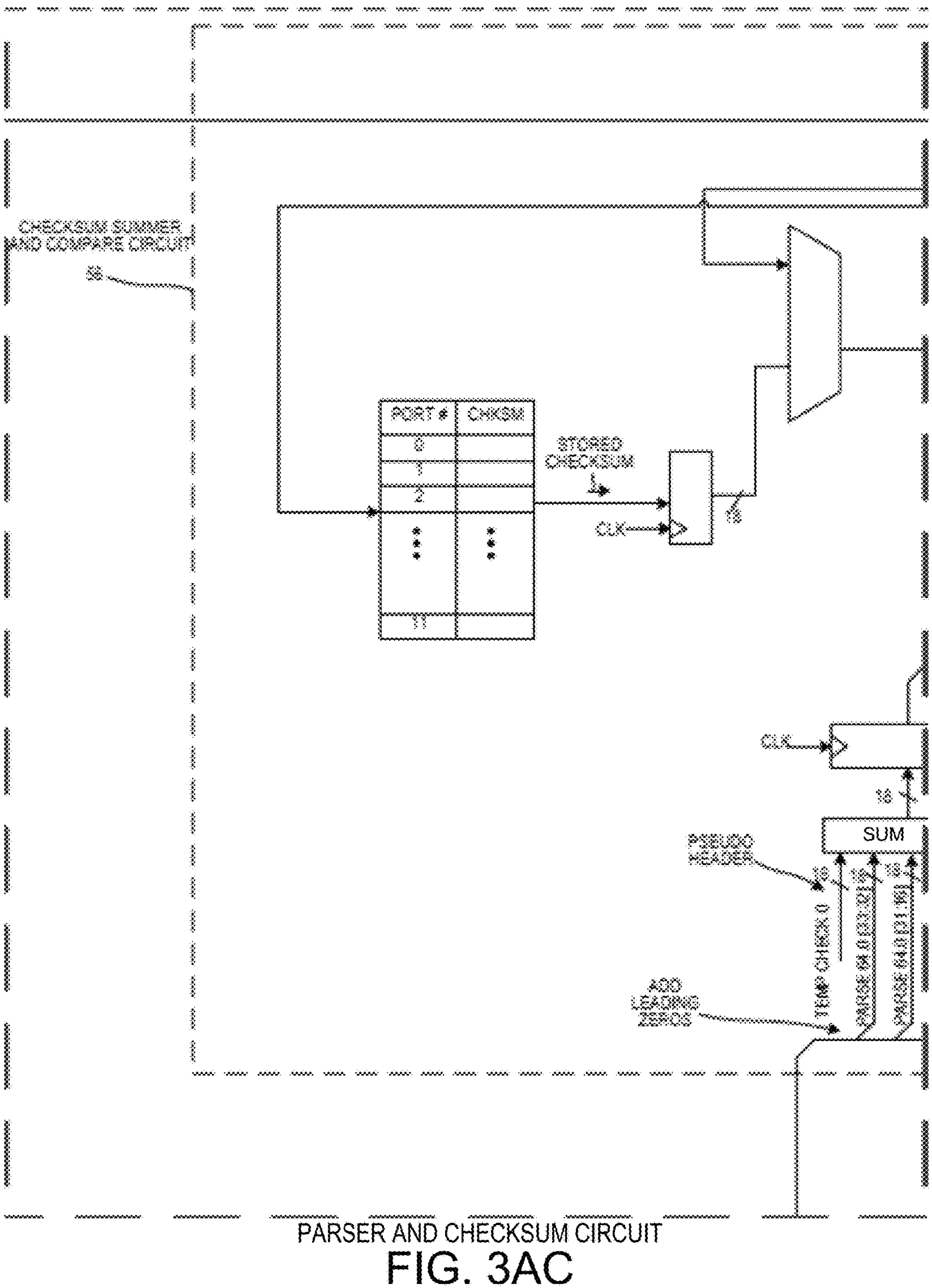
Figure 3A:
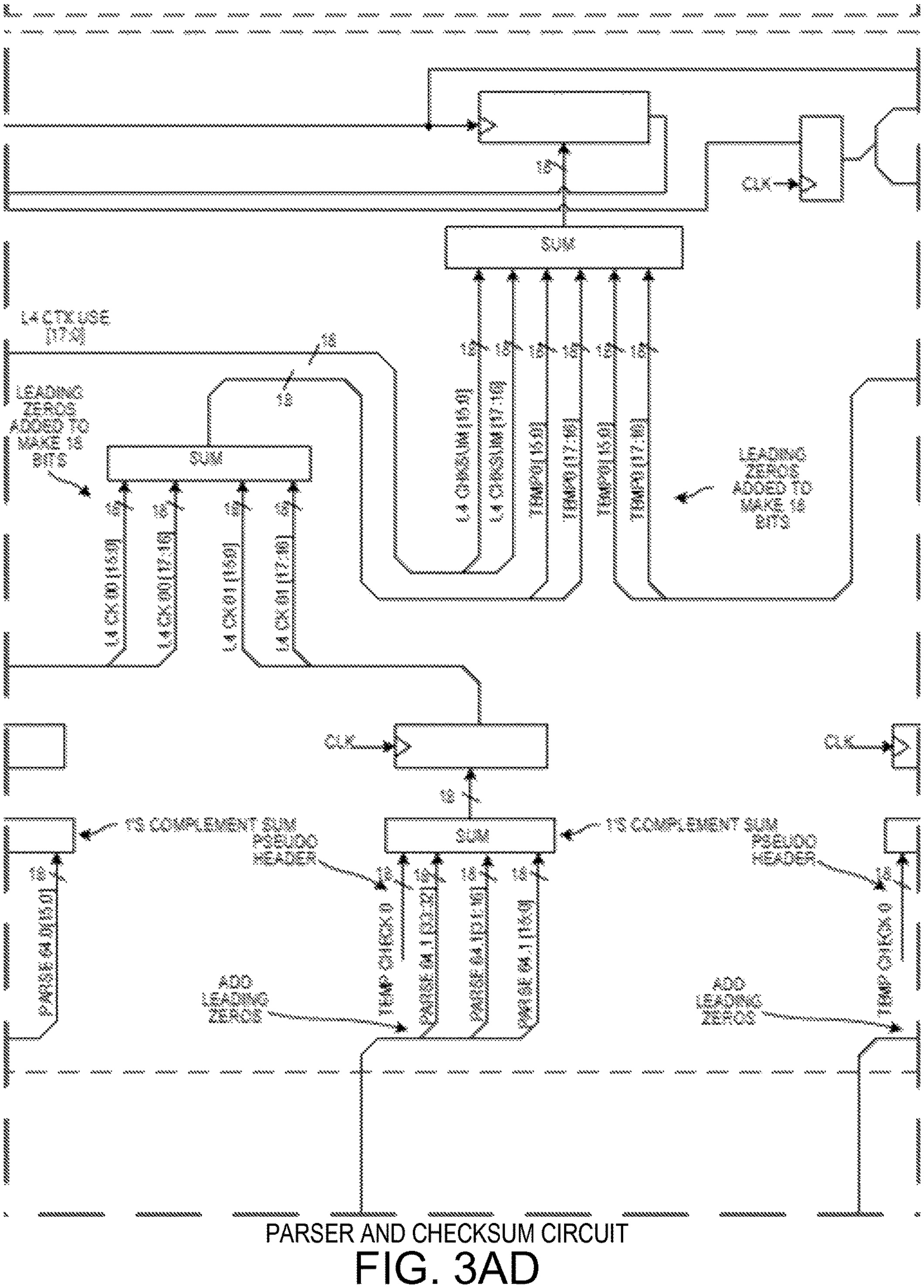
Figure 3A:
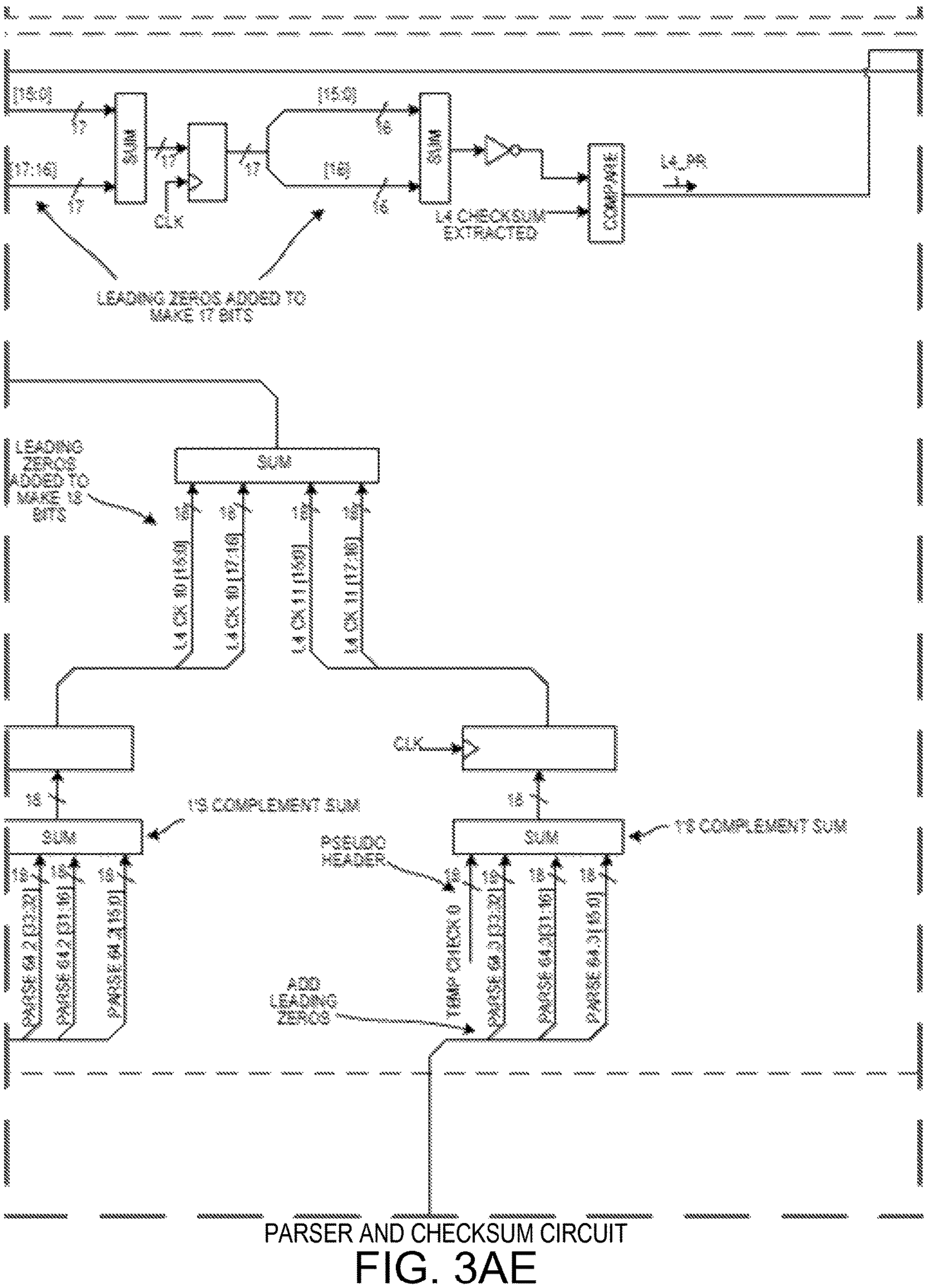
Figure 3A:
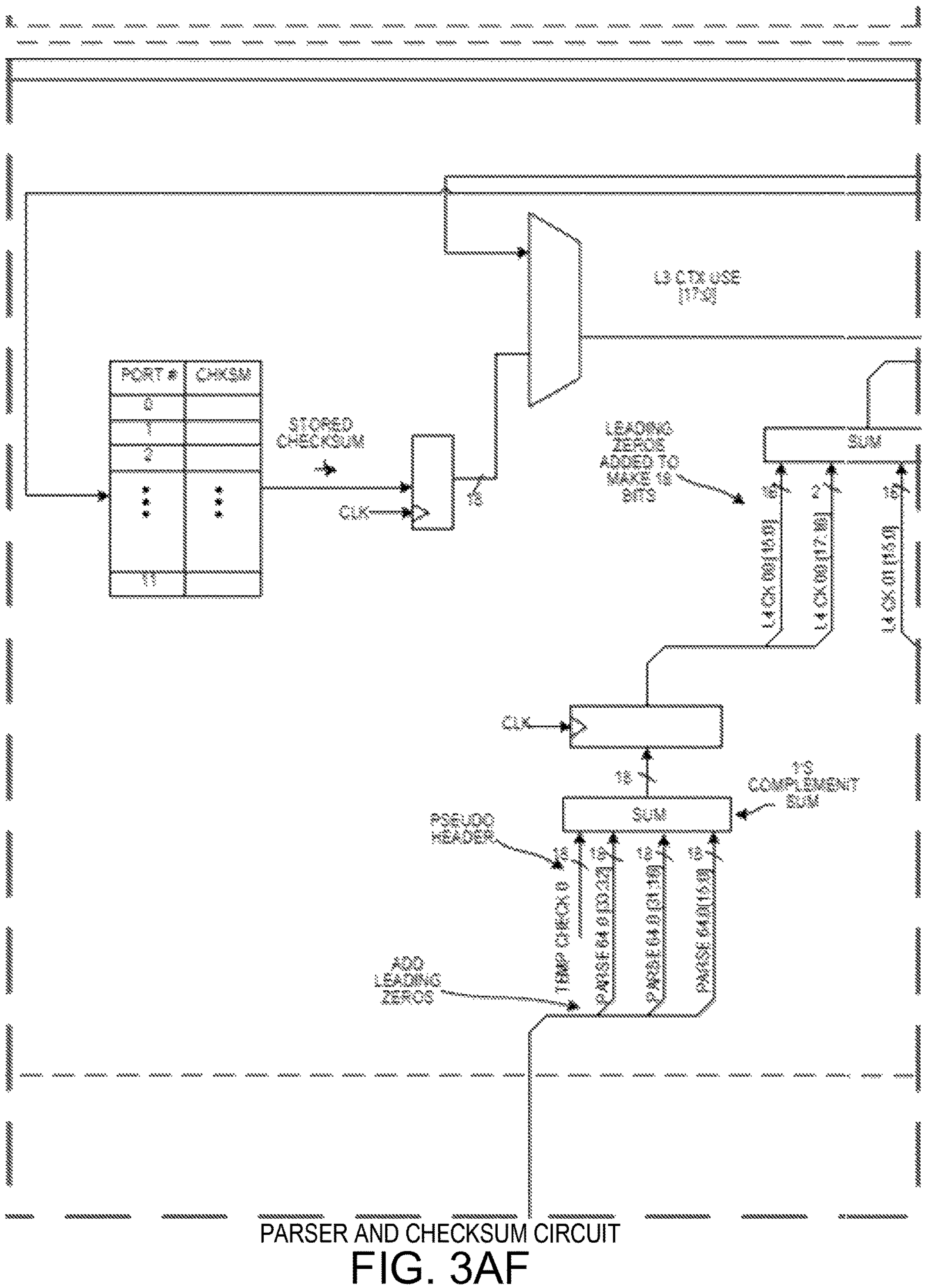
Figure 3A:
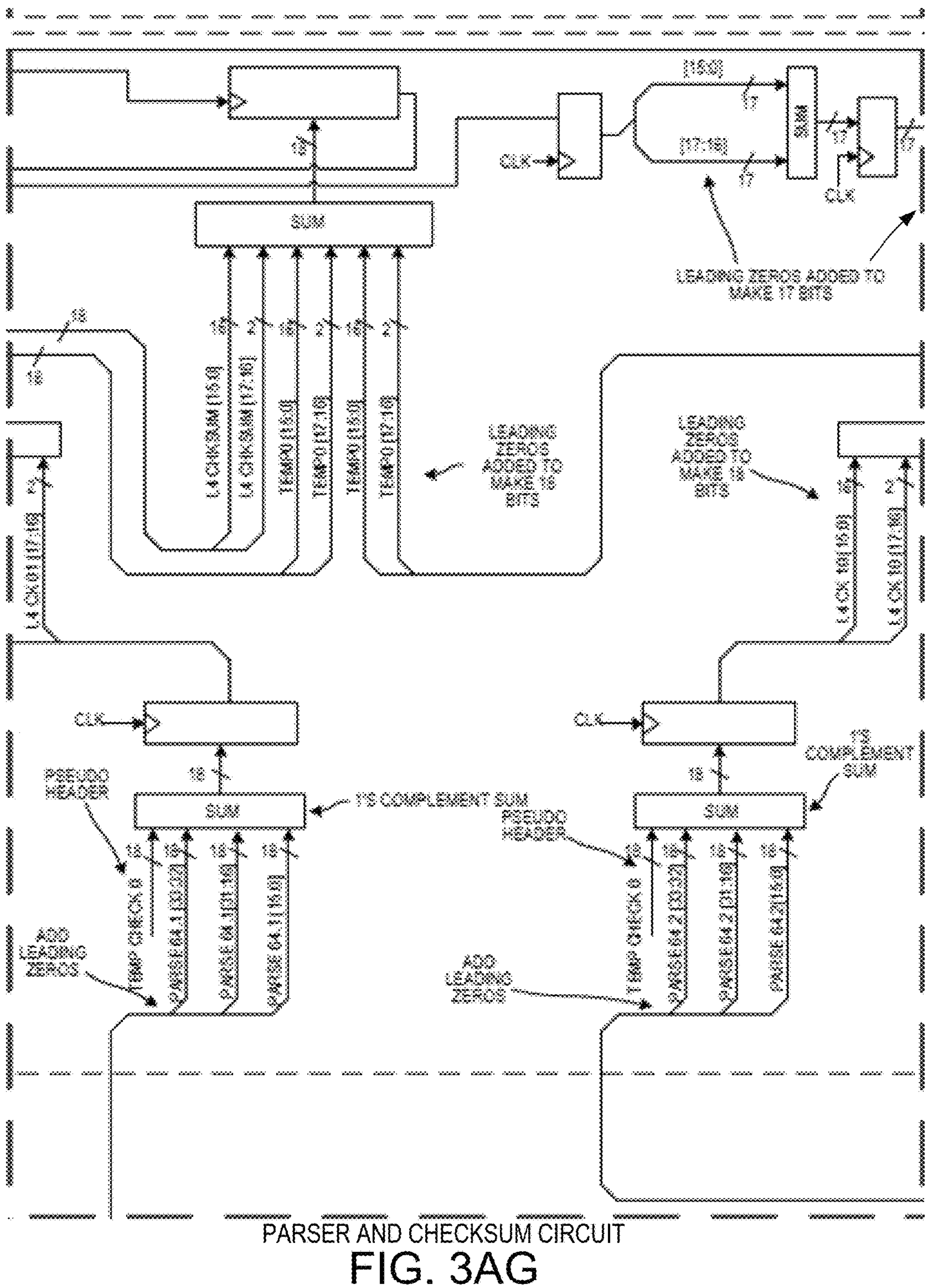
Figure 3A:
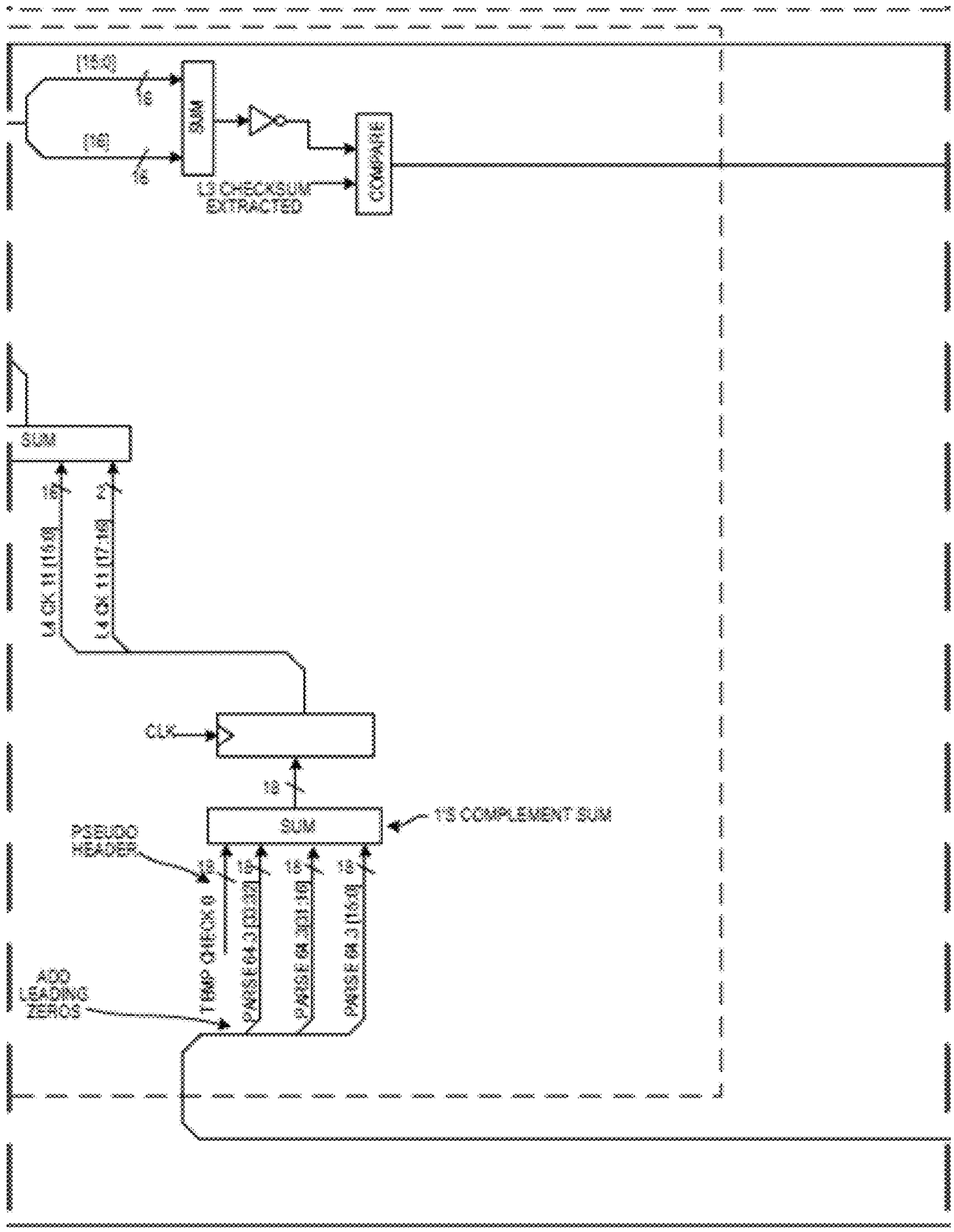
Figure 3A:
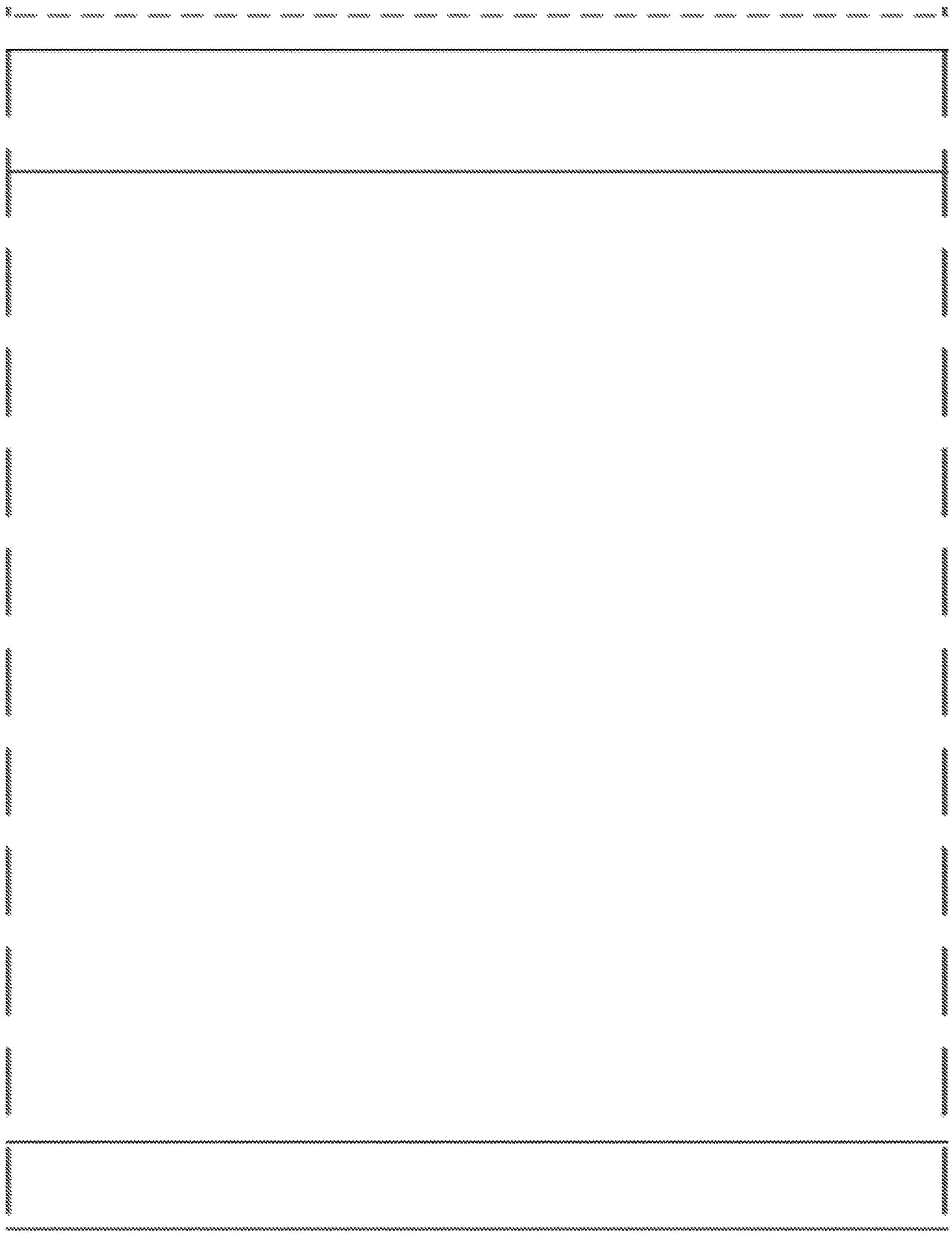
Figure 3A:
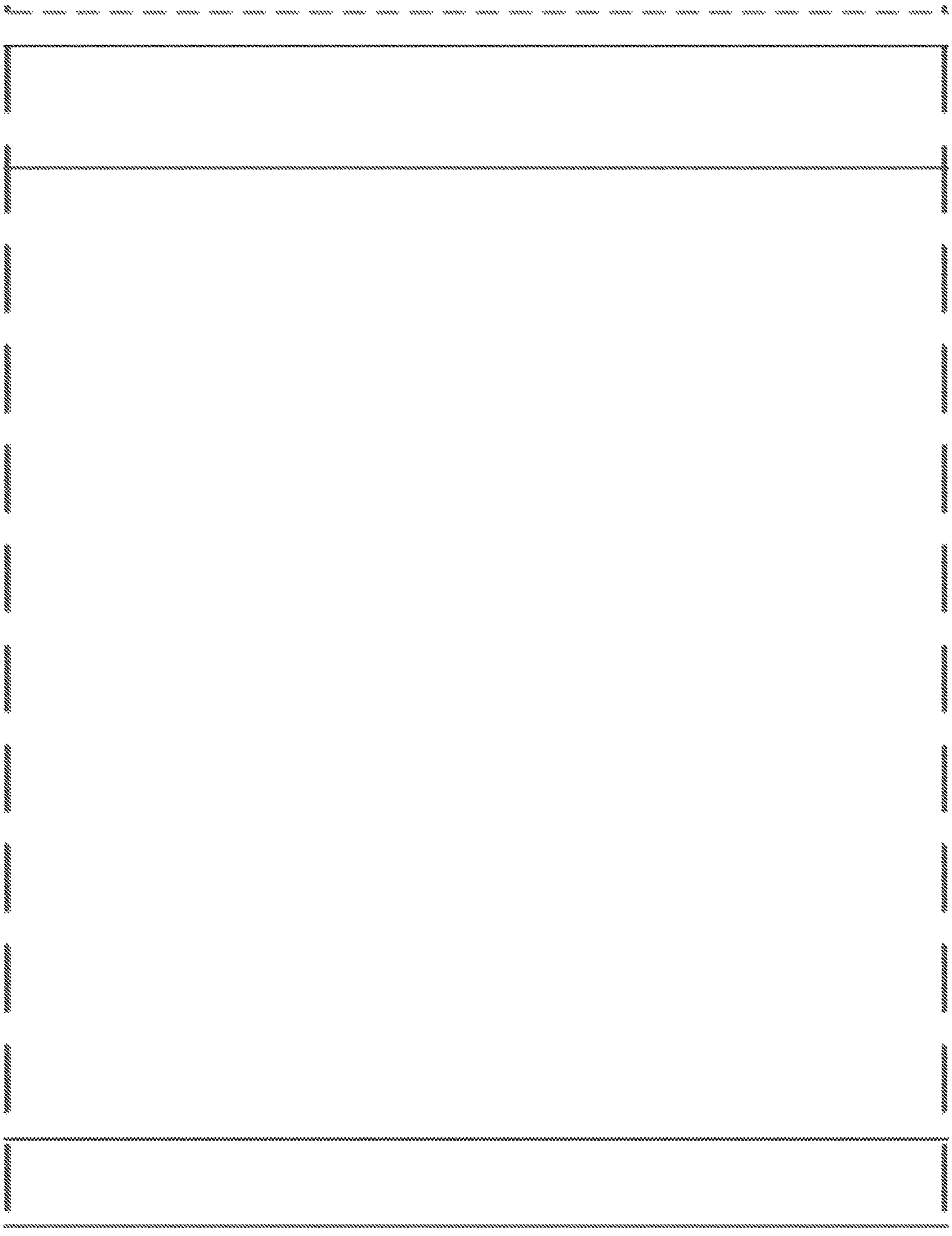
Figure 3A:
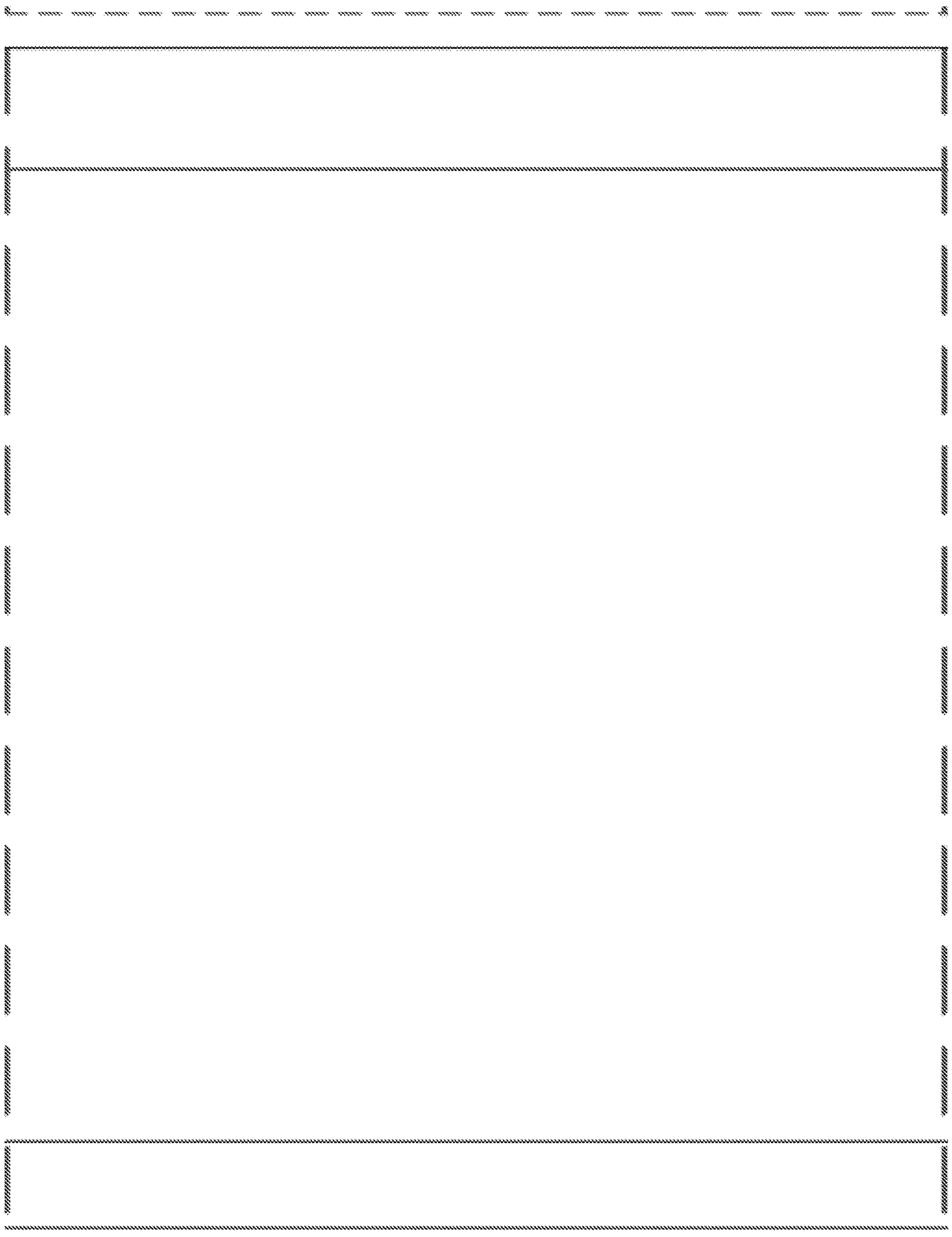
Figure 3A:
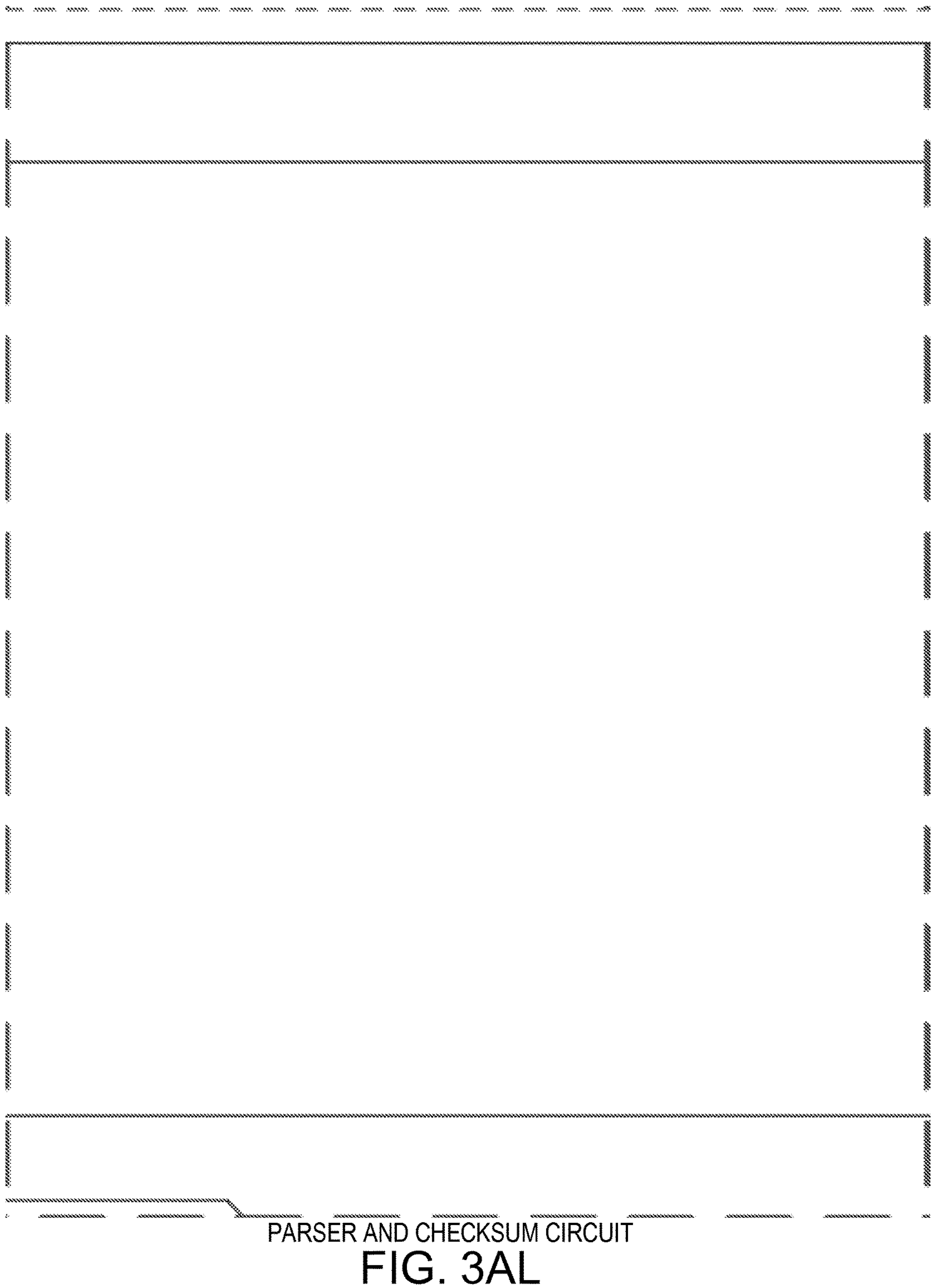
Figure 3A:
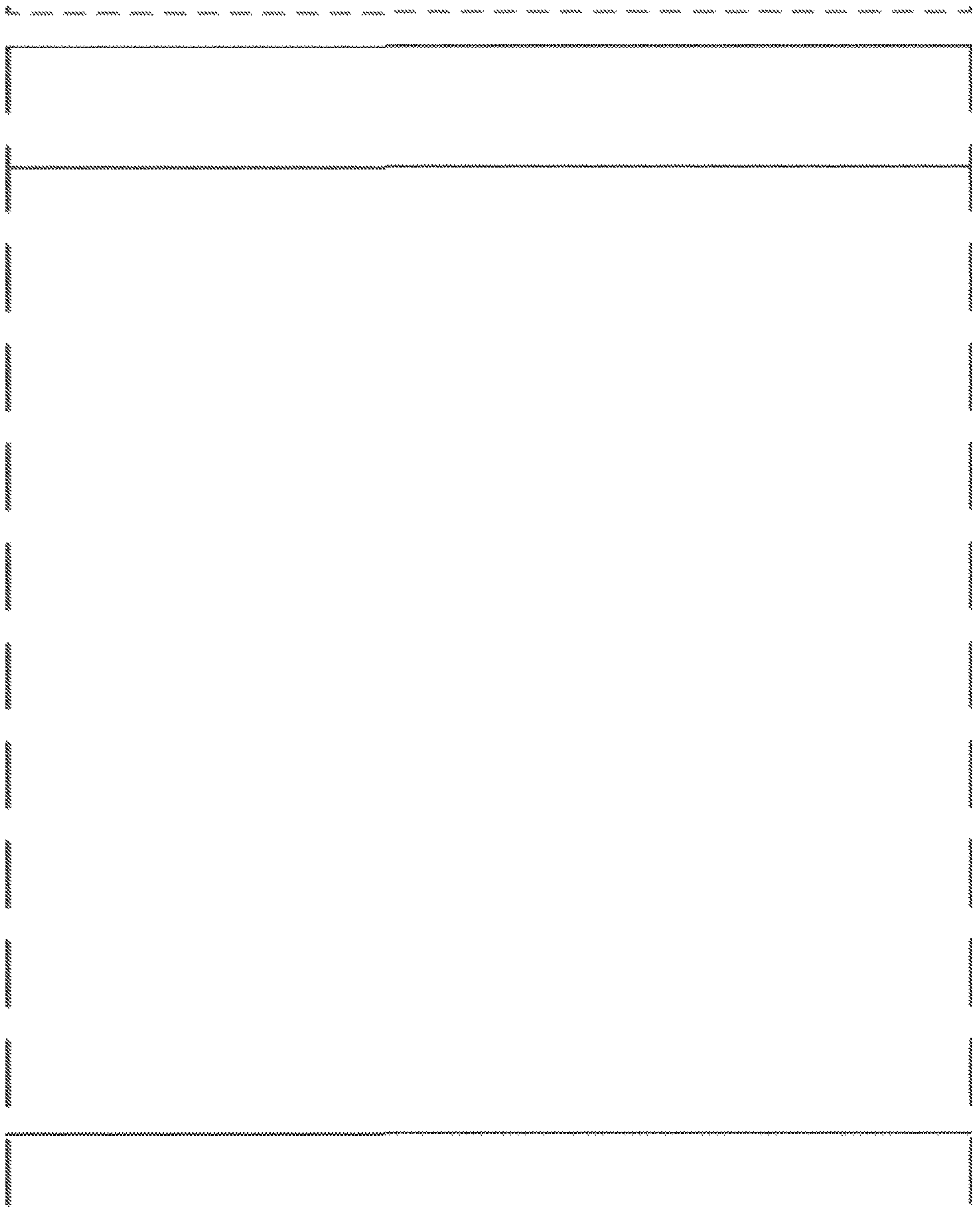
Figure 3A:
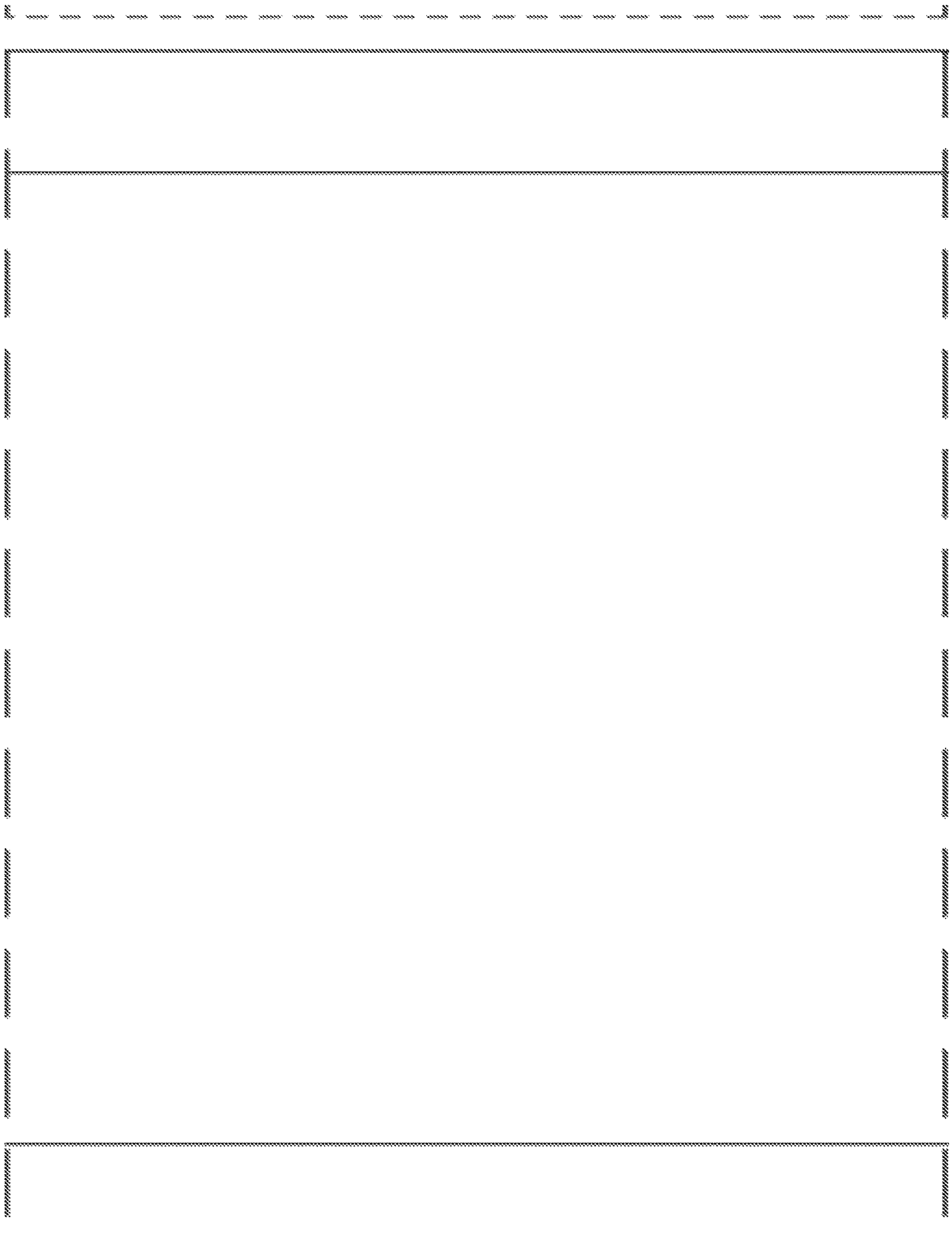
Figure 3A:
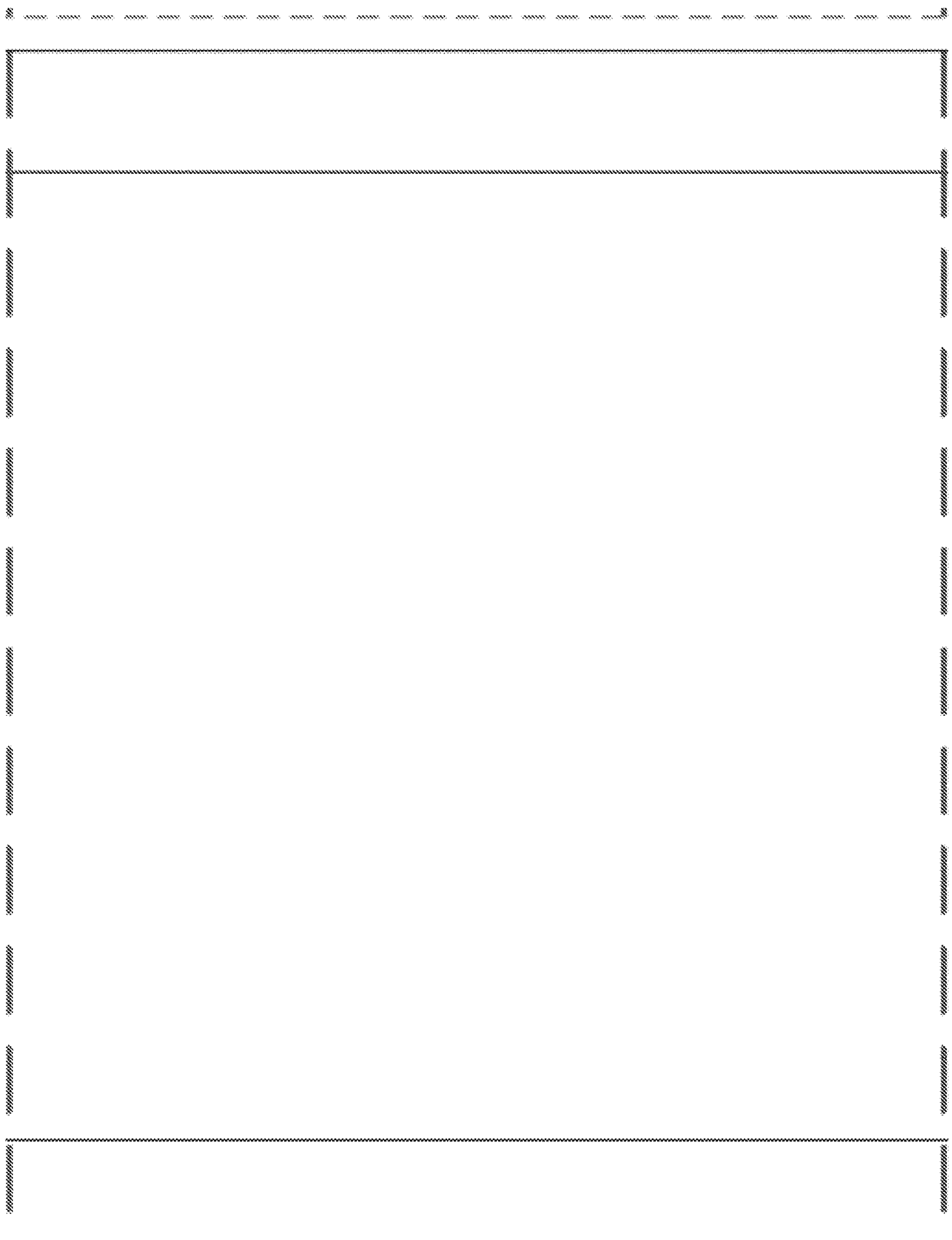
Figure 3A:
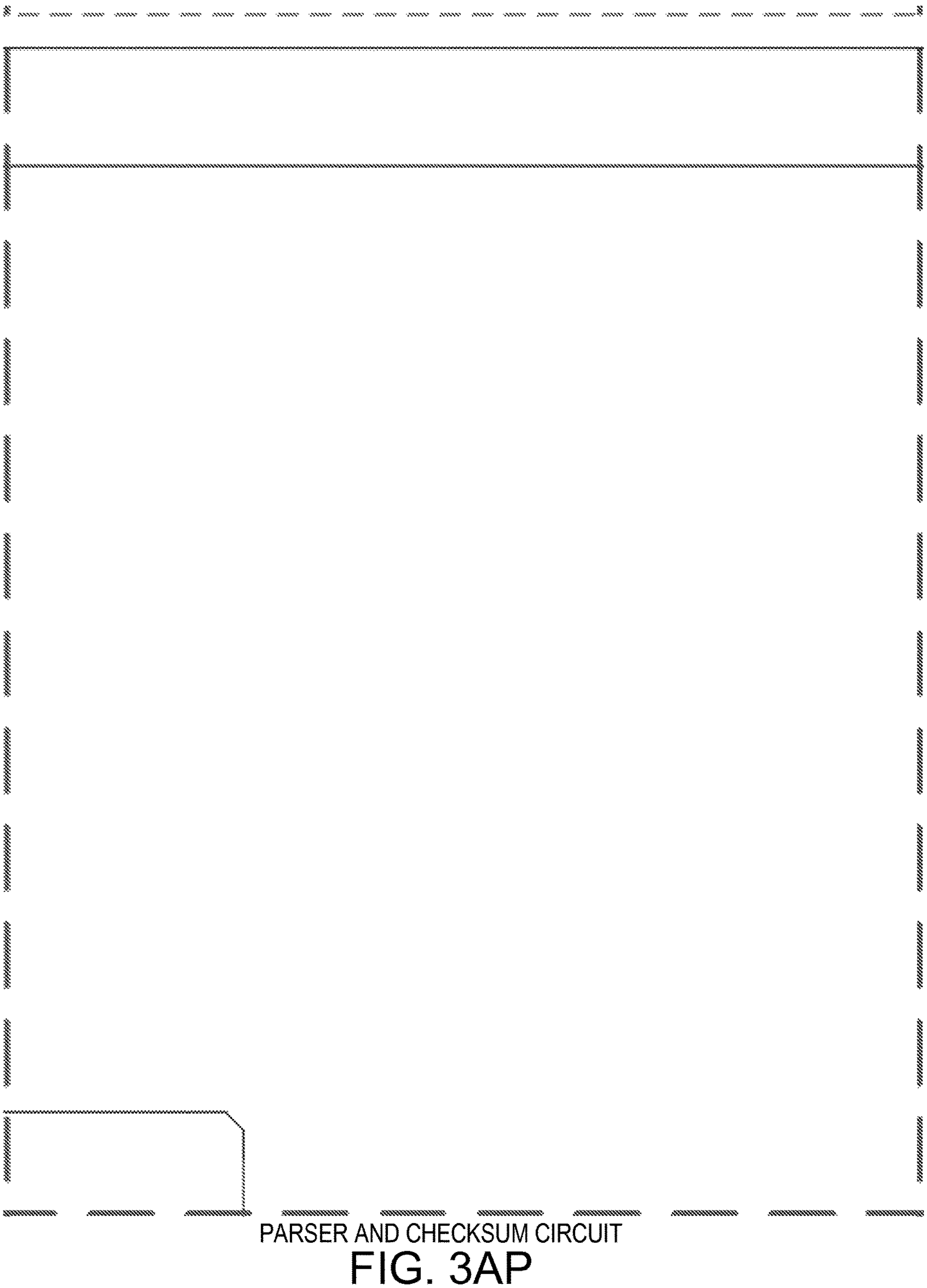
Figure 3A:
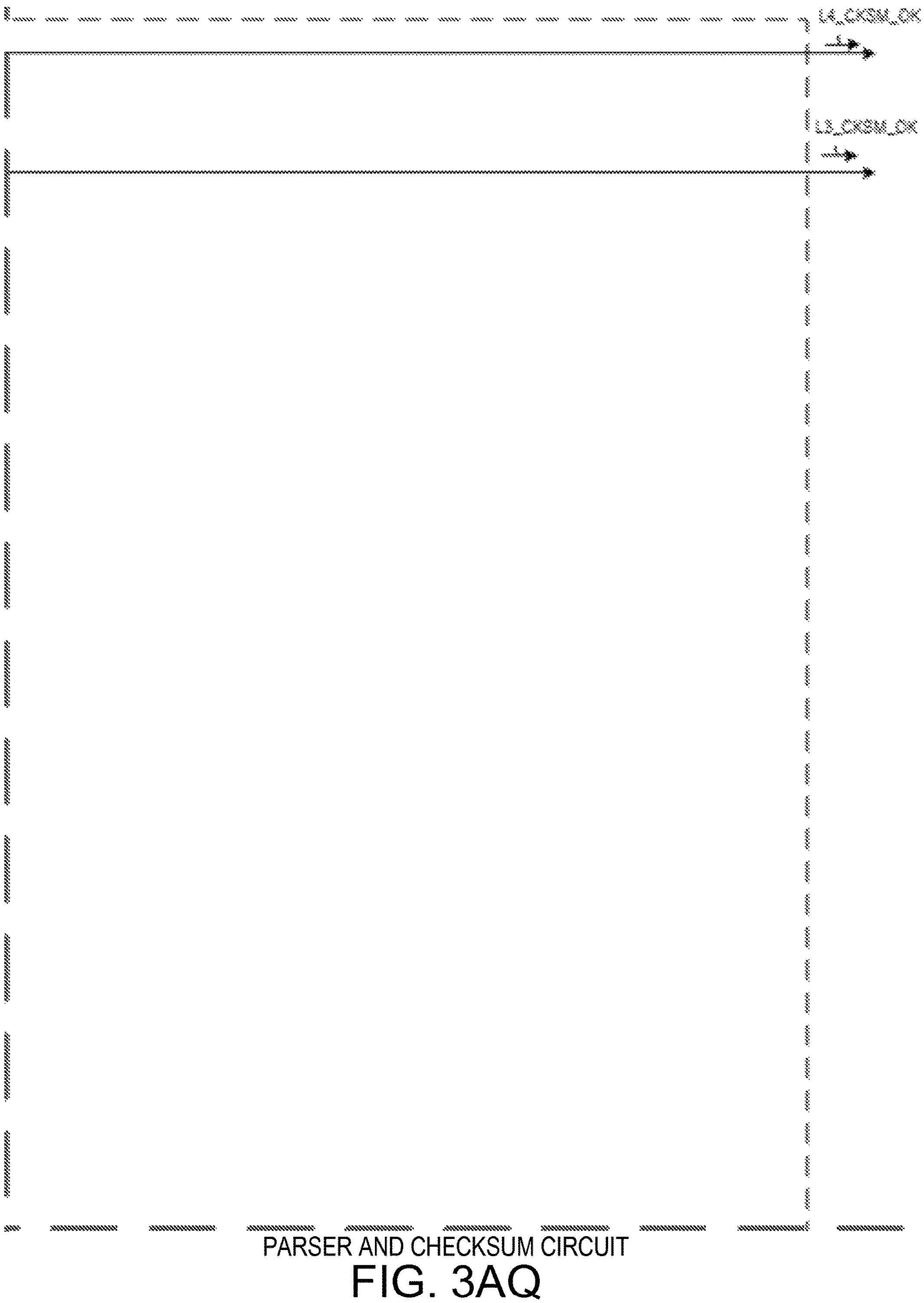
Figure 3A:
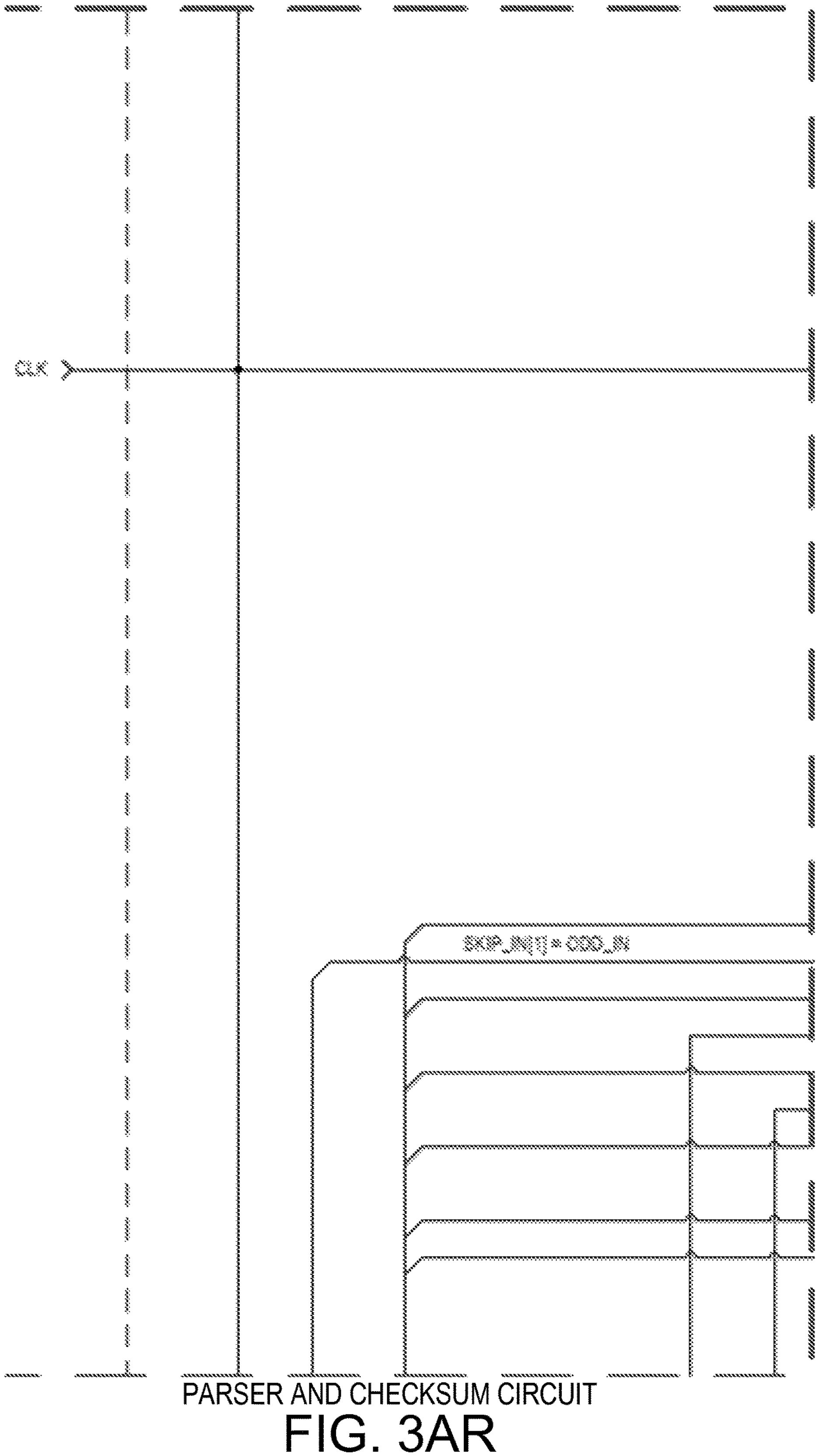
Figure 3A:
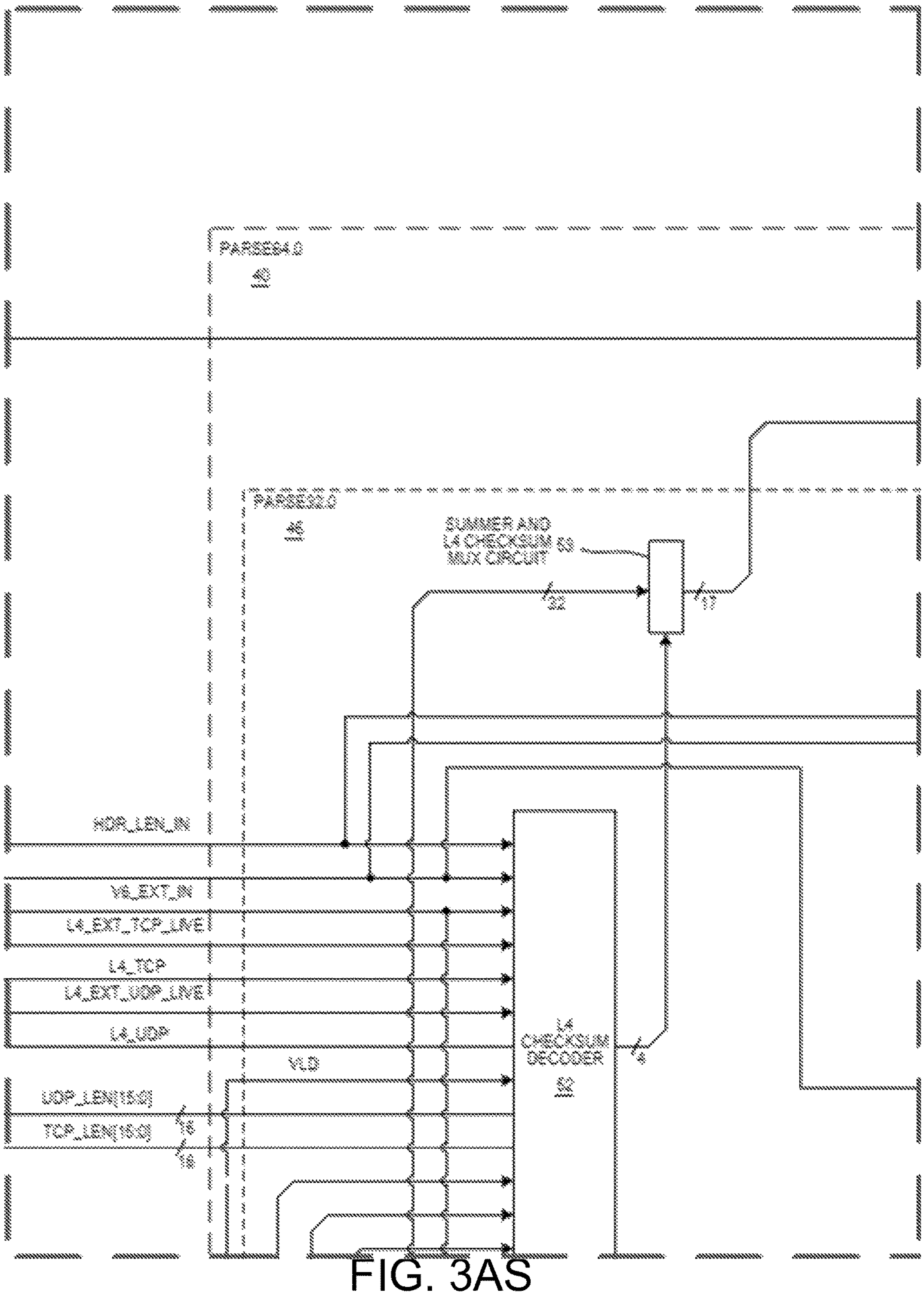
Figure 3A:
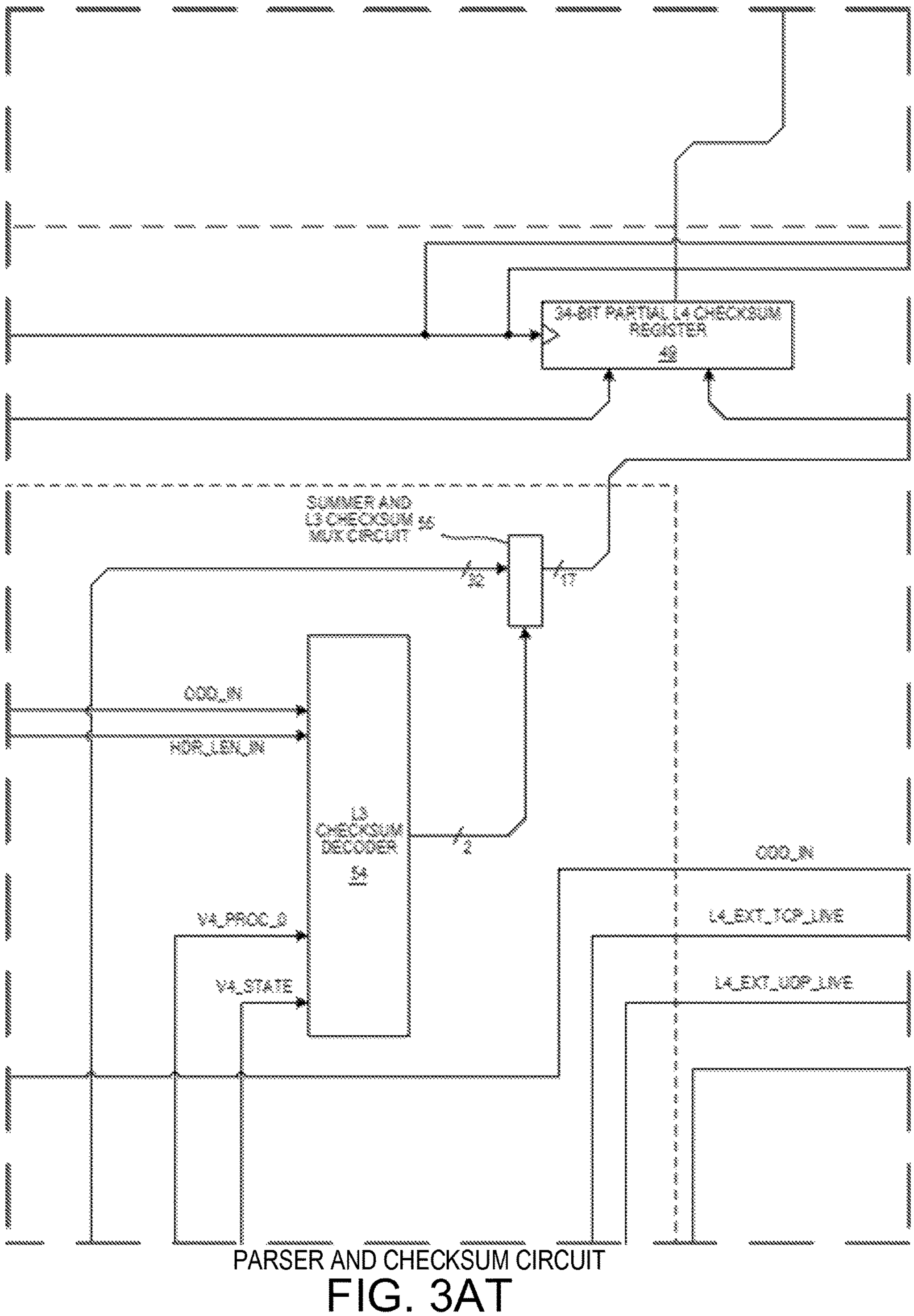
Figure 3A:
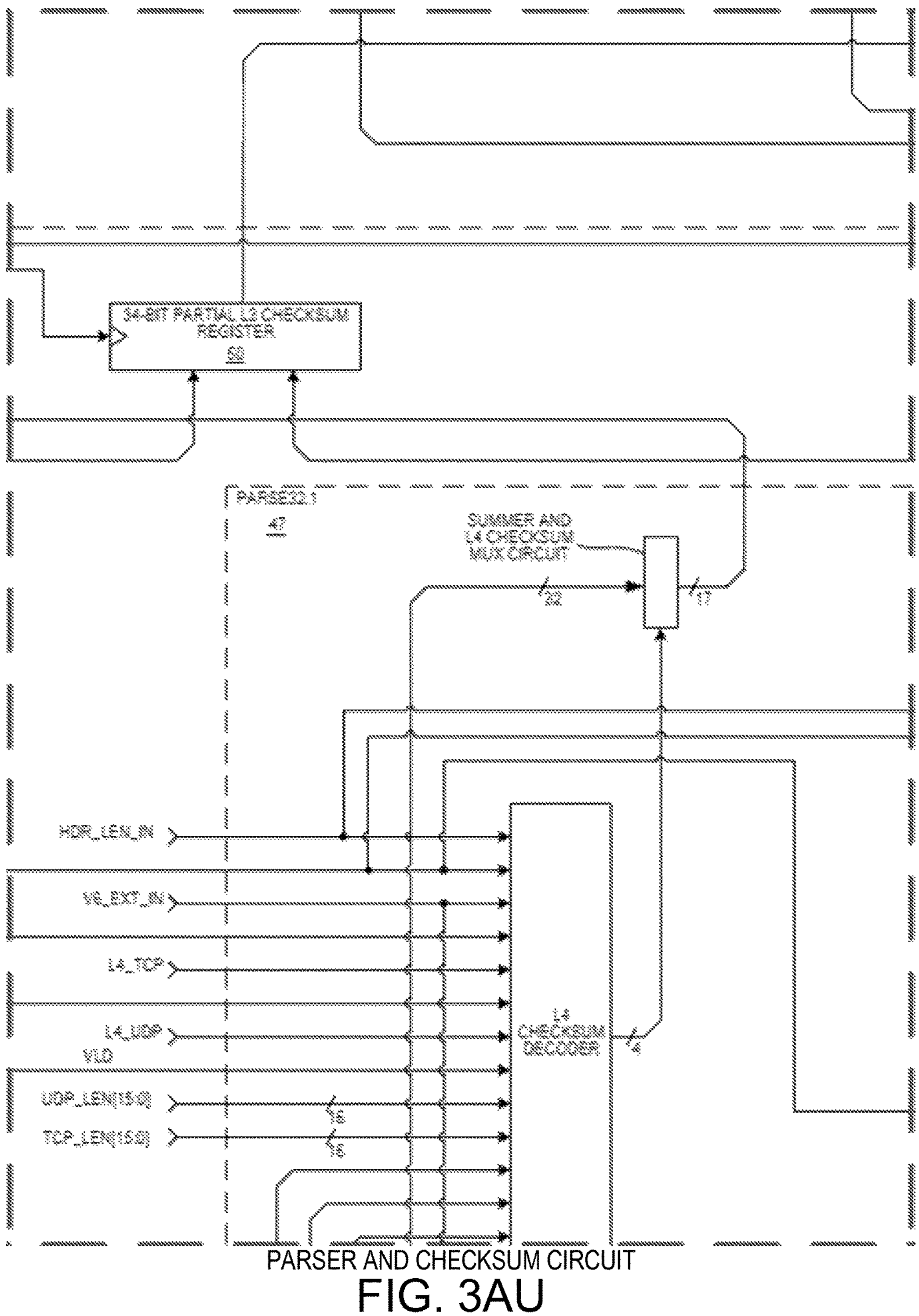
Figure 3A:
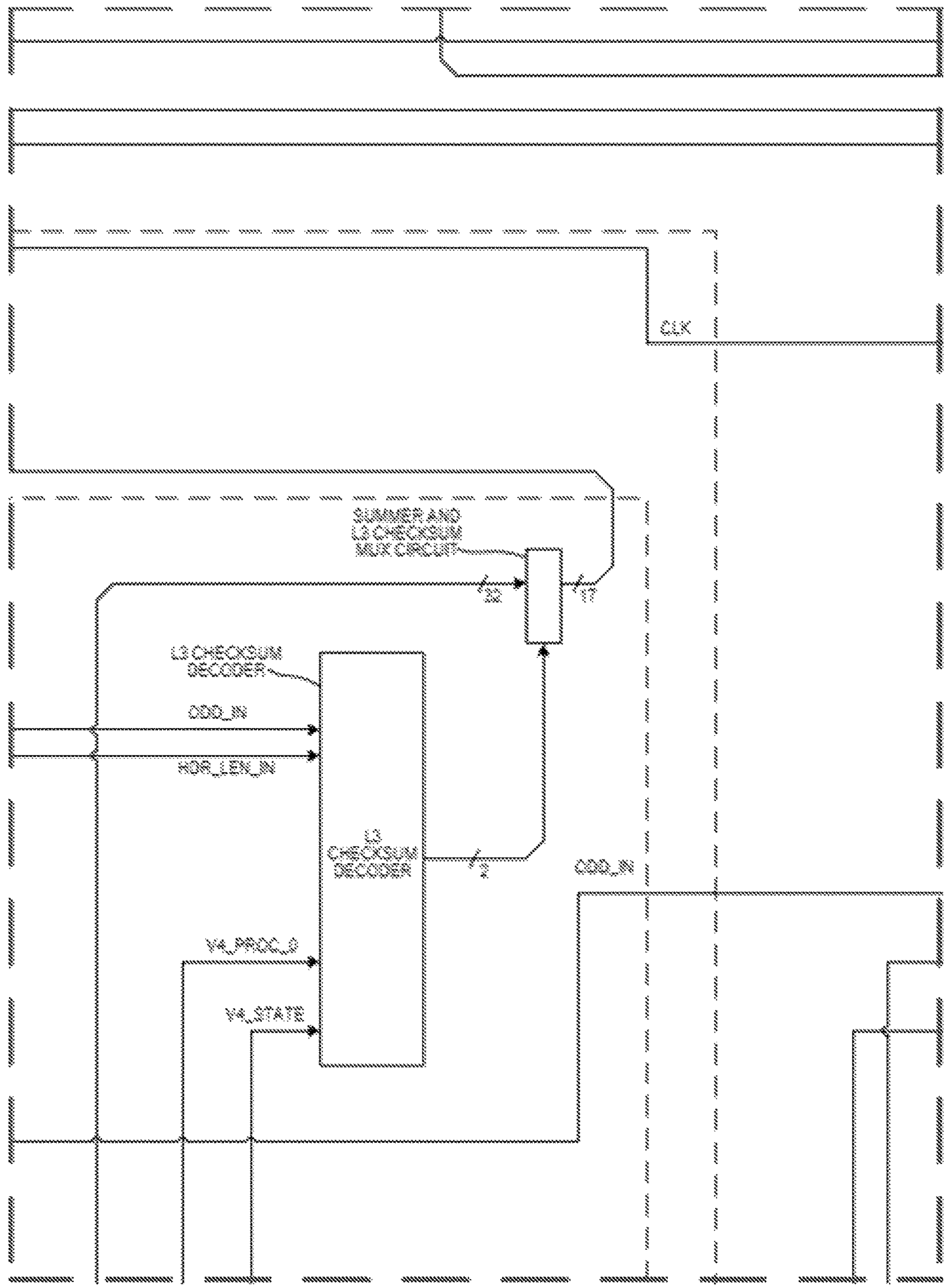
Figure 3A:
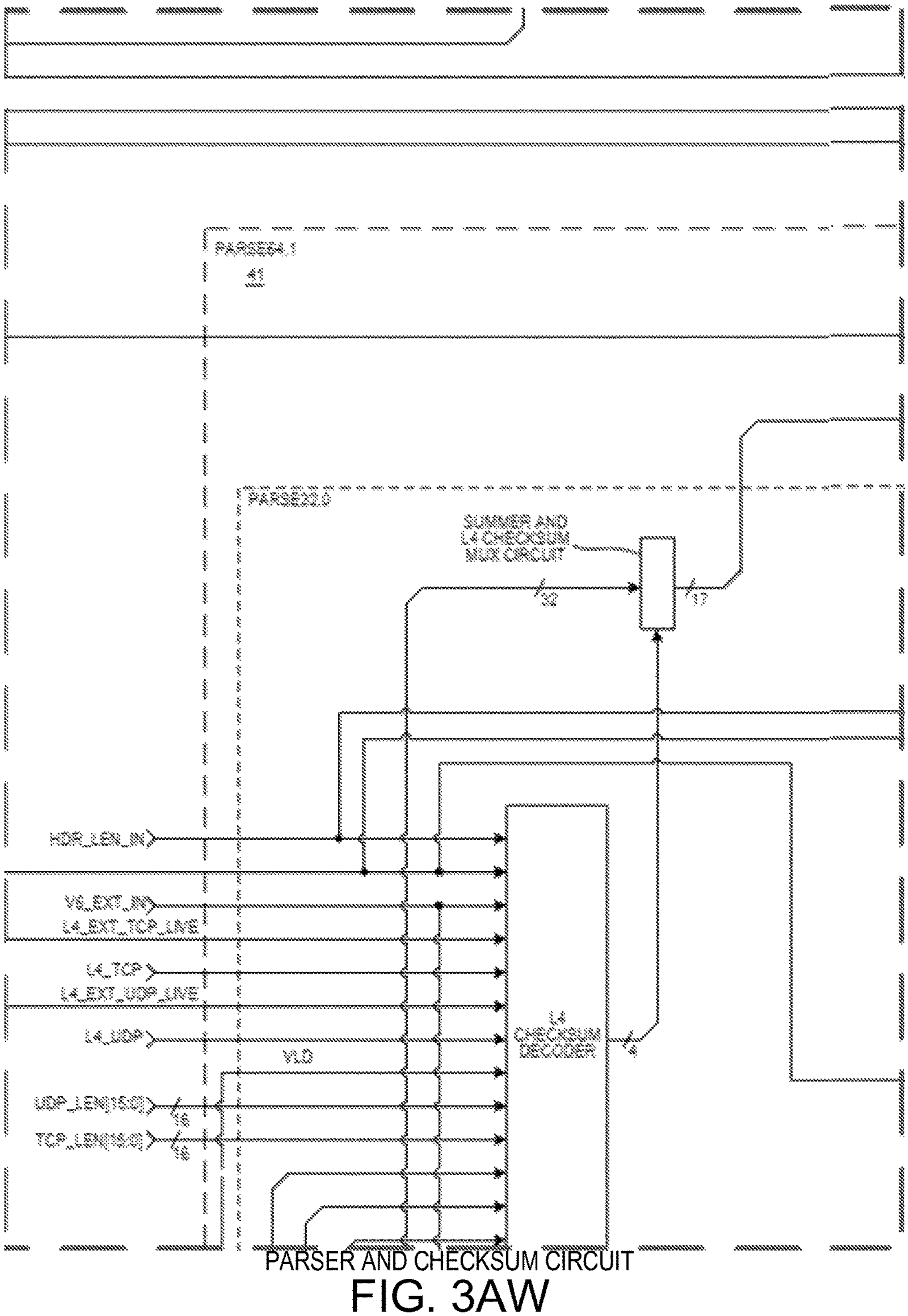
Figure 3A:
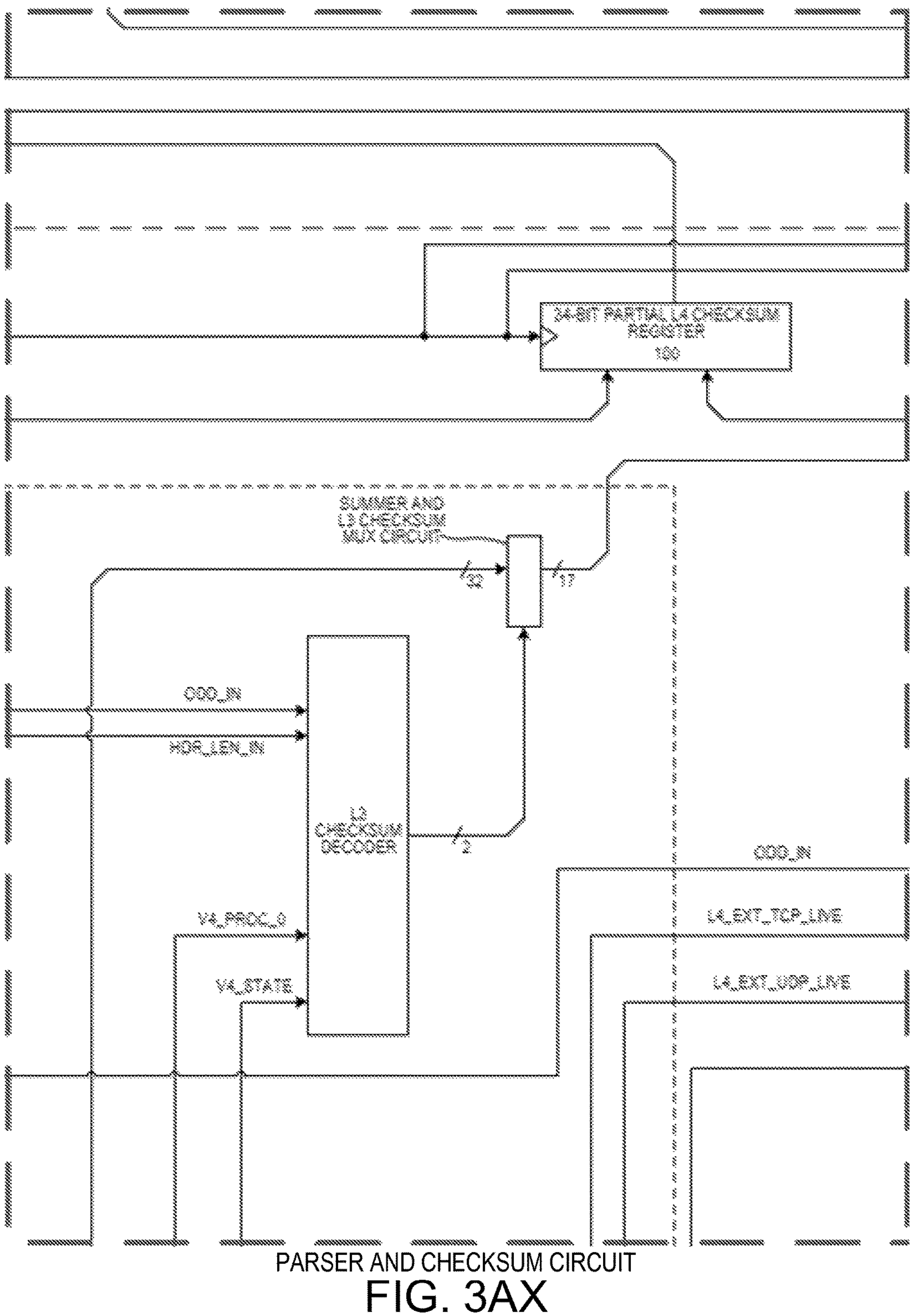
Figure 3A:
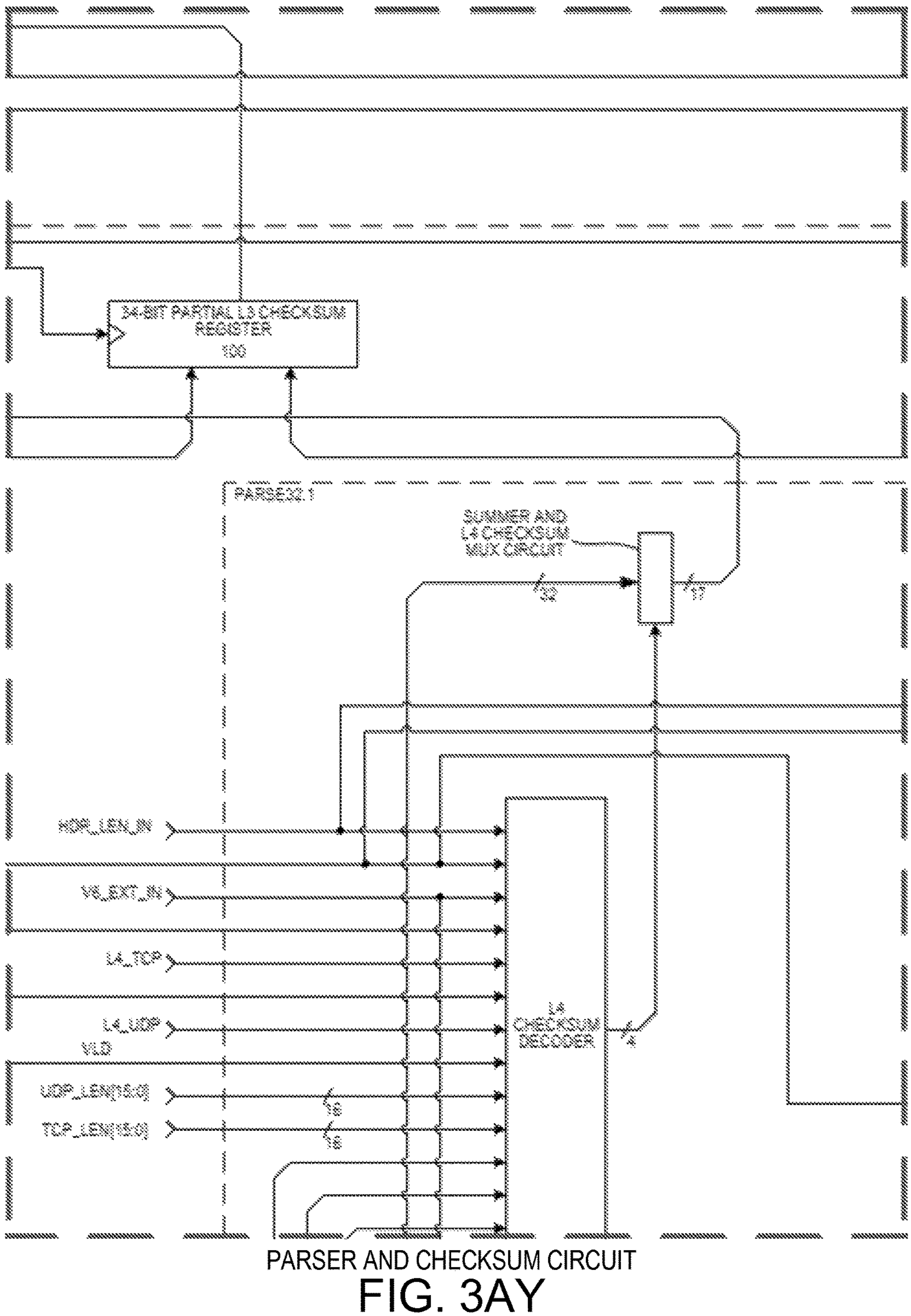
Figure 3A:
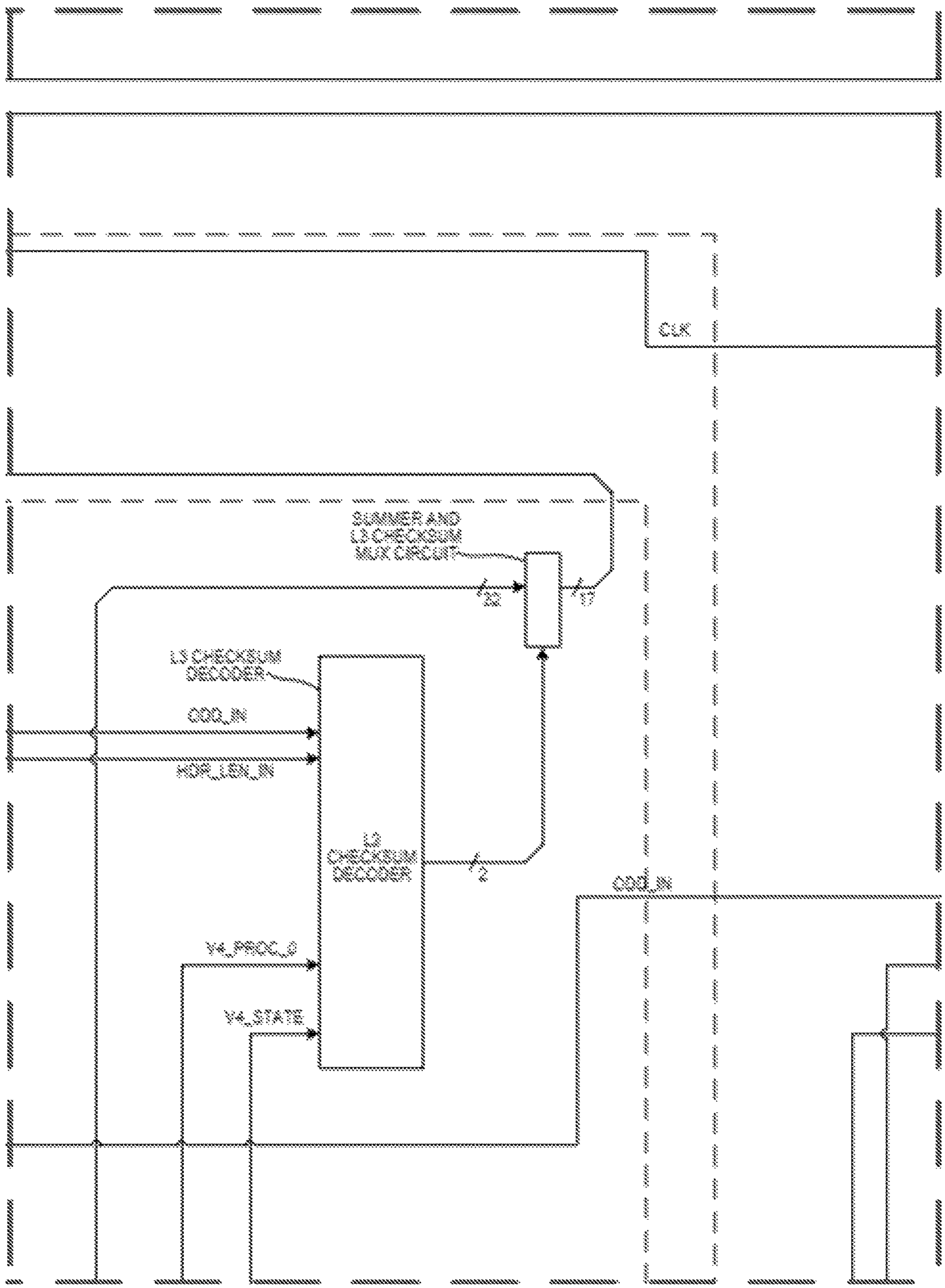
Figure 3B:
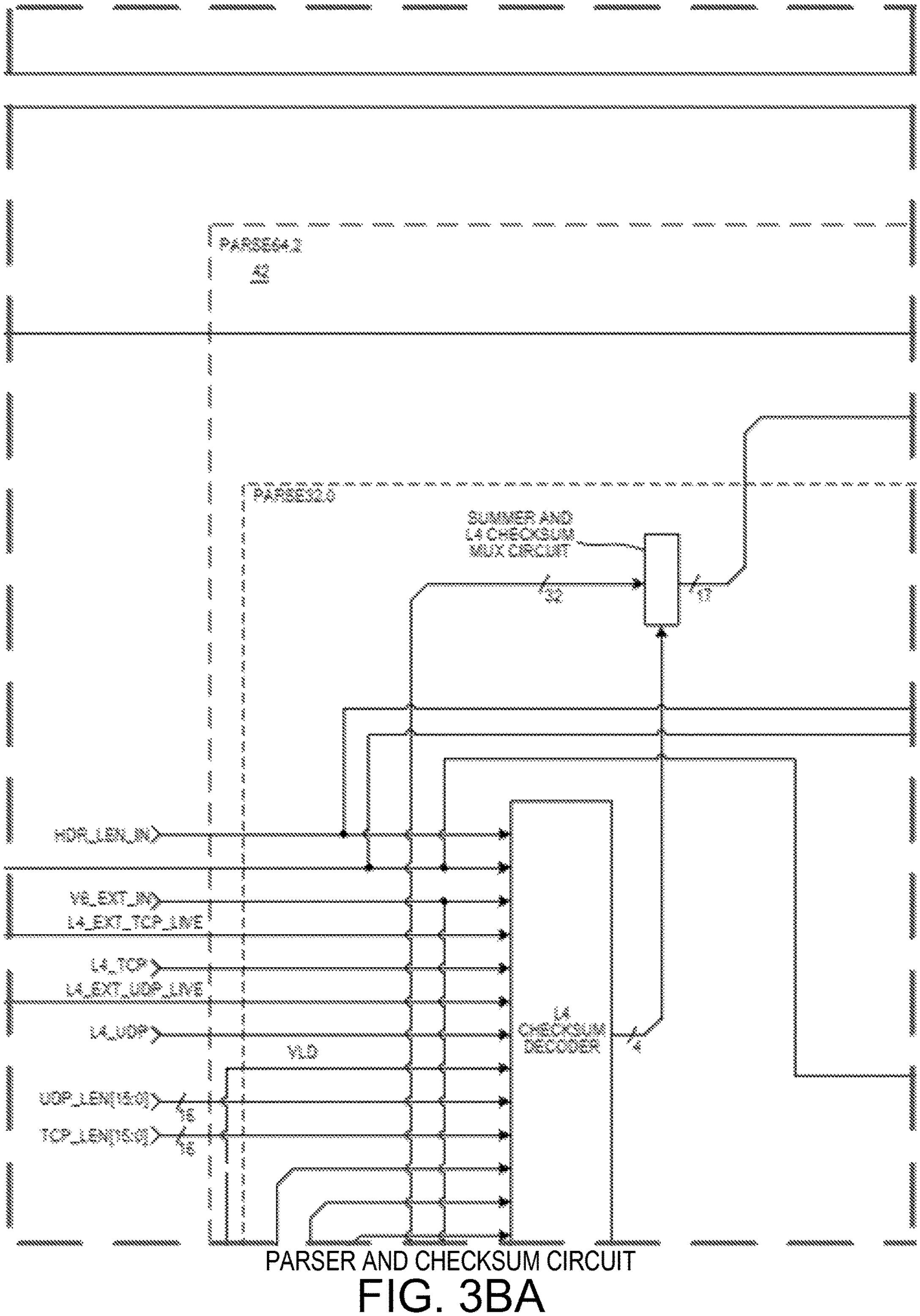
Figure 3B:
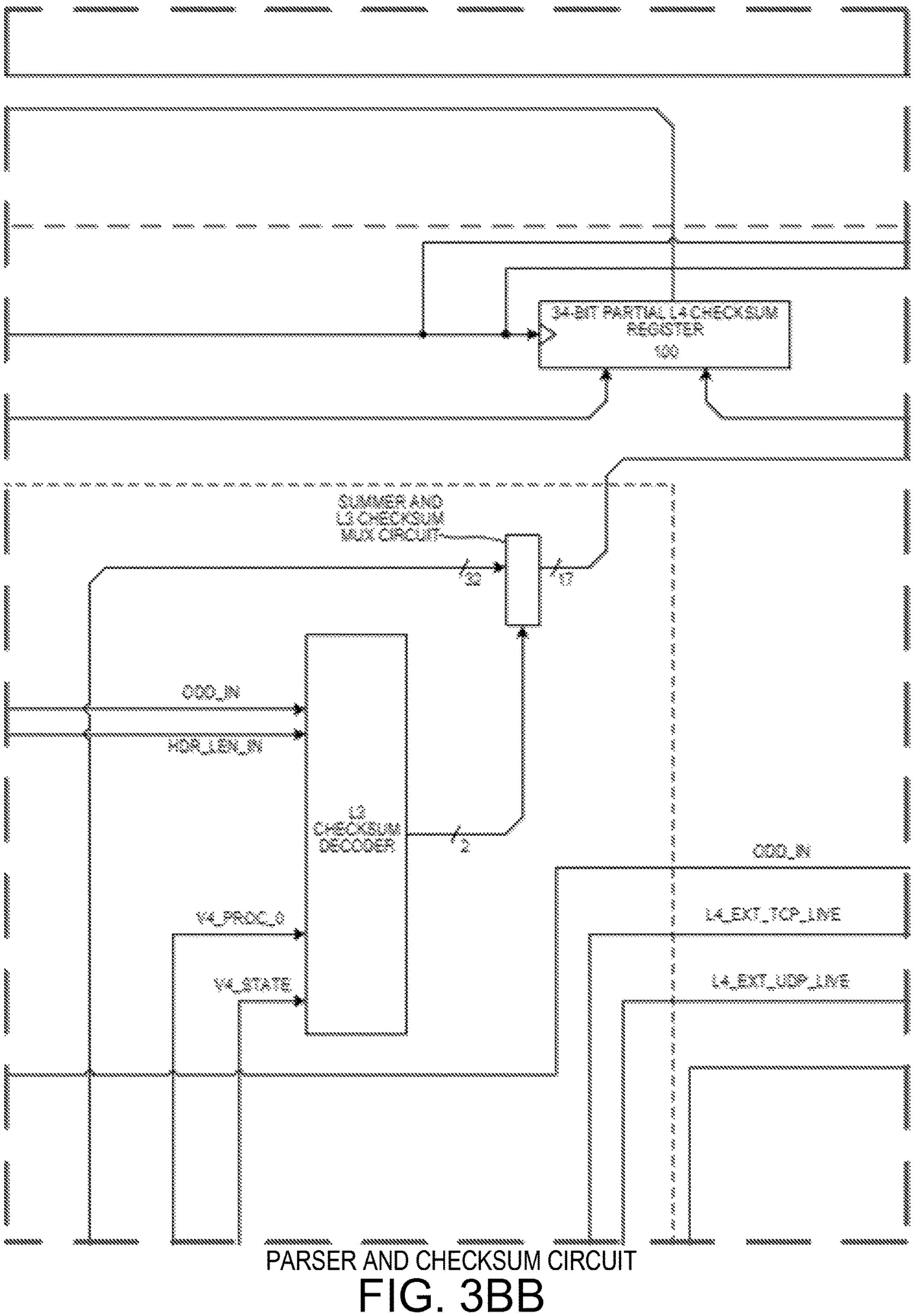
Figure 3B:
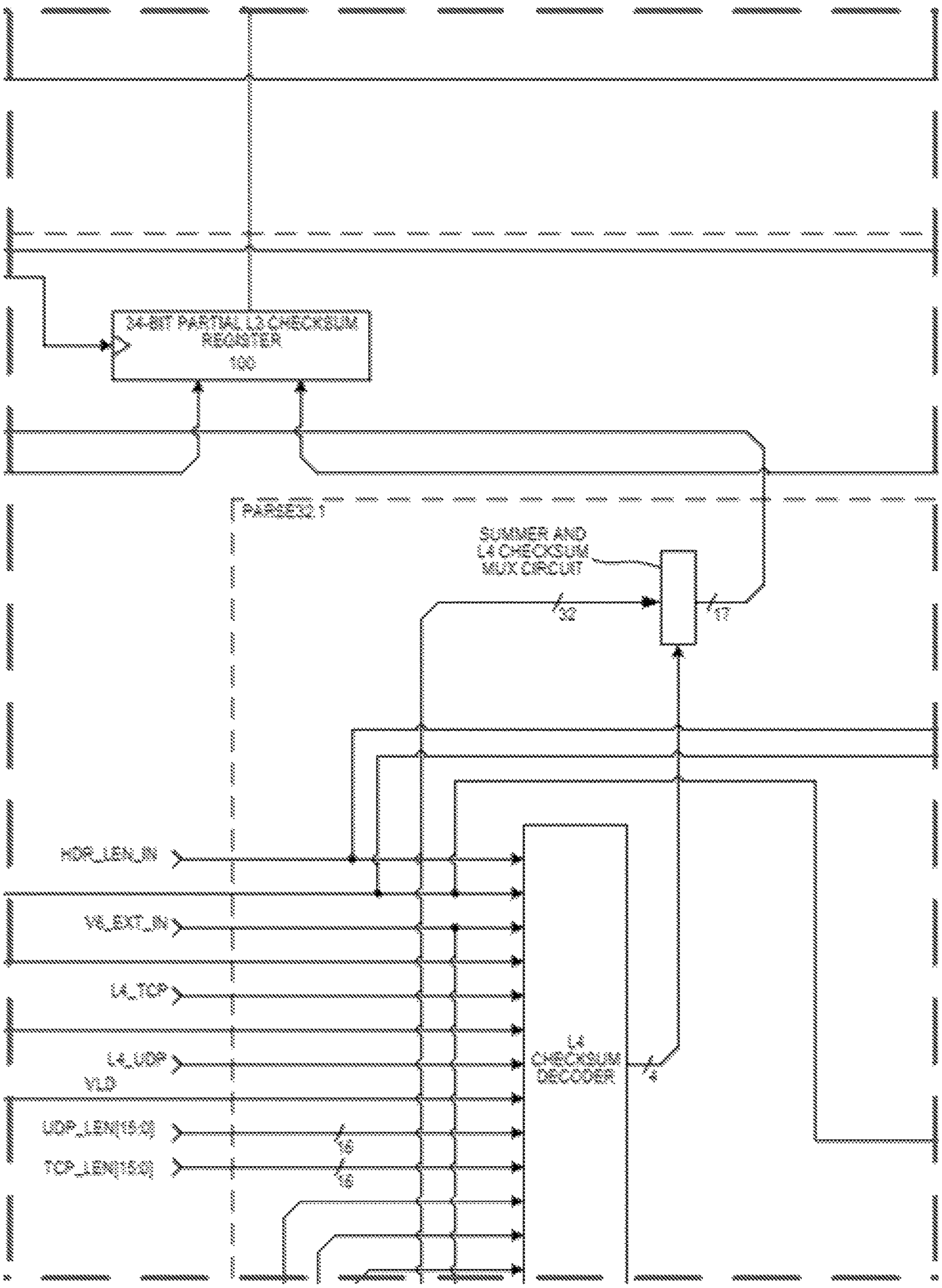
Figure 3B:
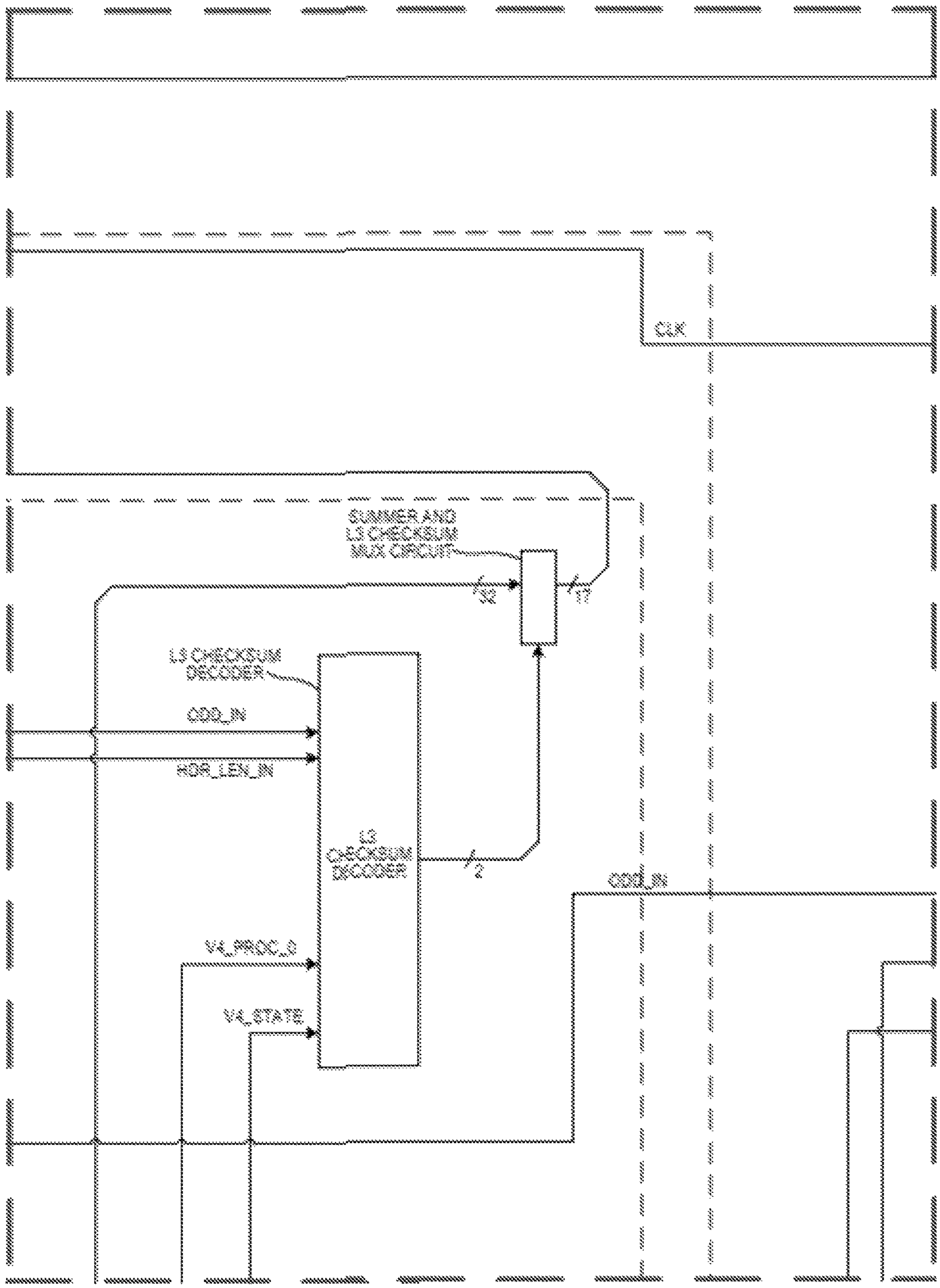
Figure 3B:
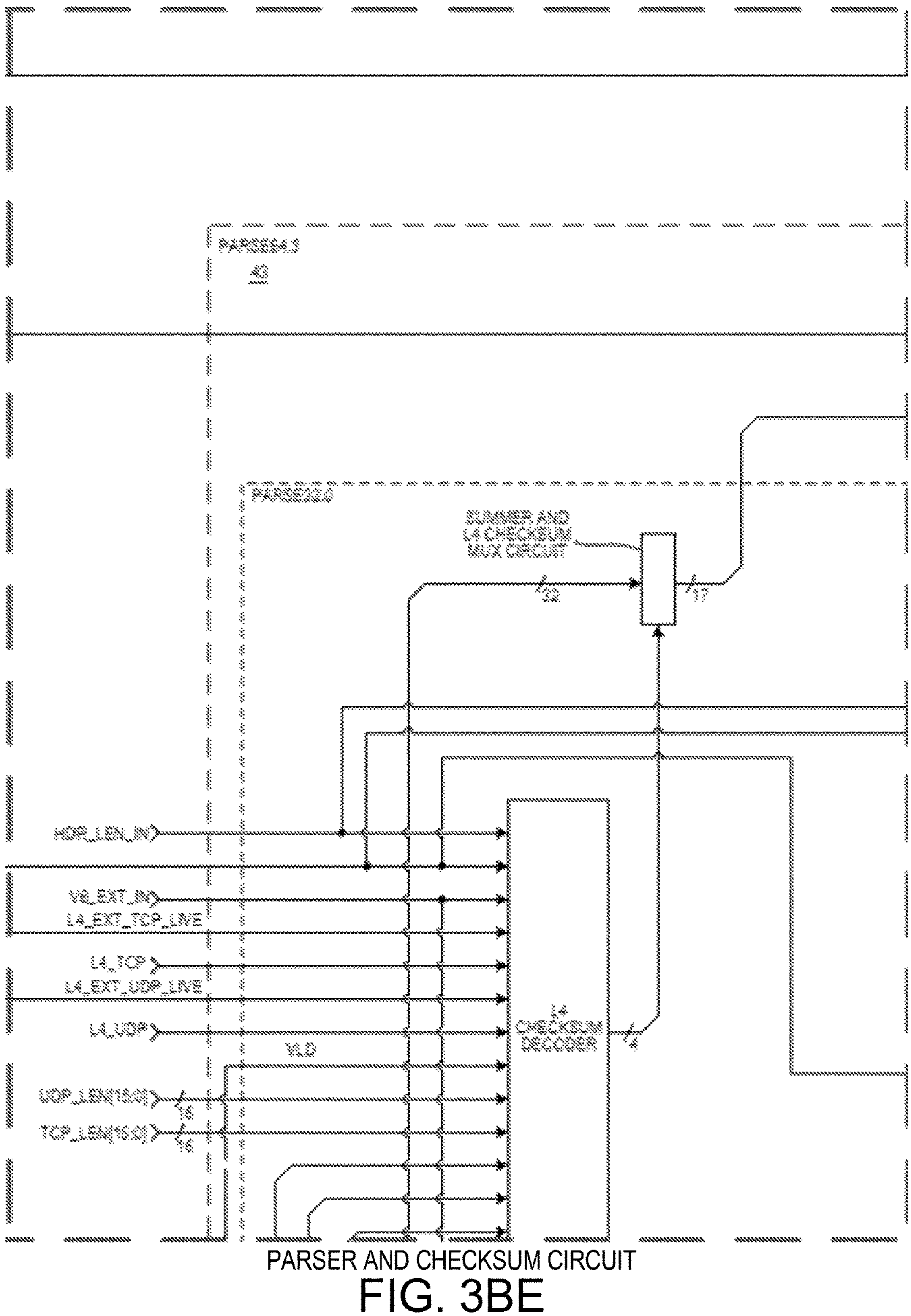
Figure 3B:
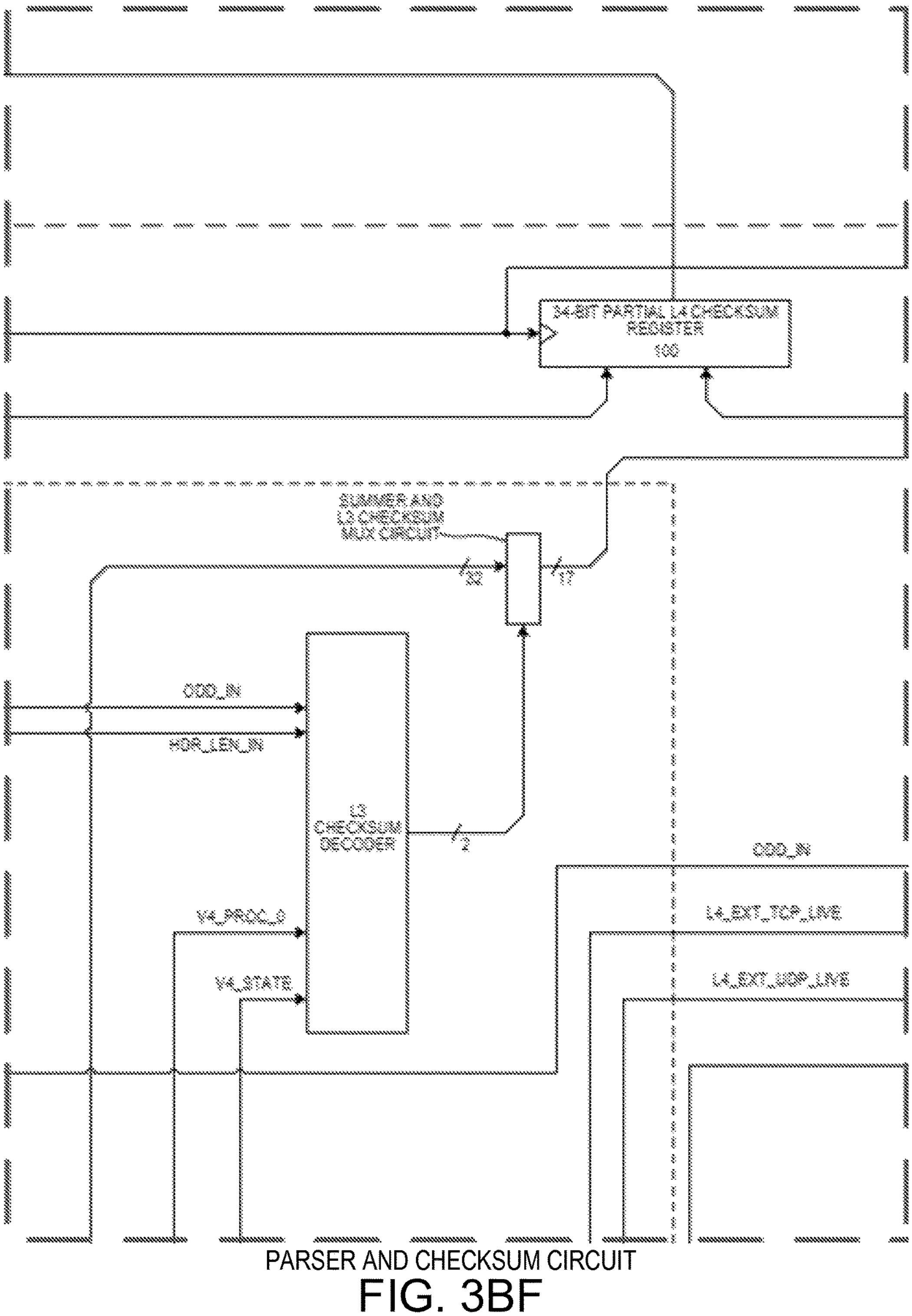
Figure 3B:
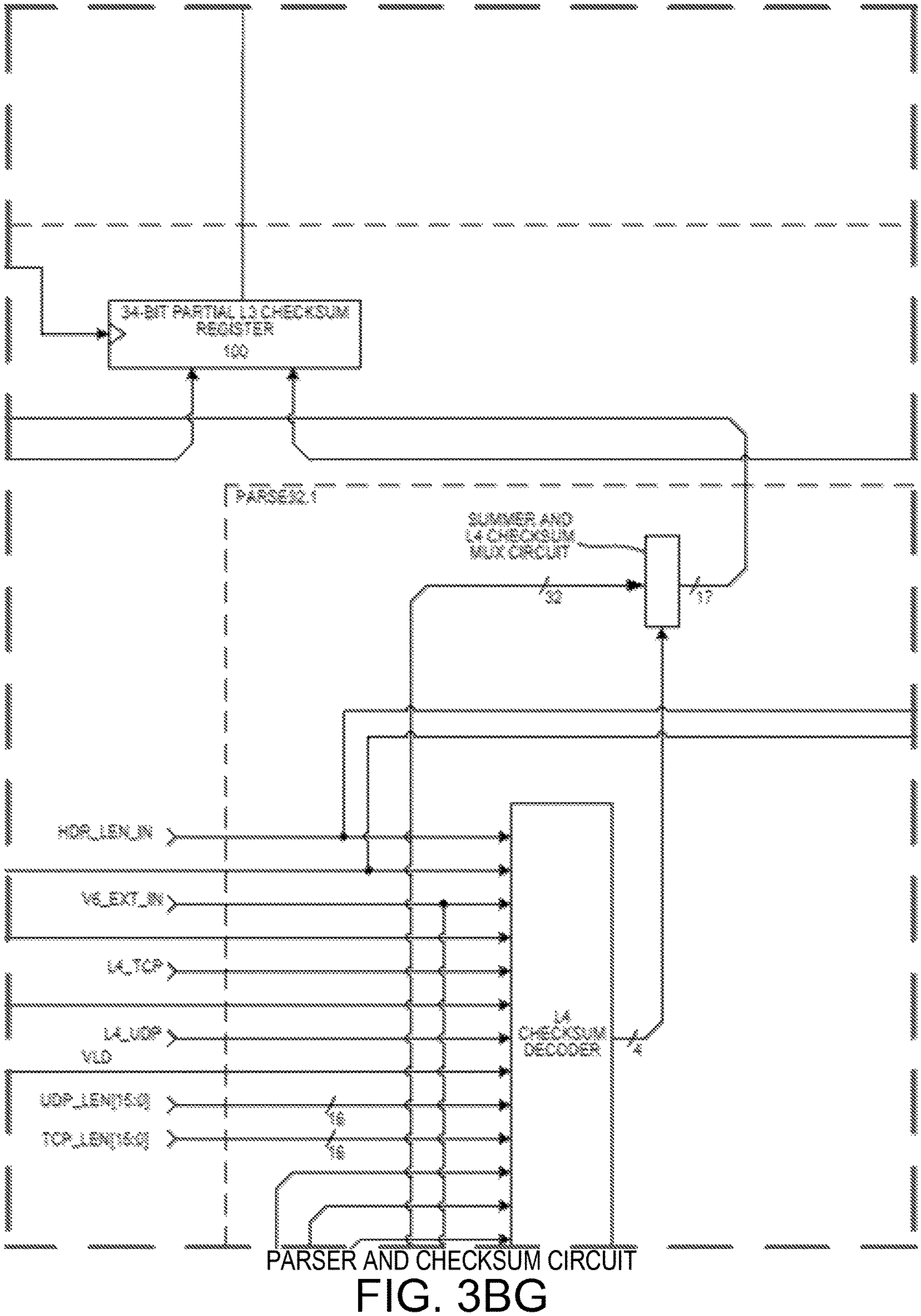
Figure 3B:
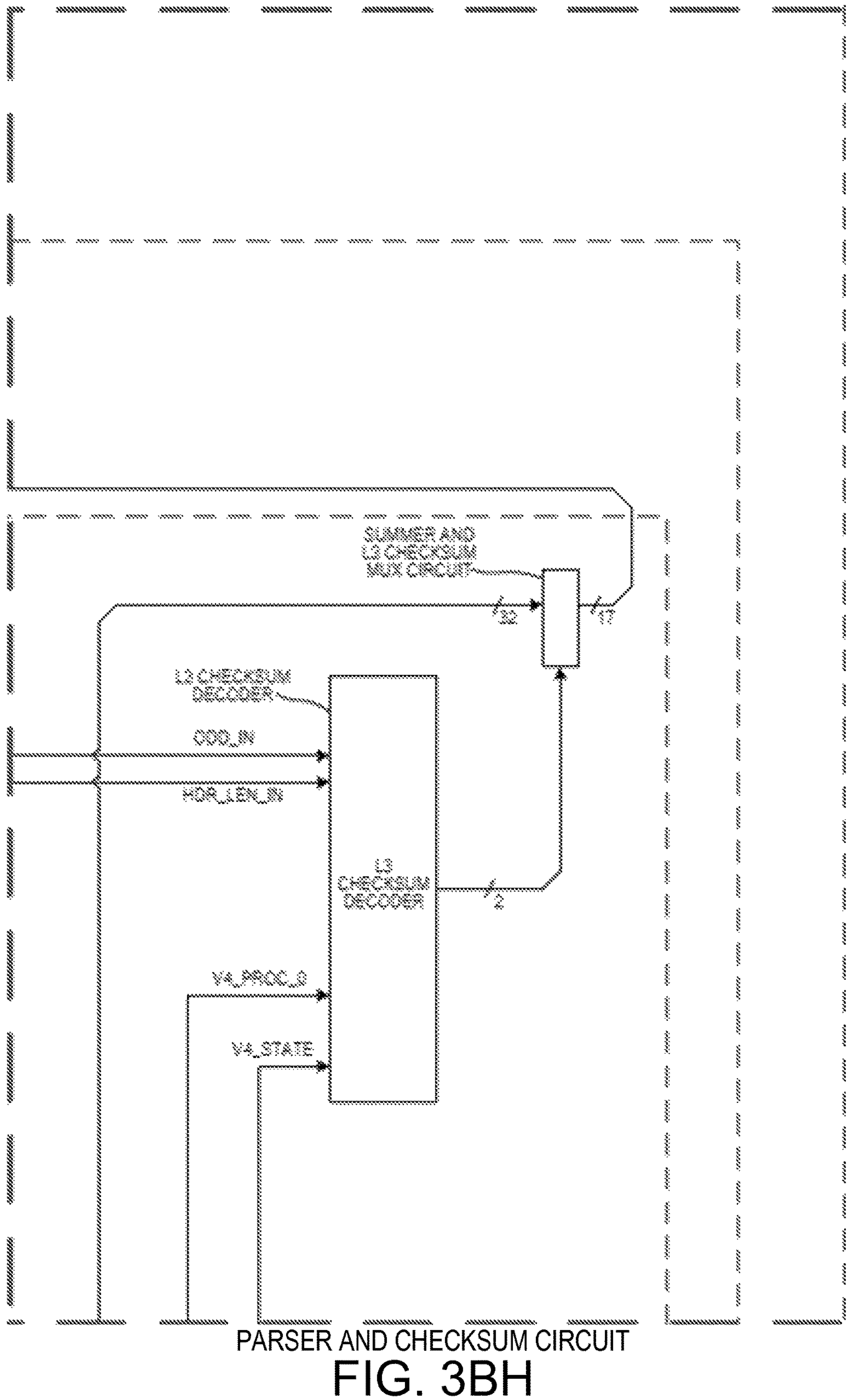
Figure 3B:
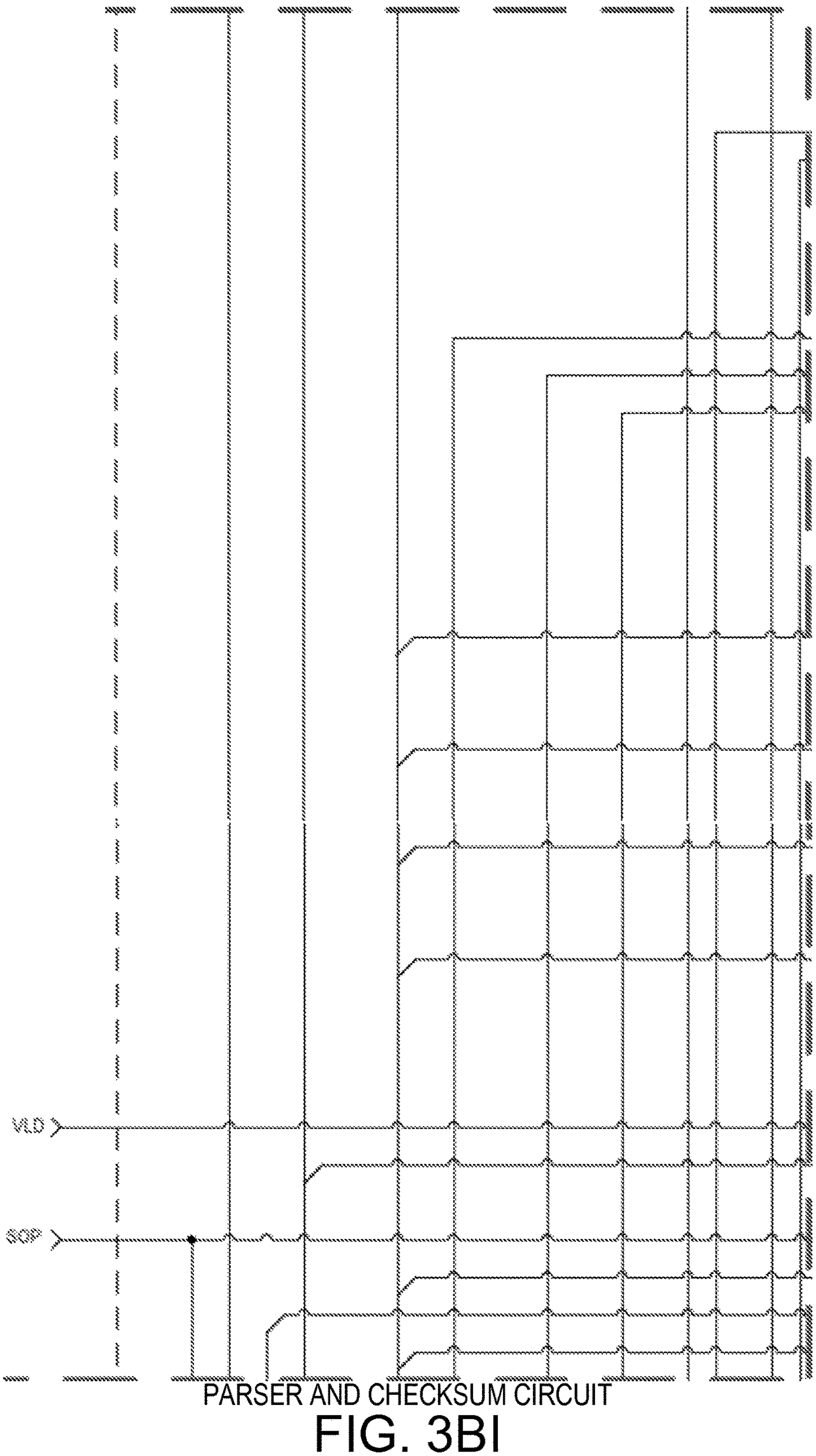
Figure 3B:
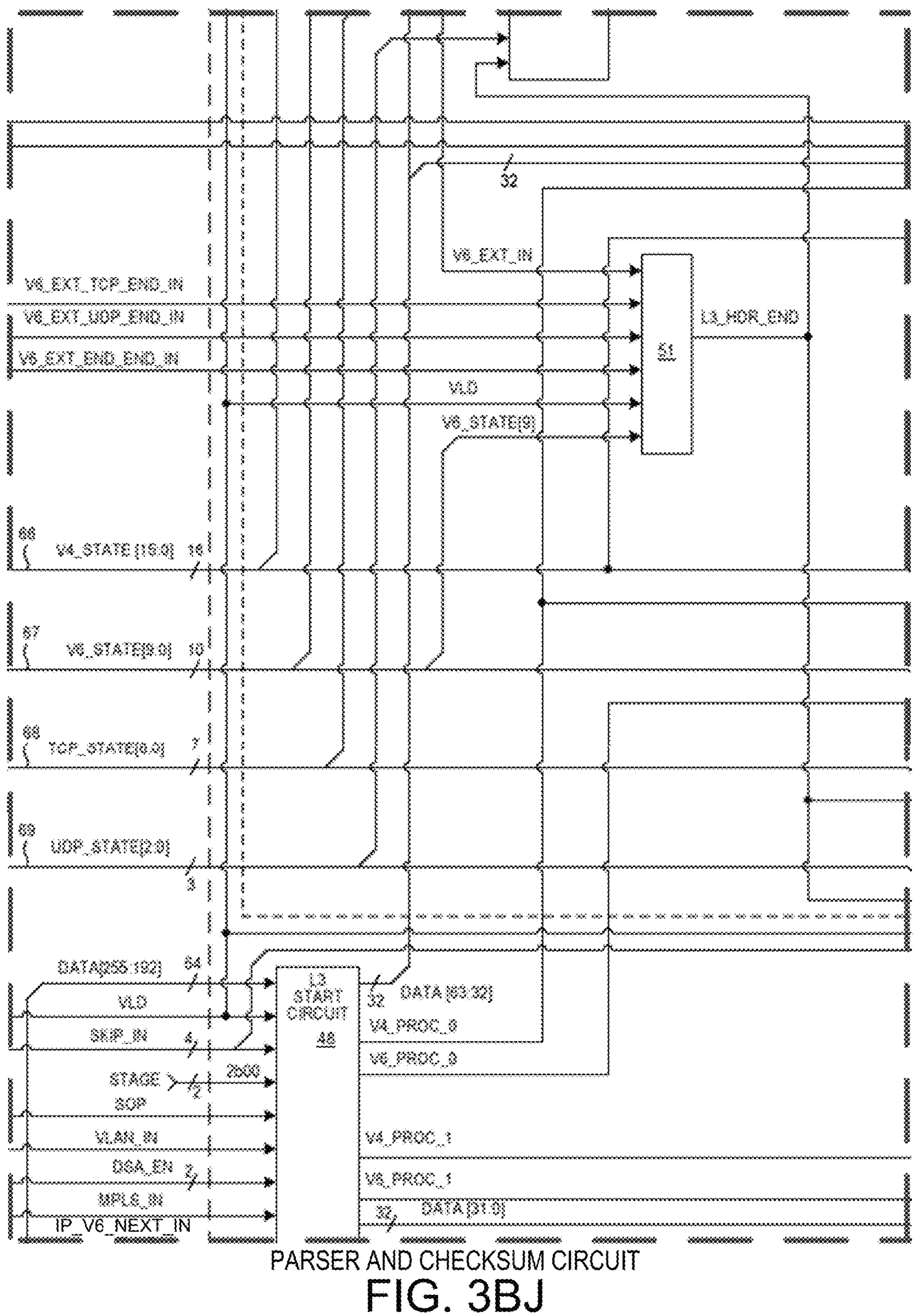
Figure 3B:
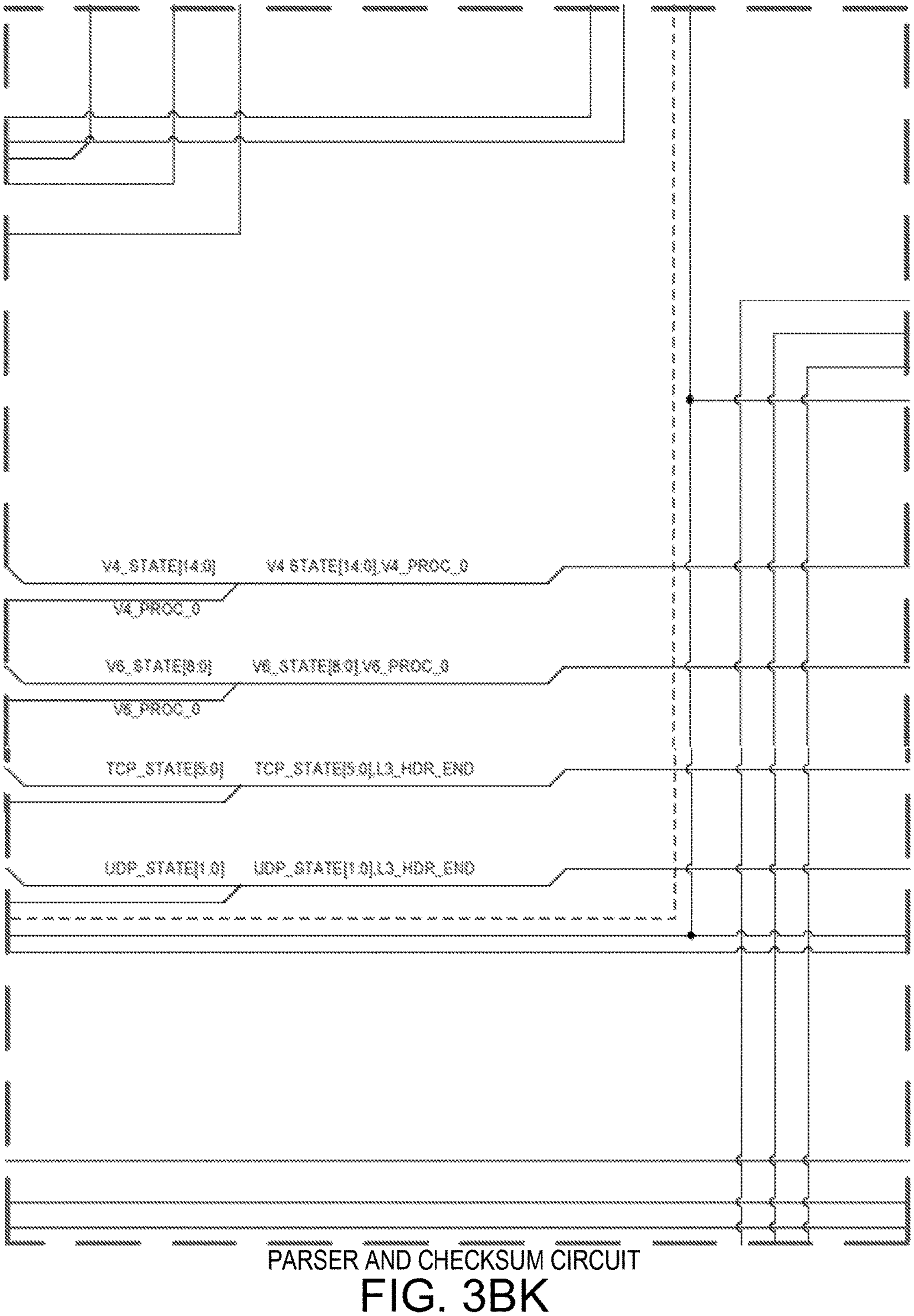
Figure 3B:
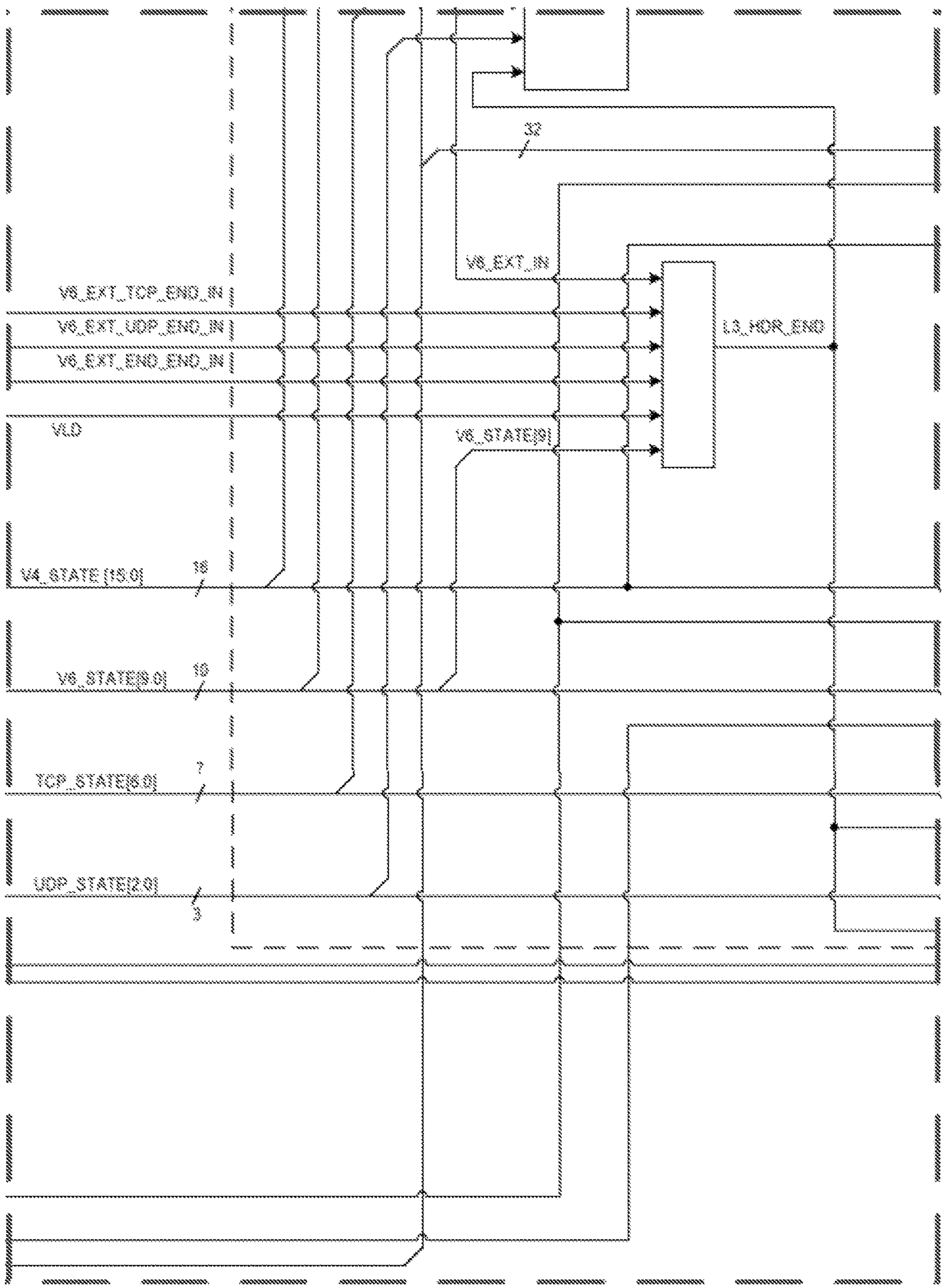
Figure 3B:
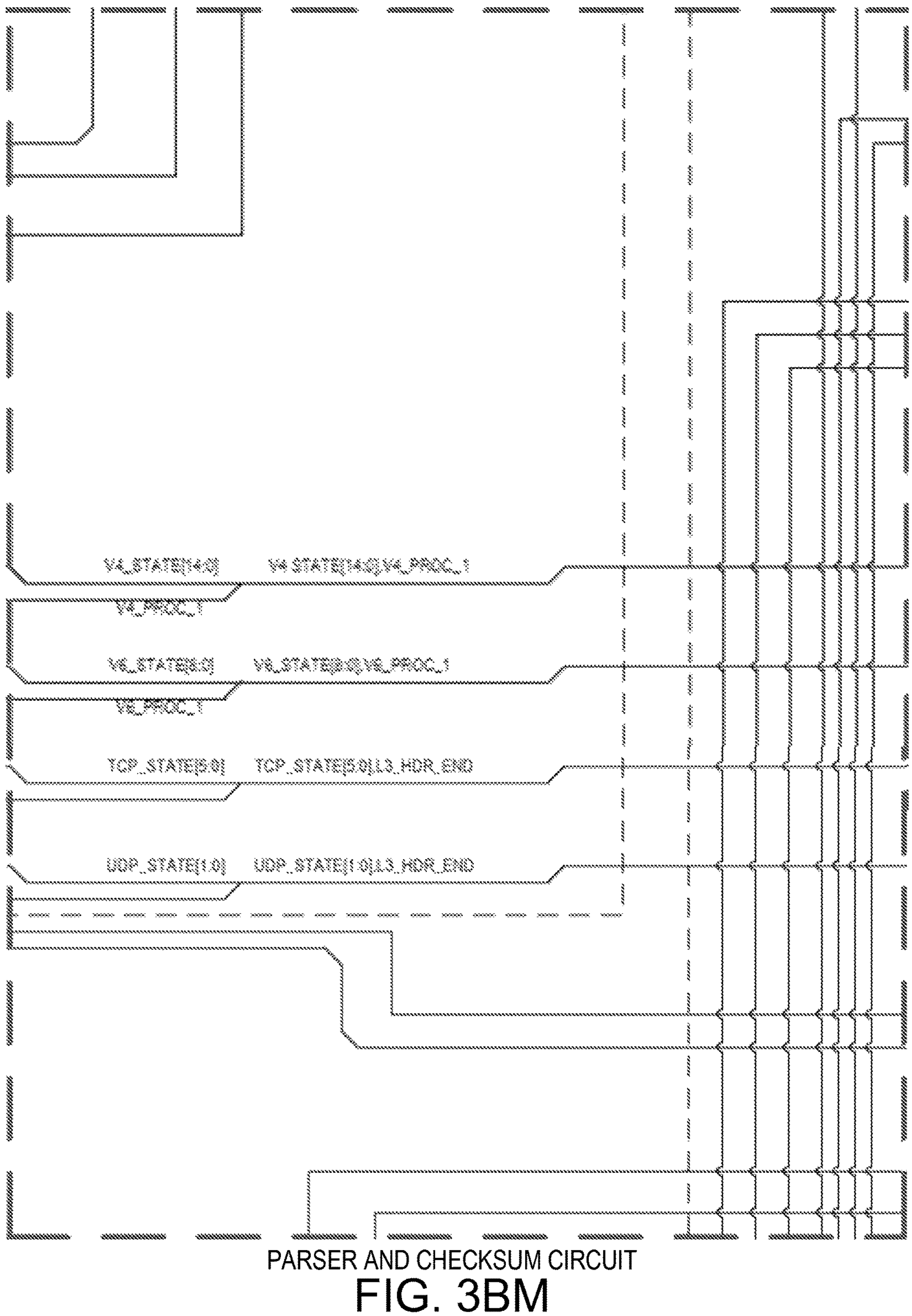
Figure 3B:
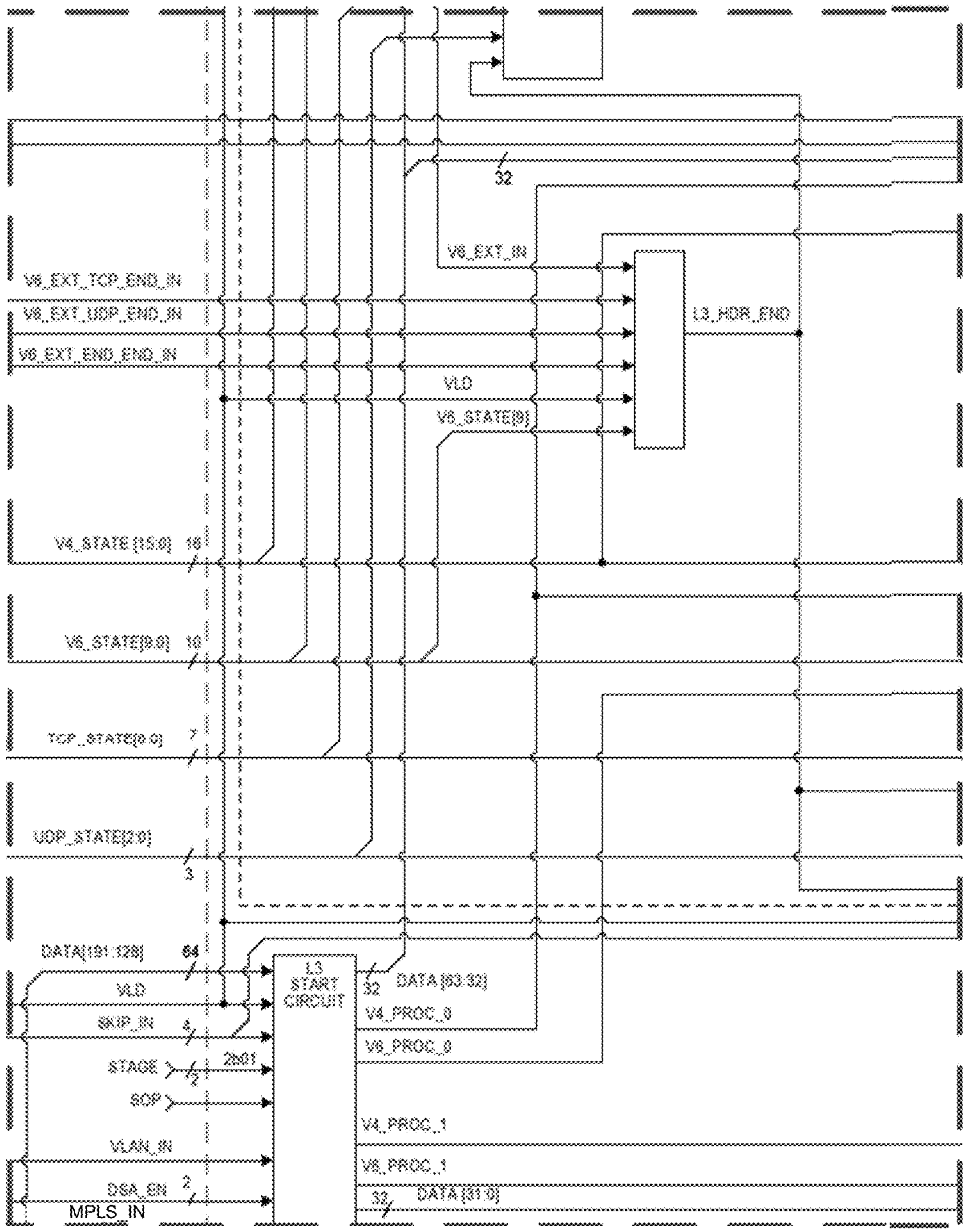
Figure 3B:
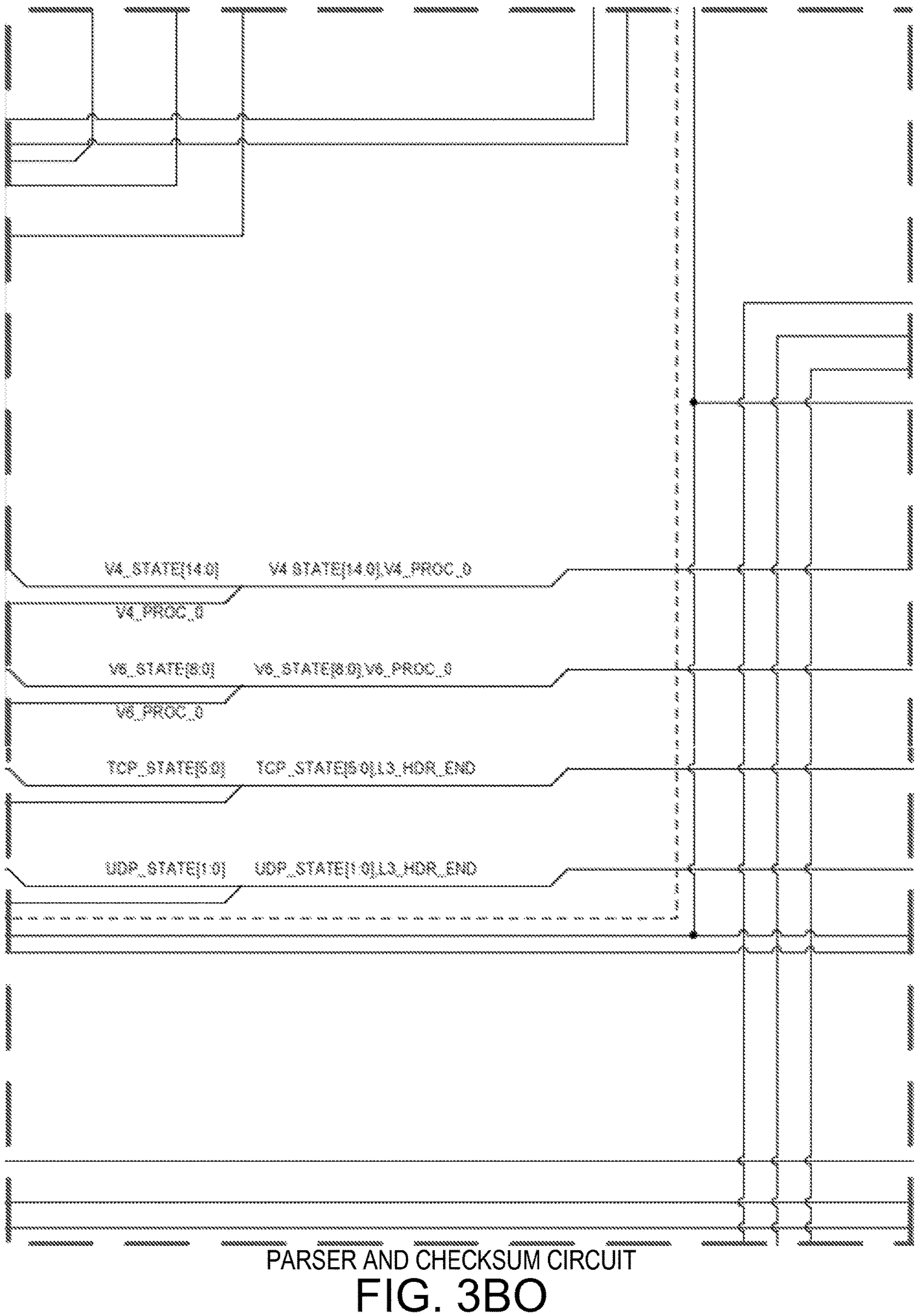
Figure 3B:
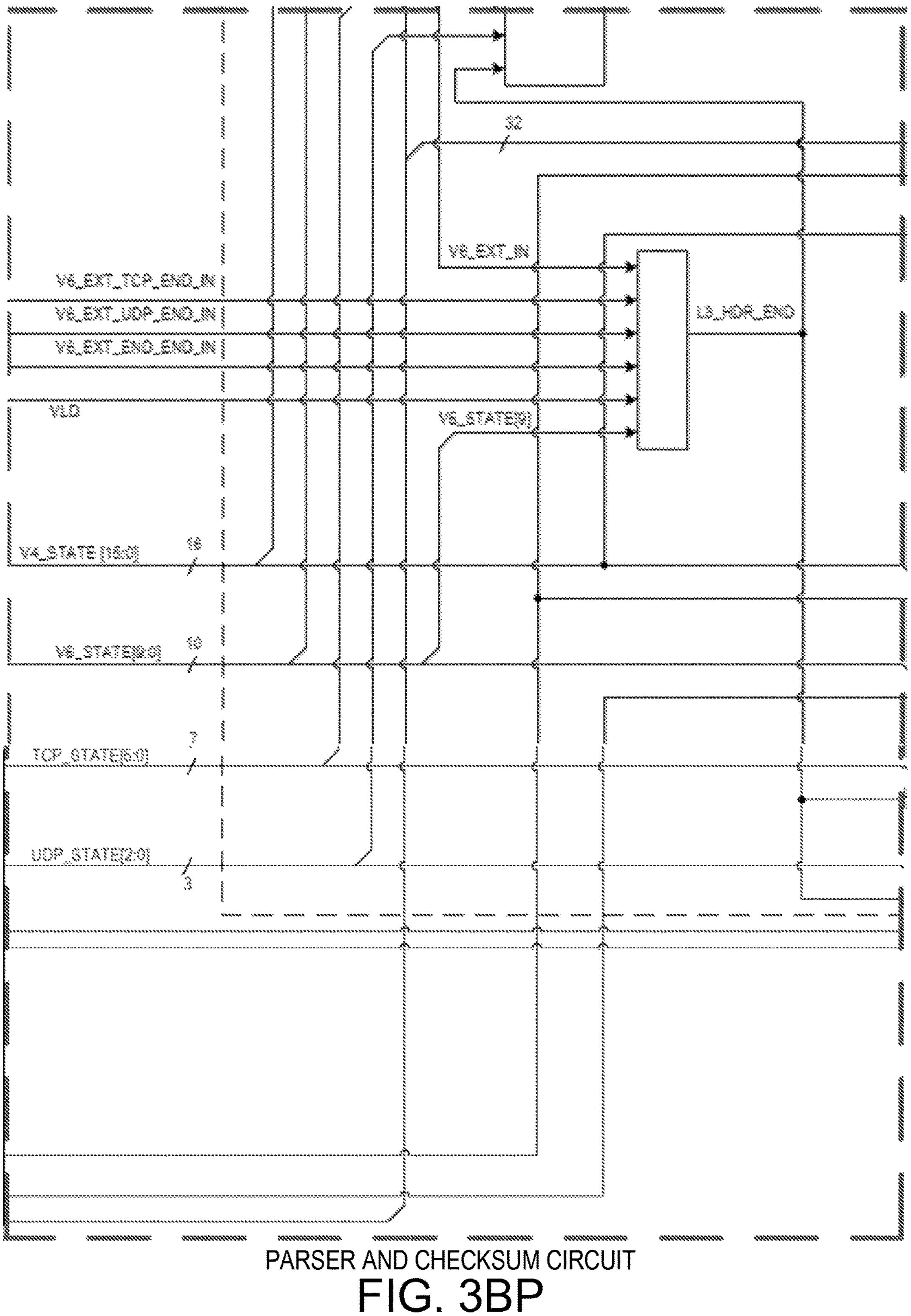
Figure 3B:
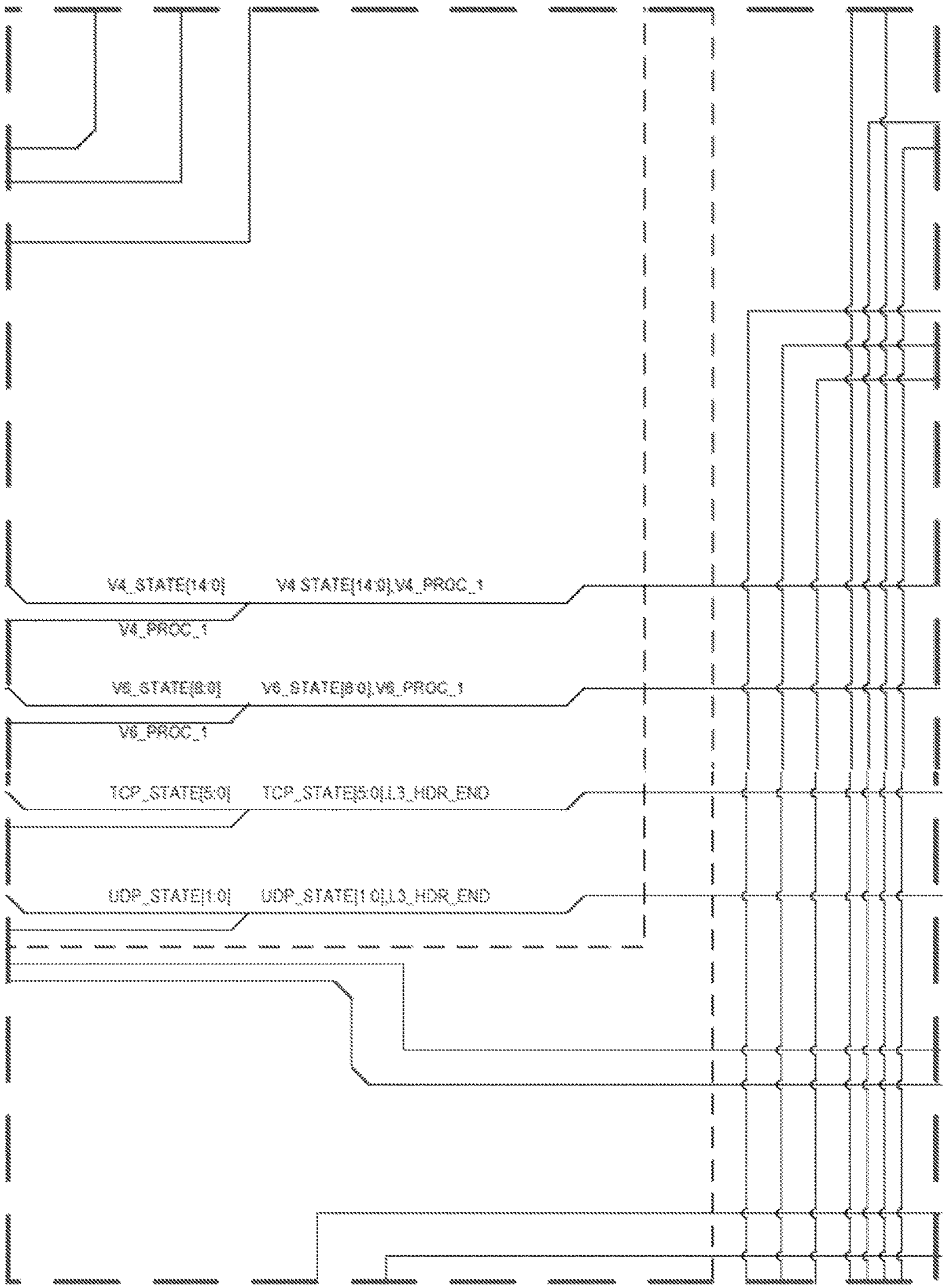
Figure 3B:
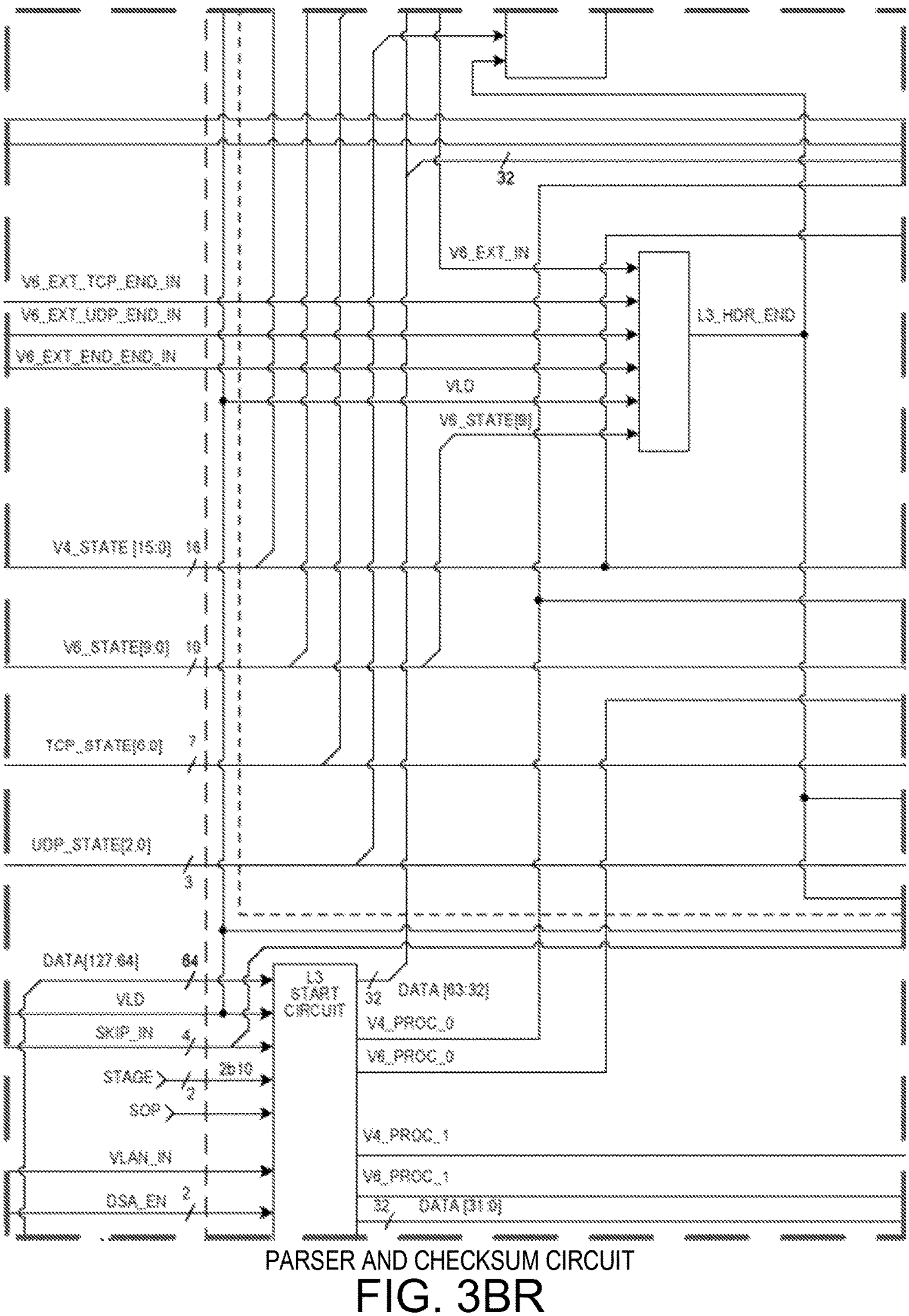
Figure 3B:
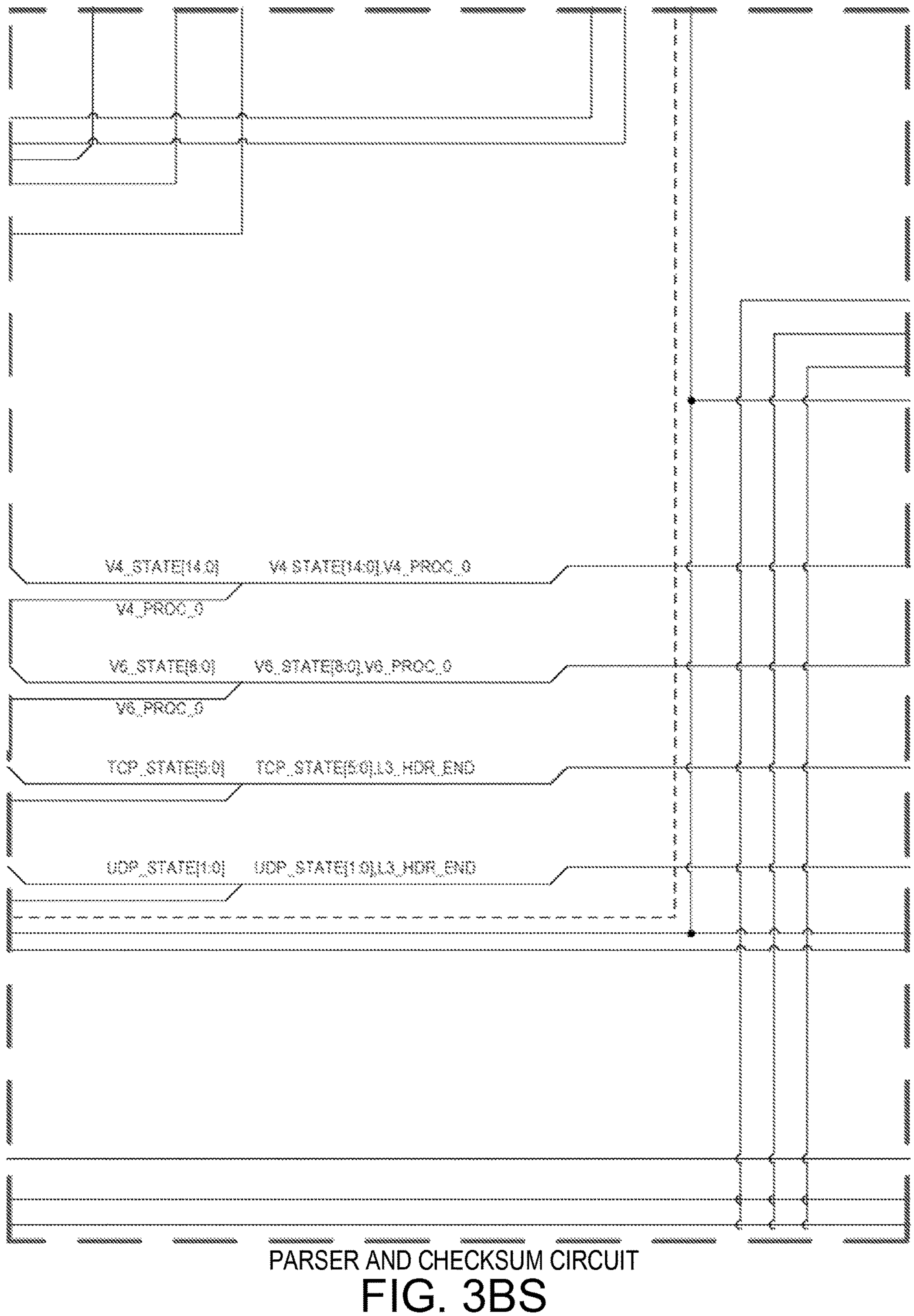
Figure 3B:
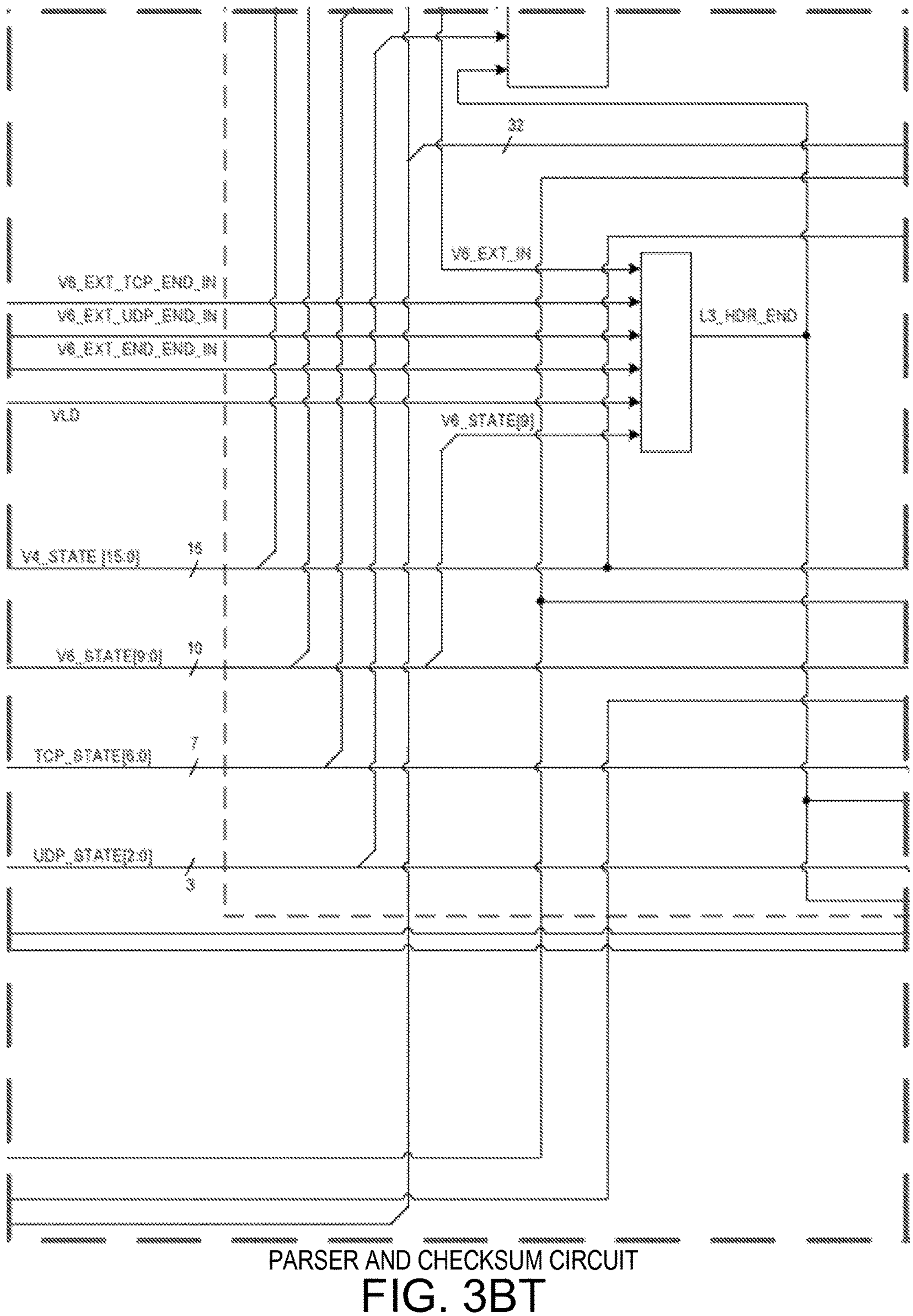
Figure 3B:
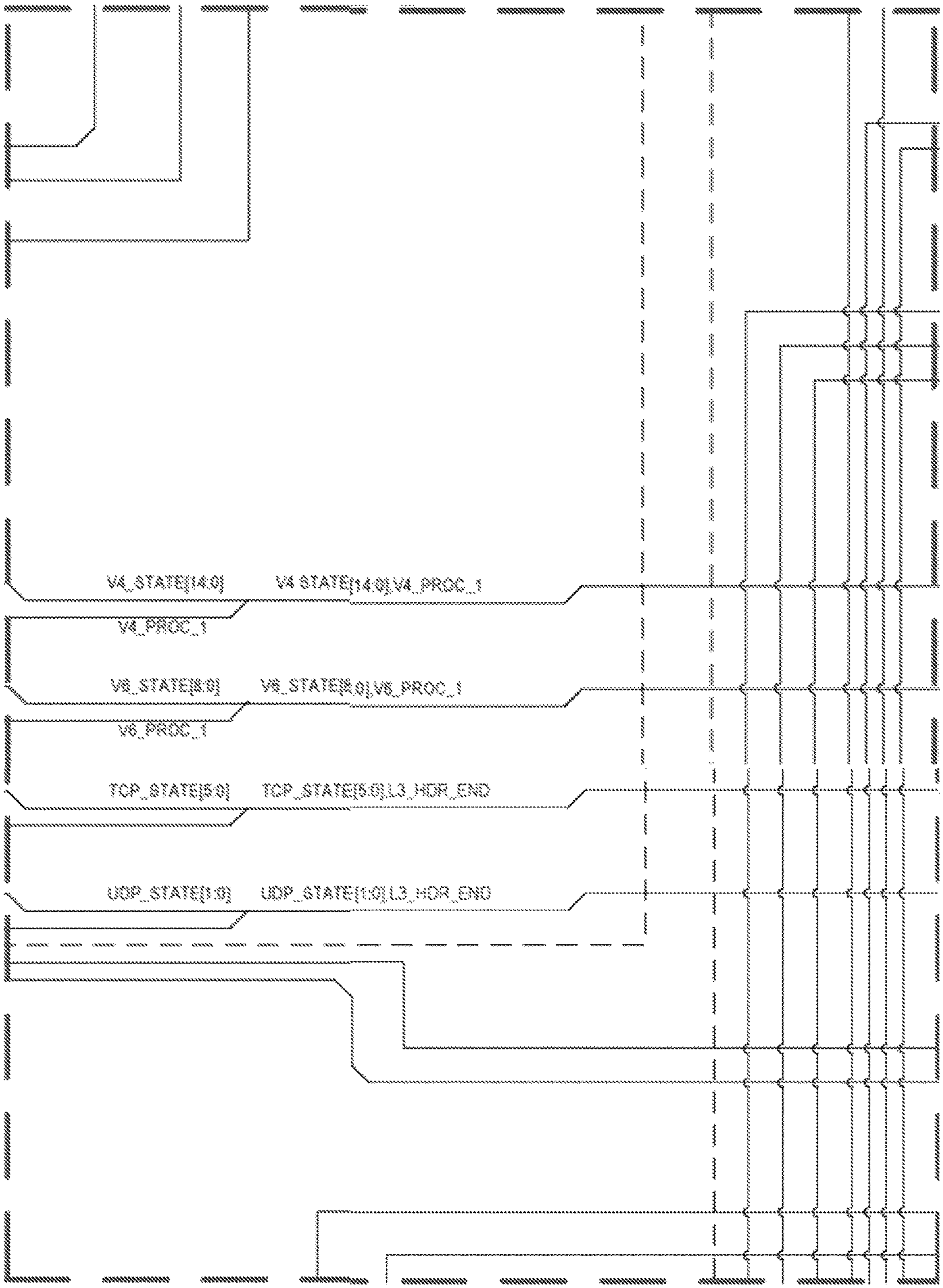
Figure 3B:
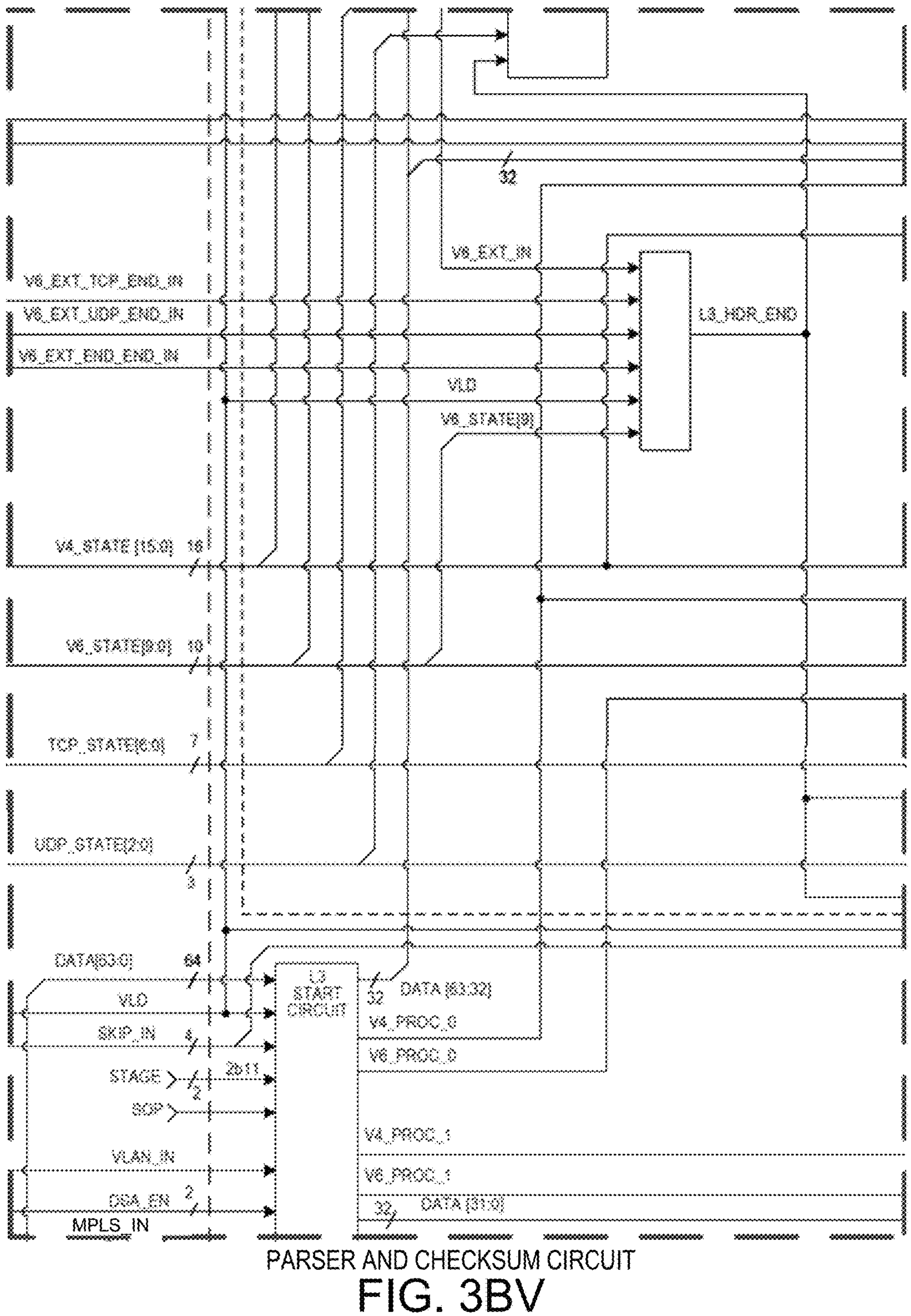
Figure 3B:
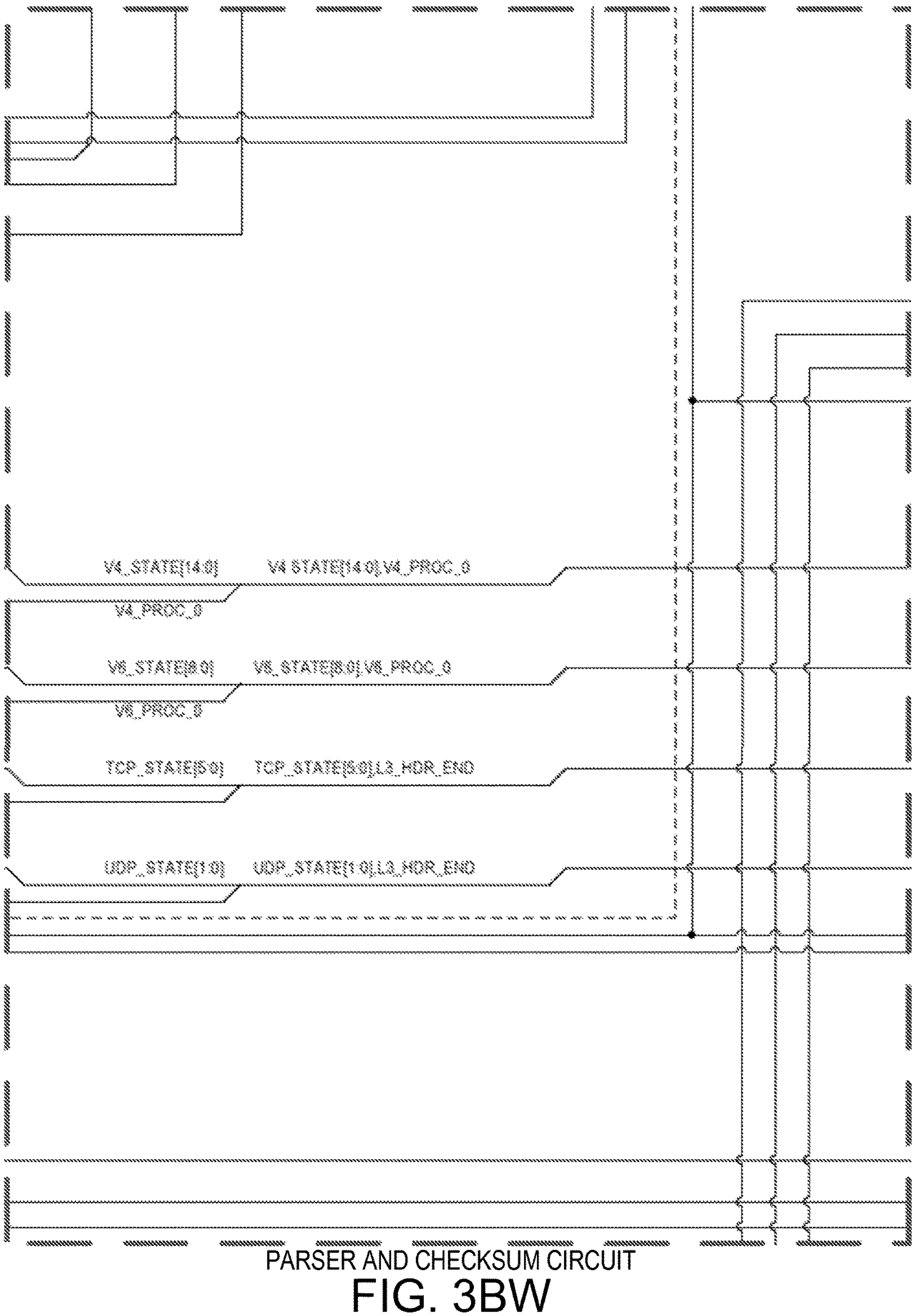
Figure 3B:
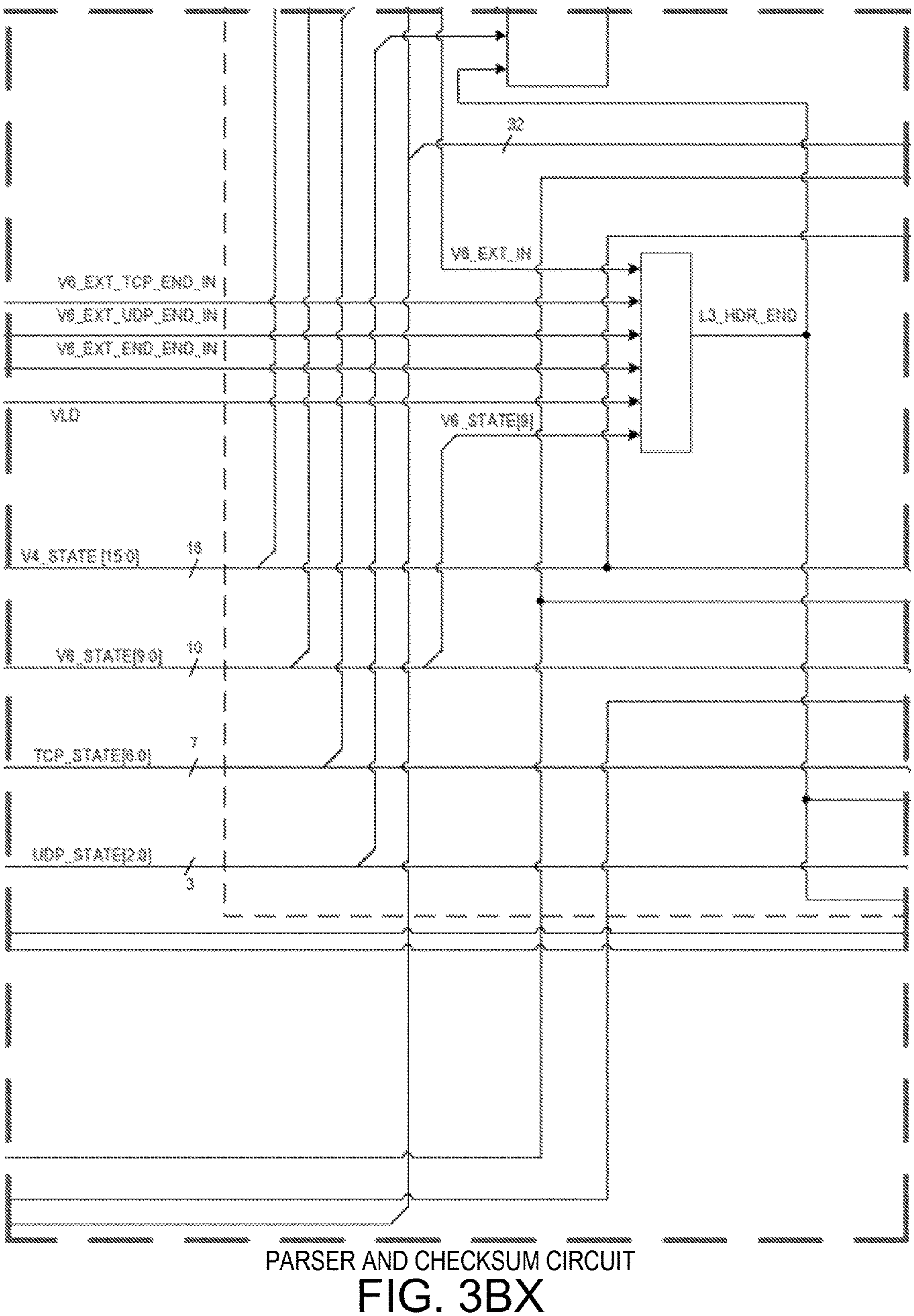
Figure 3B:
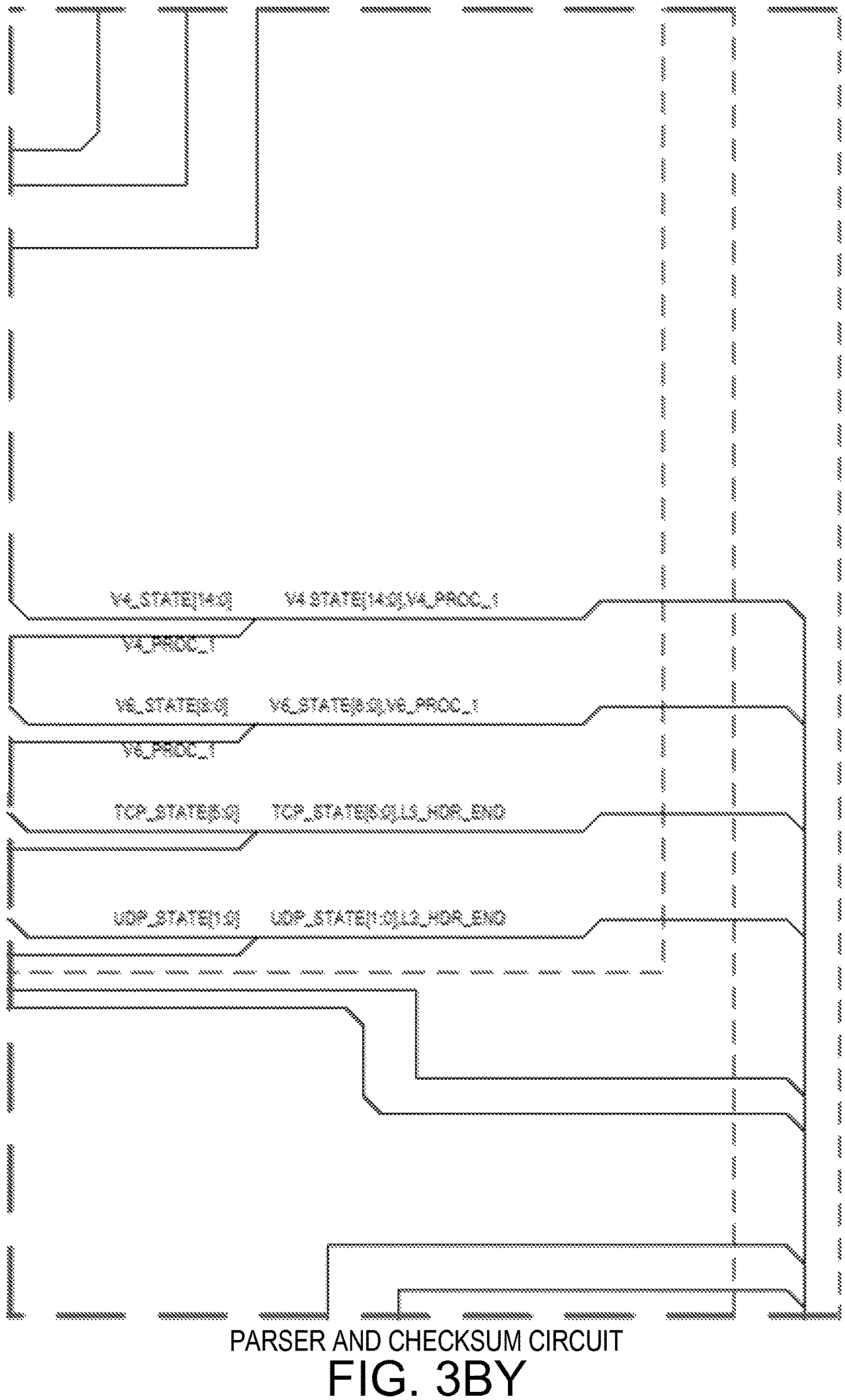
Figure 3B:
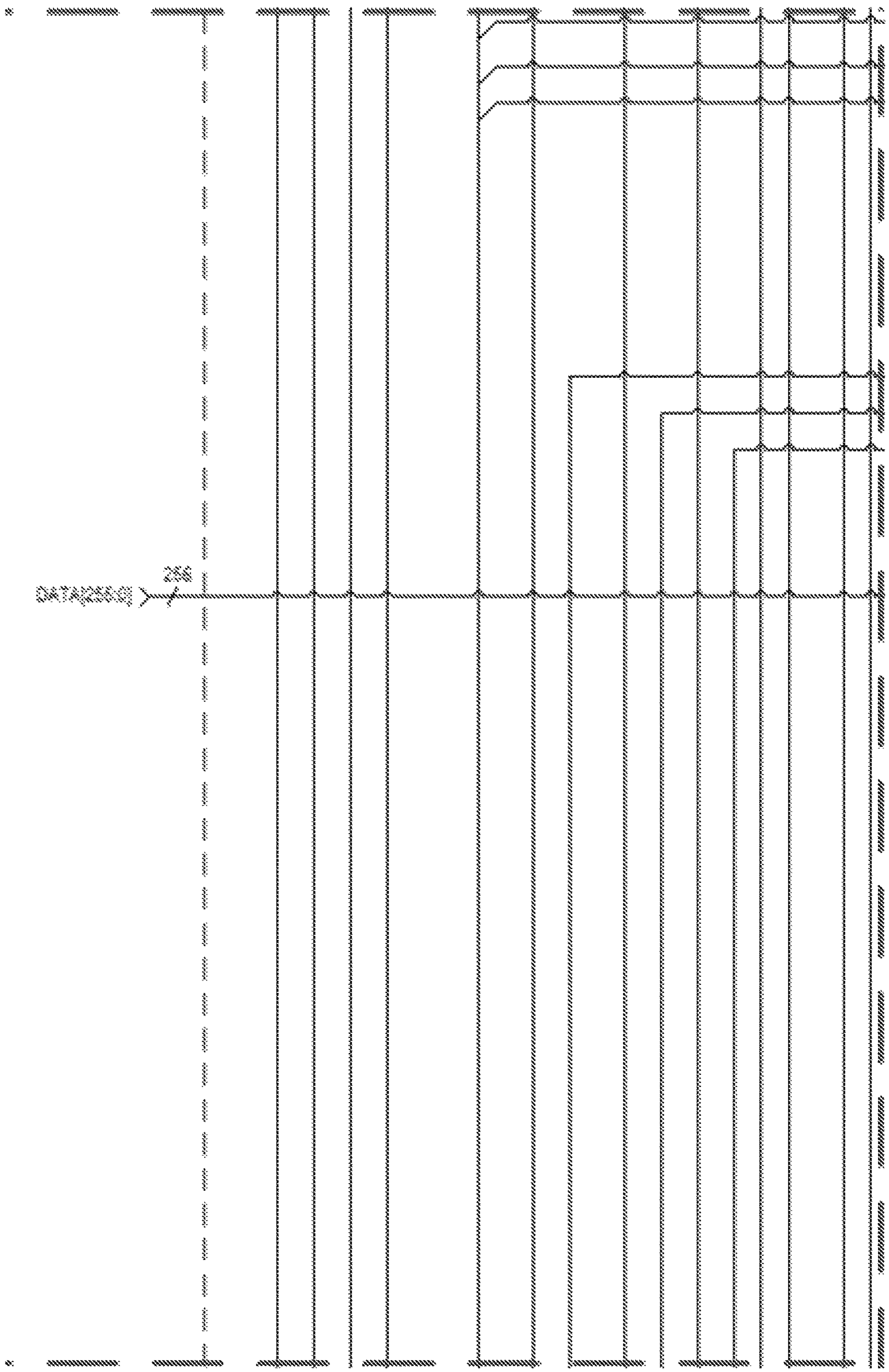
Figure 3C:
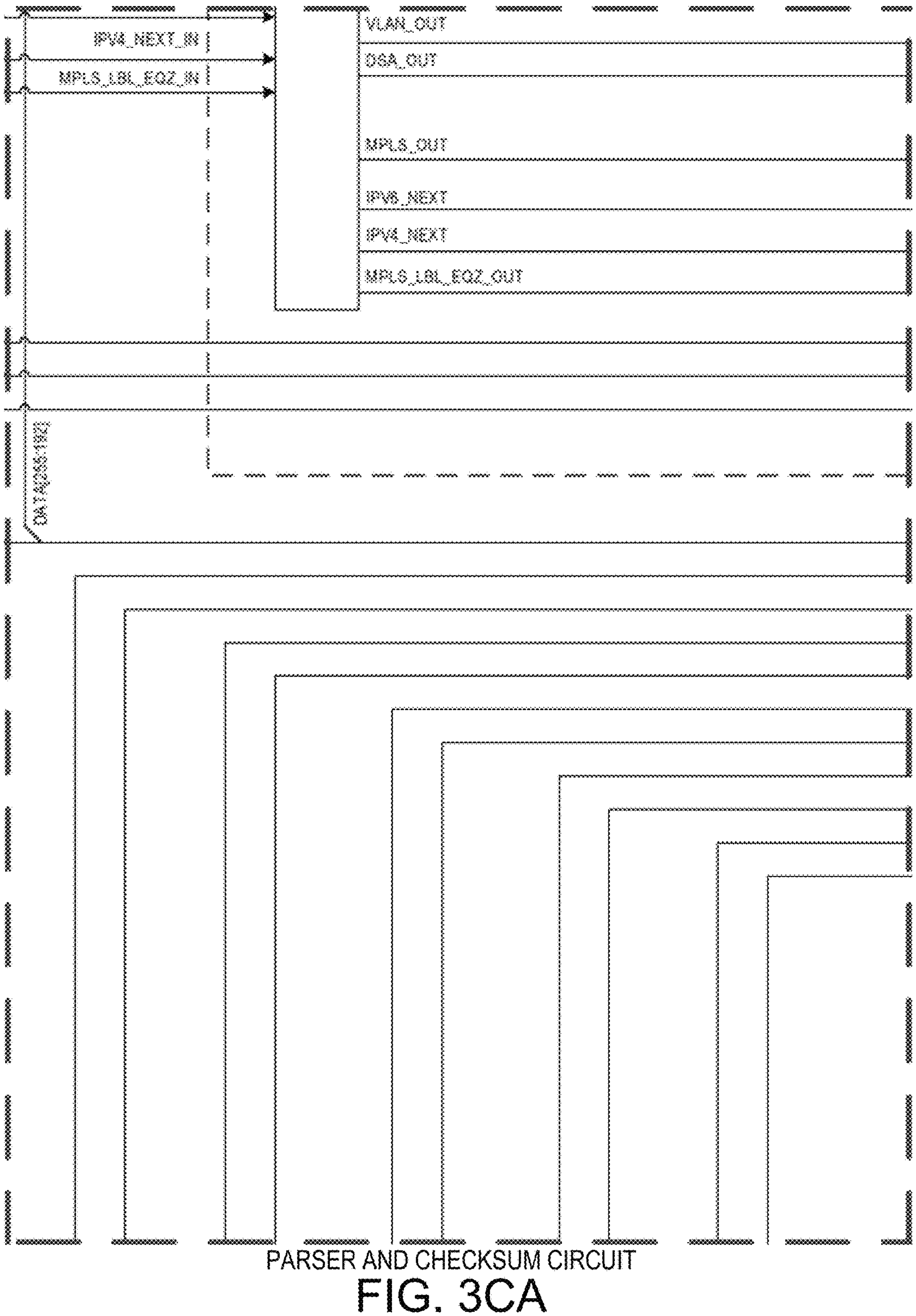
Figure 3C:
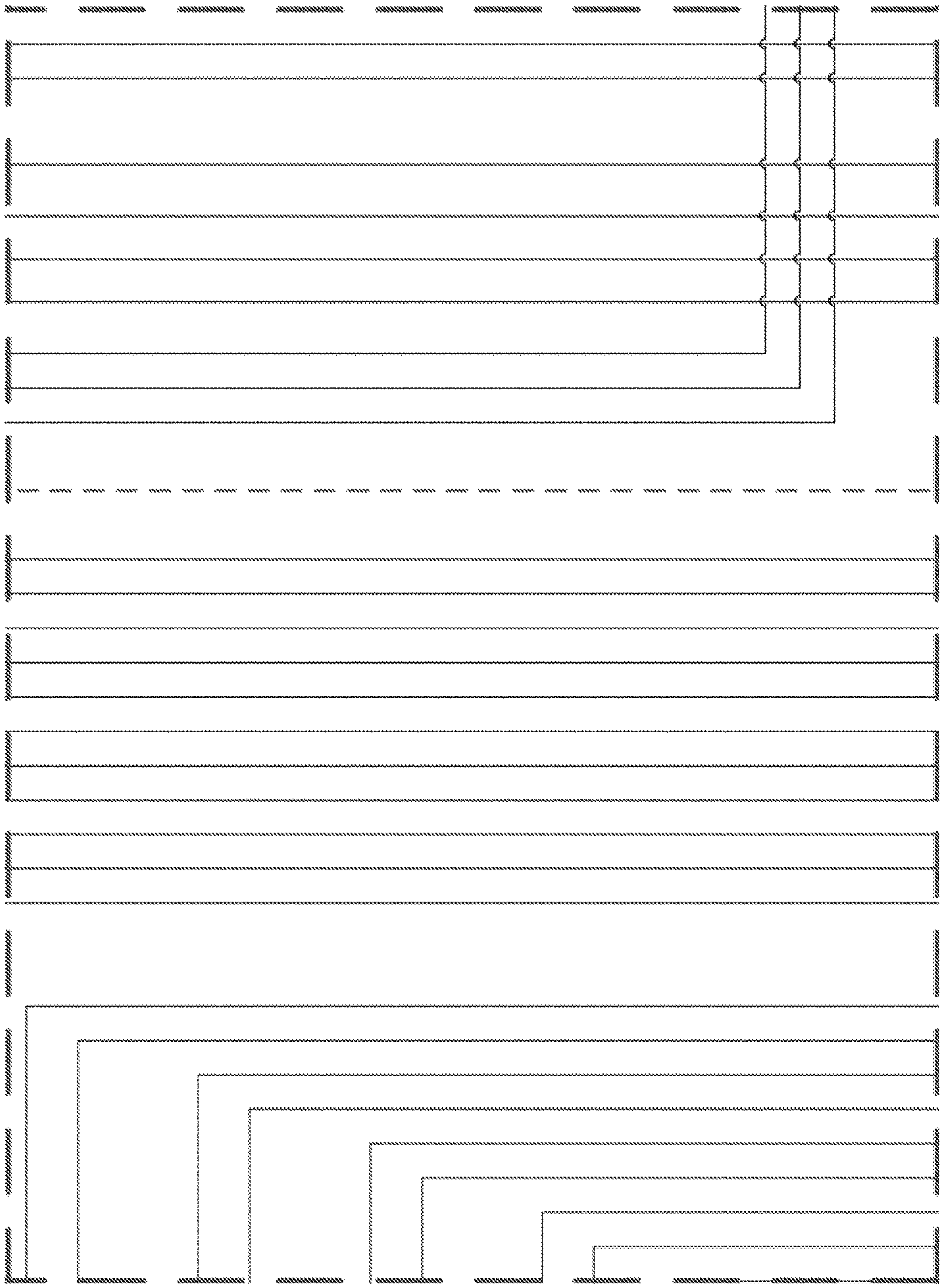
Figure 3C:
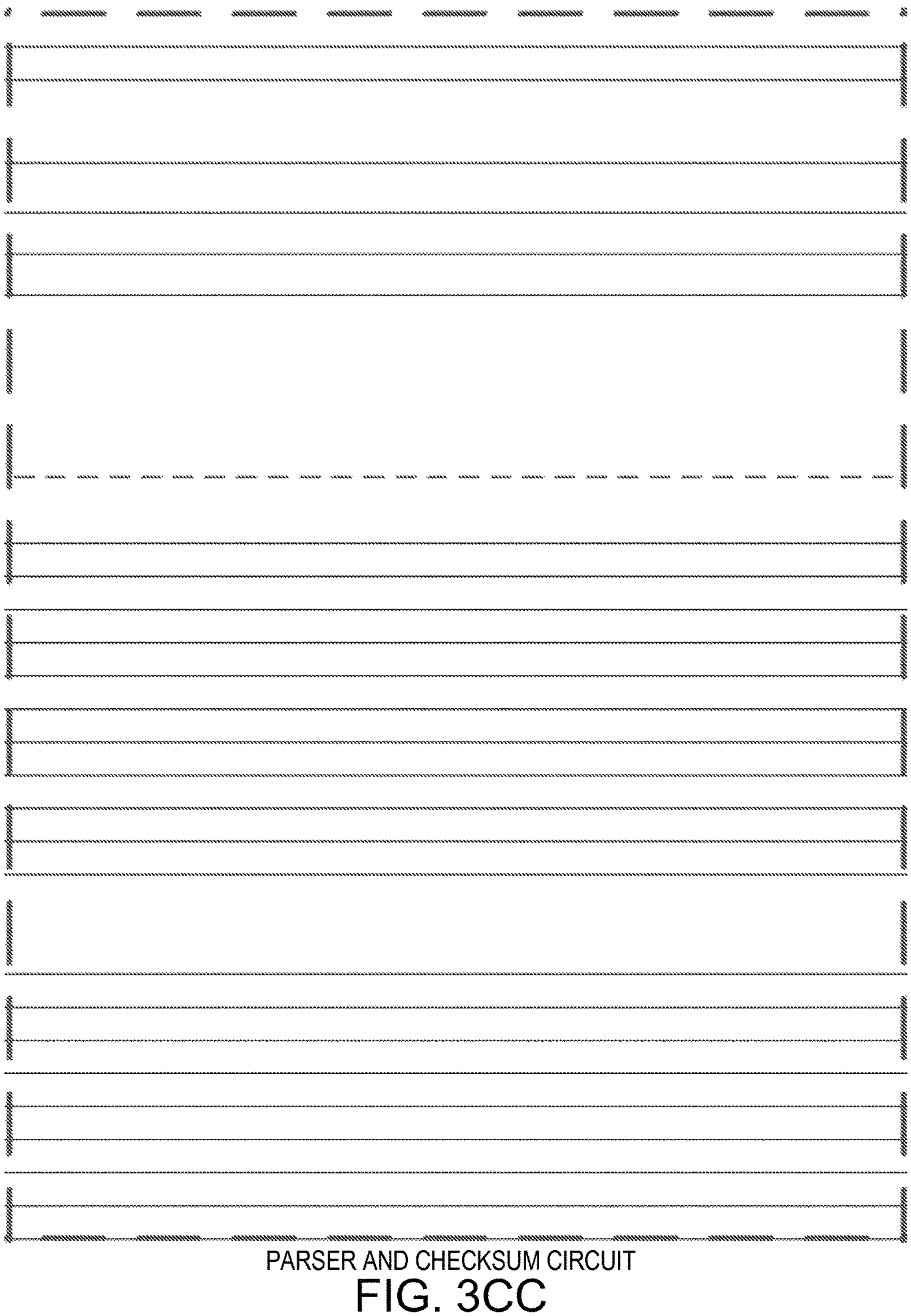
Figure 3C:
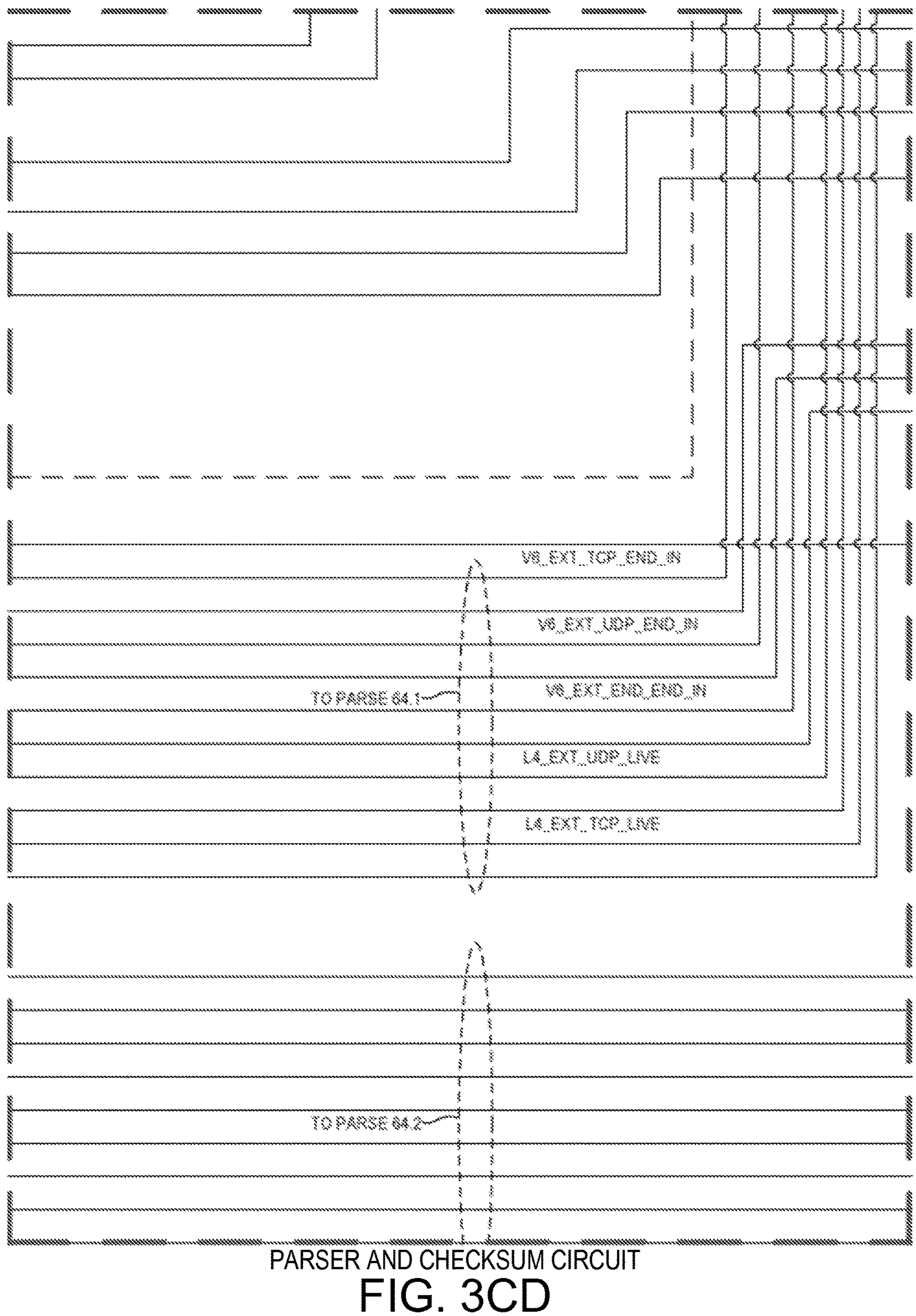
Figure 3C:
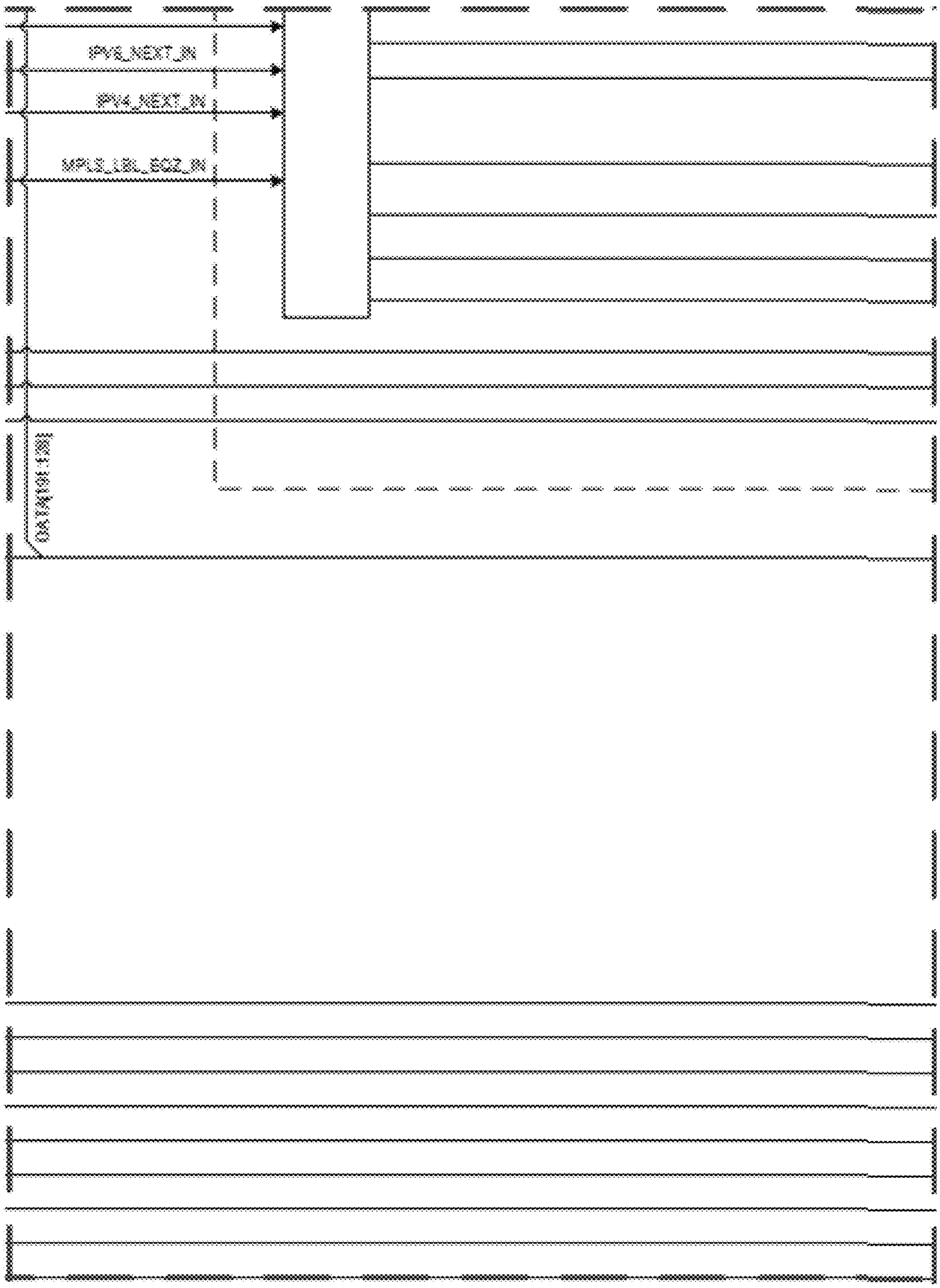
Figure 3C:
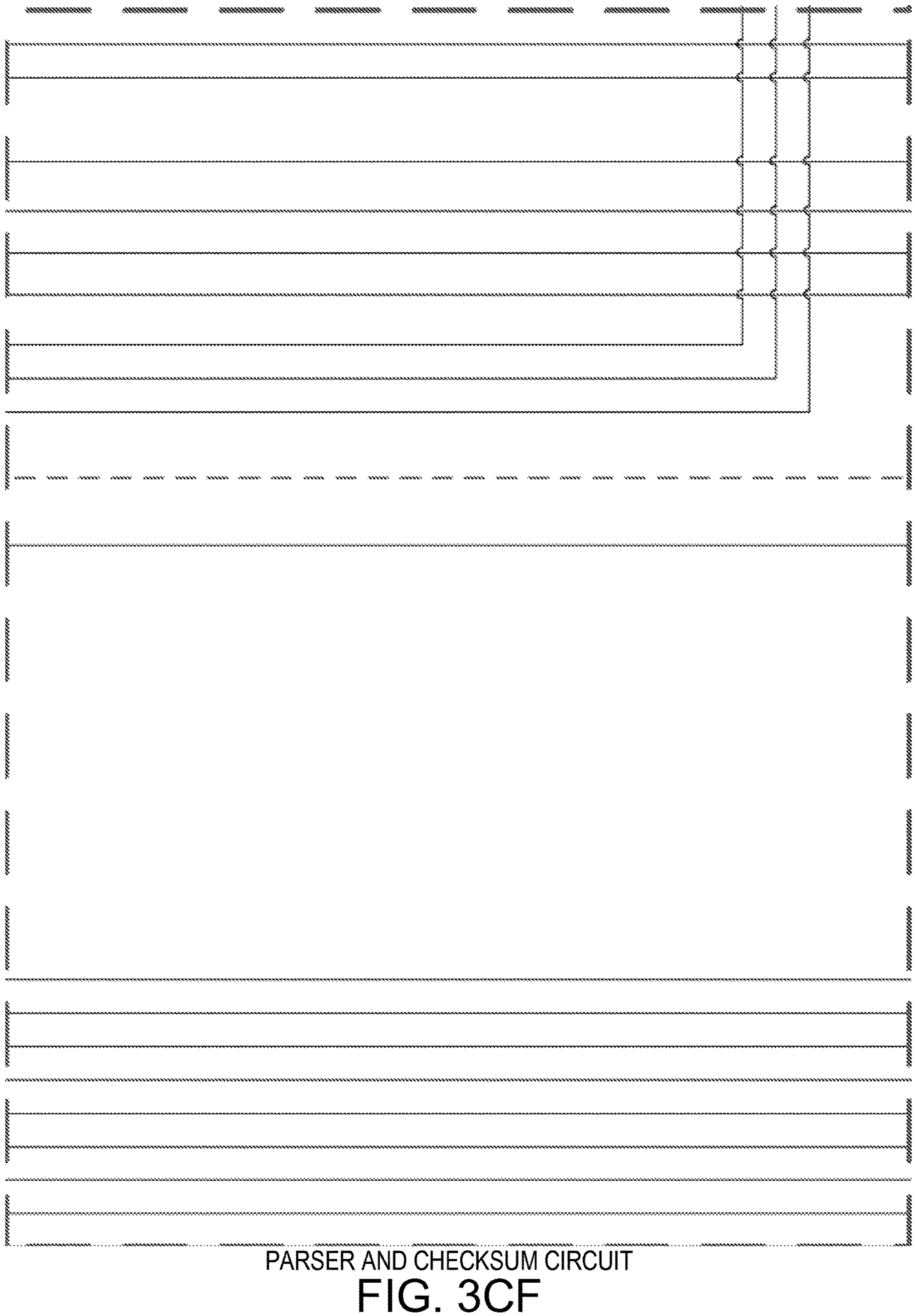
Figure 3C:
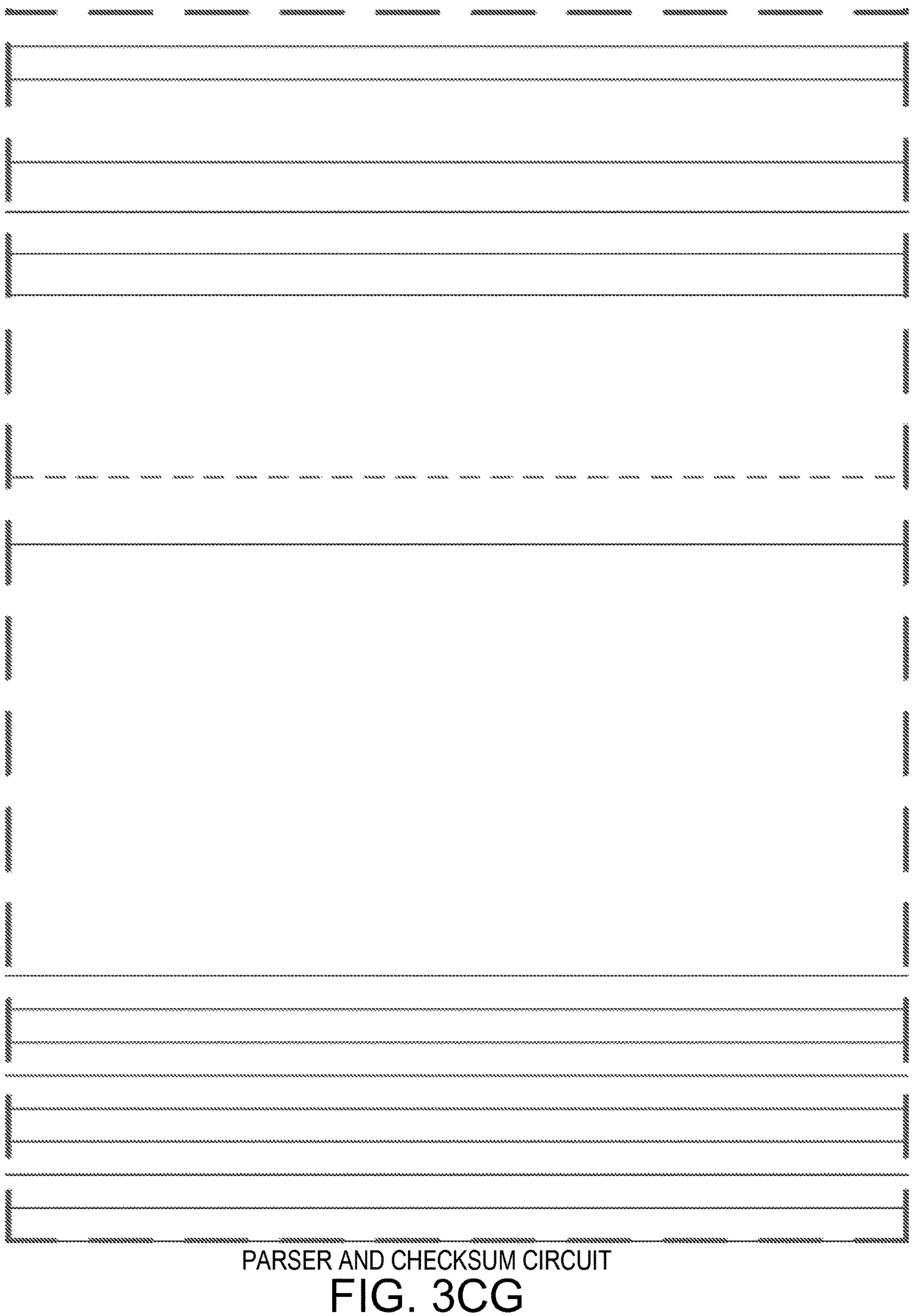
Figure 3C:
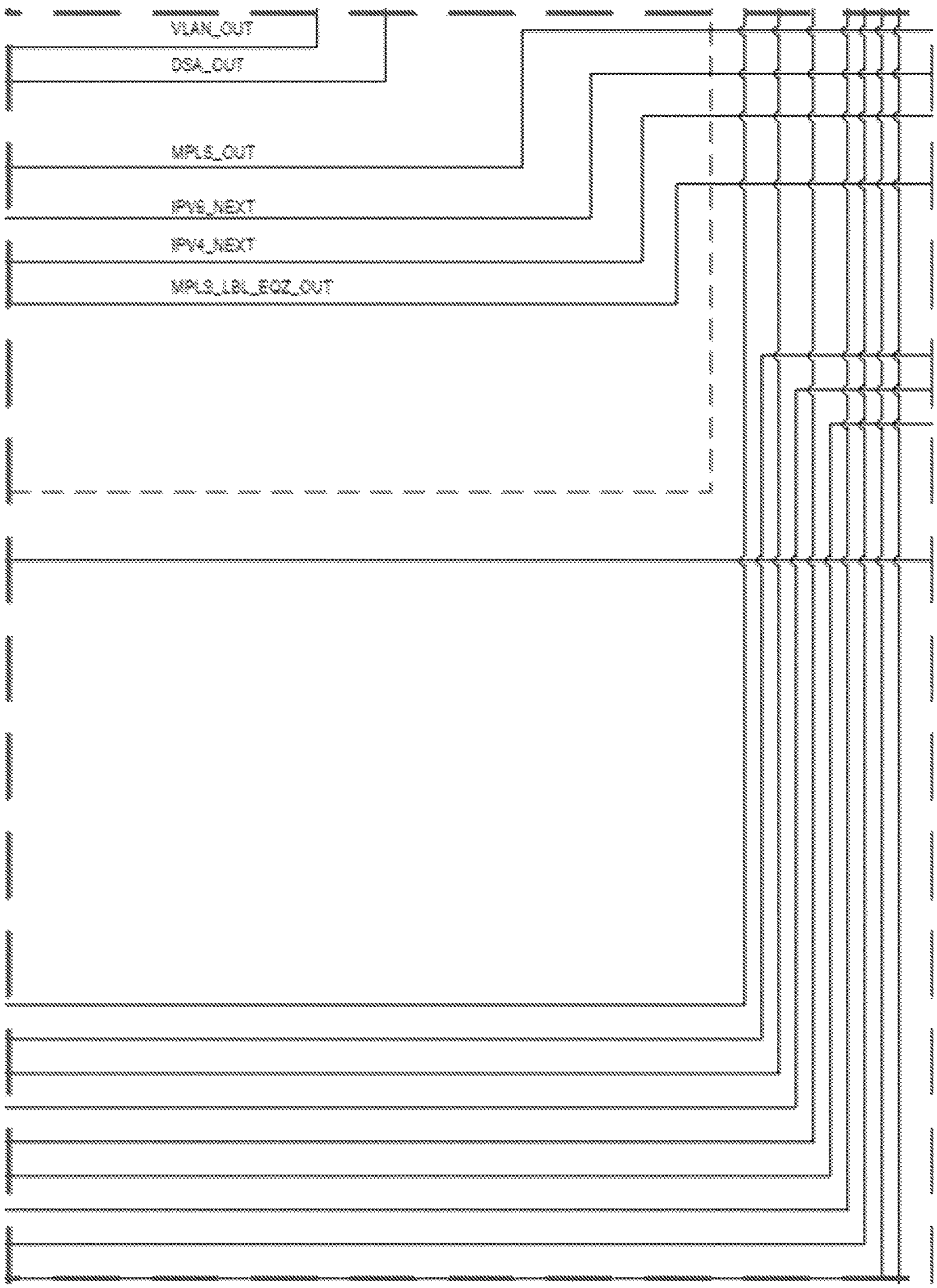
Figure 3C:
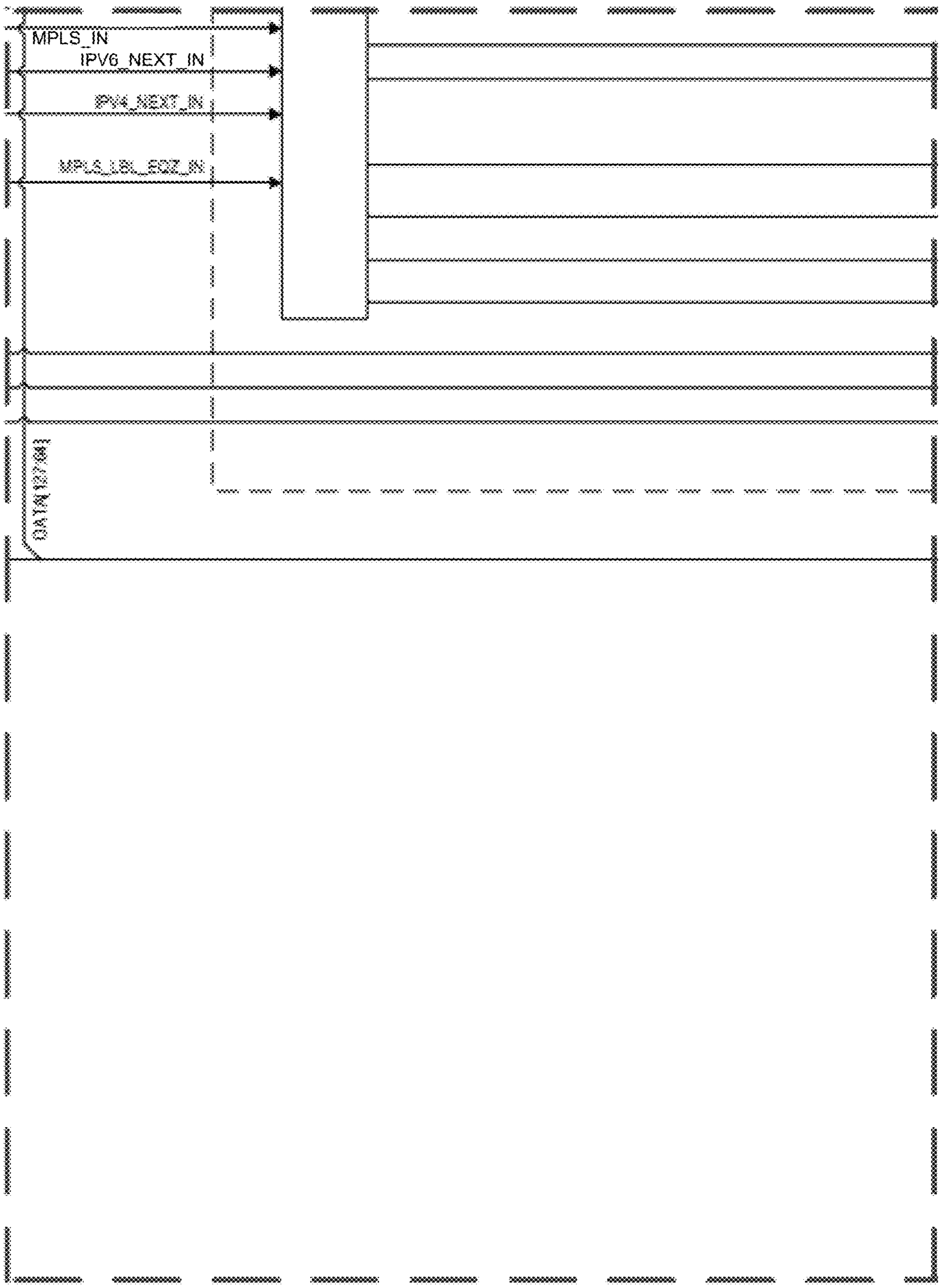
Figure 3C:
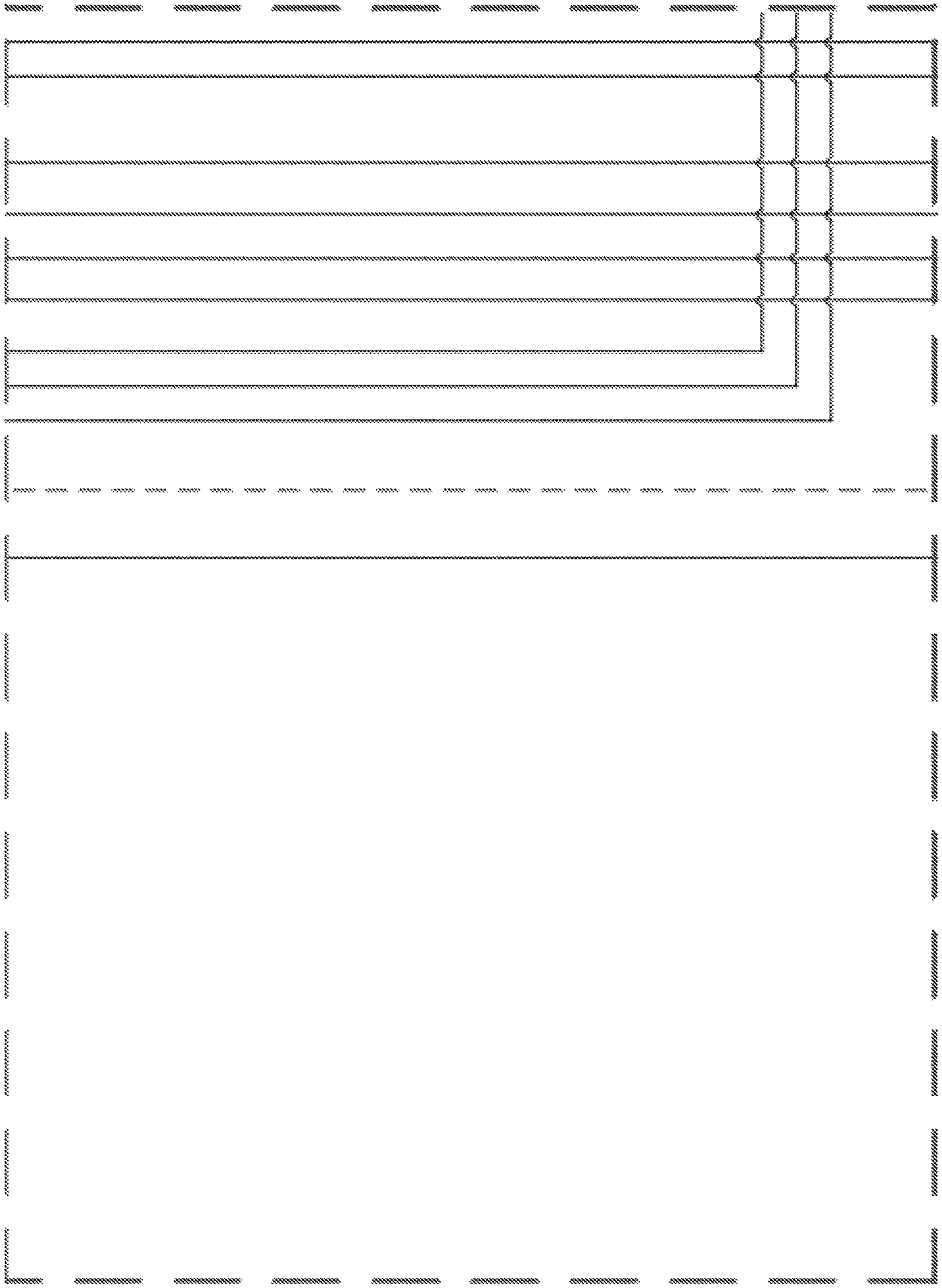
Figure 3C:
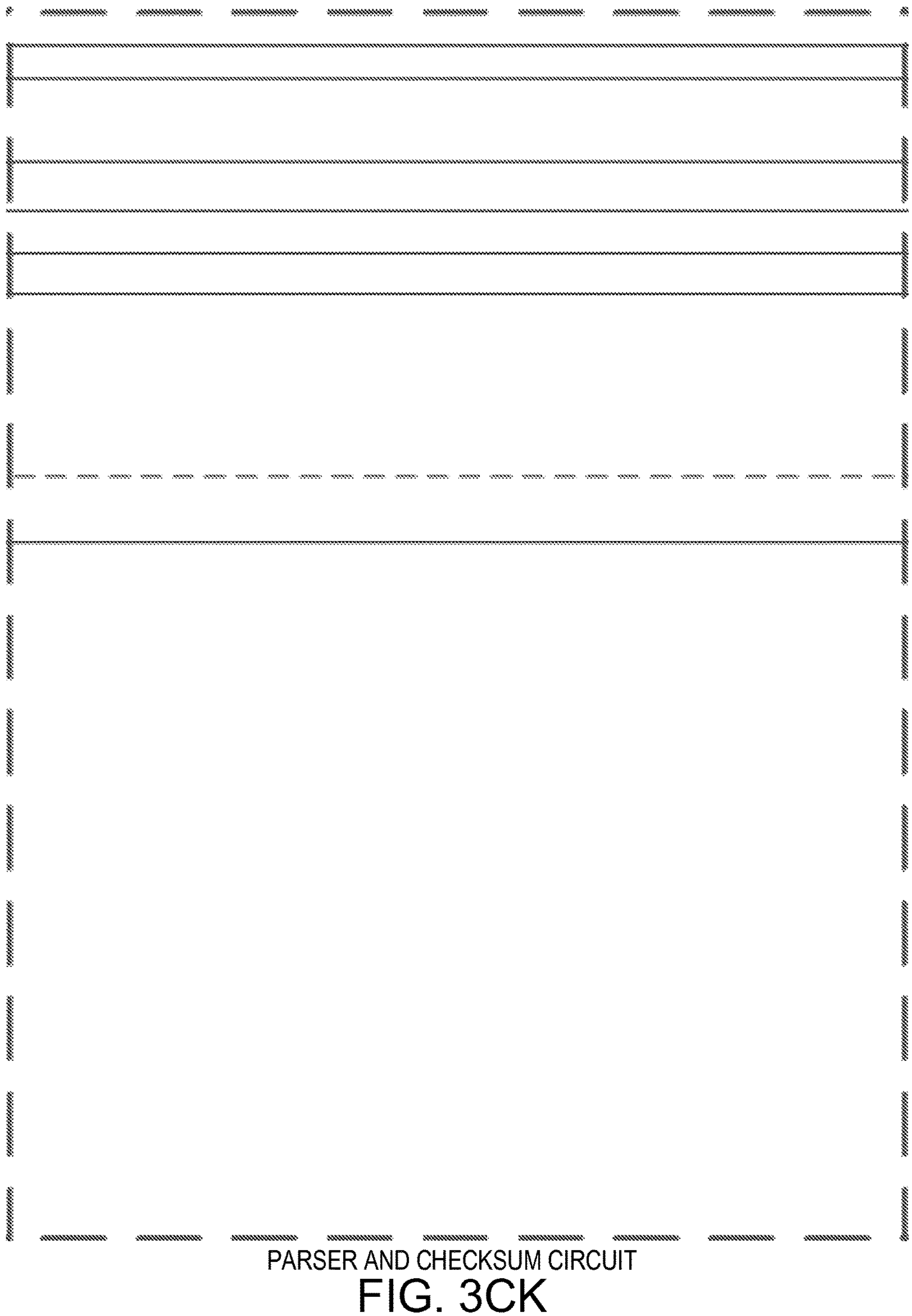
Figure 3C:
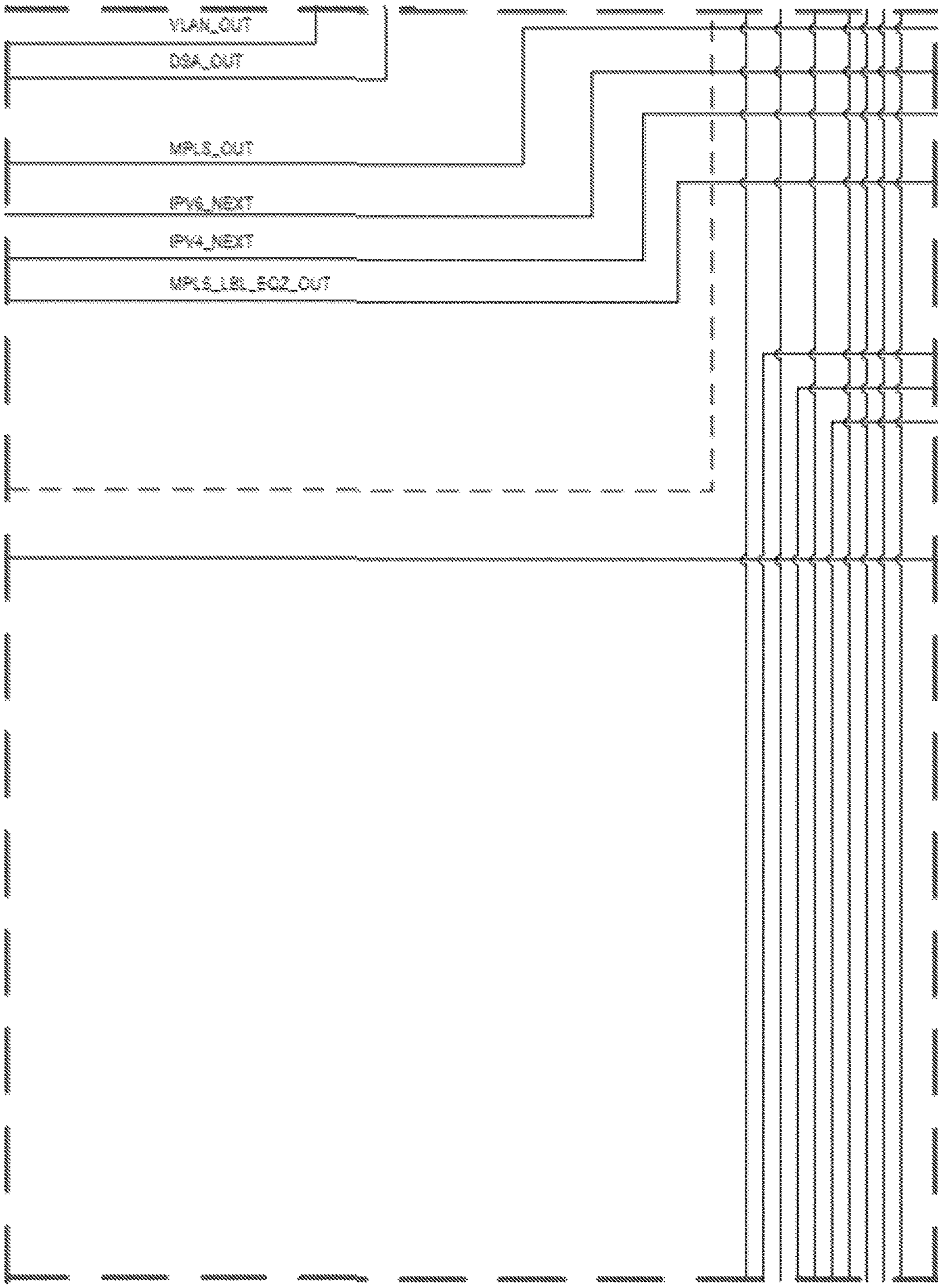
Figure 3C:
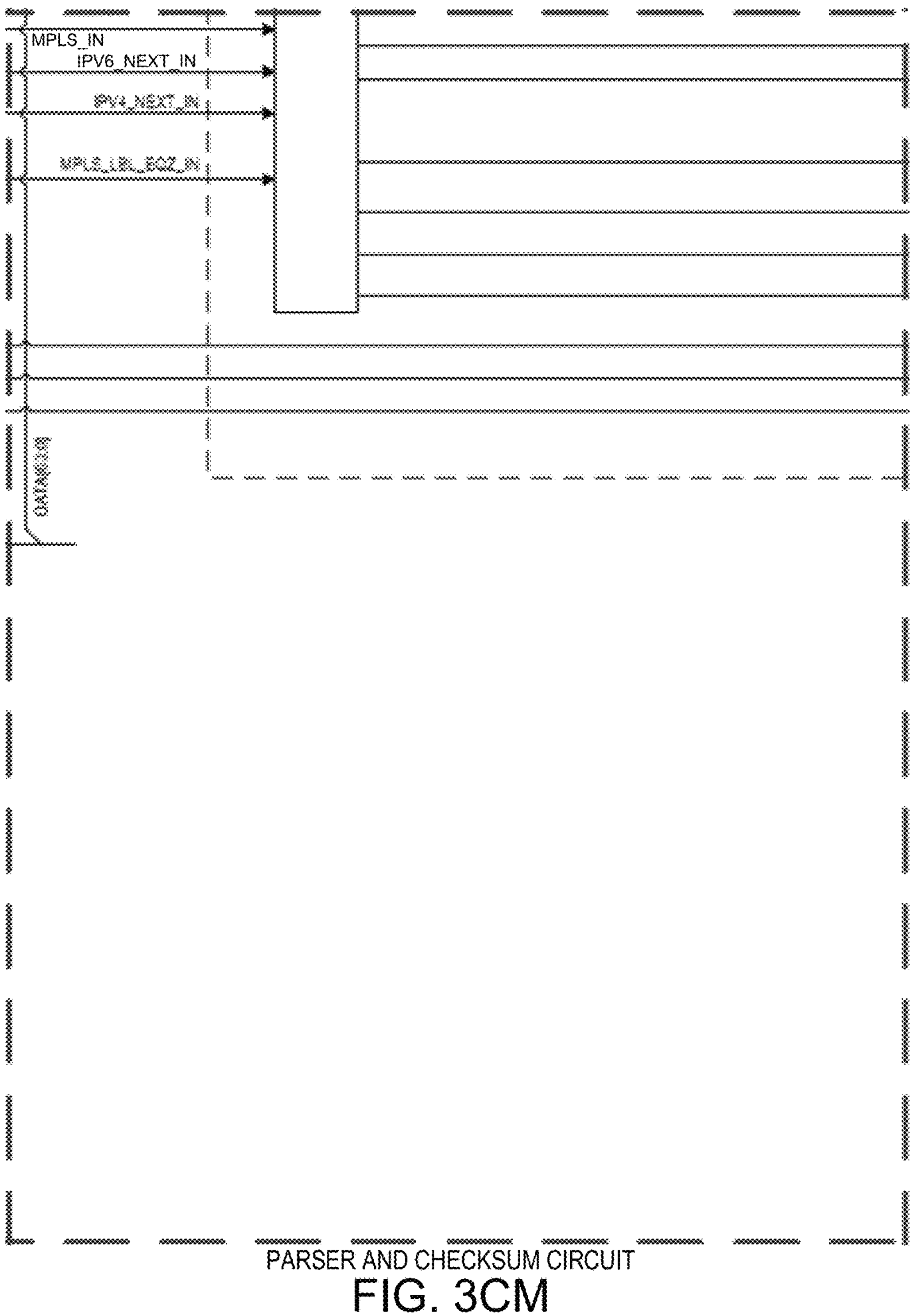
Figure 3C:
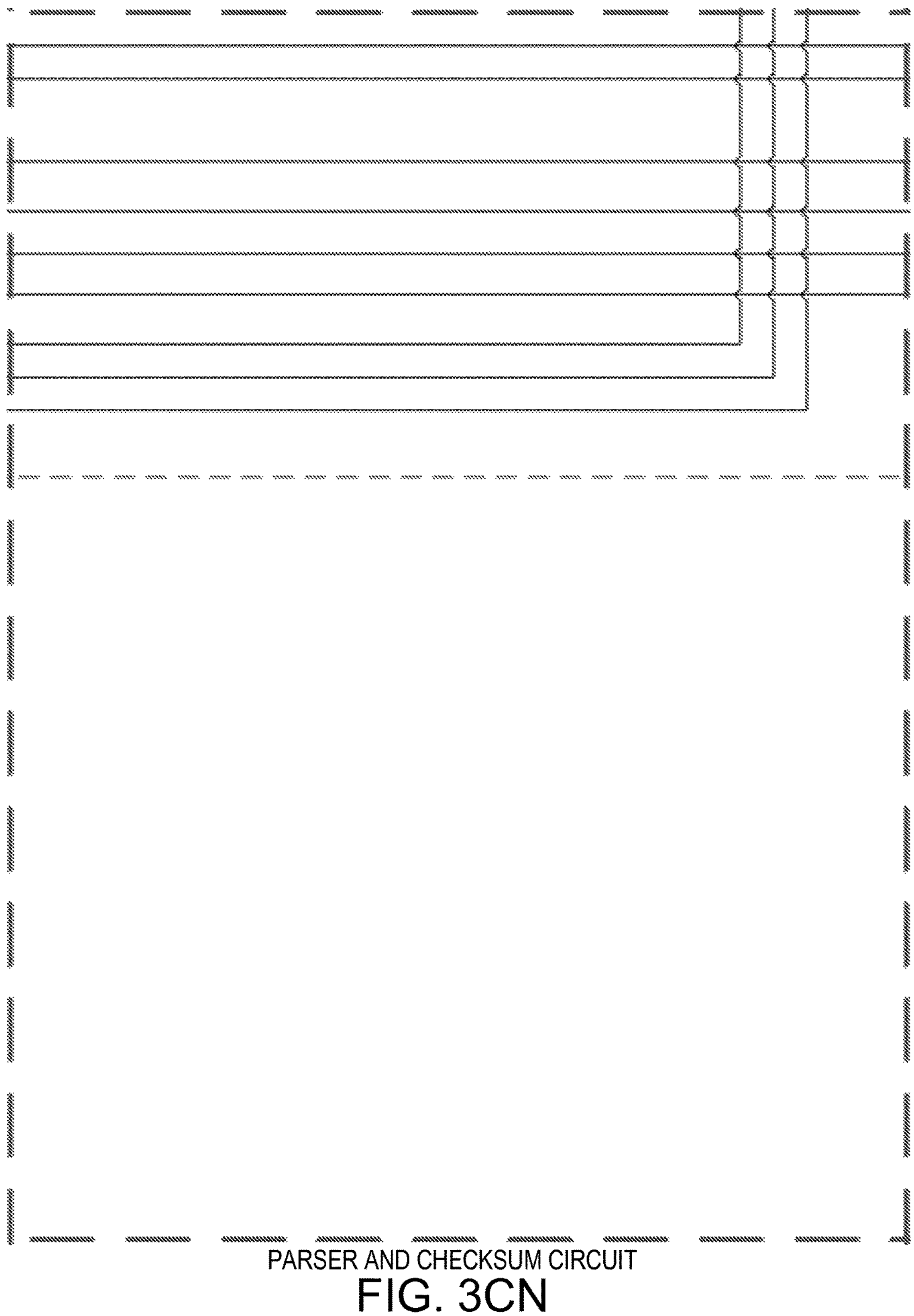
Figure 3C:
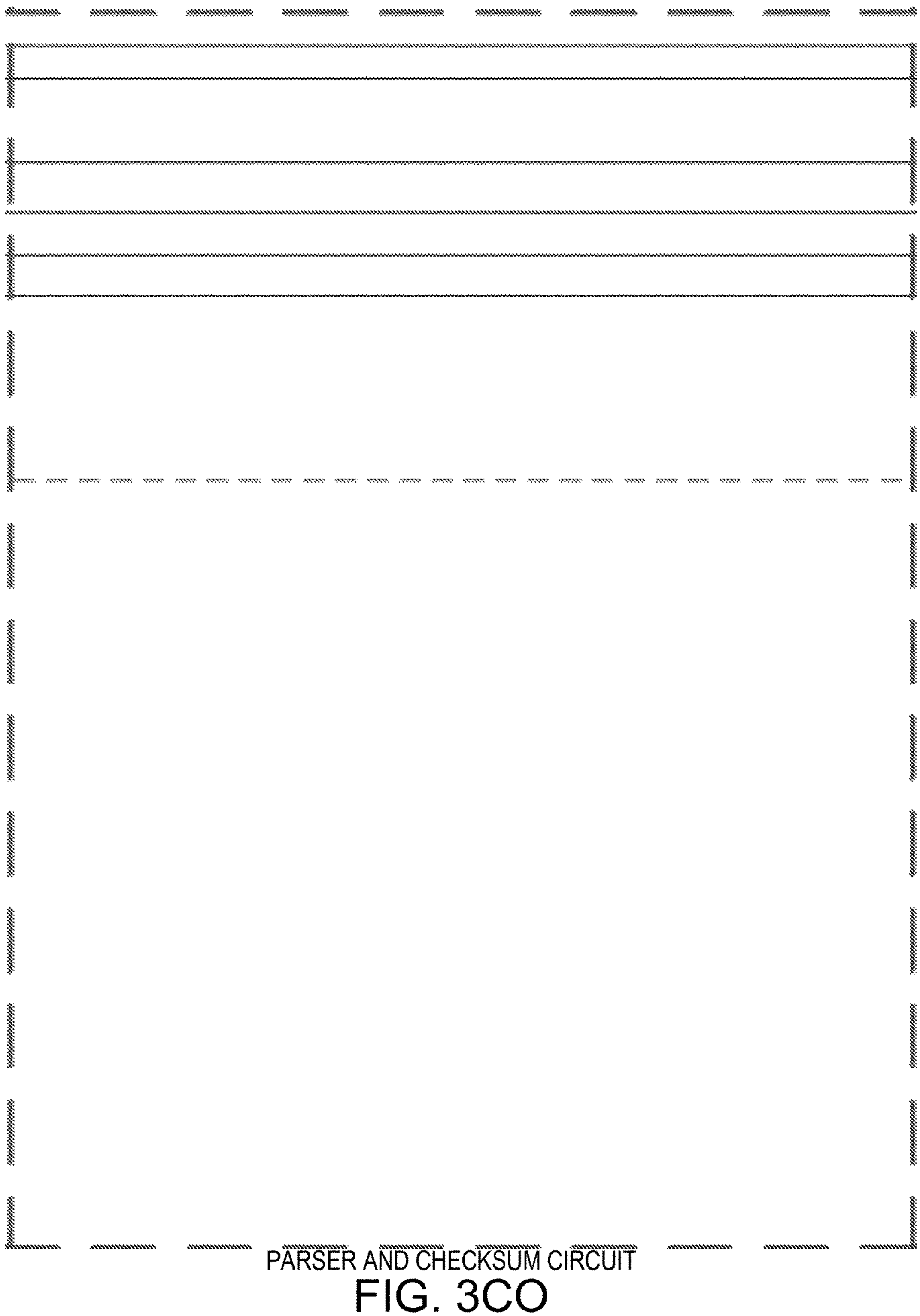
Figure 3C:
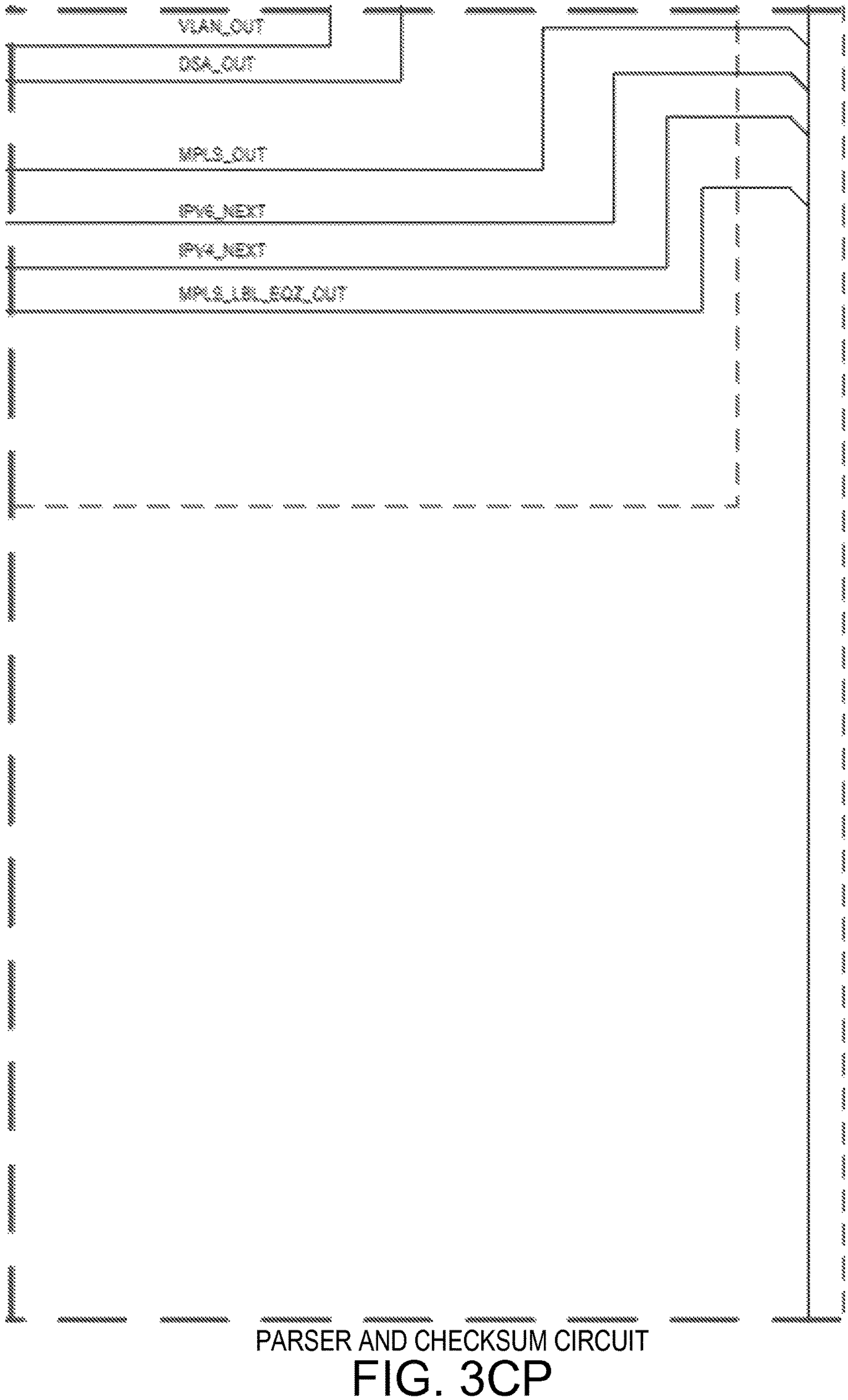
Figure 3C:
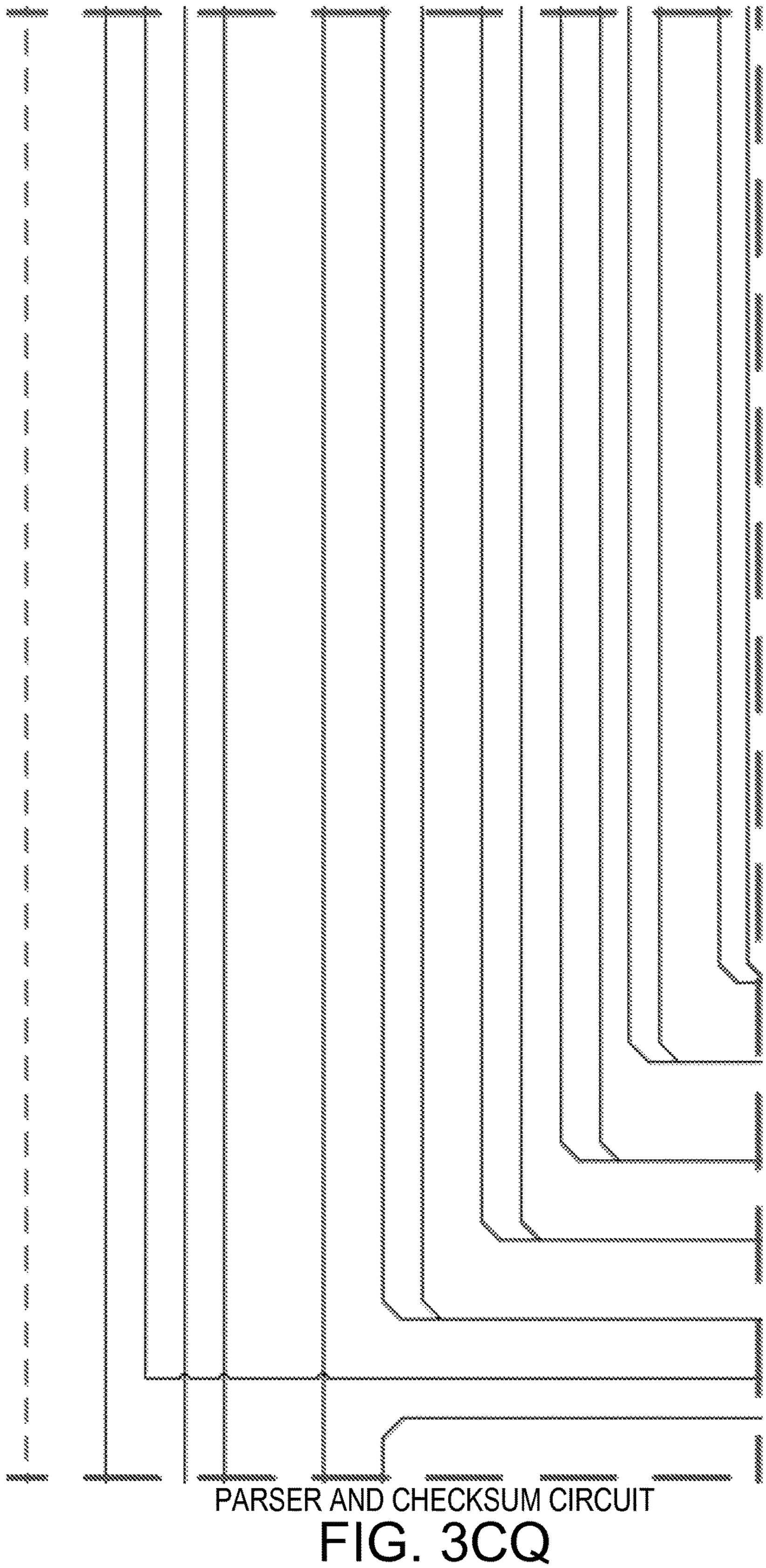
Figure 3C:
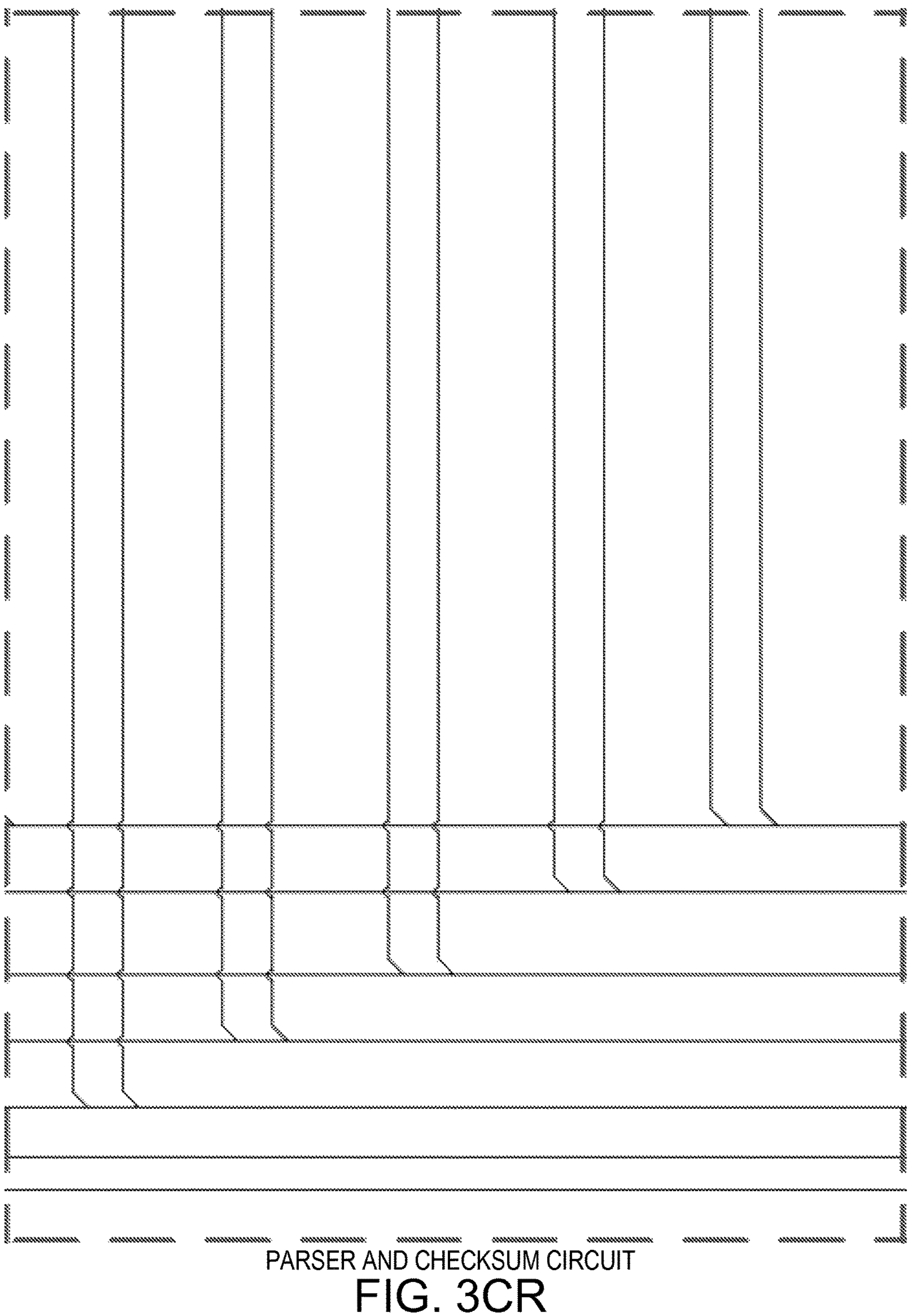
Figure 3C:
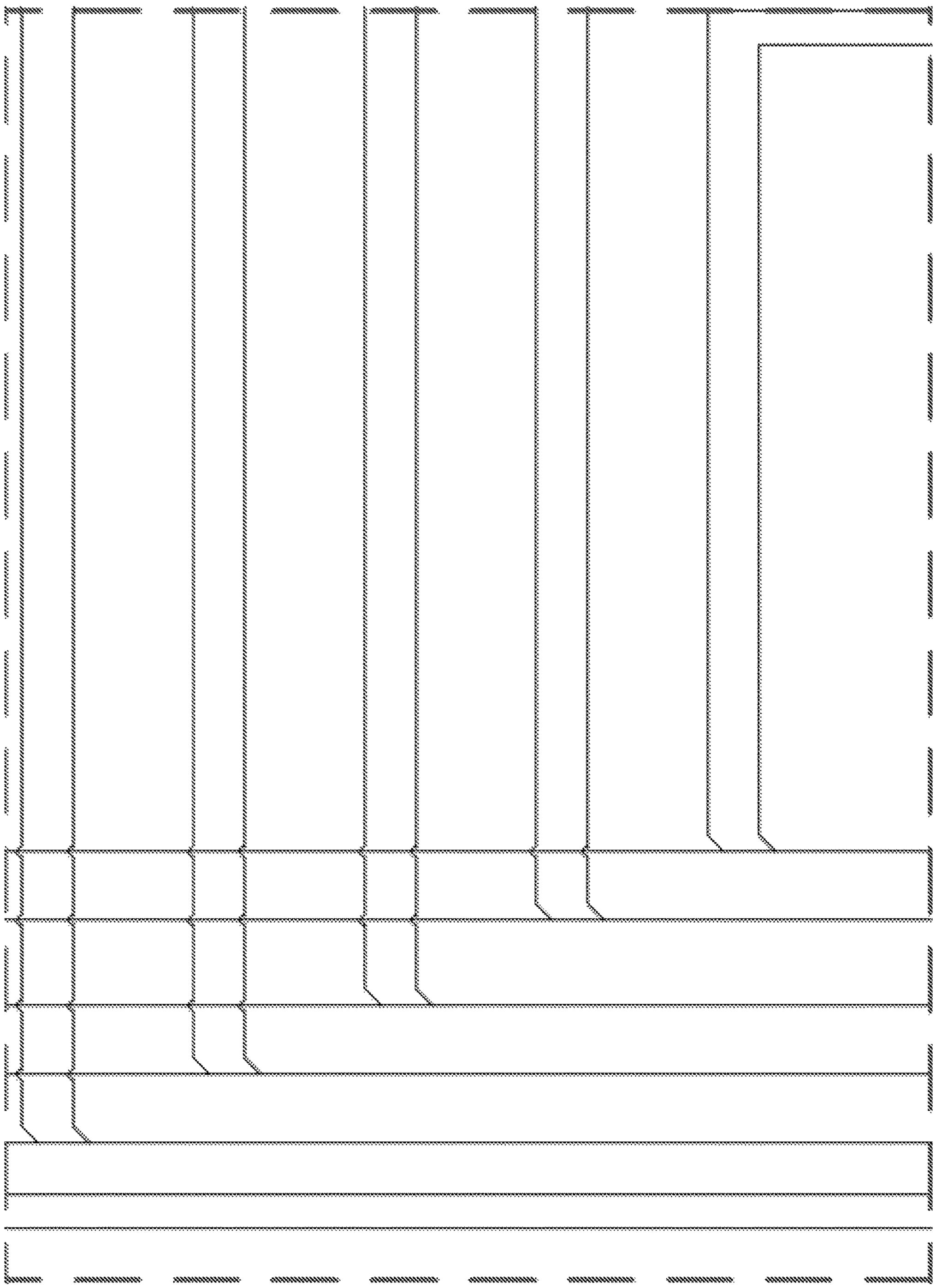
Figure 3C:
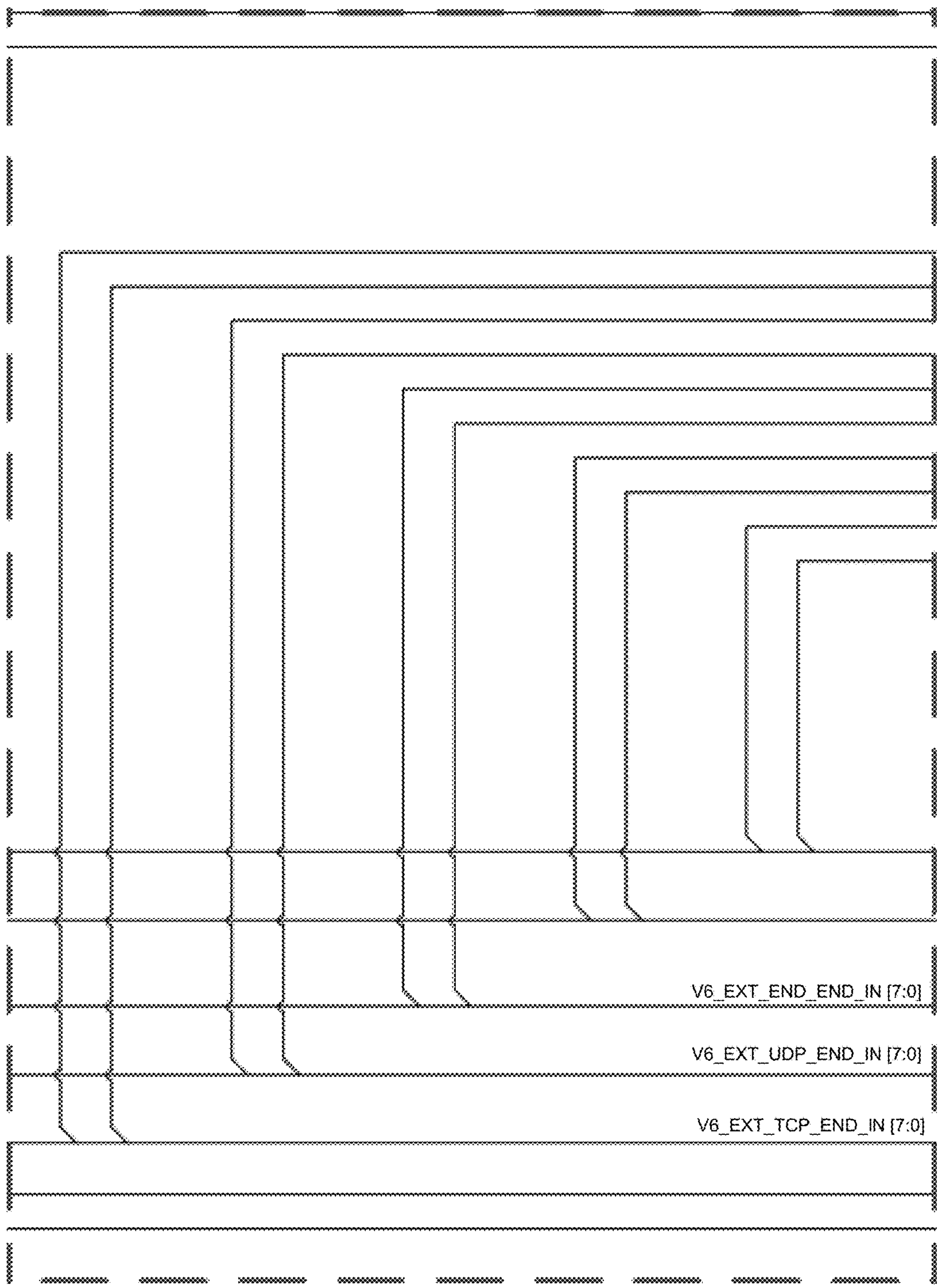
Figure 3C:
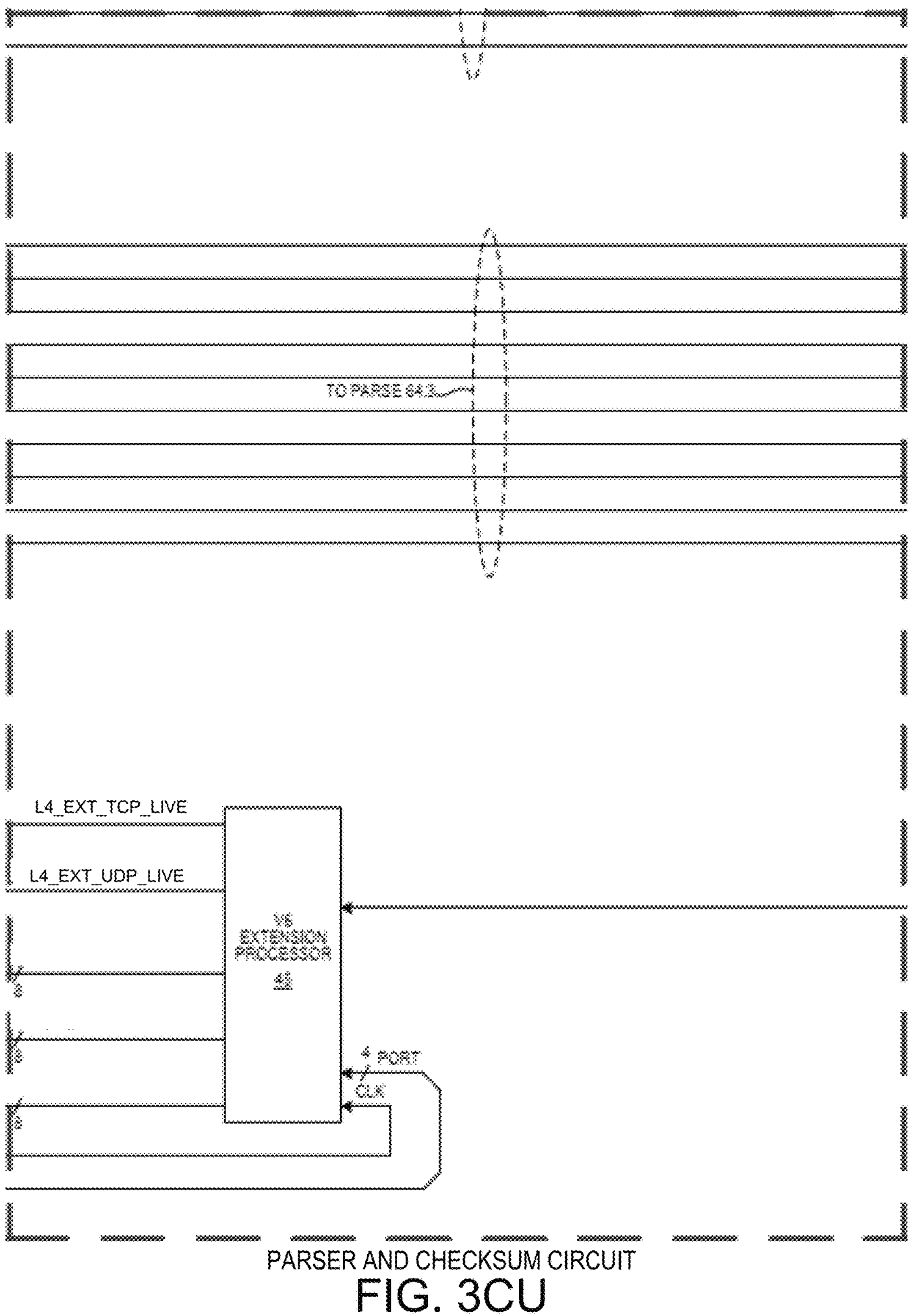
Figure 3C:
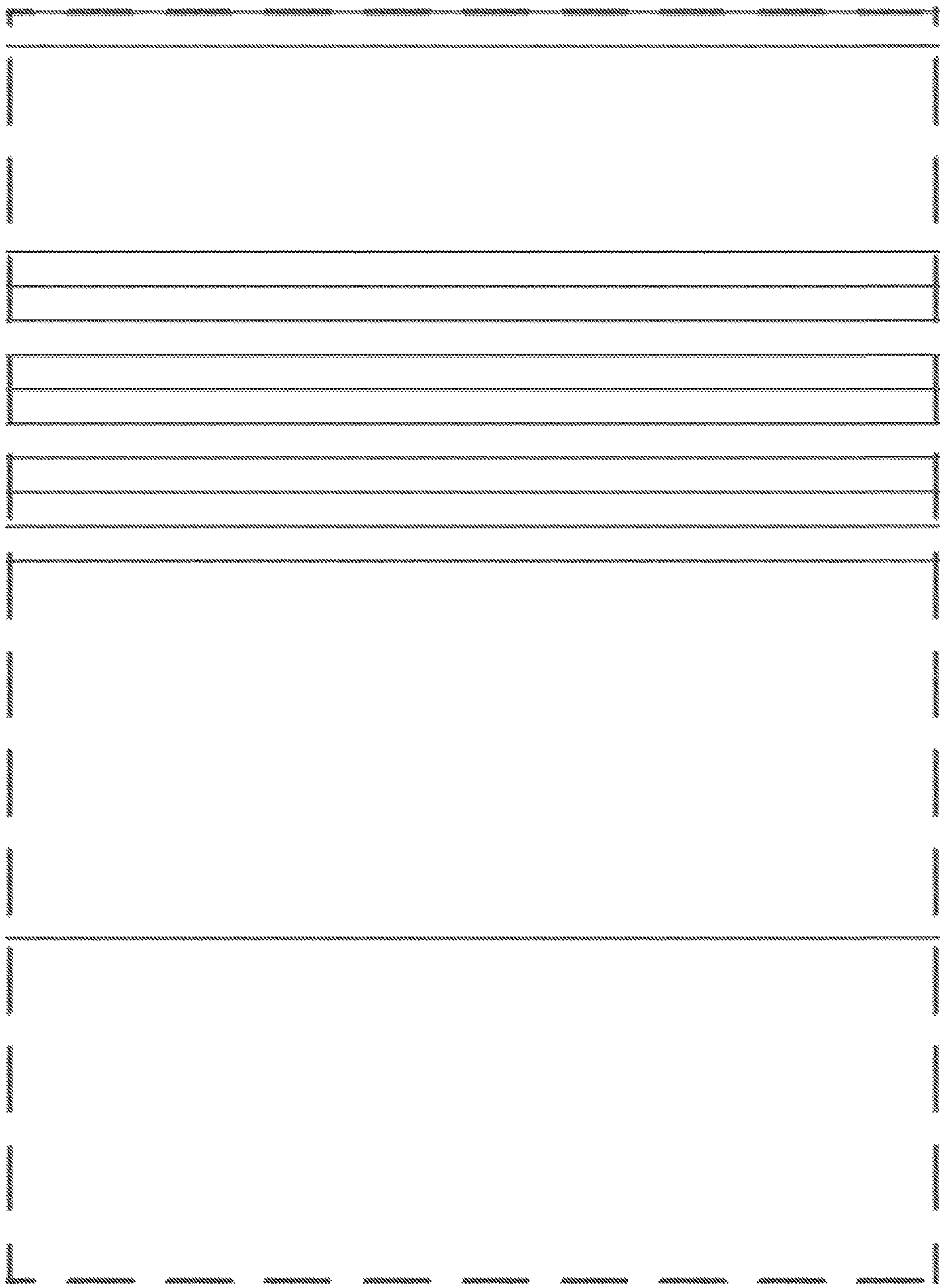
Figure 3C:
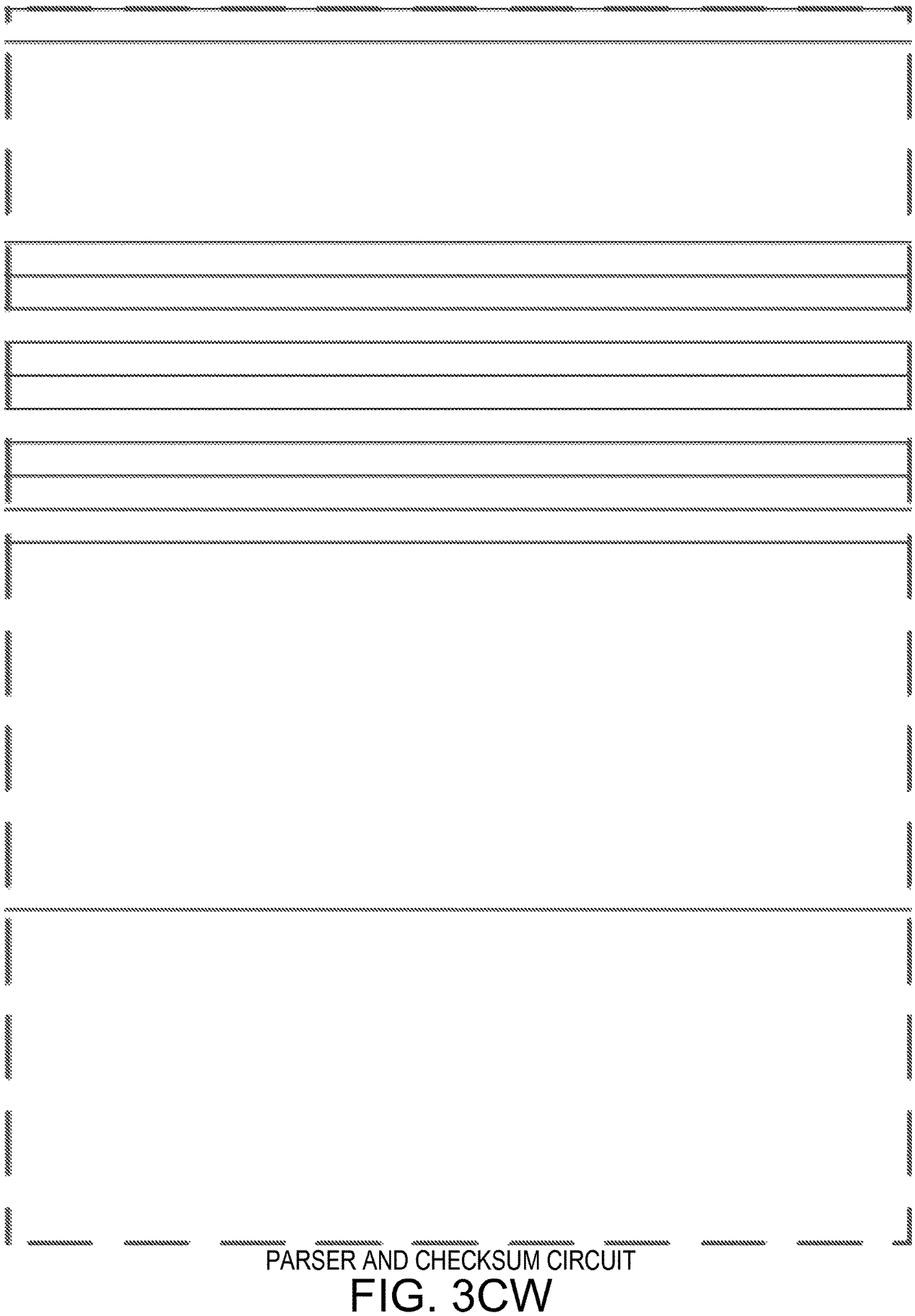
Figure 3C:
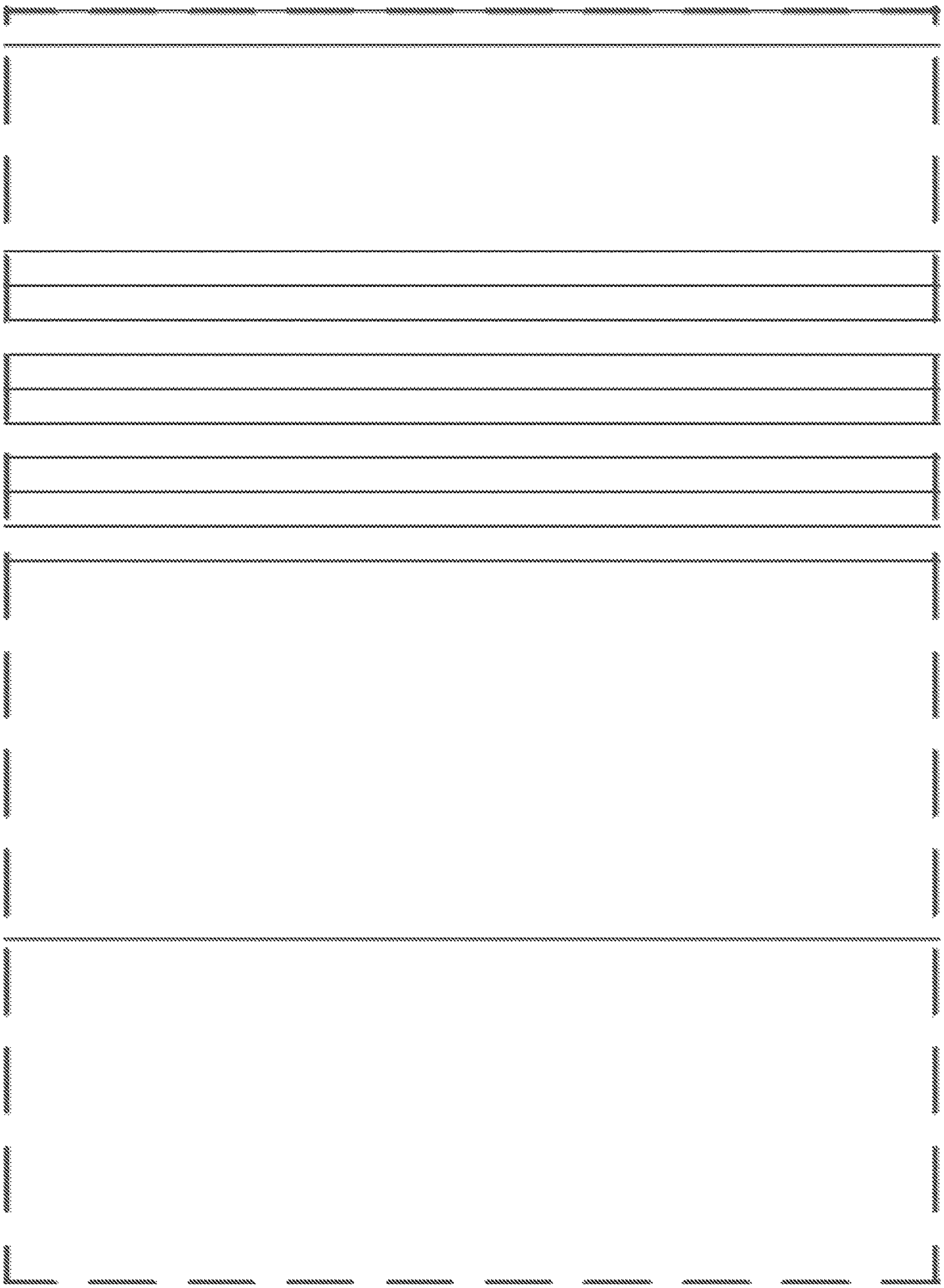
Figure 3C:
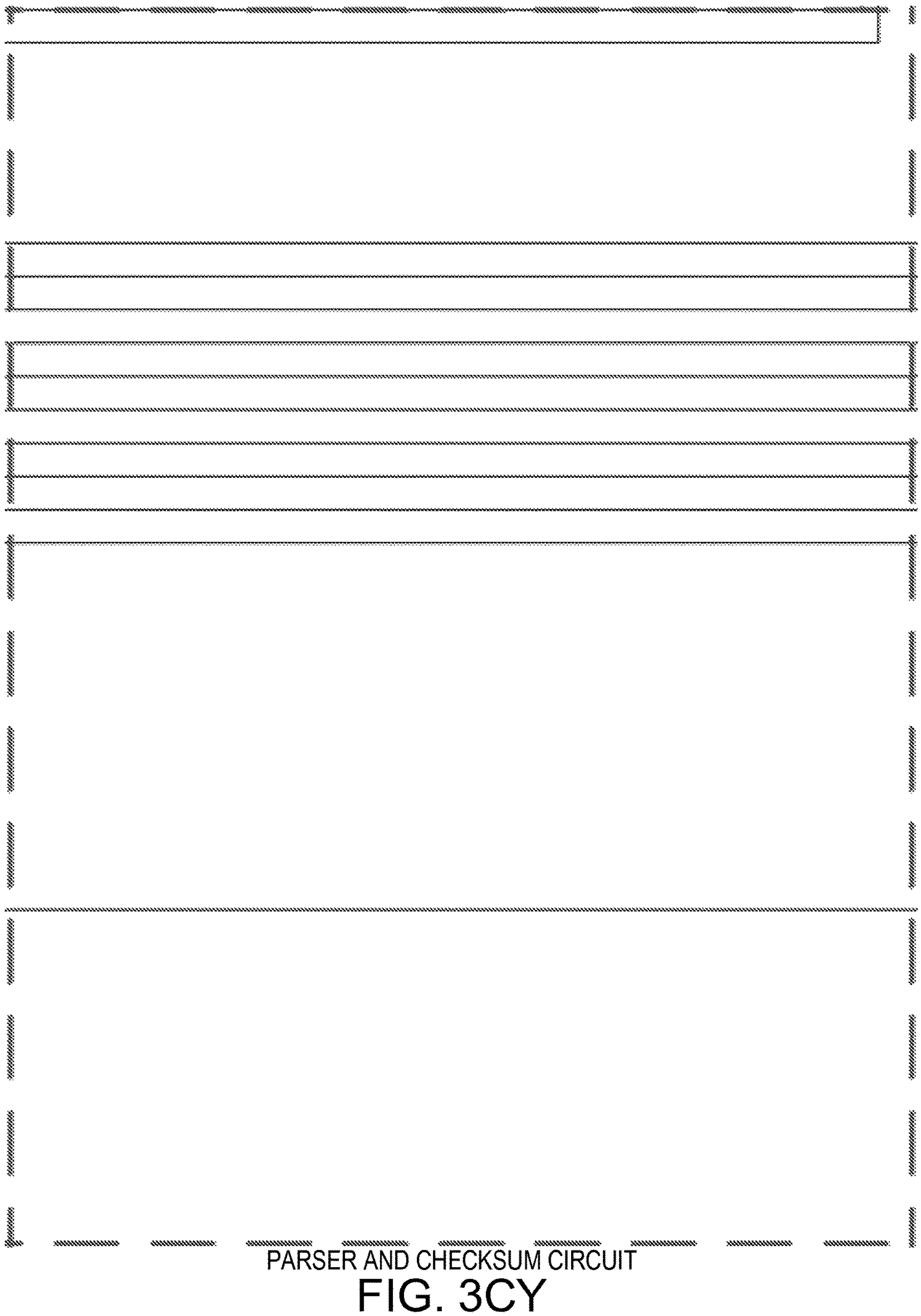
Figure 3C:
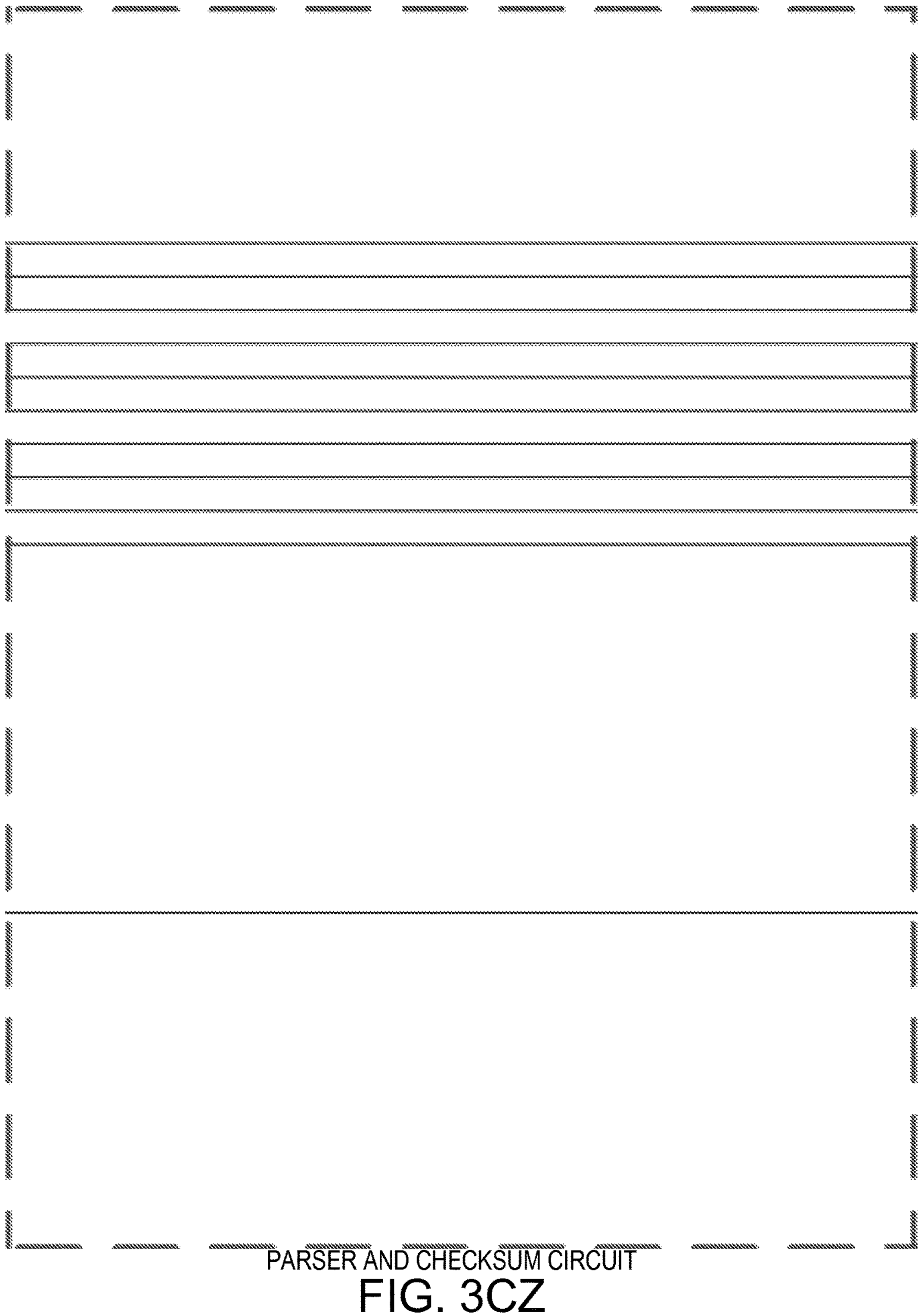
Figure 3D:
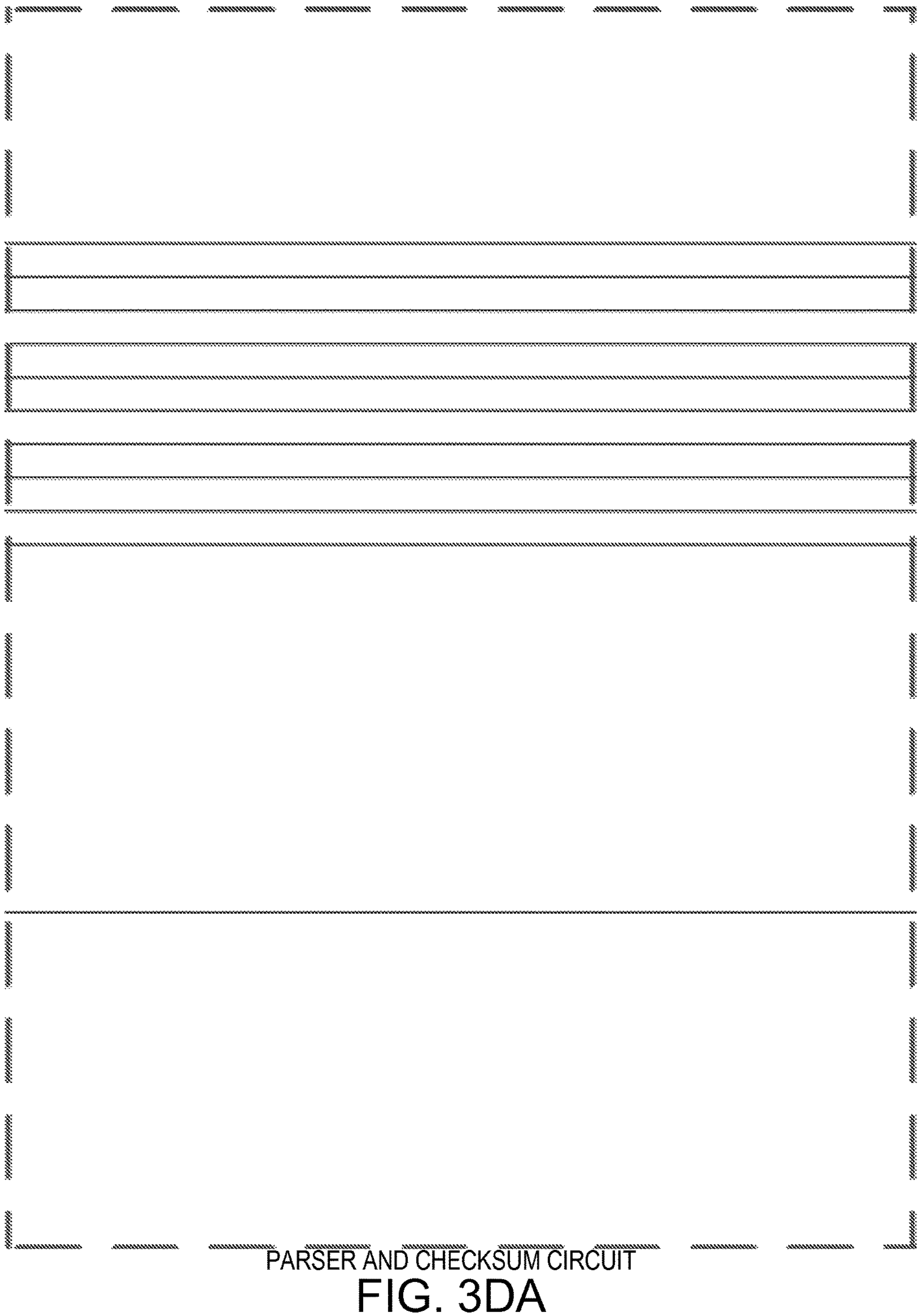
Figure 3D:
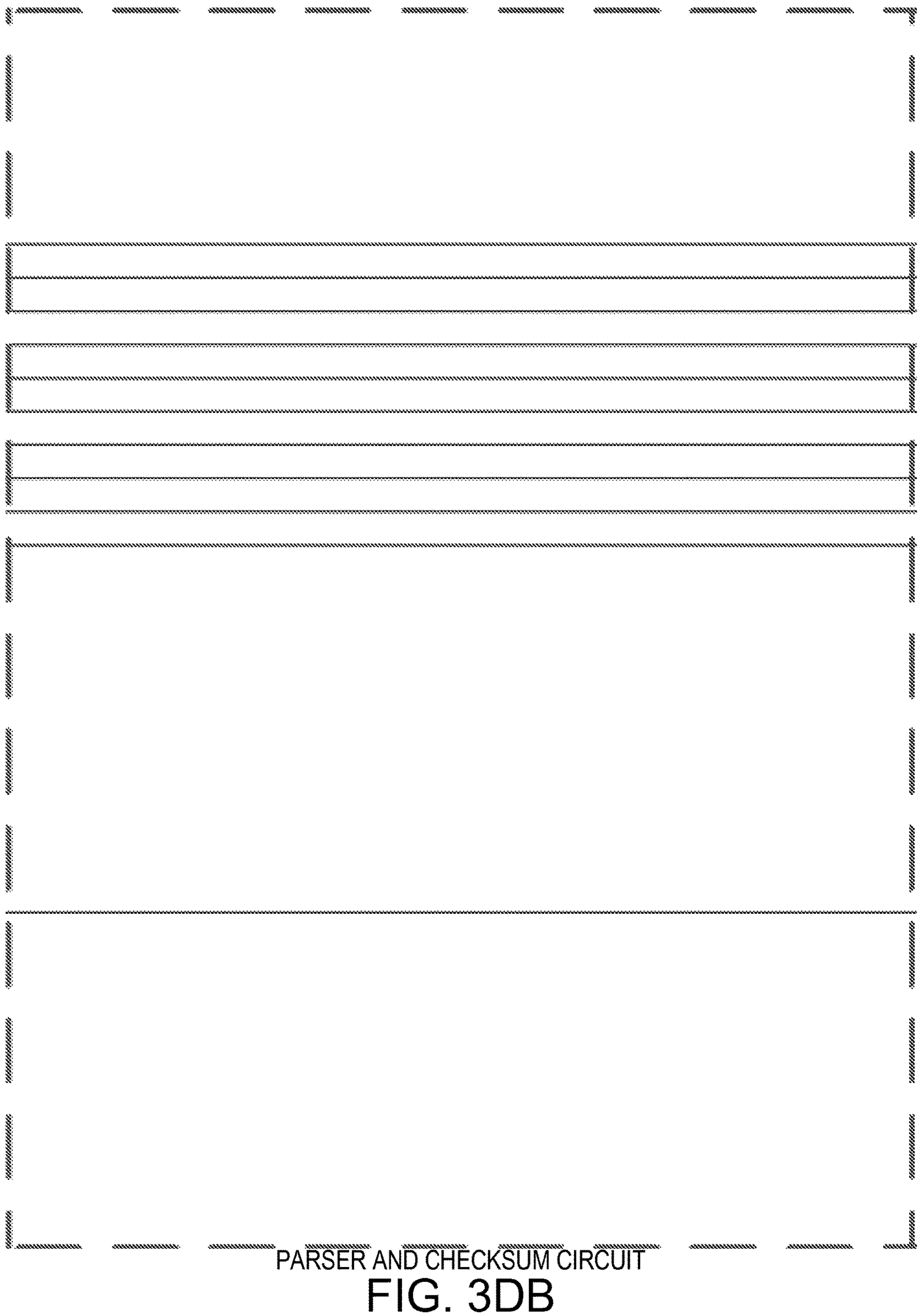
Figure 3D:
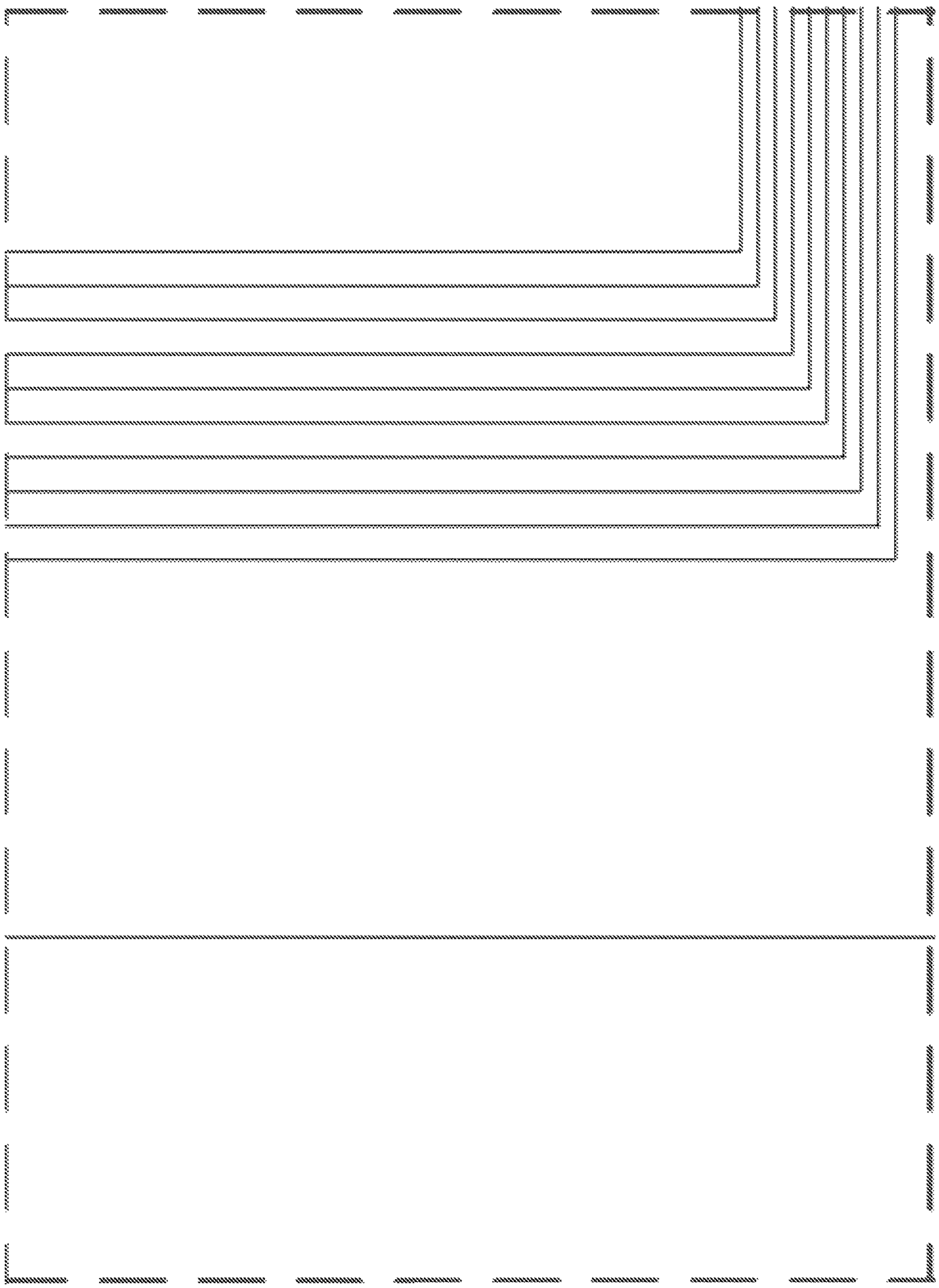
Figure 3D:
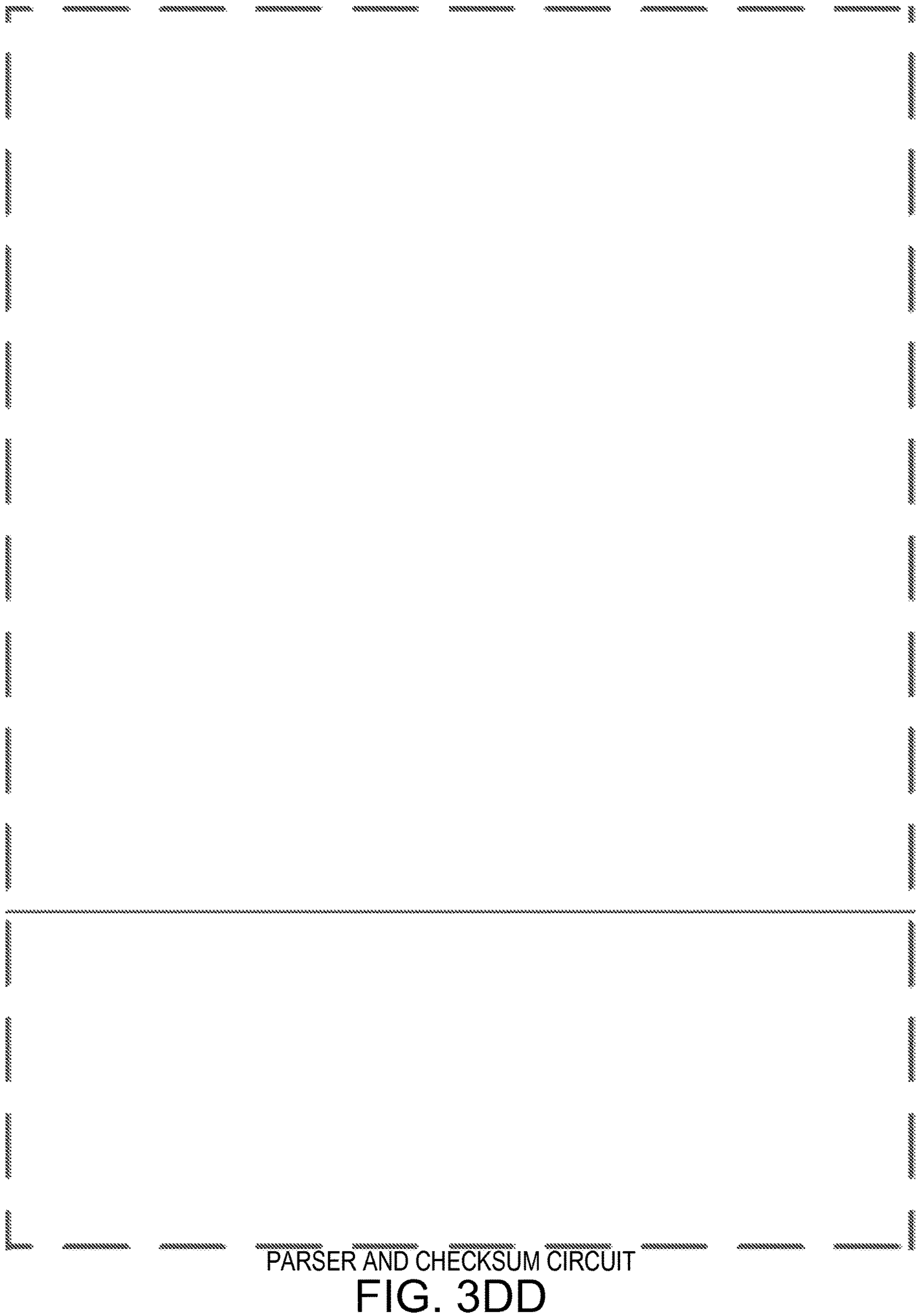
Figure 3D:
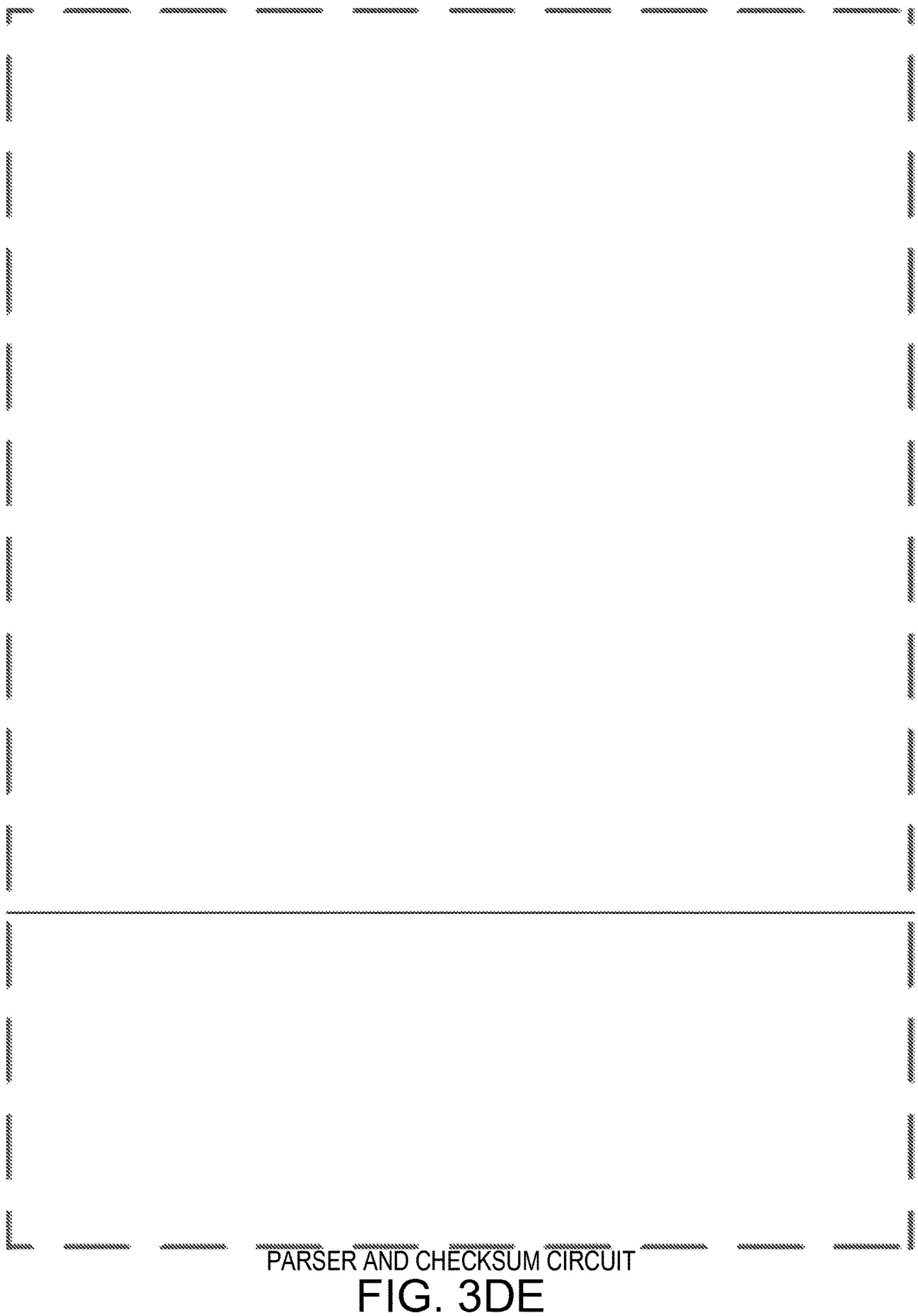
Figure 3D:
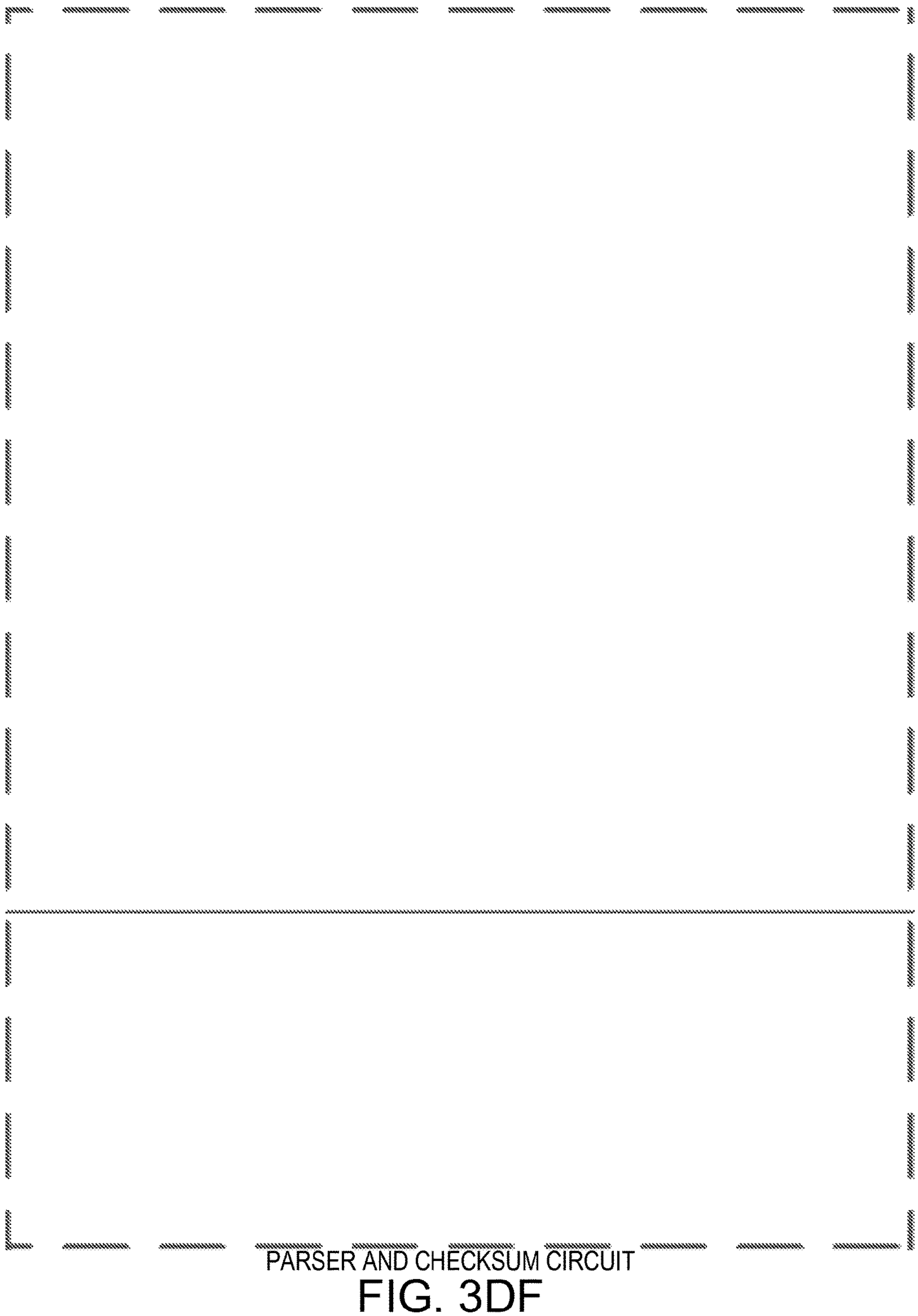
Figure 3D:
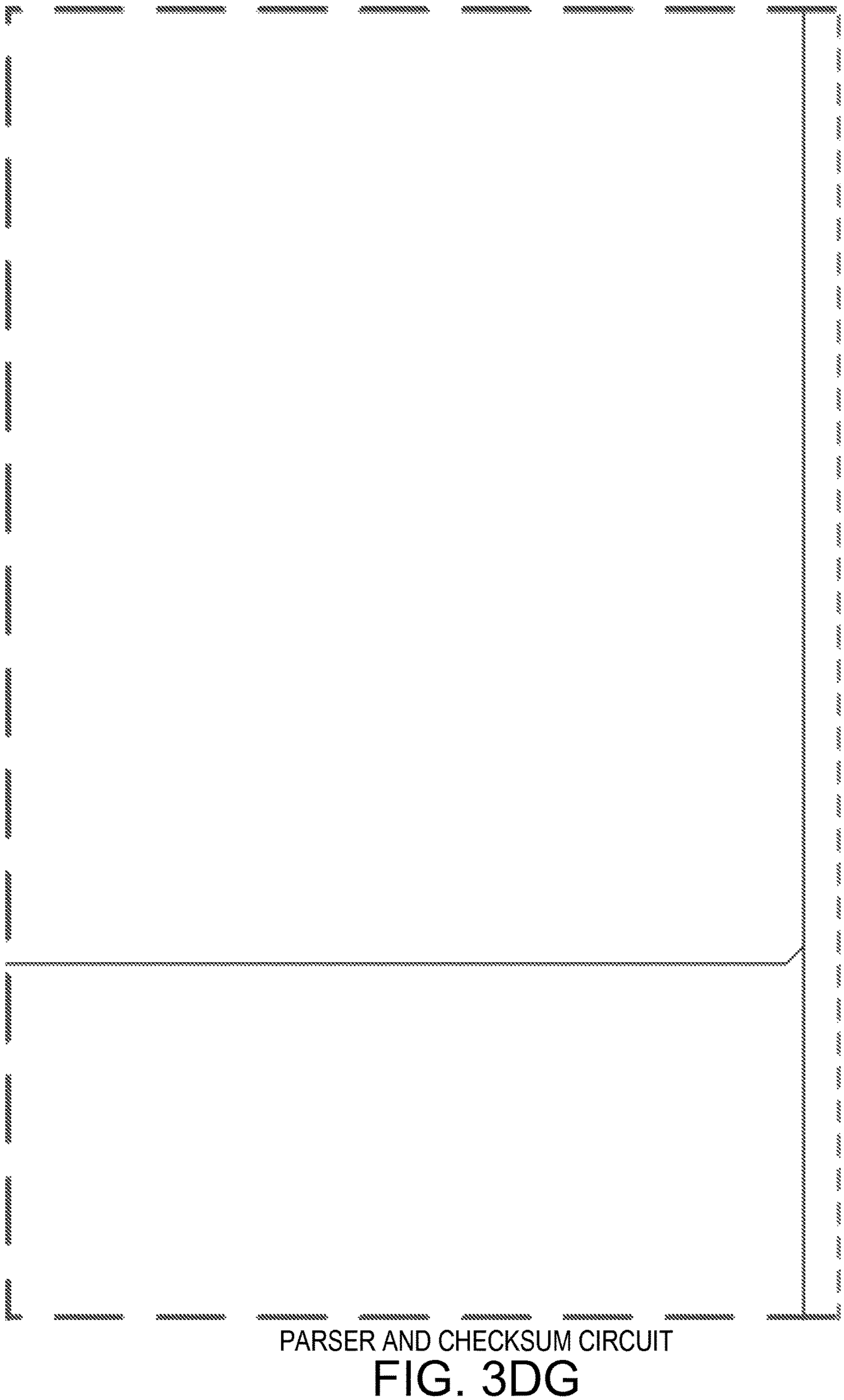
Figure 3D:
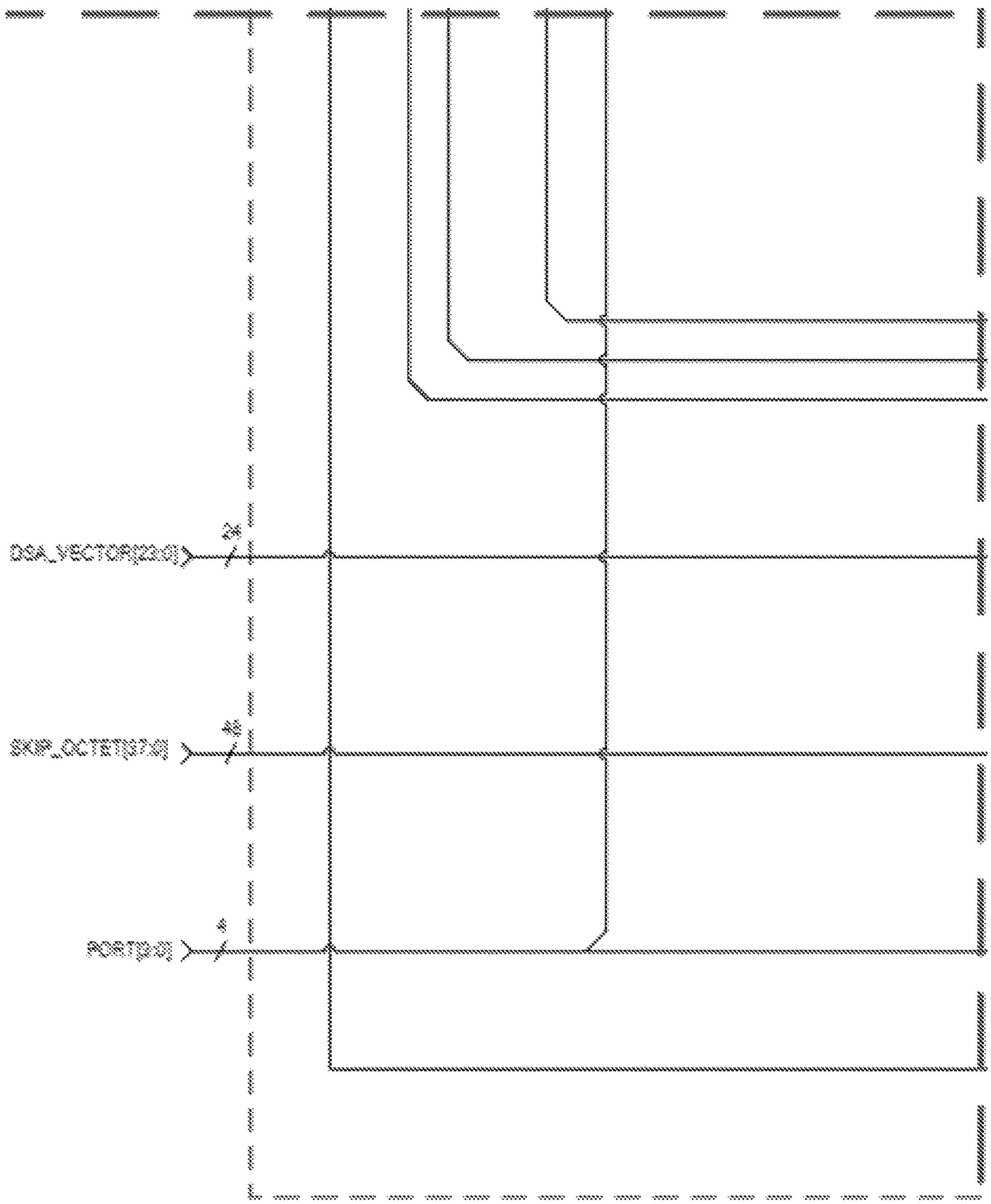
Figure 3D:
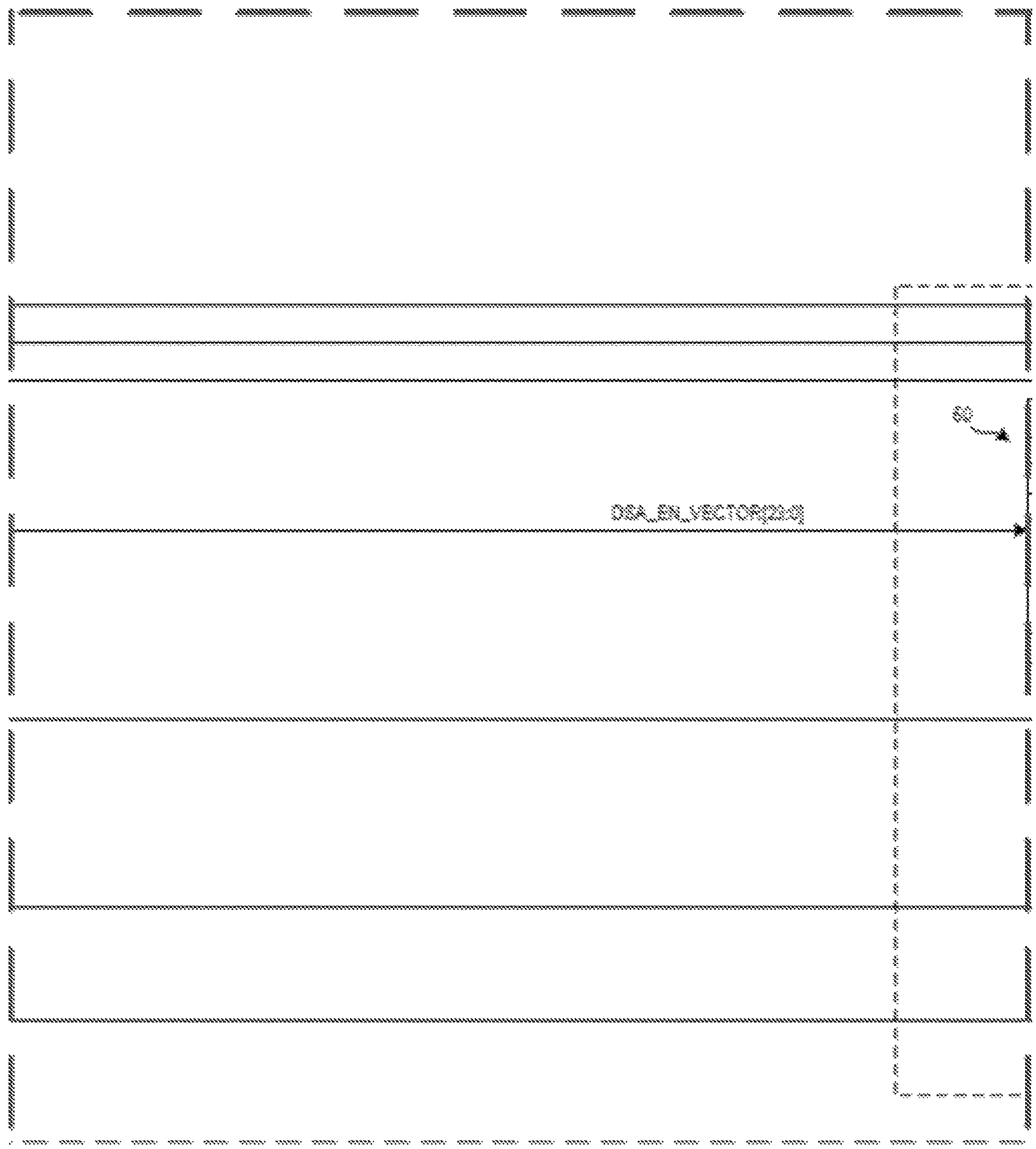
Figure 3D:
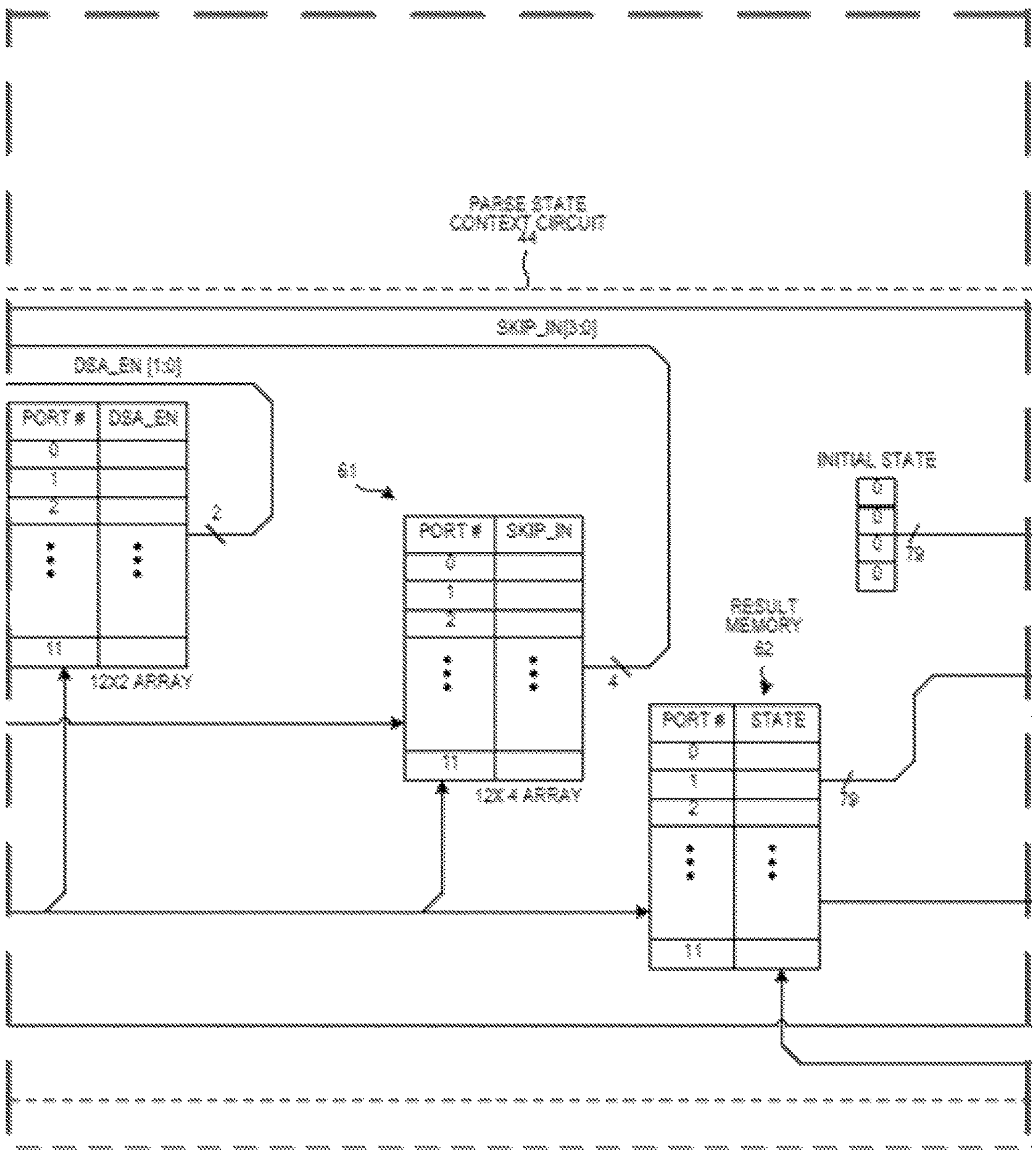
Figure 3D:
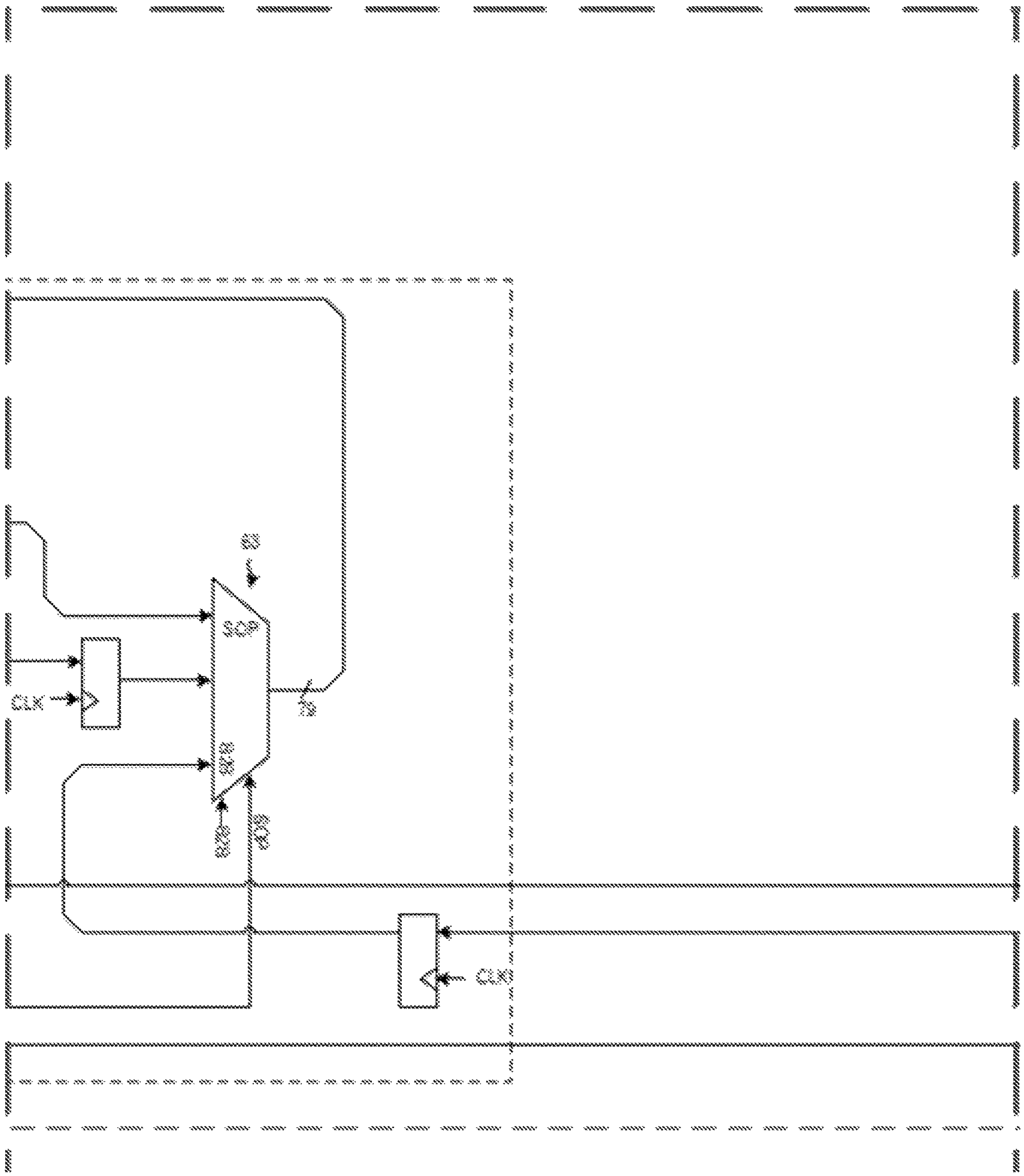
Figure 3D:
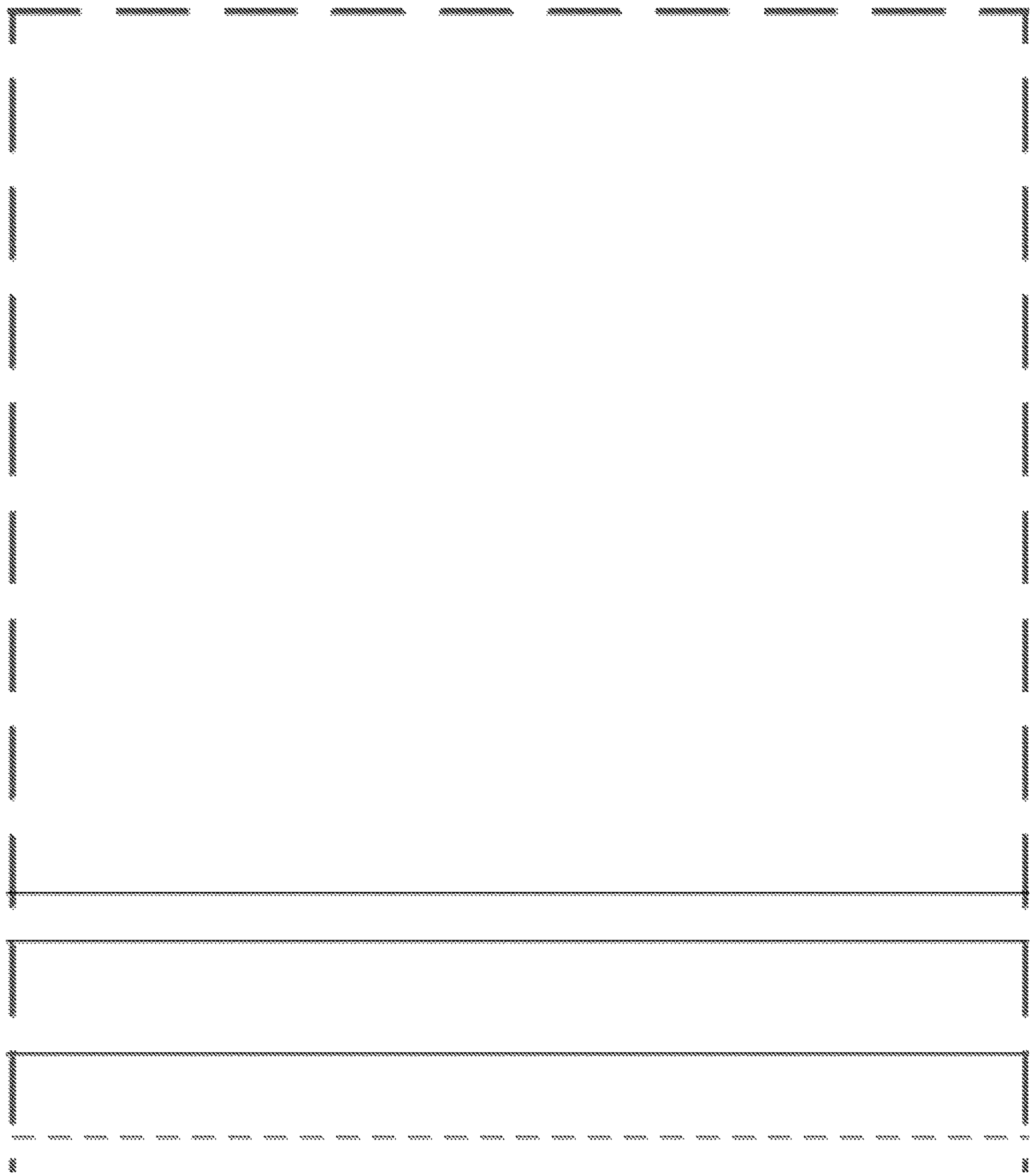
Figure 3D:
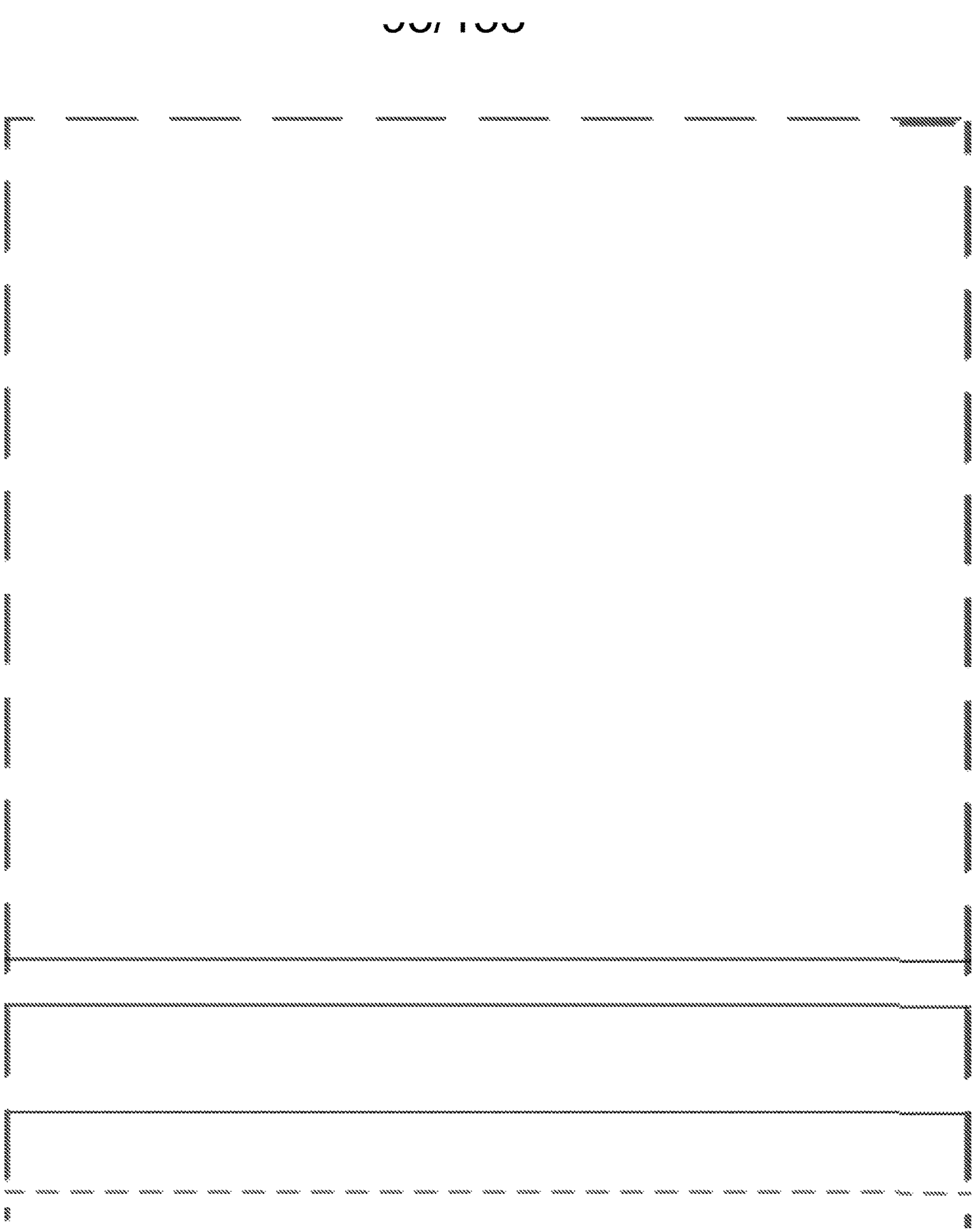
Figure 3D:
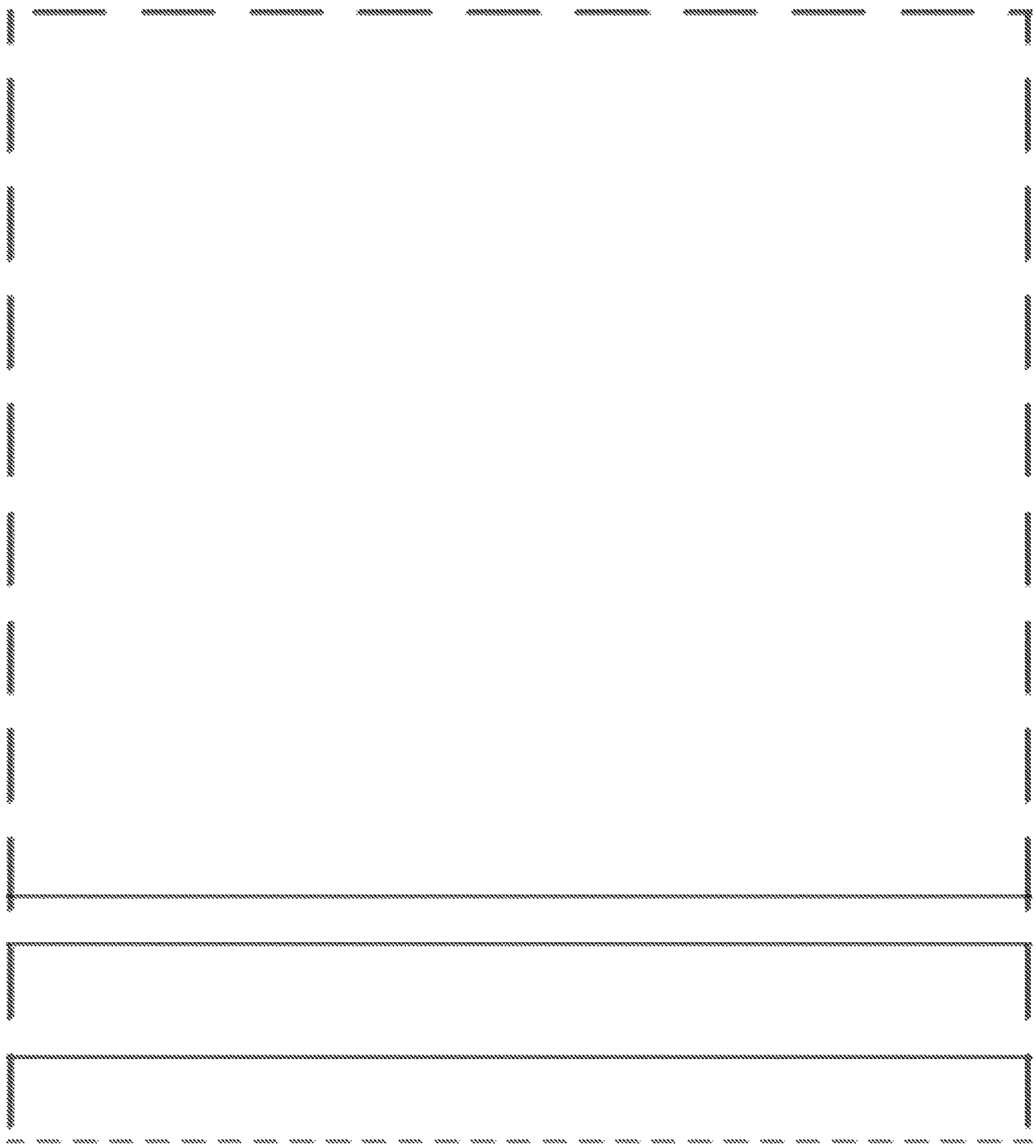
Figure 3D:
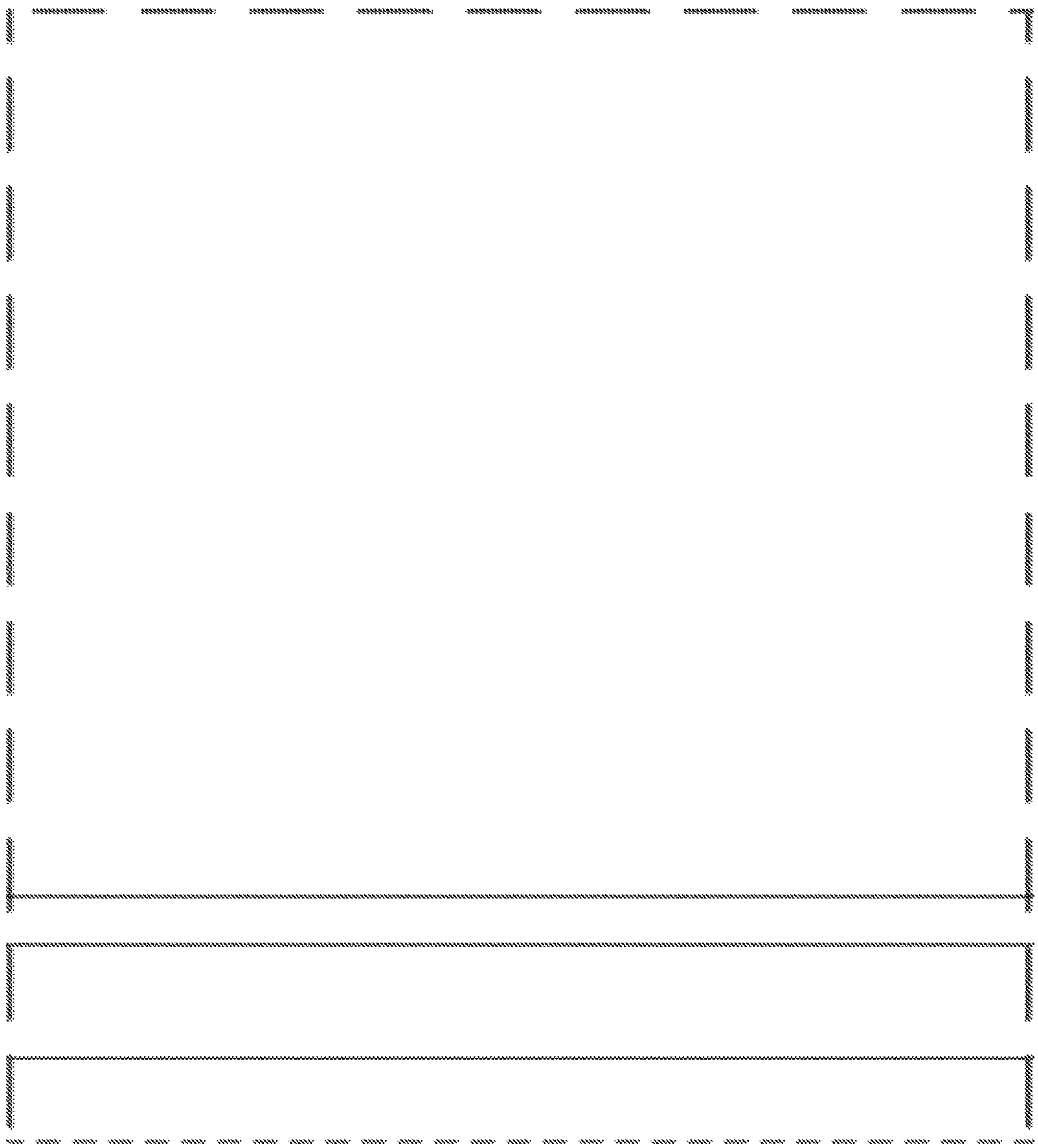
Figure 3D:
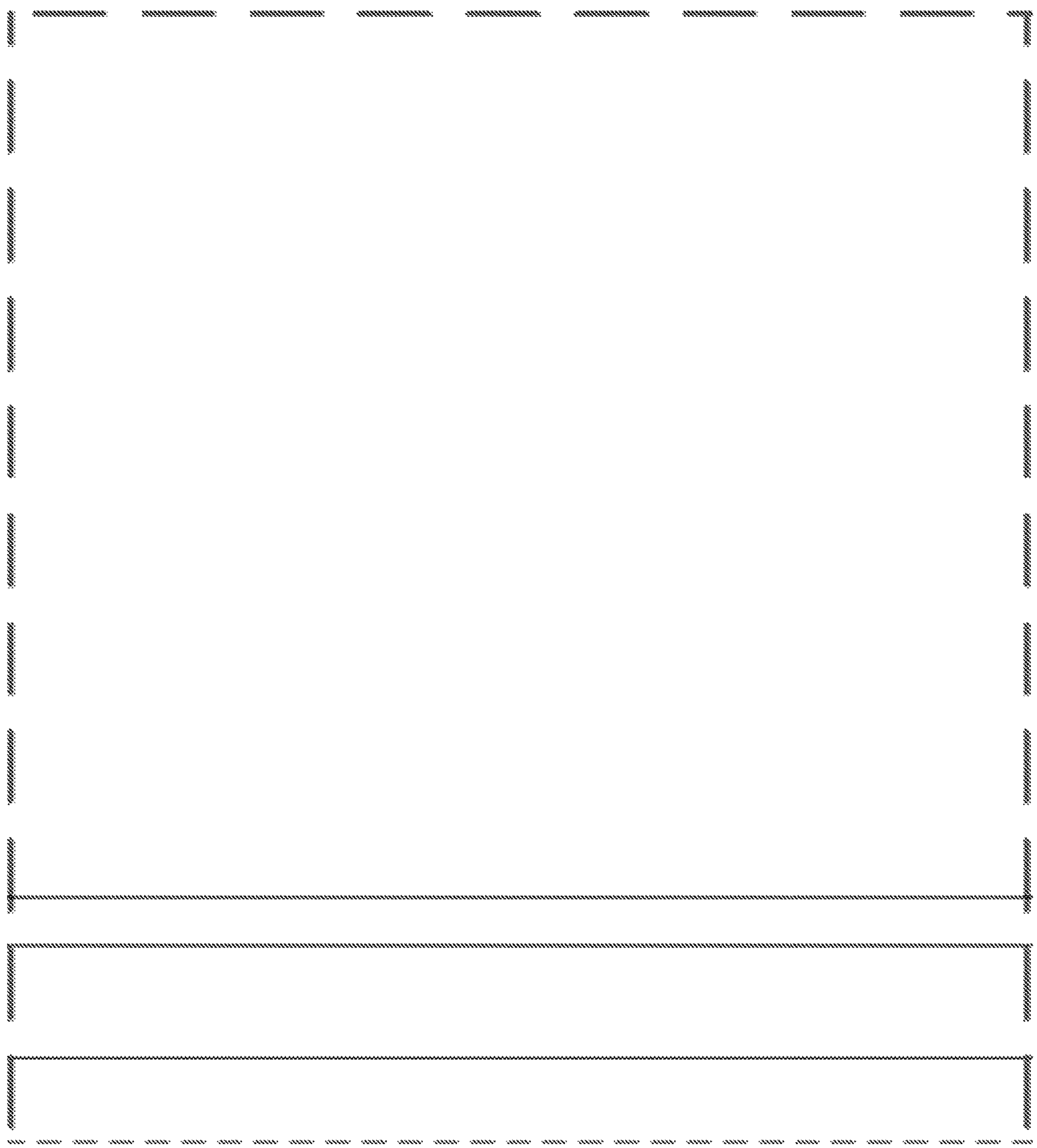
Figure 3D:
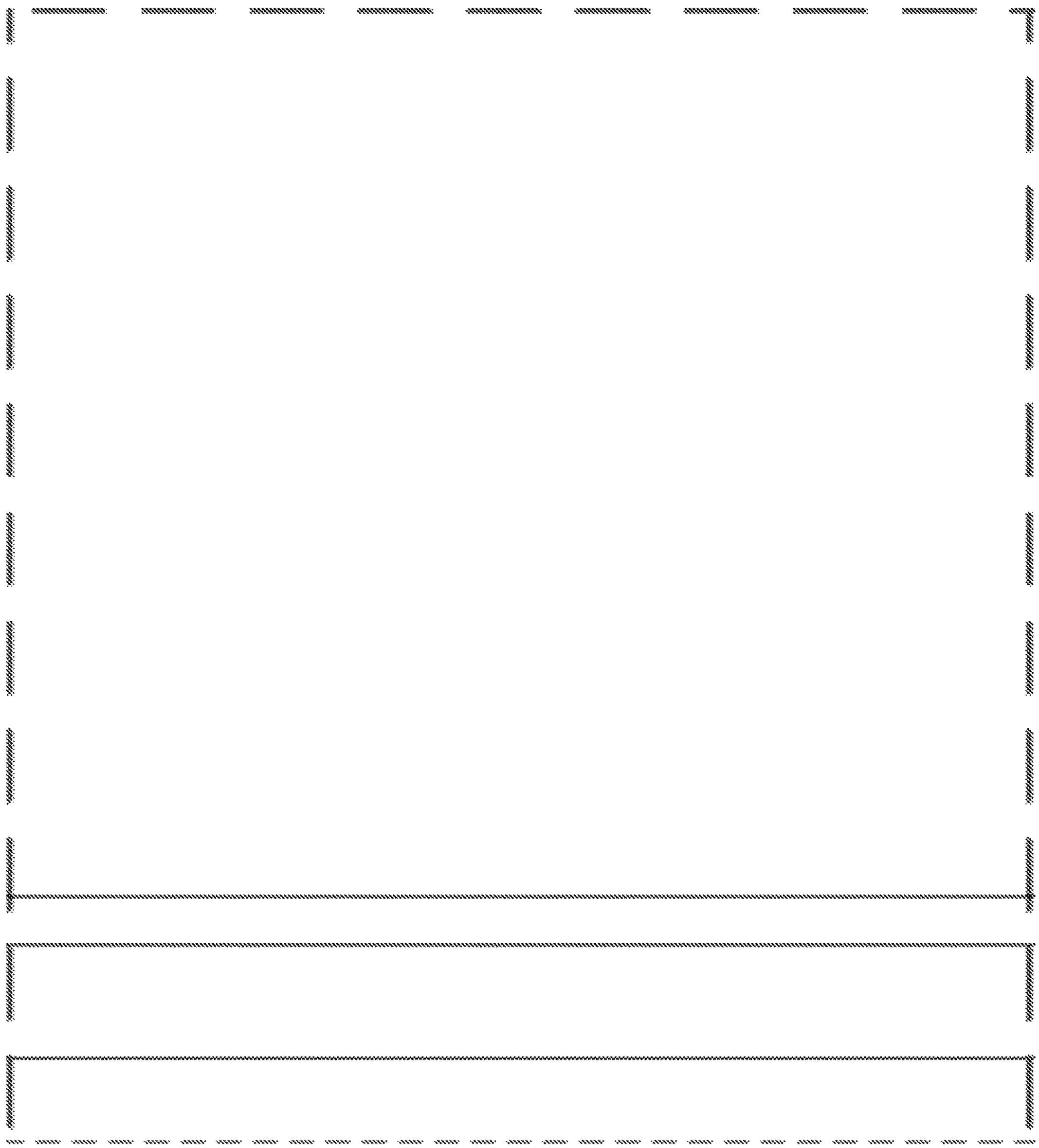
Figure 3D:
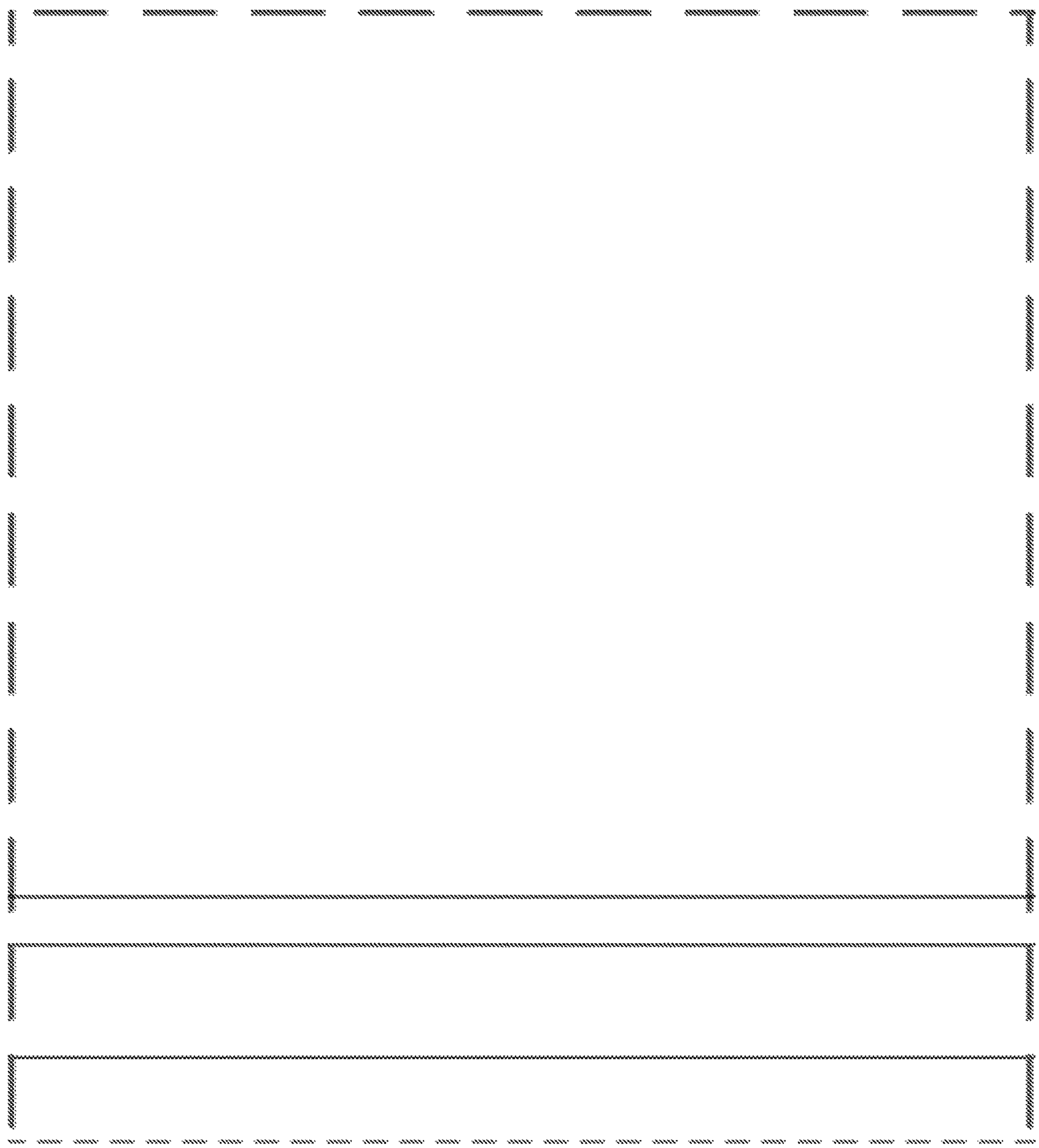
Figure 3D:
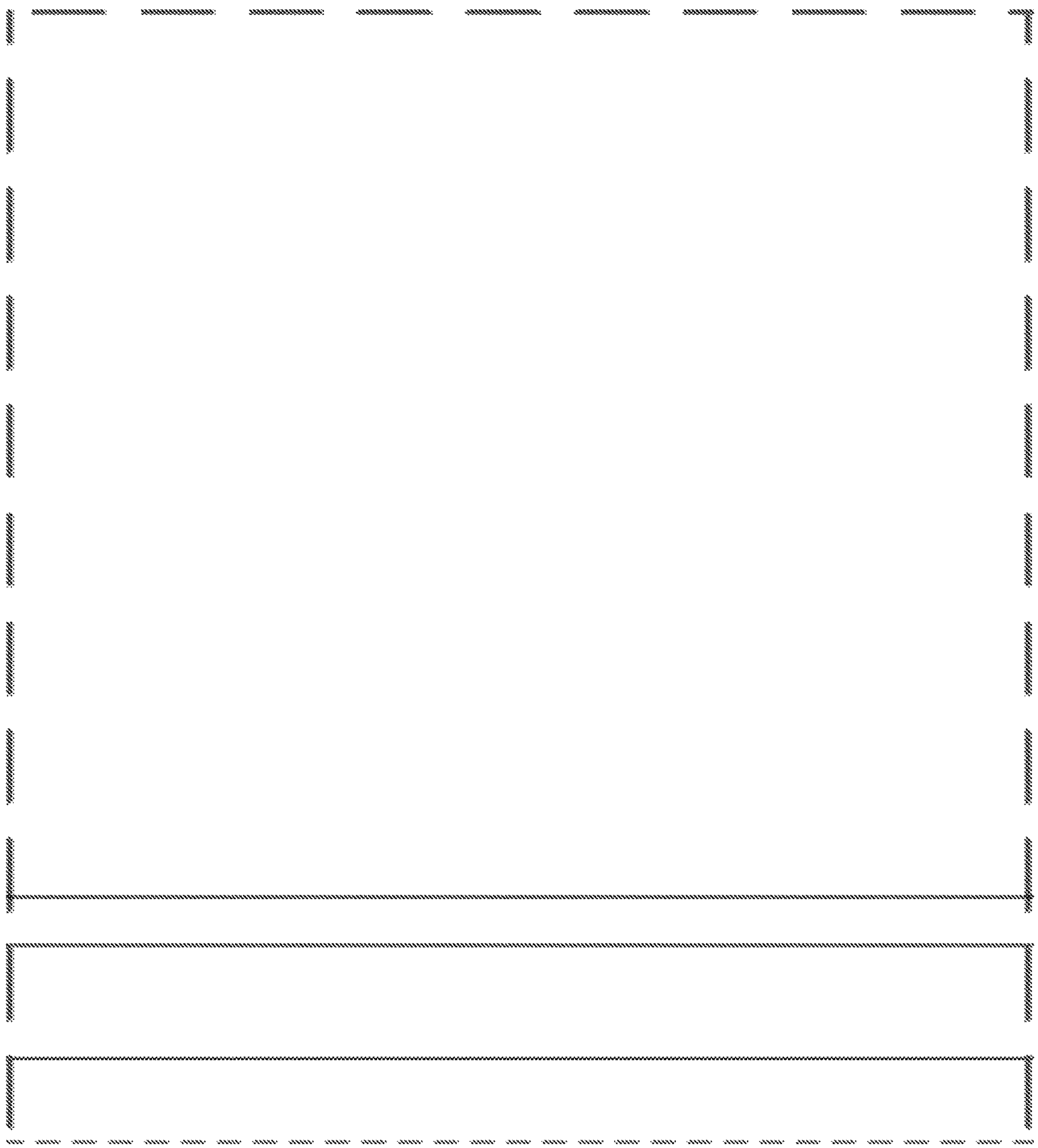
Figure 3D:
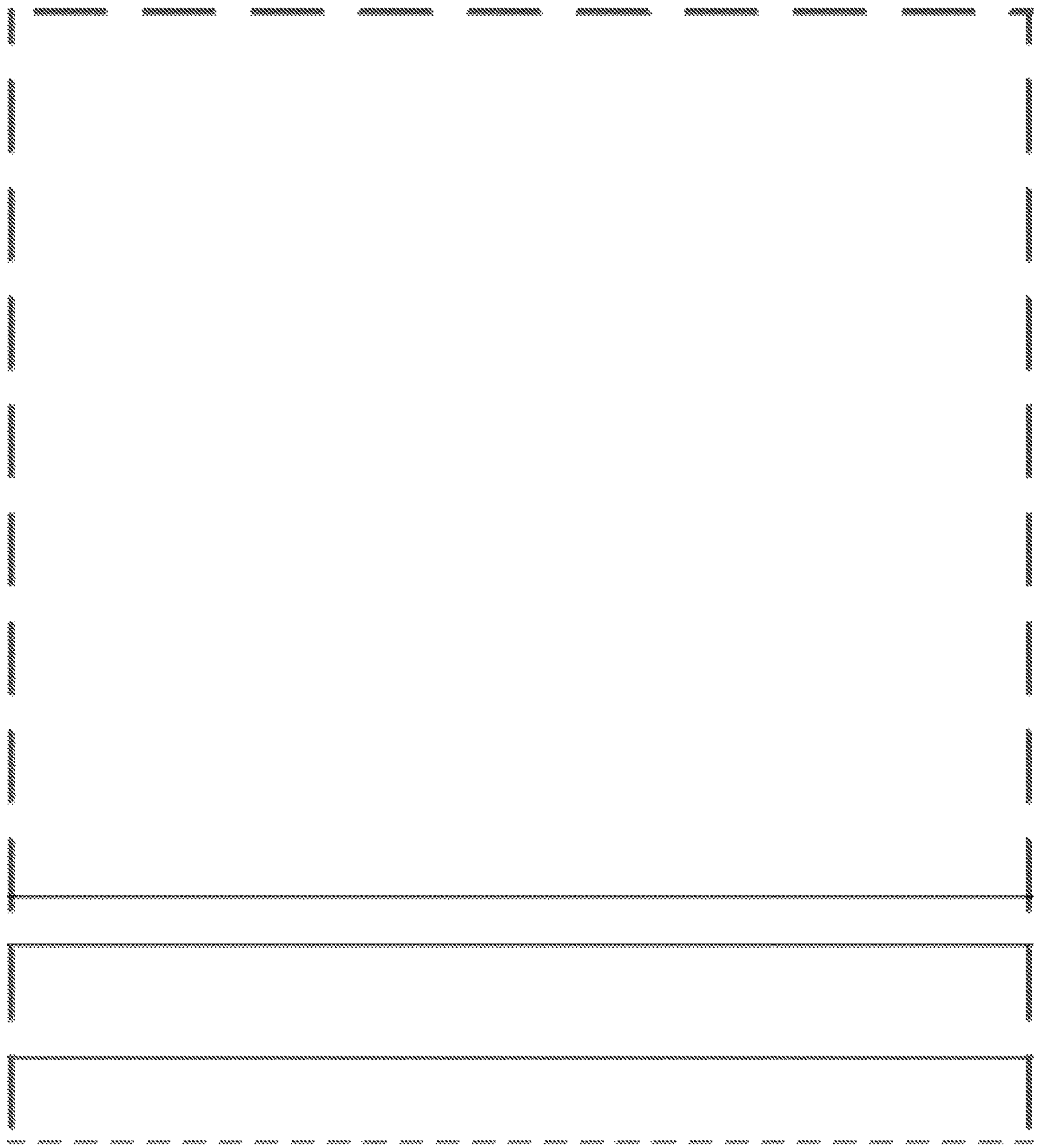
Figure 3D:
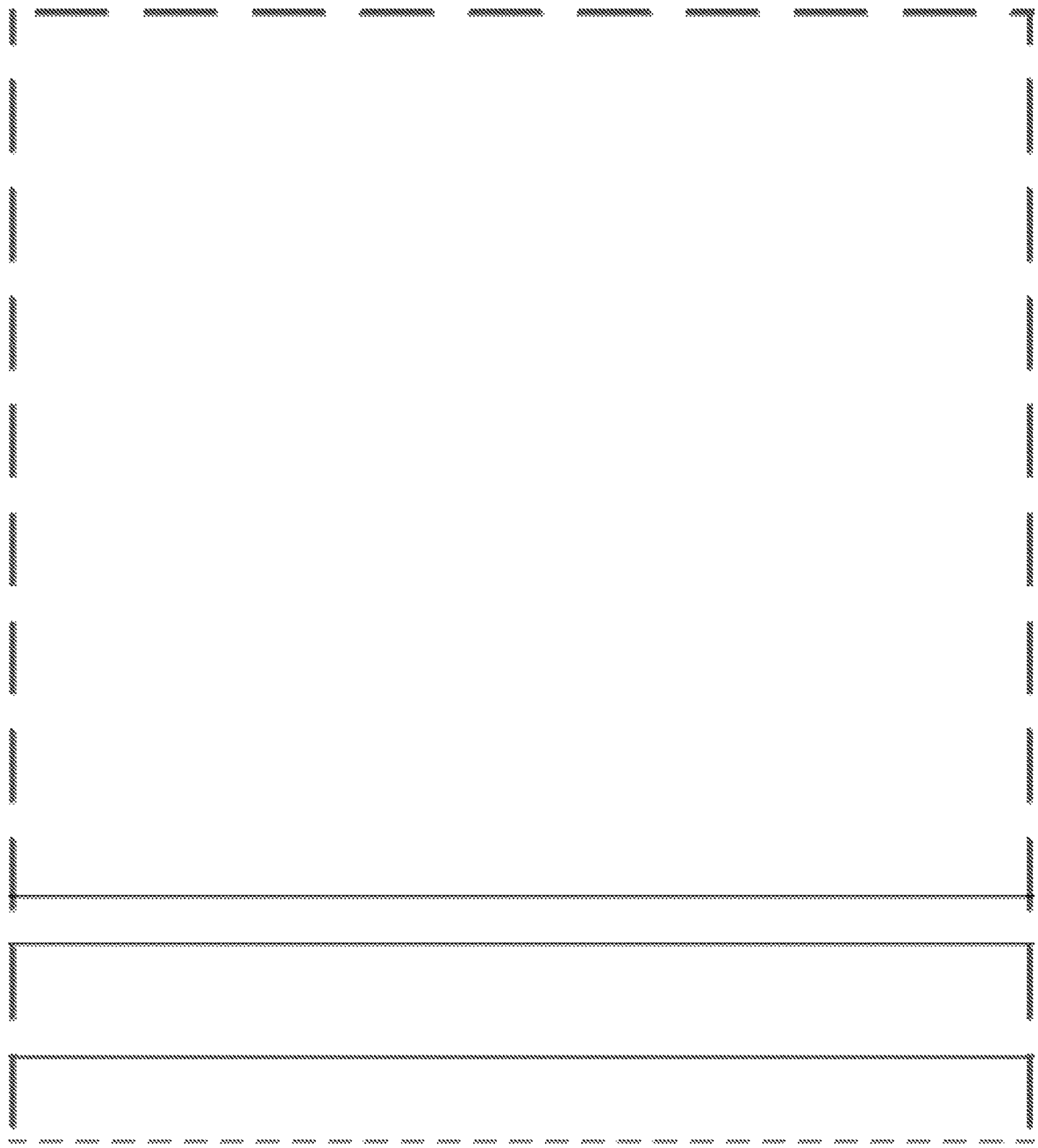
Figure 3D:
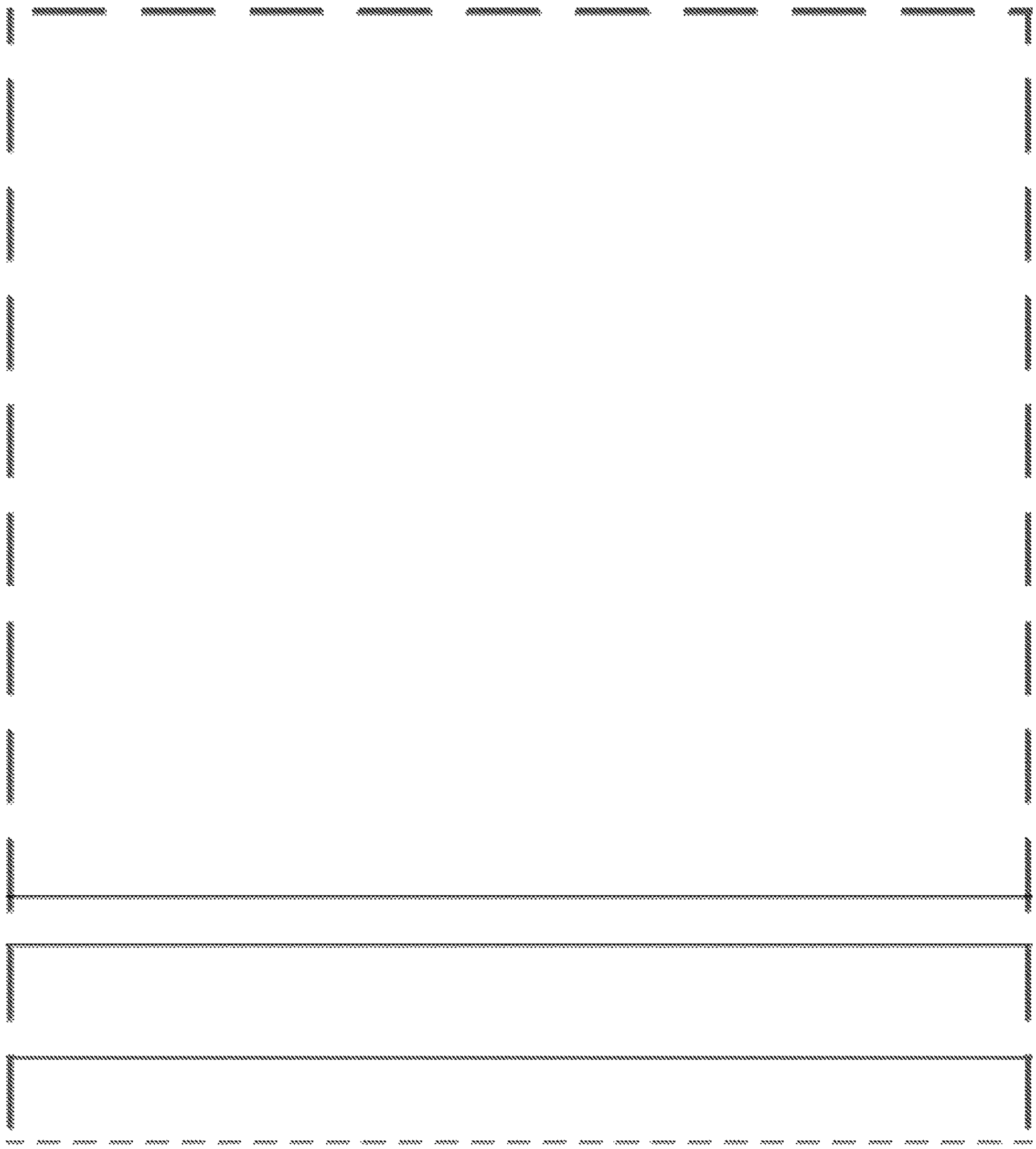
Figure 3D:
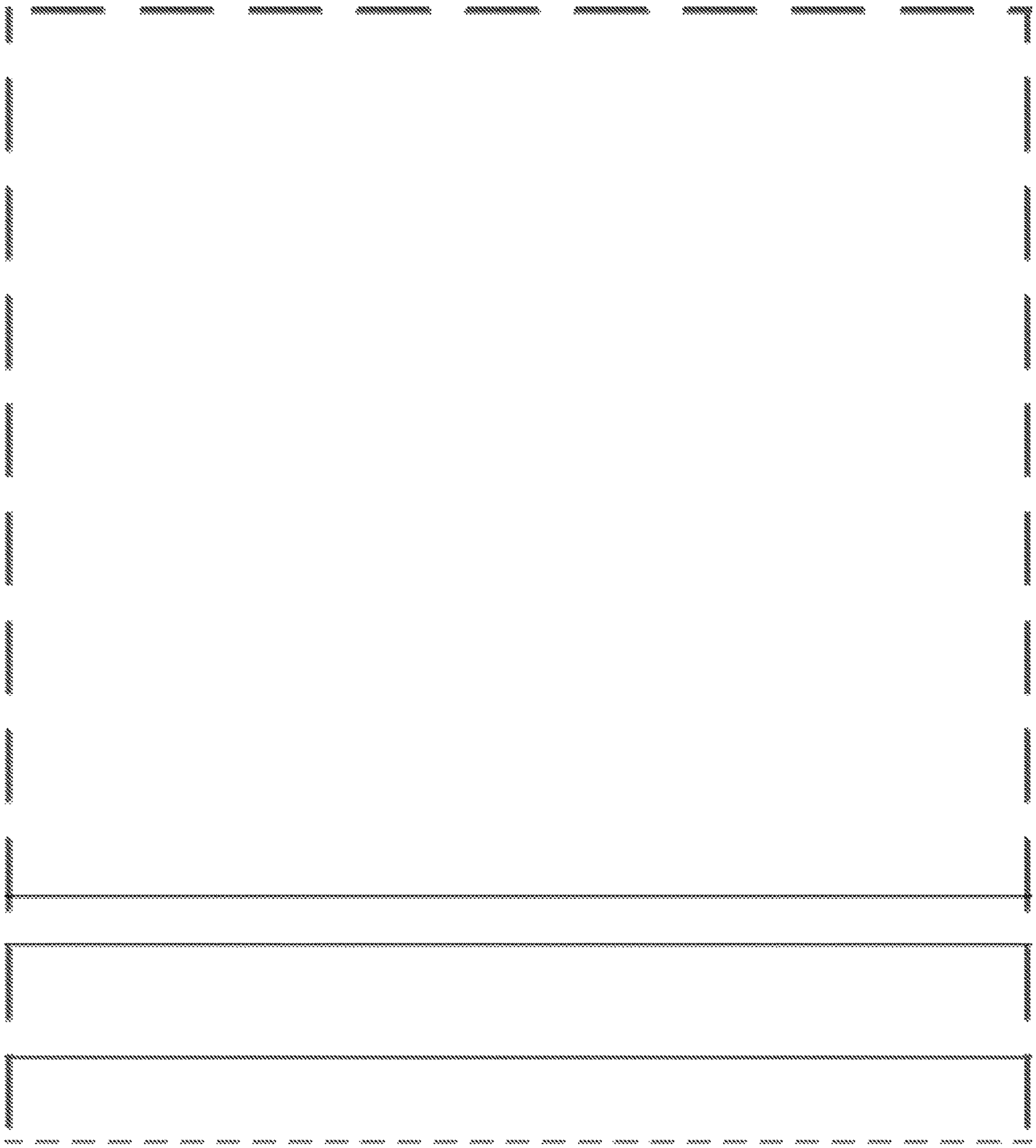
Figure 3D:
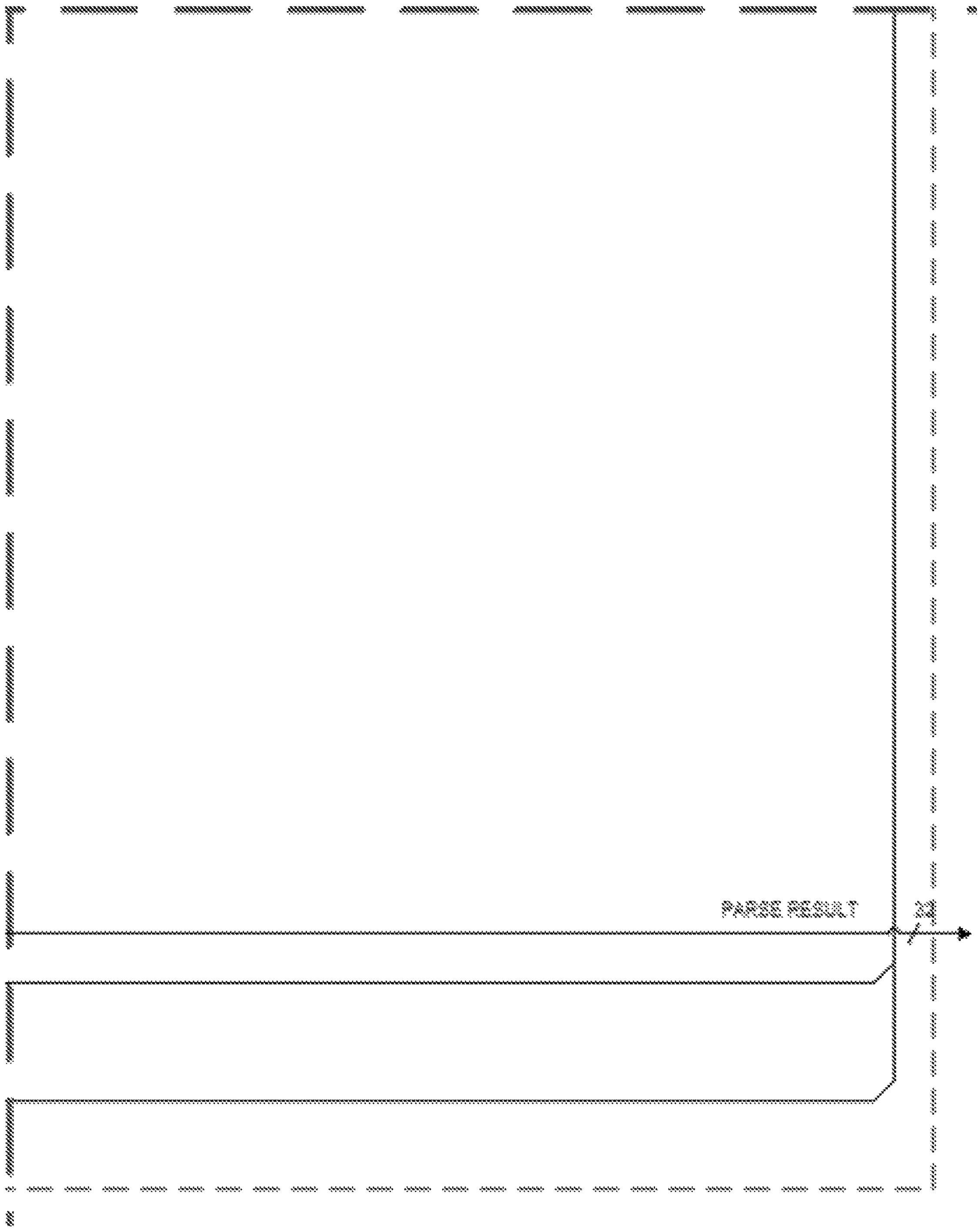
Figure 4A:
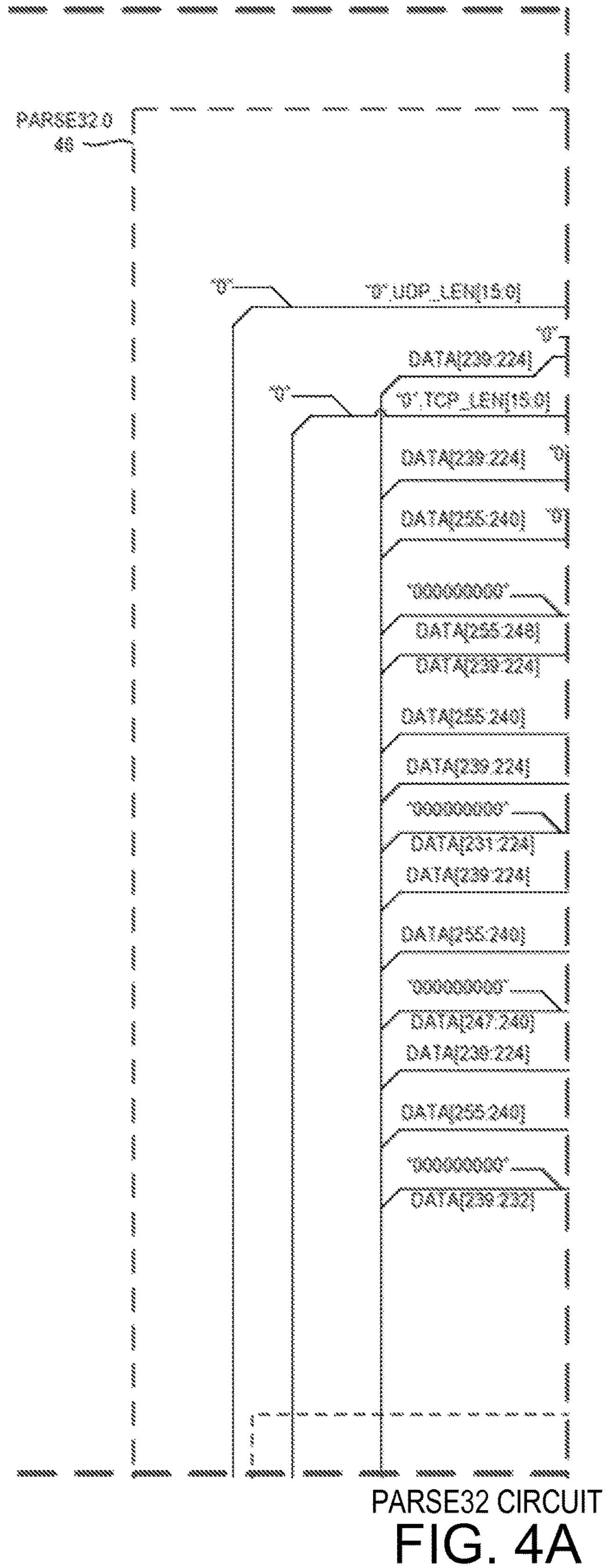
FIG. 4 includes FIG. 4A, FIG. 4B, FIG. 4C, FIG. 4D, FIG. 4E, FIG. 4F, FIG. 4G, FIG. 4H, FIG. 4I, FIG. 4J, FIG. 4K, FIG. 4L, FIG. 4M, FIG. 4N, FIG. 4O, and FIG. 4P, which together form a detailed circuit diagram of the parse32.0 circuit 46 of FIG. 3.
Figure 4B:
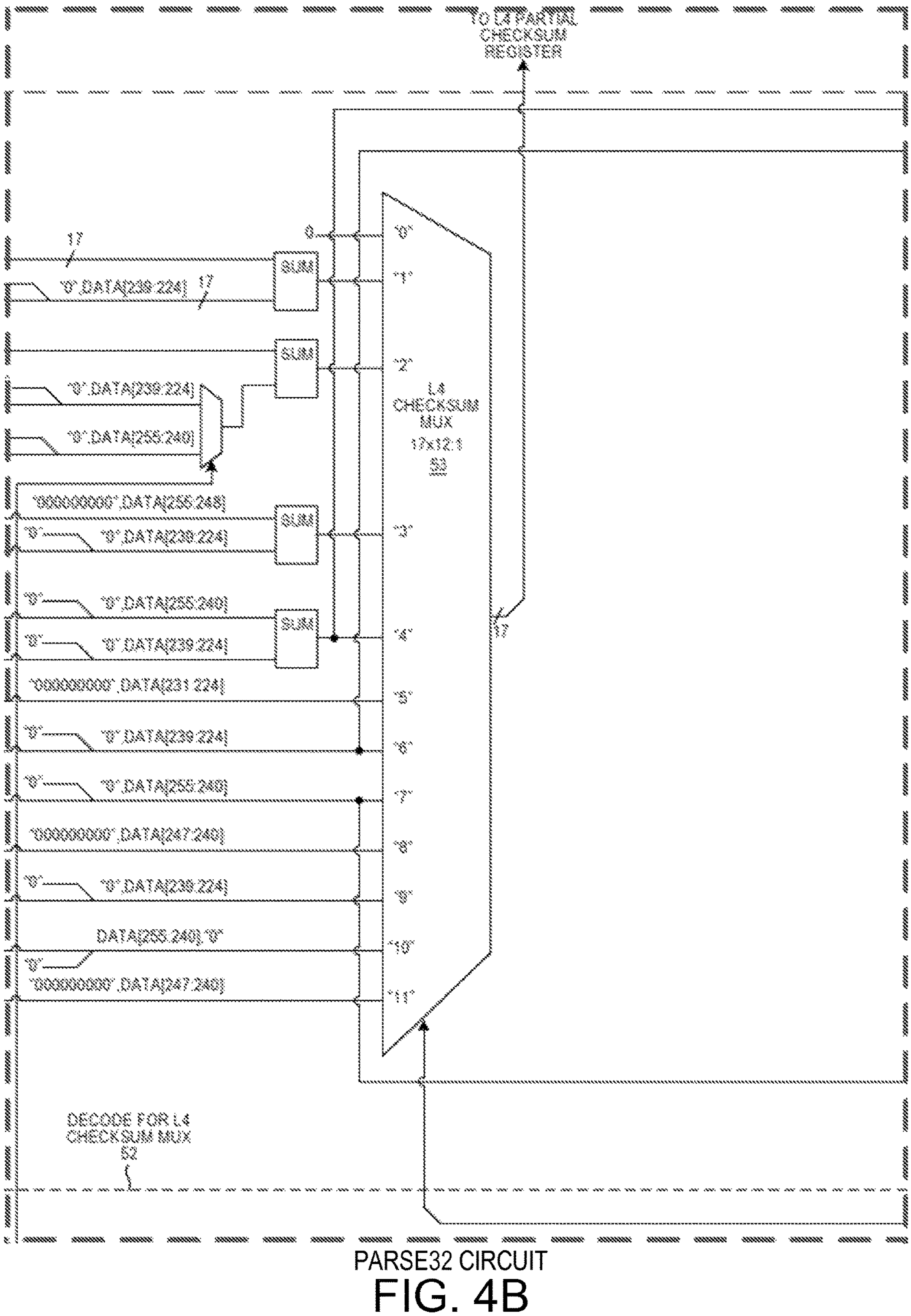
Figure 4C:
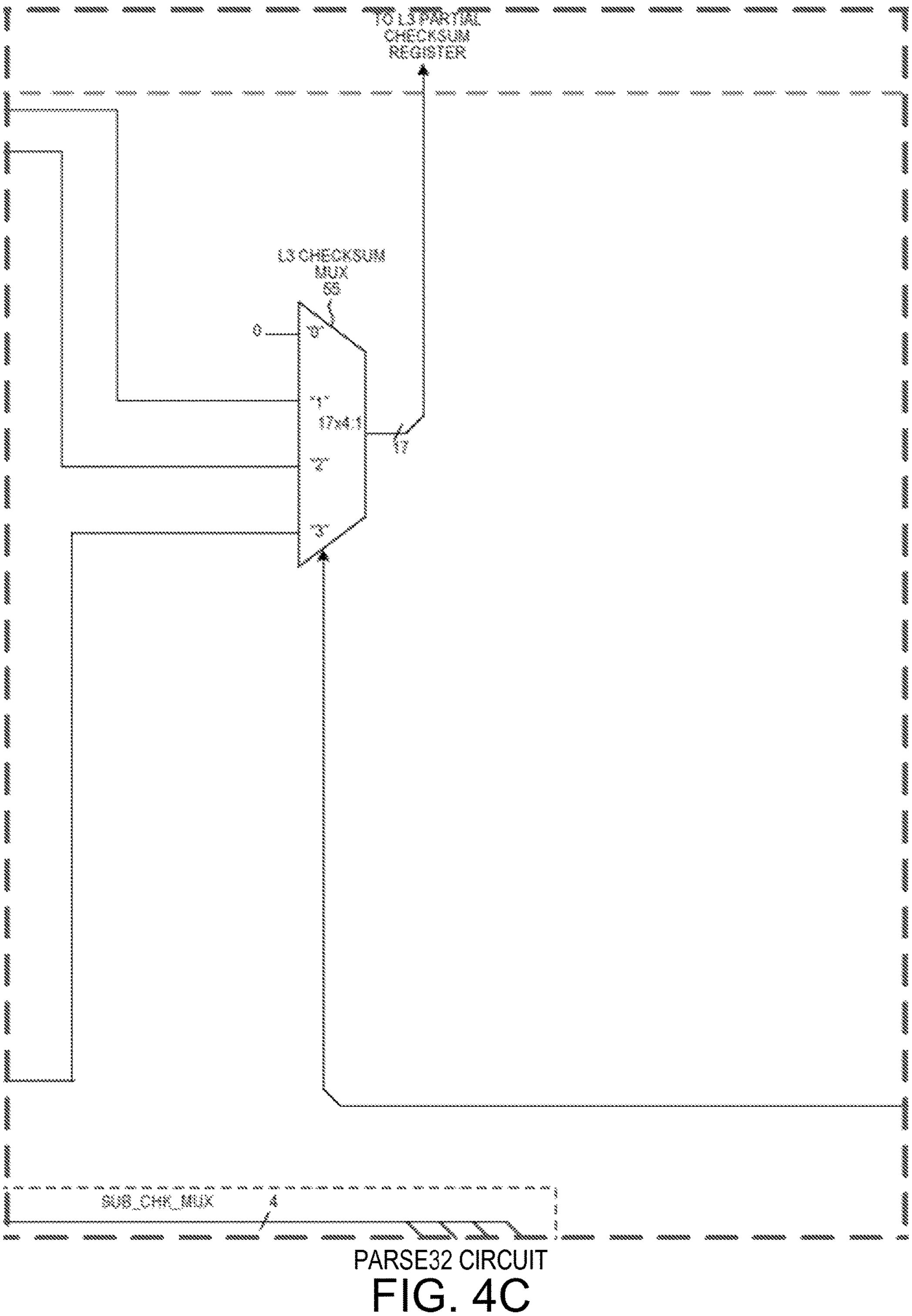
Figure 4D:
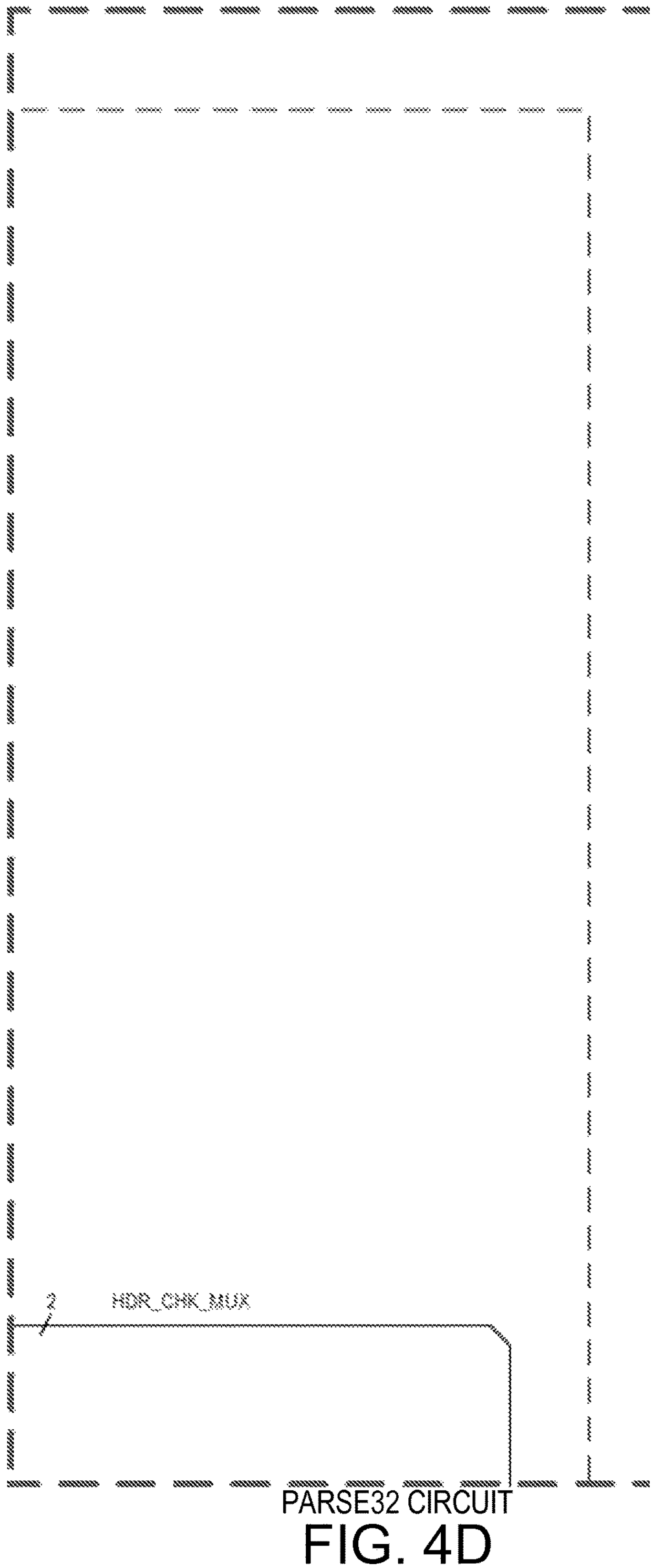
Figure 4E:
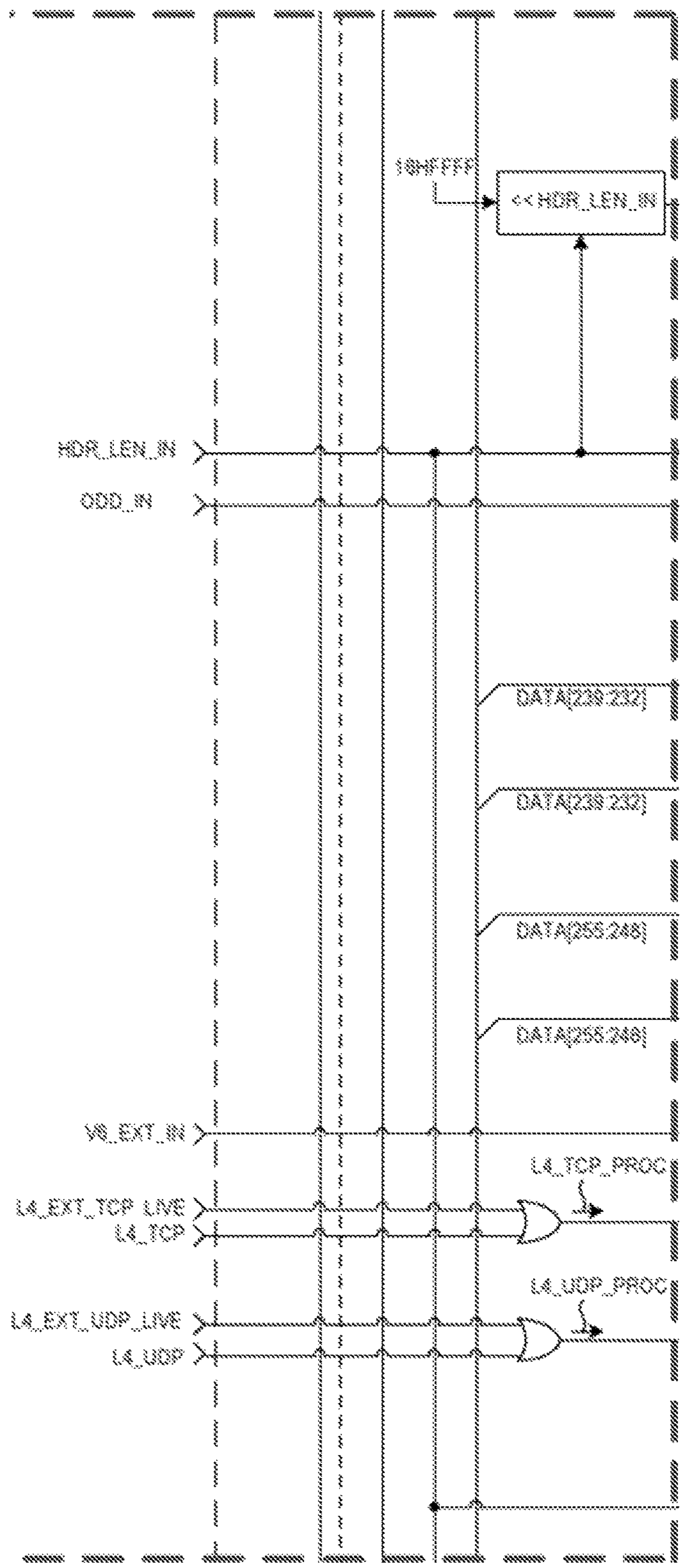
Figure 4F:
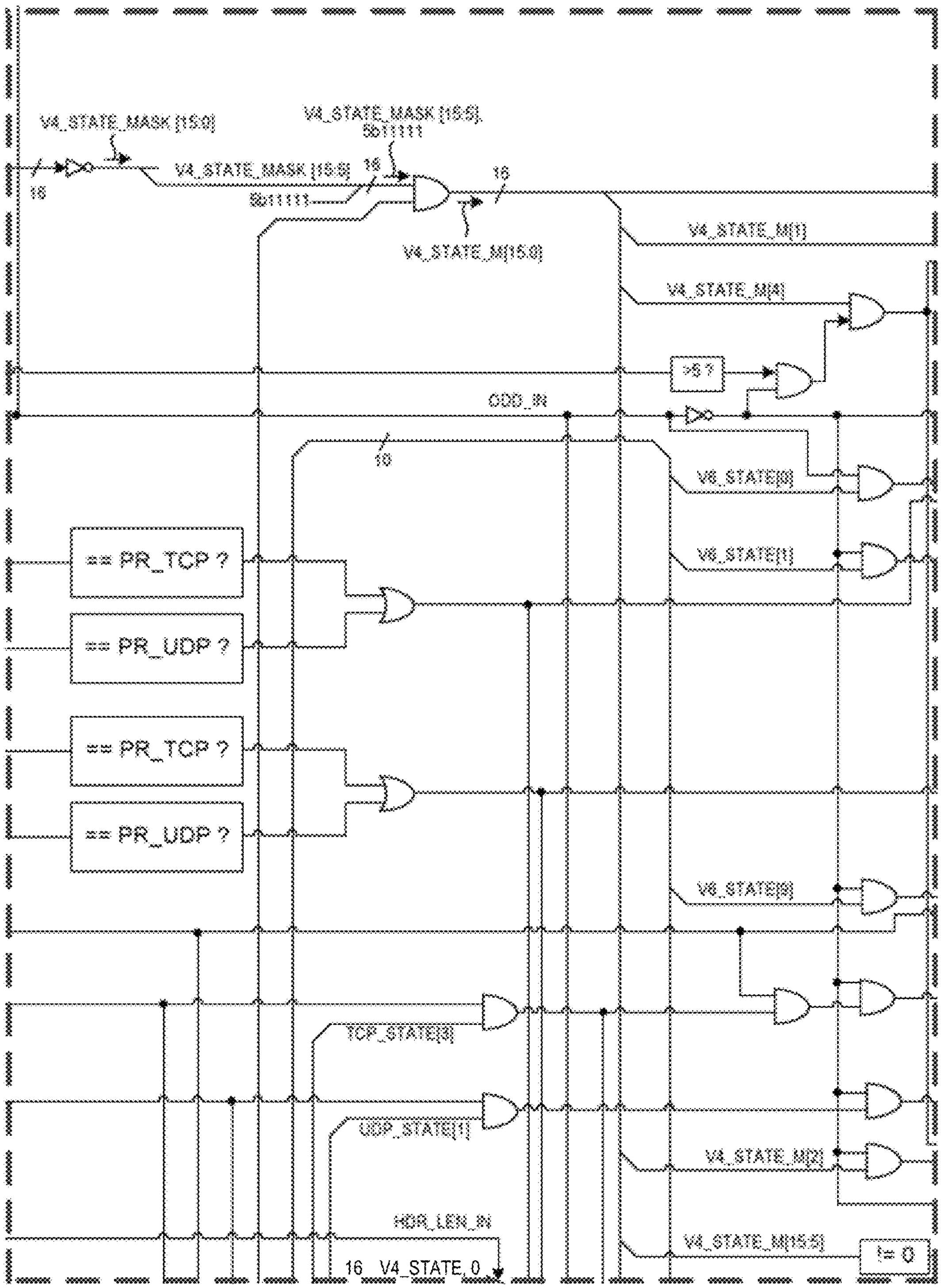
Figure 4G:
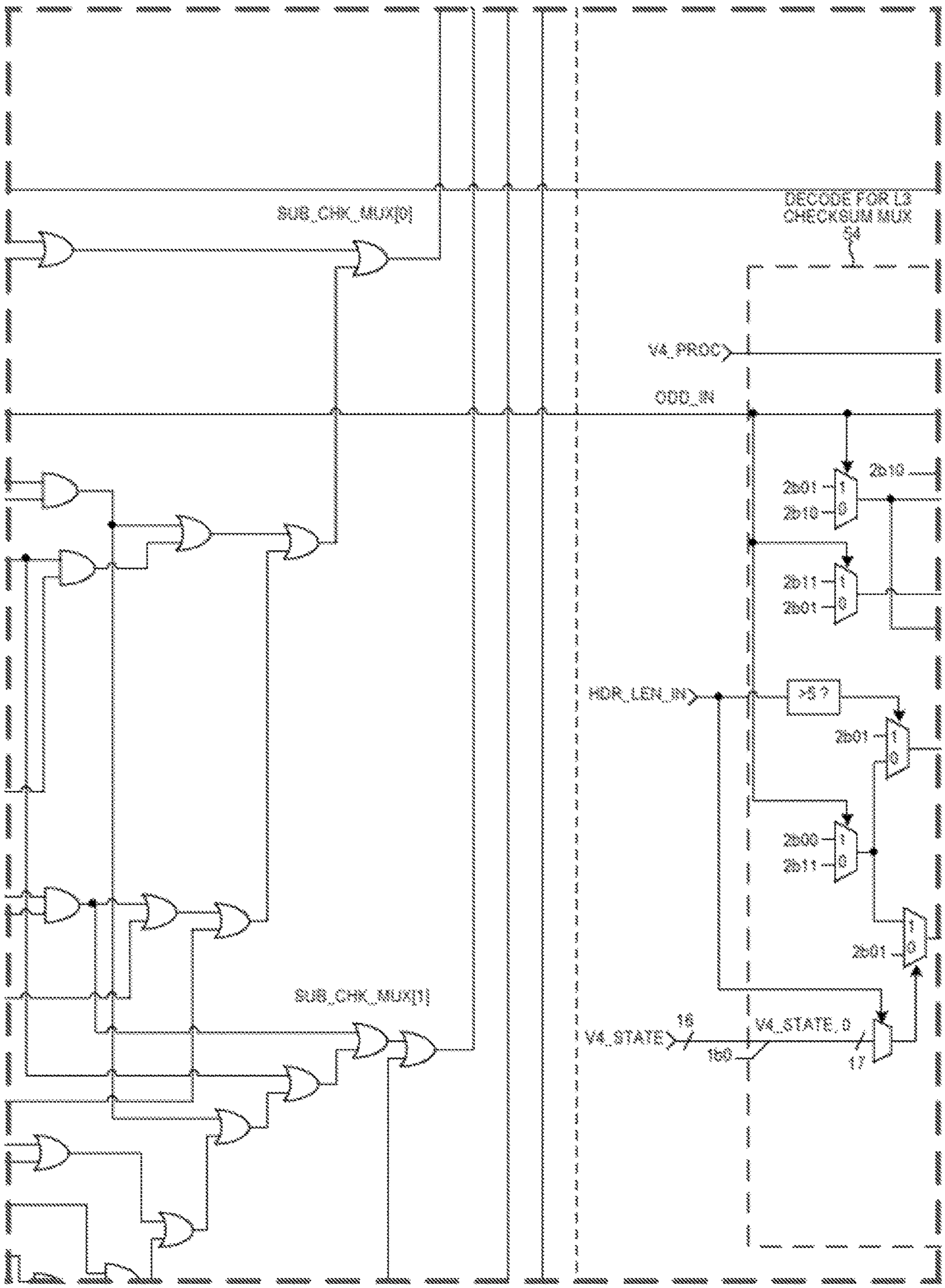
Figure 4H:
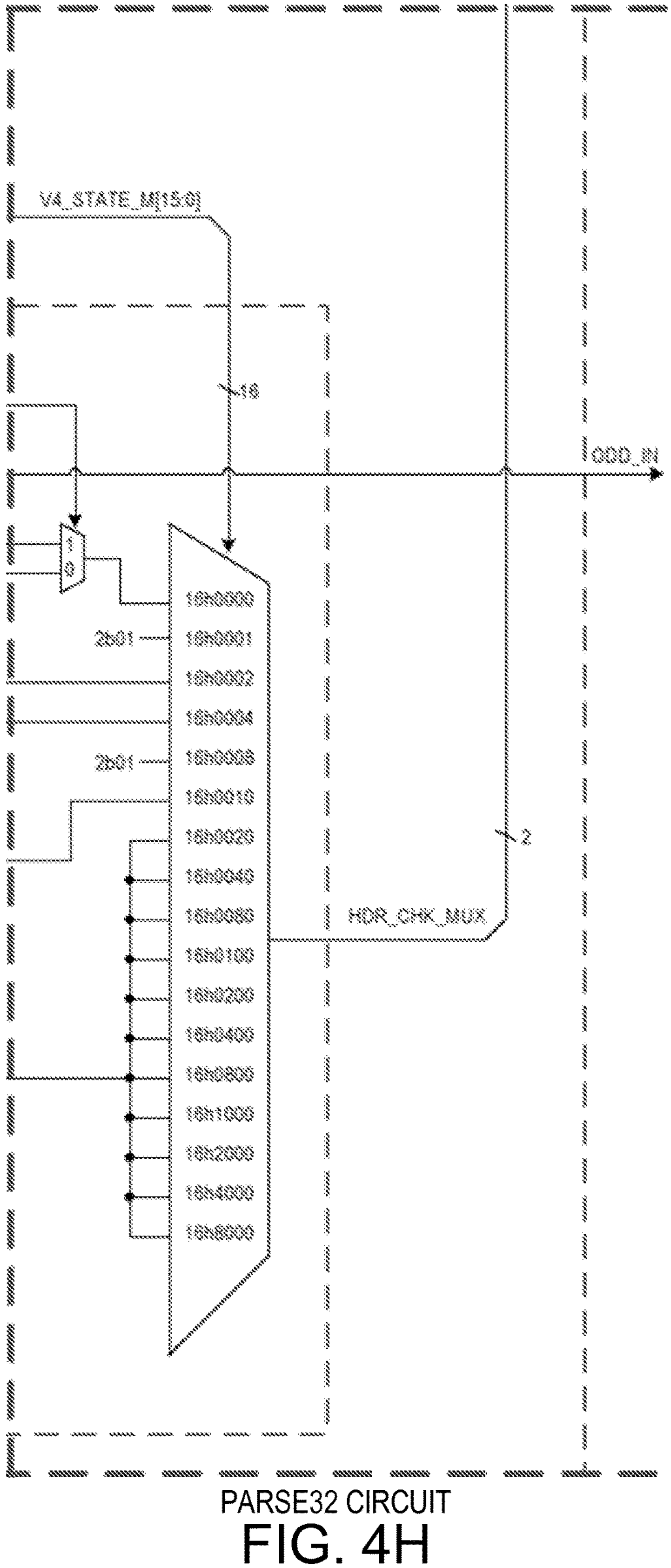
Figure 4I:
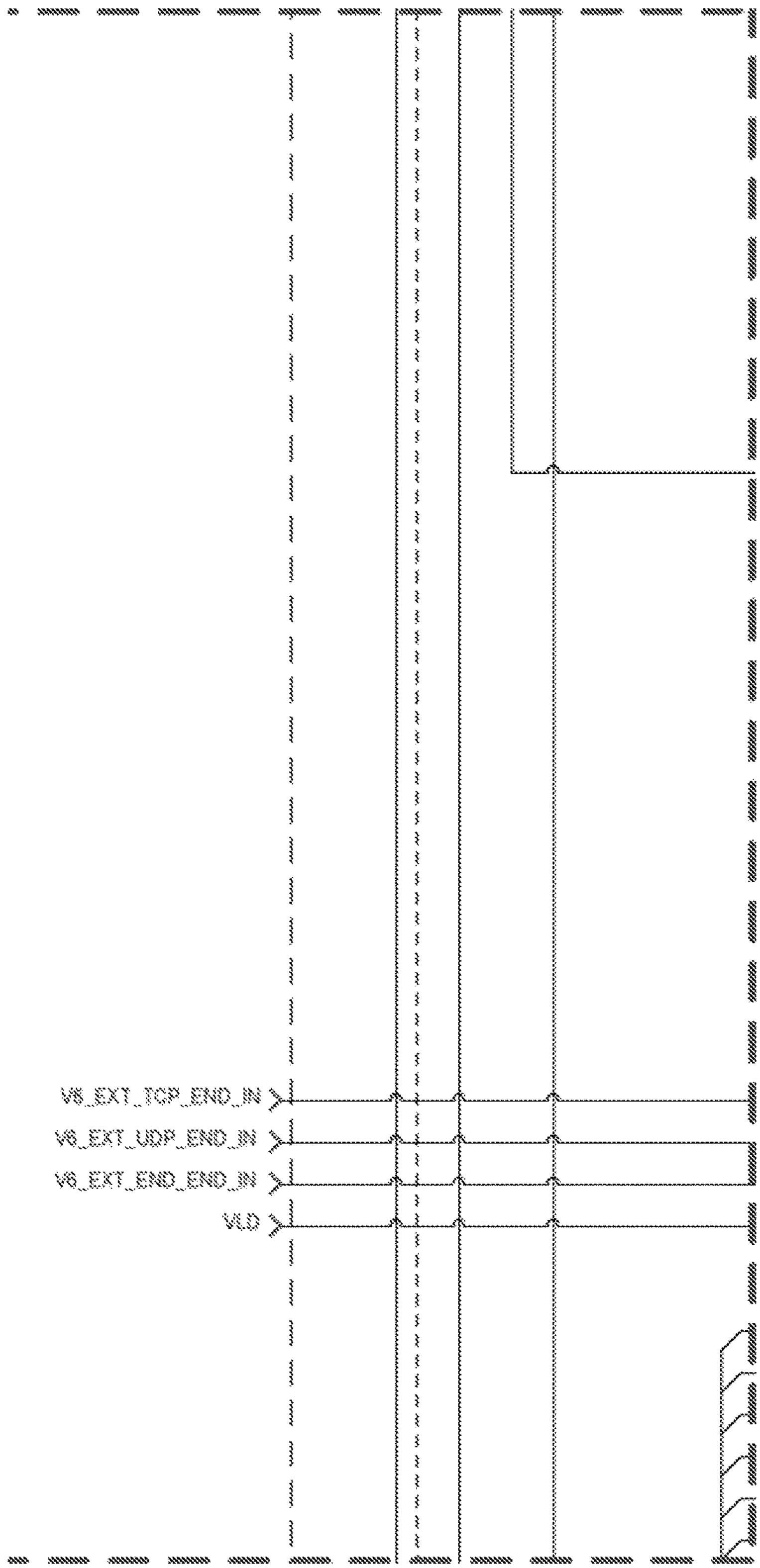
Figure 4J:
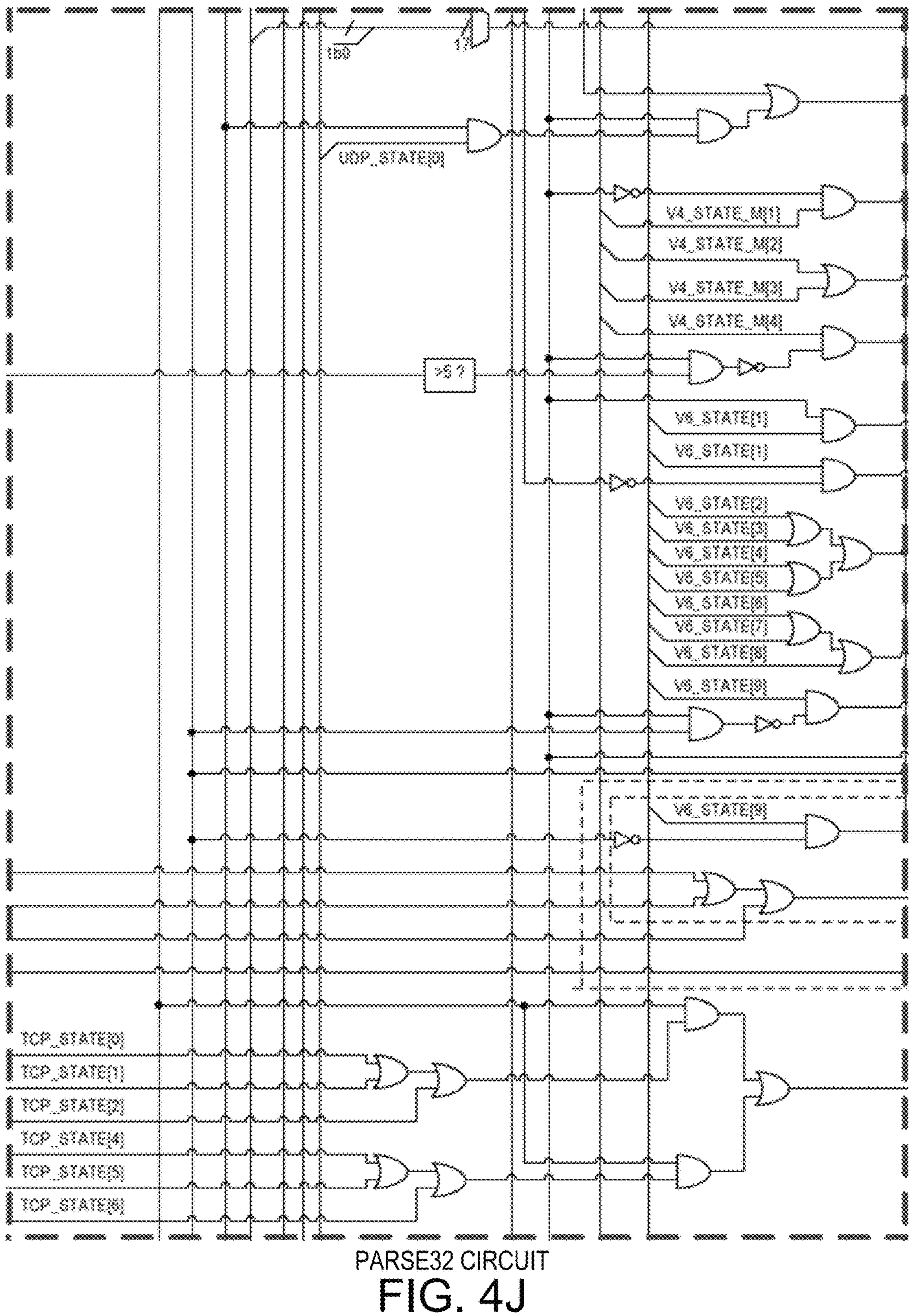
Figure 4K:
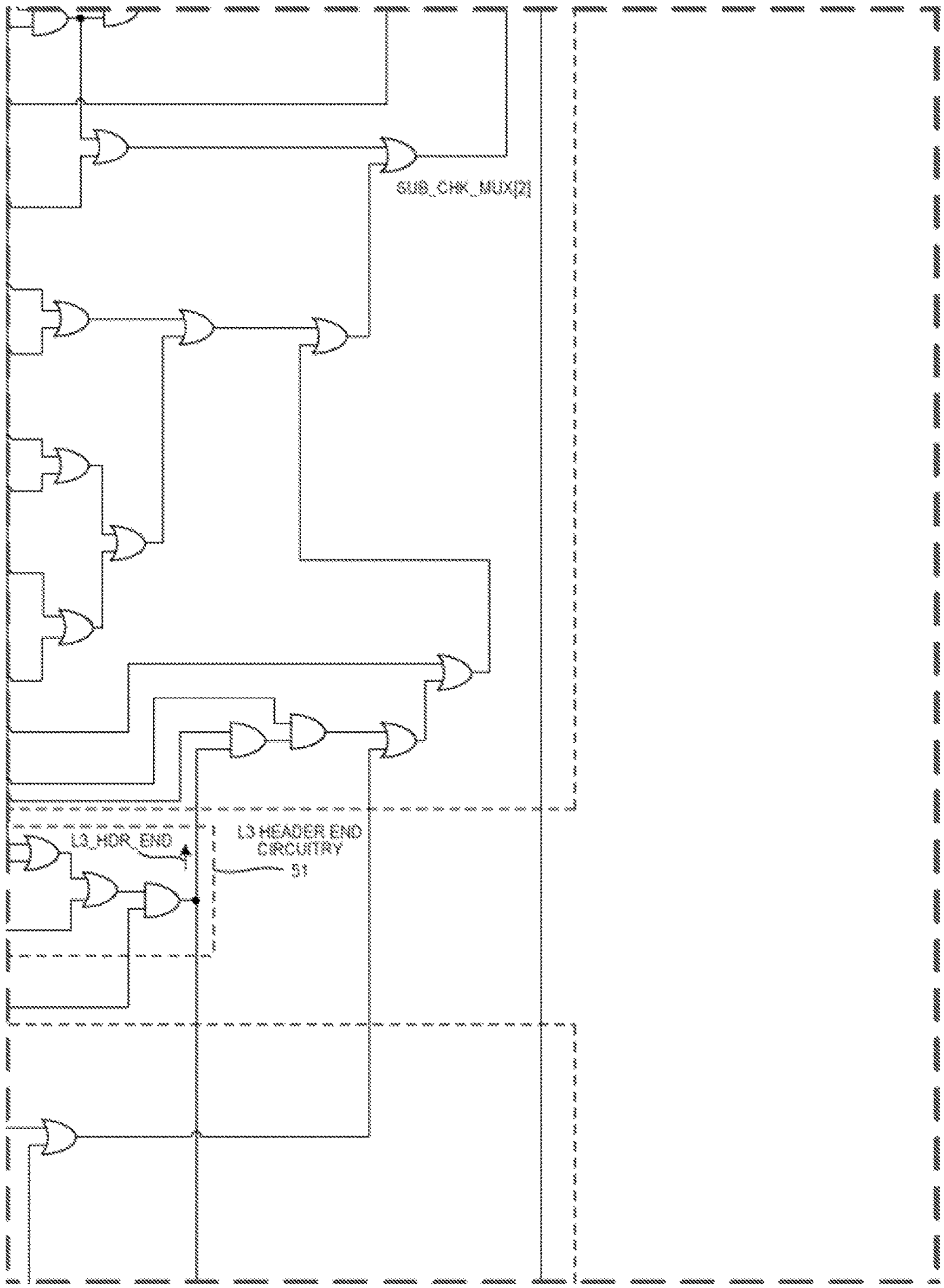
Figure 4L:
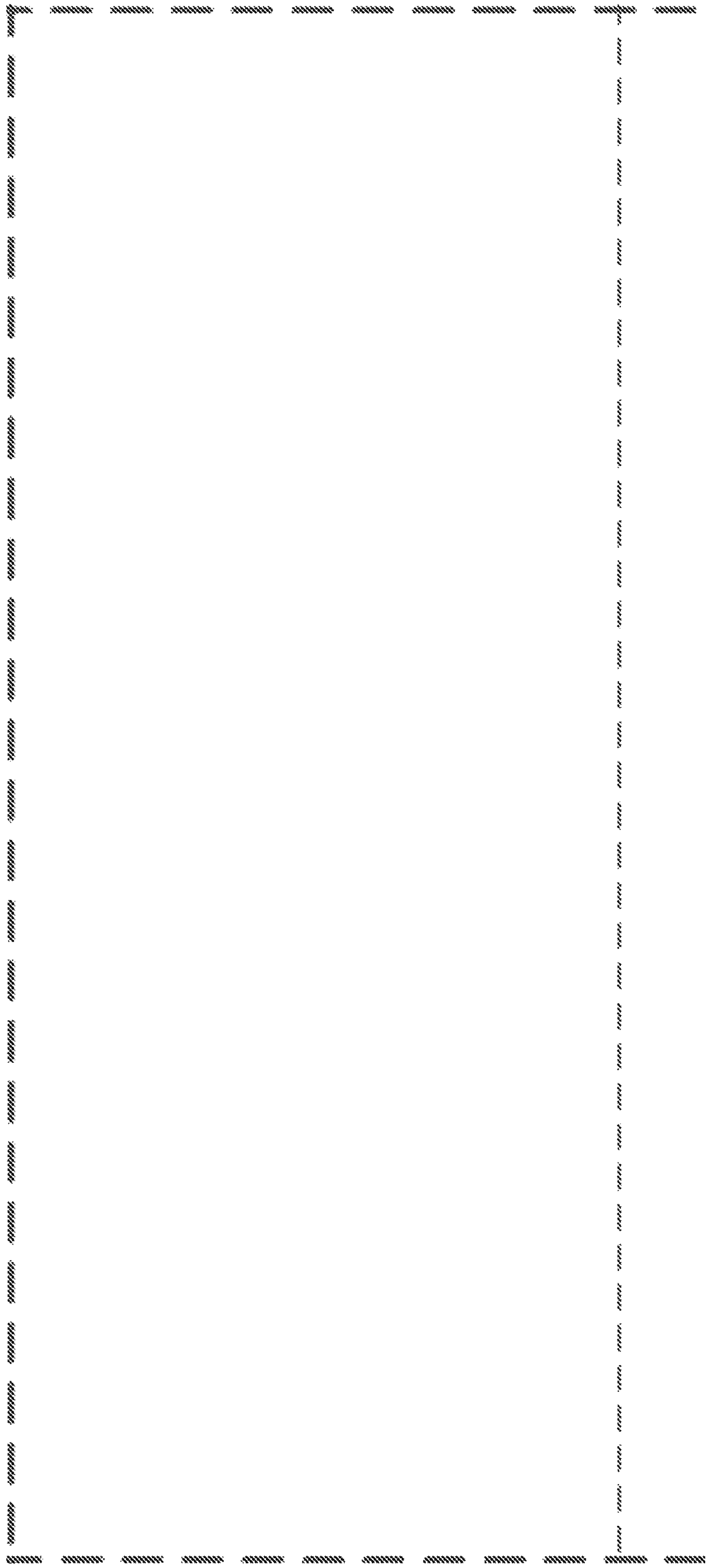
Figure 4M:
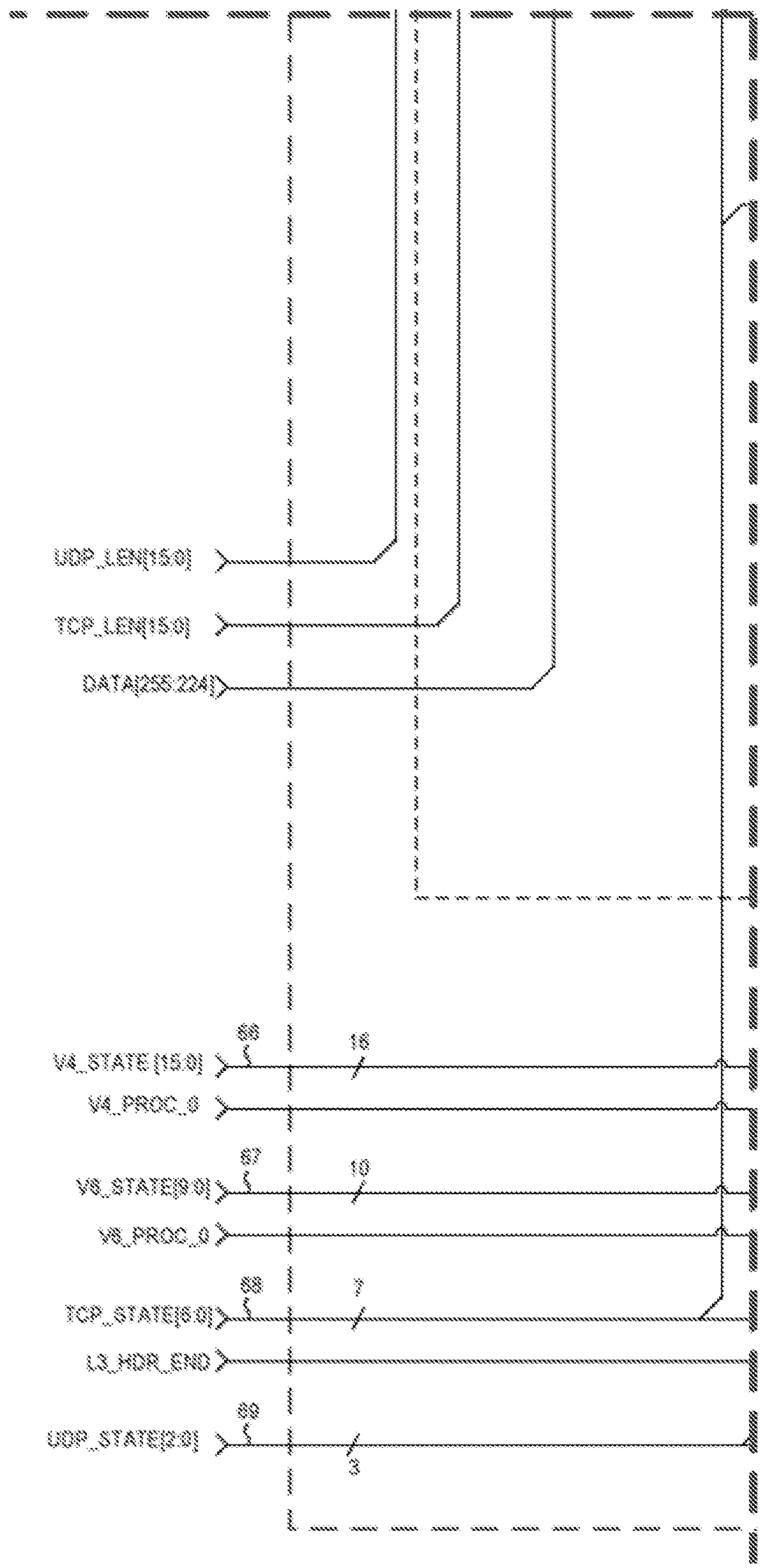
Figure 4N:
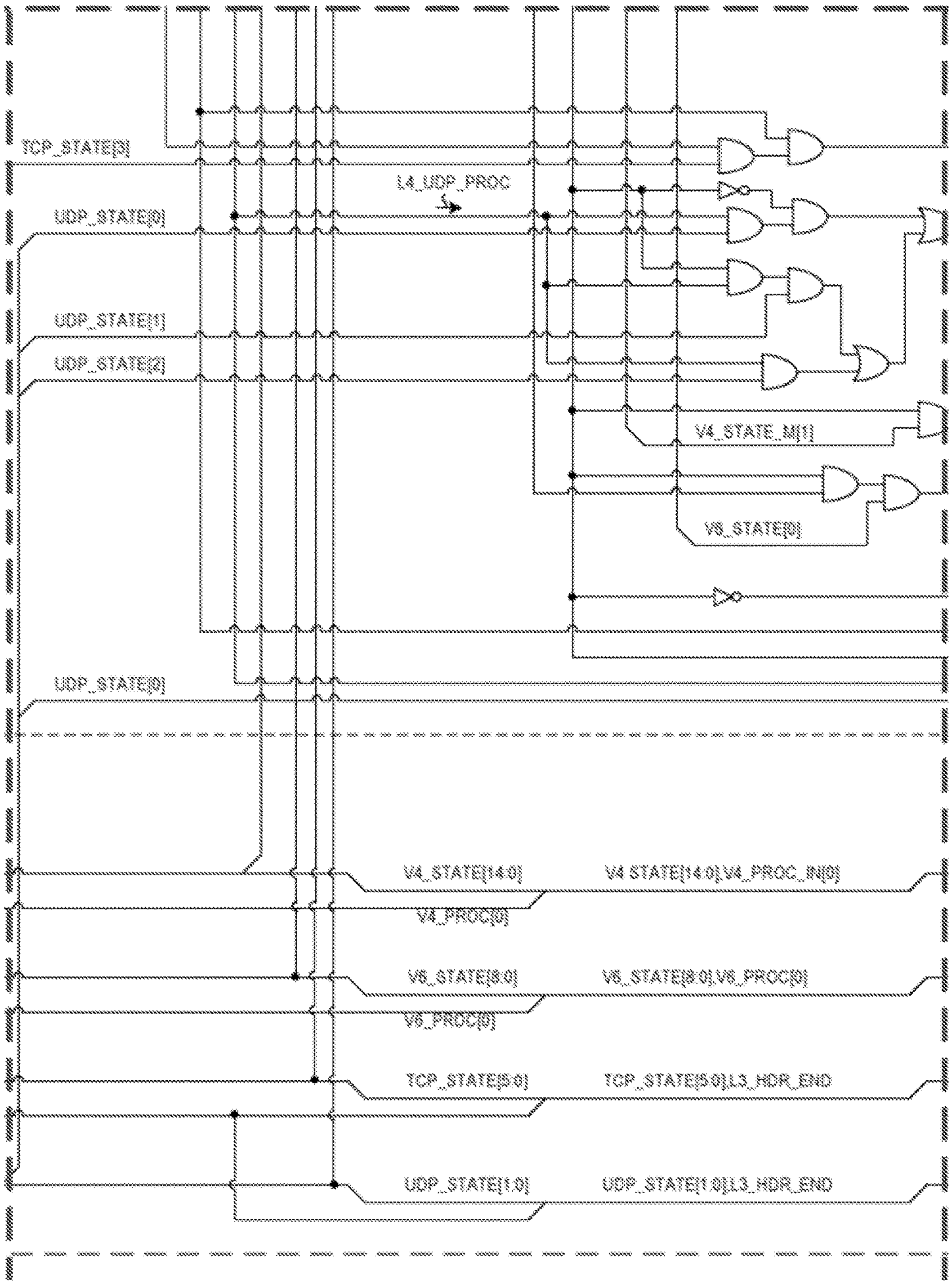
Figure 4O:
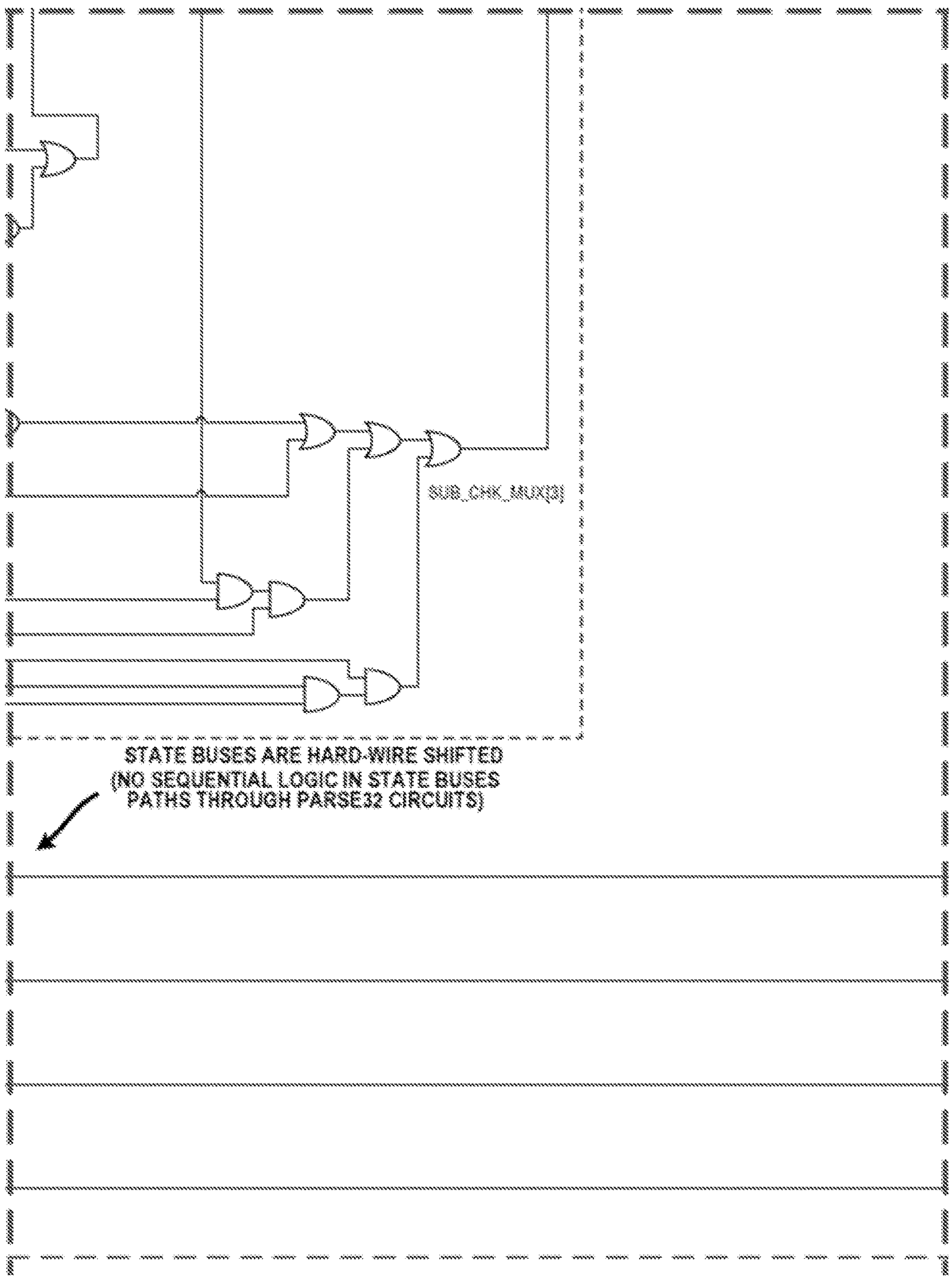
Figure 4P:
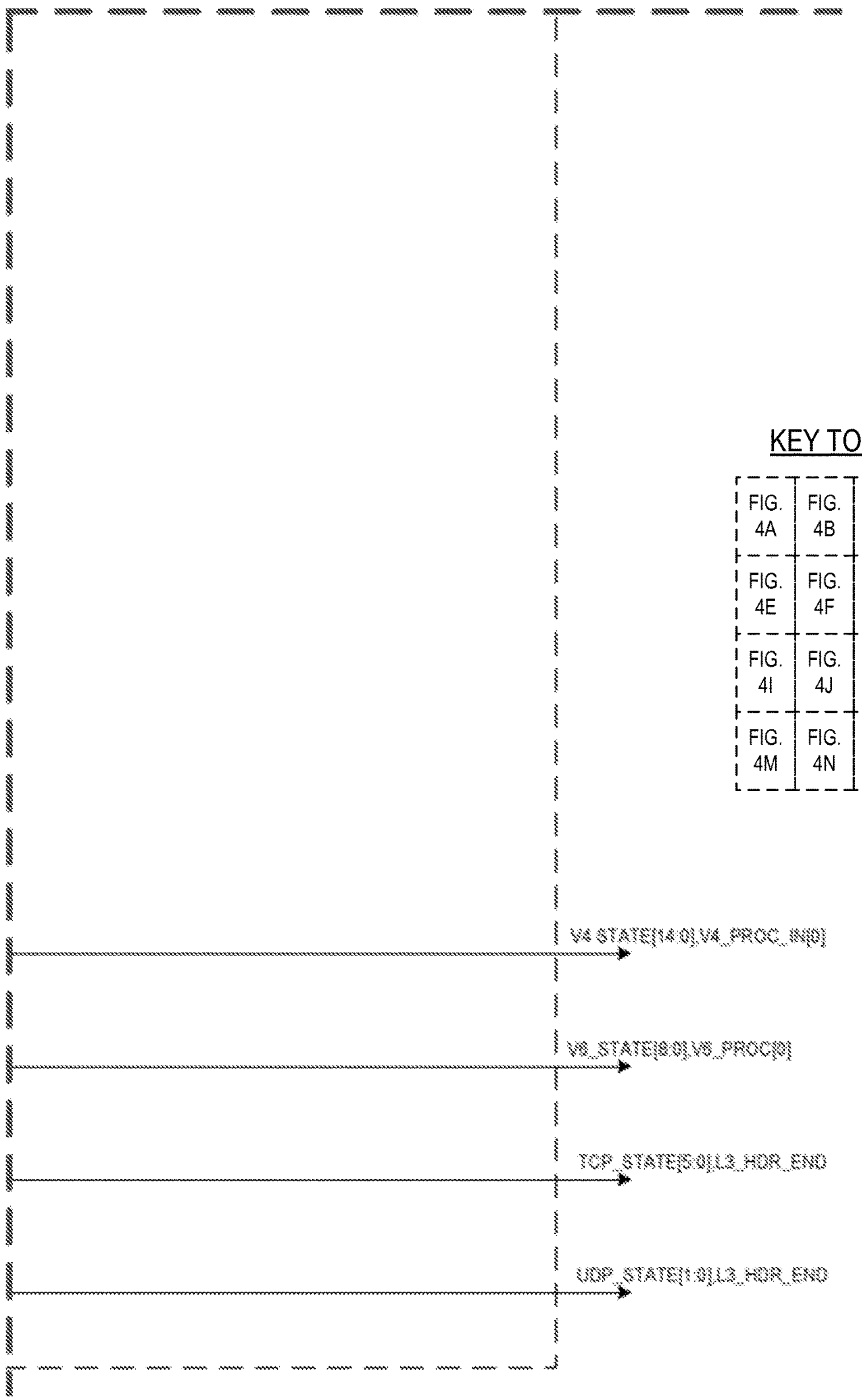
Figure 4P:
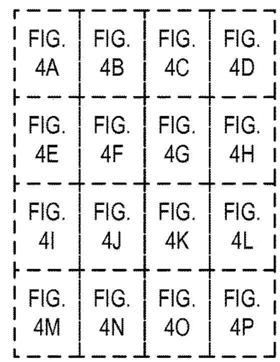
Figure 5A:
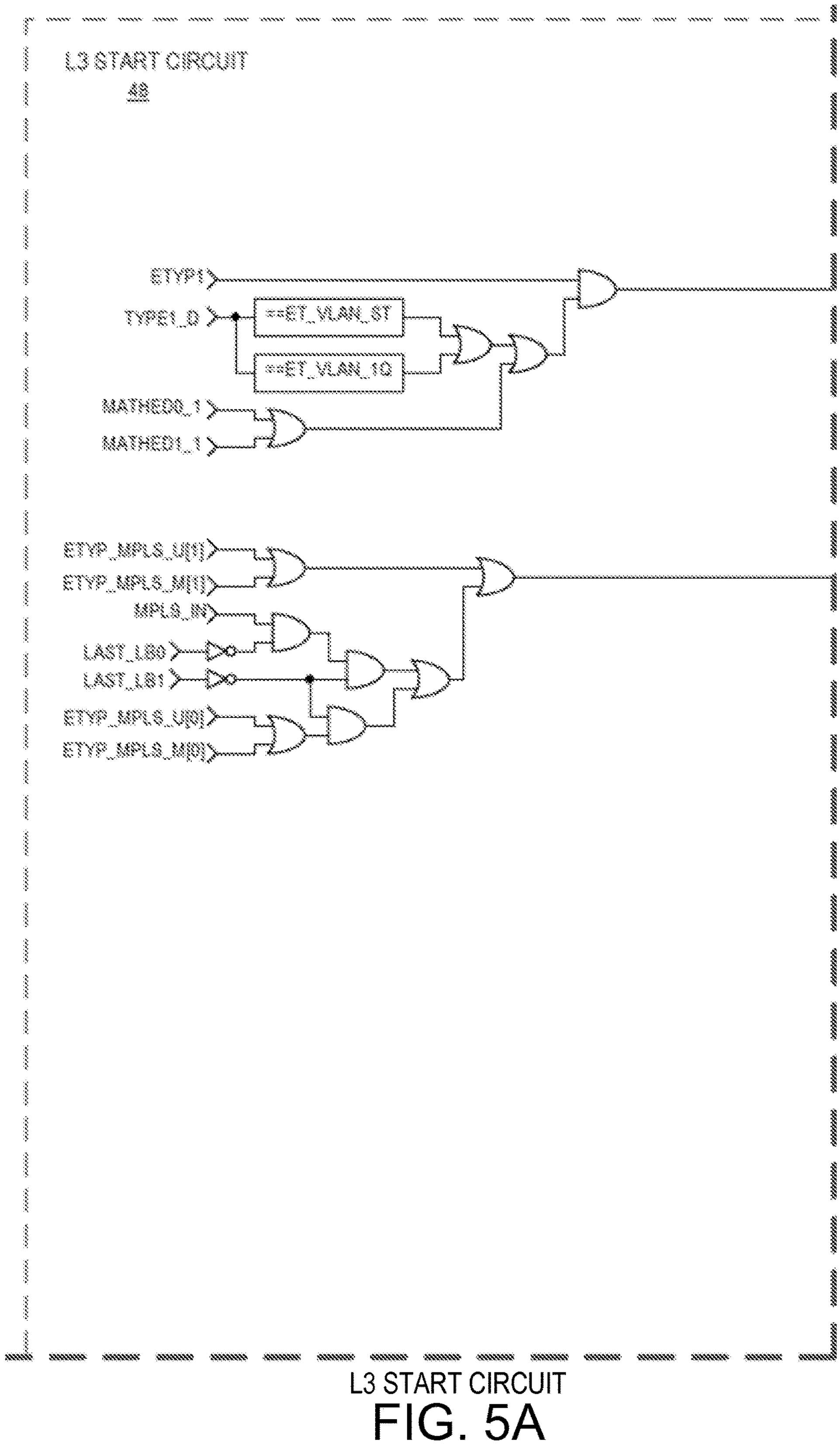
FIG. 5 includes FIG. 5A, FIG. 5B, FIG. 5C, FIG. 5D, FIG. 5E, FIG. 5F, FIG. 5G, and FIG. 5H, which together form a detailed circuit diagram of the L3 start circuit 48 shown in FIG. 3.
Figure 5B:
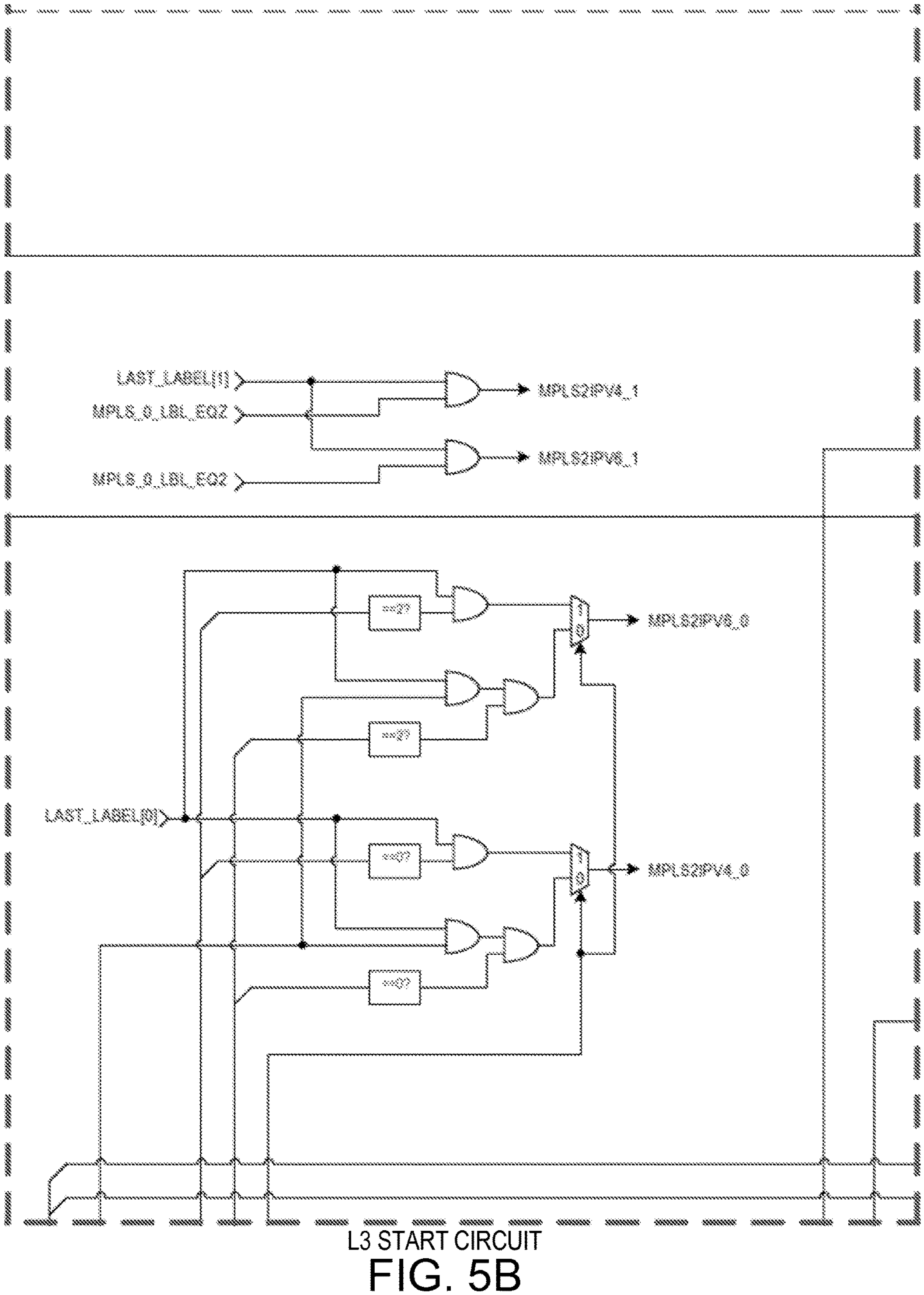
Figure 5C:
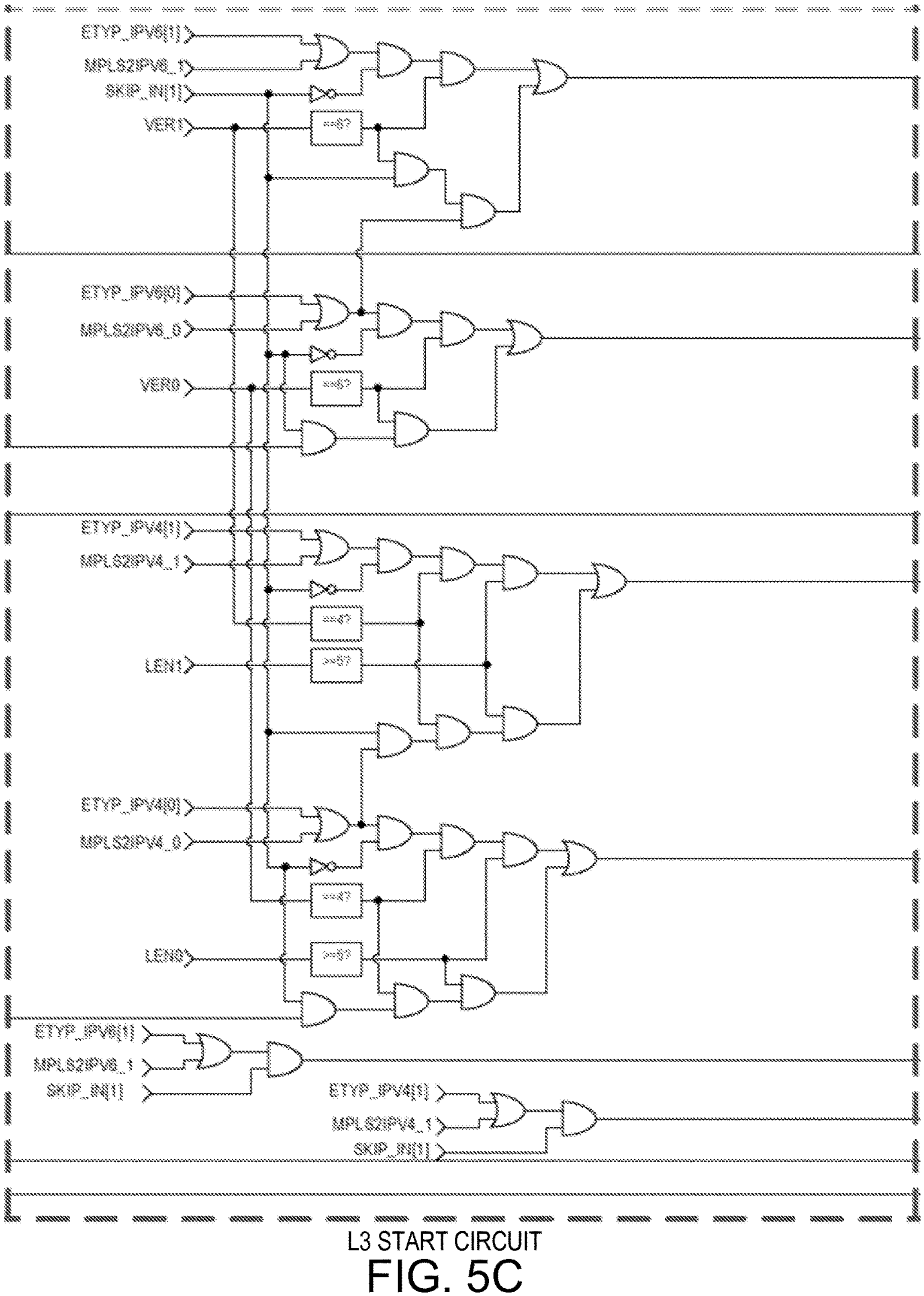
Figure 5D:
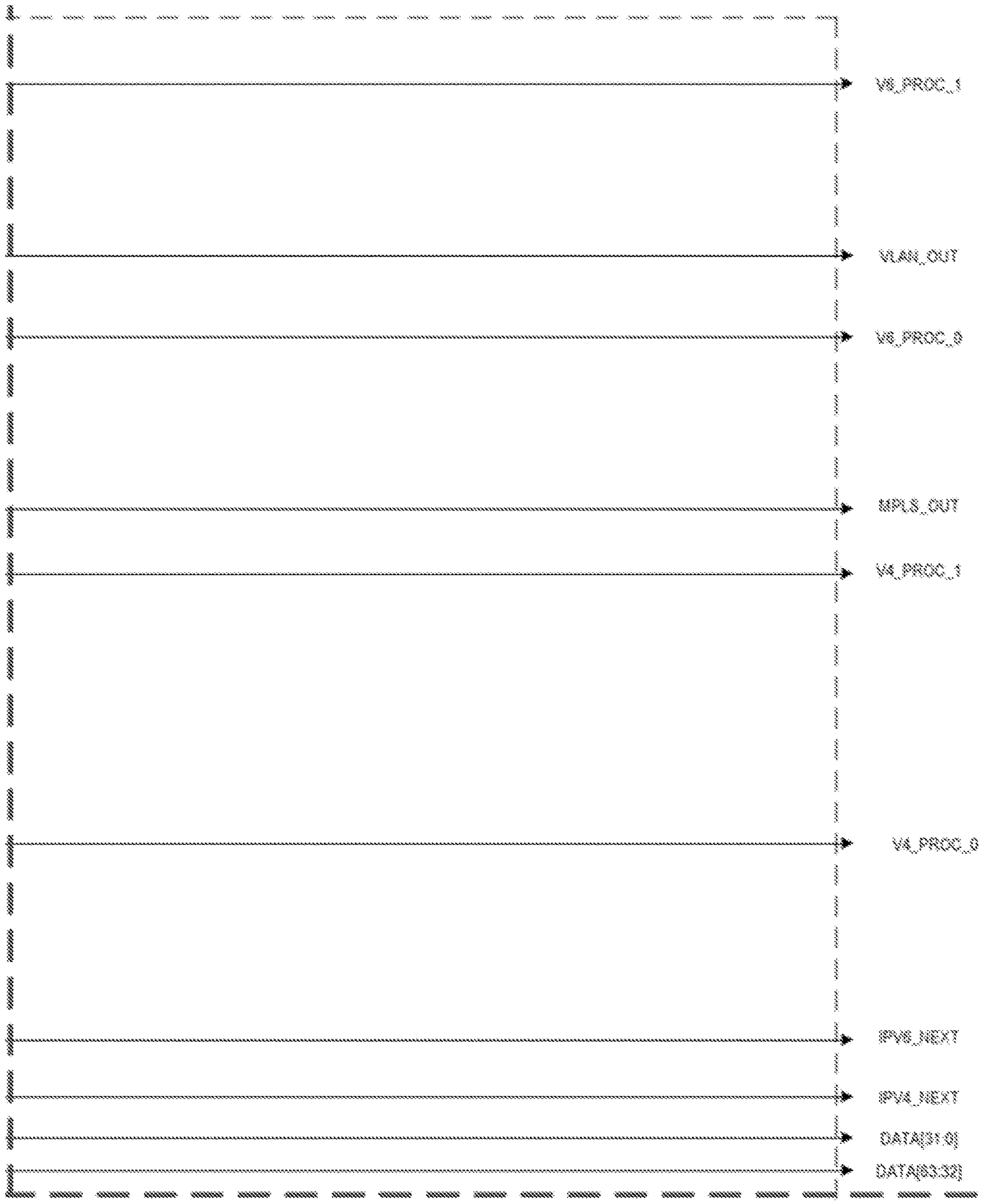
Figure 5E:
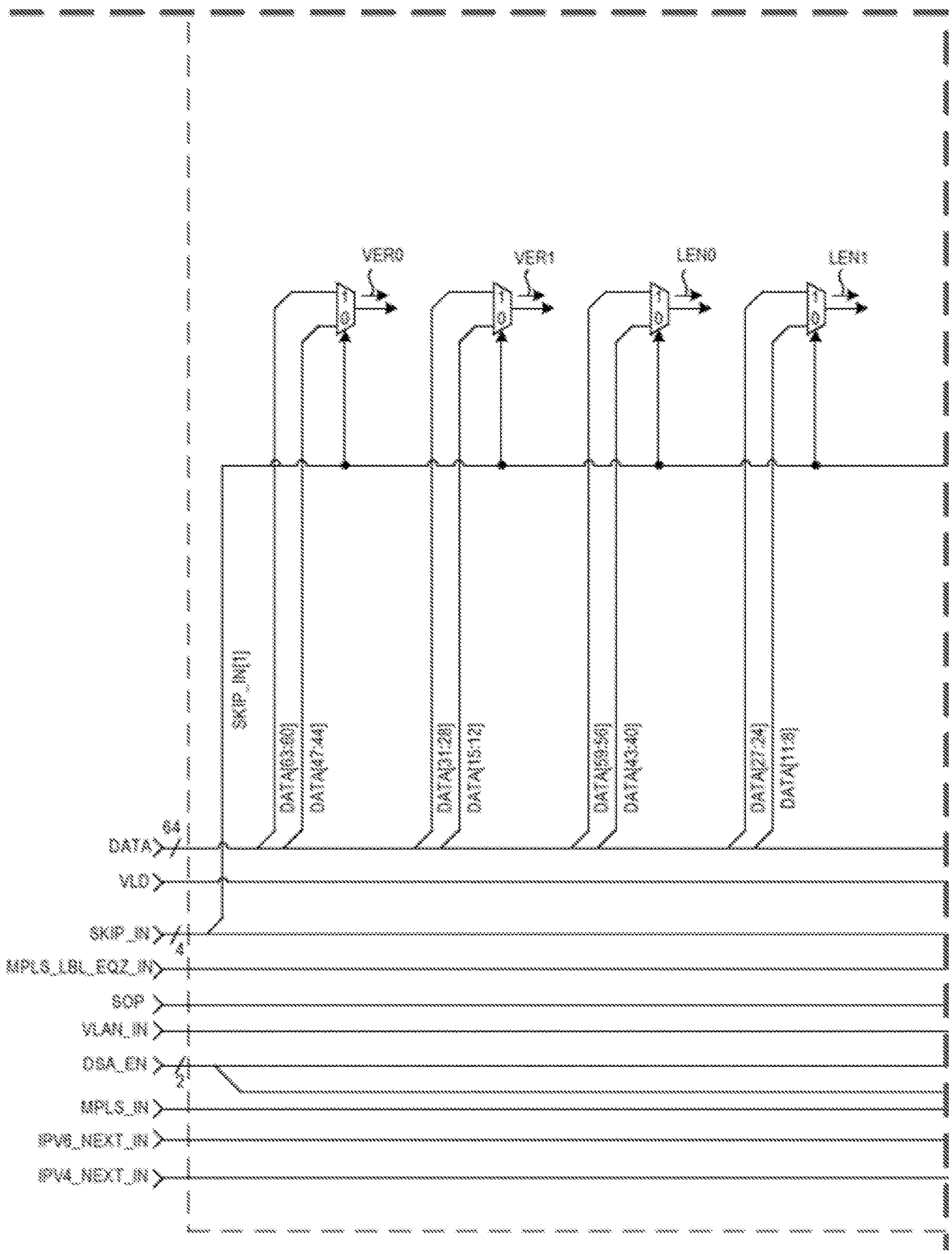
Figure 5F:
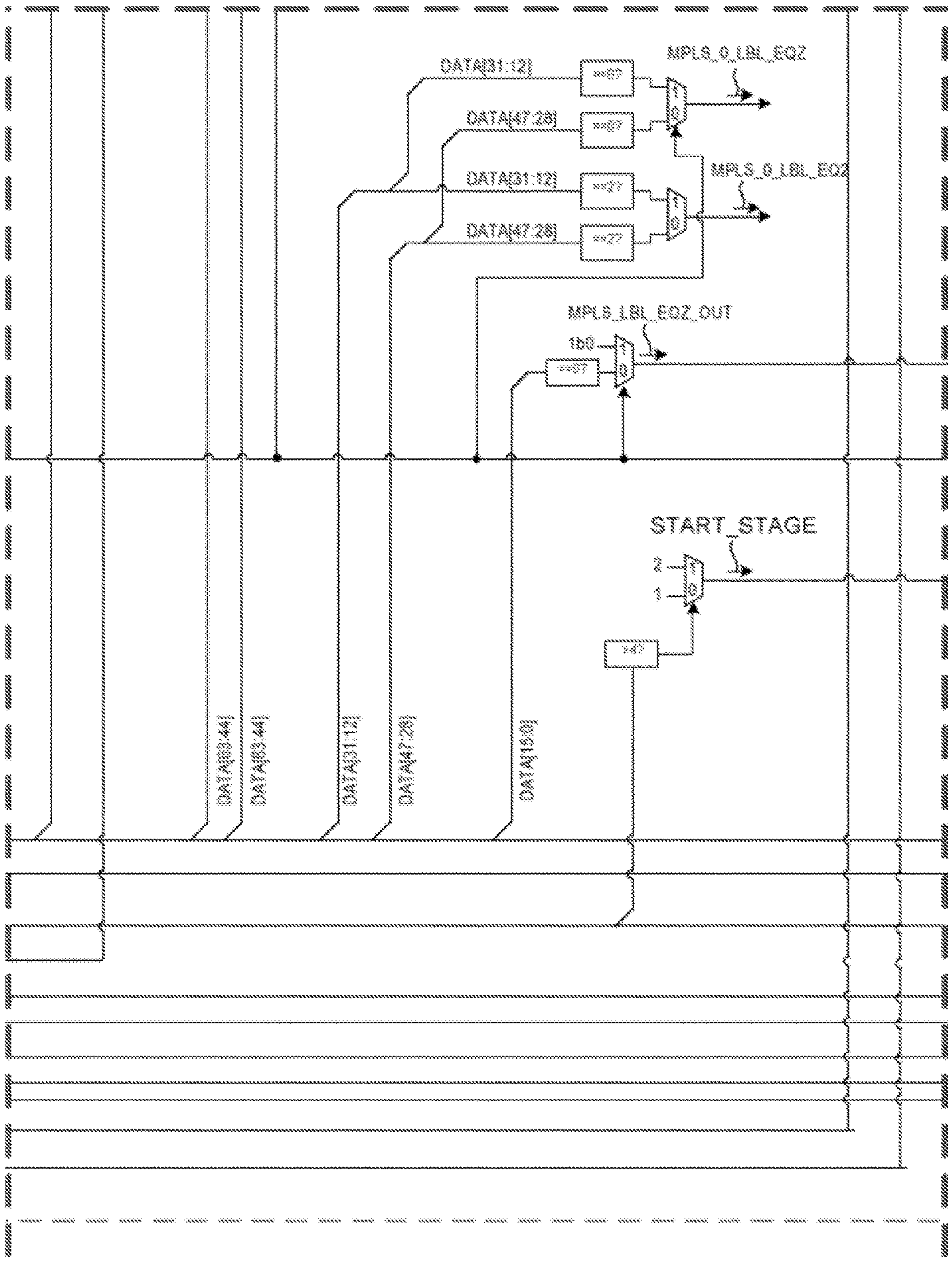
Figure 5G:
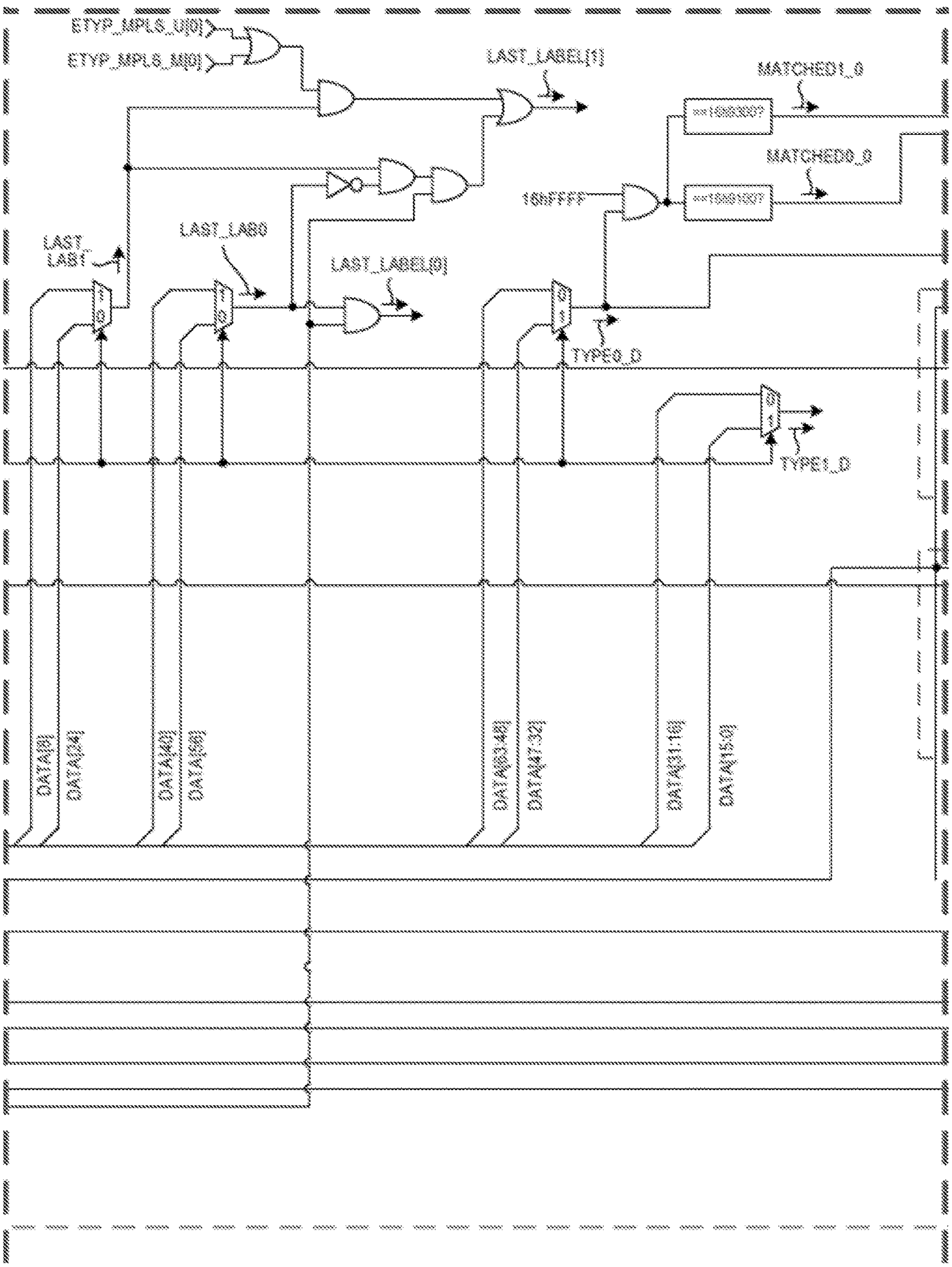
Figure 5H:
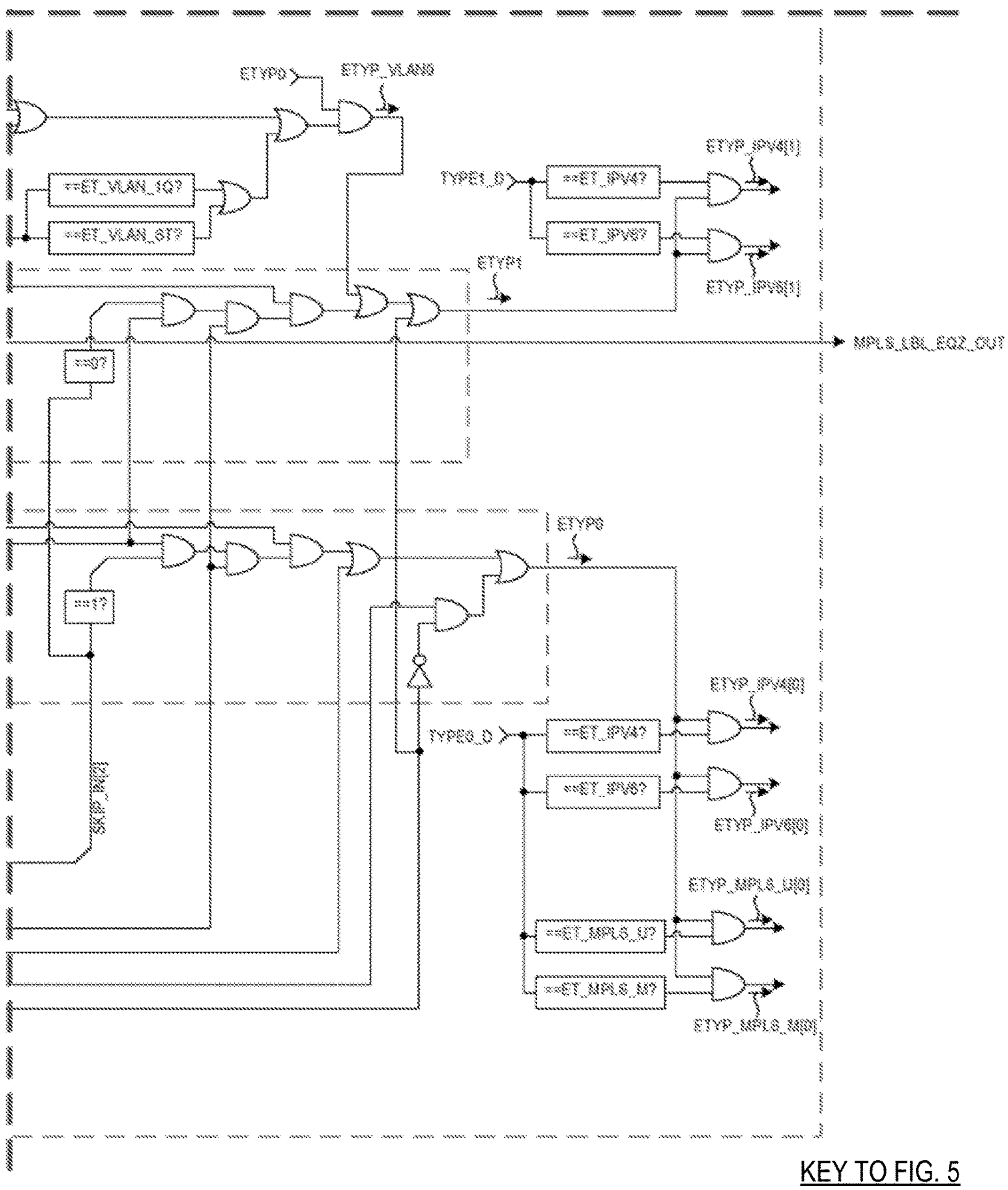

FIG. 2 is a high-level block diagram of the parse and checksum circuit 12. The parse and checksum circuit 12 comprises four parse64 circuits 40, 41, 42, and 43, a parse state context circuit 44, a IPV6 extension processor 45, and a checksum summer and compare circuit 56. In accordance with one novel aspect, state buses having state information for IPV4, IPV6, TCP, and UDP flow through each of the eight parse32 circuits. The parse32 circuits begin parsing on the most significant word. The state information passes through each of the eight parse32 circuits as what are referred to as "1-hot buses" where the bits are shifted without involving any digital logic as explained in further detail below. The parse and checksum circuit 12 outputs a 32-bit parse result signal comprising 2-bits of L2_VLAN information, 2-bits of L2_MPLS information, 7-bits of IPV6_EXT information, 2-bits of L3_status information, 3-bits of L4_status information, and a 16-bit checksum value. In addition, the parse and checksum circuit 12 outputs an L3_CKSM_OK digital signal indicating whether the calculated checksum is the same as the identified L3 checksum identified within the packet, and an L4_CKSM_OK digital signal indicating whether the calculated checksum is the same as the identified L4 checksum identified within the packet. All of the CDL code that describes and generates the parser and checksum circuit 12 is in a text file entitled "parser-and-checksum-circuit.txt" provided in the ASCII Text File Appendix.

FIG. 3 is a more detailed diagram of the parse and checksum circuit 12. The parse and checksum circuit 12 comprises four parse64 circuits 40, 41, 42, and 43, a parse state context circuit 44, a IPV6 extension processor 45, and a checksum summer and compare circuit 56. The four parse64 circuits are structurally identical. Each of the parse64 circuits is identified with the notation "parse64.X" where X identifies the stage. Reference numeral 40 identifies parse64.0 circuit. Reference numeral 41 identifies parse64.1 circuit. Reference numeral 42 identifies parse64.2 circuit. Reference numeral 43 identifies parse64.3 circuit.

Each parse64 circuit comprises an L3 start circuit, a two parse32 circuits, a 34-bit partial L4 checksum register, and a 34-bit partial L3 checksum register. Each of the parse32 circuits is identified with the notation "parse32.X" where X identifies whether the parse32 circuit is on the left side or on the right side of the parse64 circuit. Reference numeral 47 identifies the parse32.1 circuit of the parse64.0 circuit 40. Reference numeral 48 identifies the L3 start circuit of the parse64.0 circuit 40. Reference numeral 49 identifies the 34-bit partial L4 checksum register of the parse64.0 circuit 40. Reference numeral 50 identifies the 34-bit partial L3 checksum register of the parse64.0 circuit 40. All of the CDL code that describes and generates the parse64 circuits of FIG. 3 is in a text file entitled "parse64-circuit.txt" provided in the ASCII Text File Appendix.

Each parse32 circuit comprises an L3 header circuit, an L4 checksum decoder, an L4 summer and checksum multiplexer circuit, an L3 checksum decoder, and an L3 summer and checksum multiplexer circuit. Reference numeral 51 identifies the L3 header circuit of the parse32.0 circuit 46. Reference numeral 52 identifies the L4 checksum decoder of the parse32.0 circuit 46. Reference numeral 53 identifies the L4 summer and checksum multiplexer of the parse32.0 circuit 46. Reference numeral 54 identifies the L3 checksum decoder of the parse32.0 circuit 46. Reference numeral 55 identifies the L3 summer and checksum multiplexer circuit of the parse32.0 circuit 46.

The parse and checksum circuit 12 receives an 800 MHz clock signal CLK, a 1-bit digital signal VLD, a 1-bit digital signal SOP, a 256-bit word DATA [255:0], a 24-bit digital signal DSA_EN_VECTOR [23:0], a 48-bit digital signal SKIP_OCTET[47:0], and a 4-bit digital signal PORT [3:0]. The digital signal VLD indicates a valid 256-bit word is received. The digital signal SOP indicates whether the received 256-bit word is at the start of a frame. The DSA_EN_VECTOR signal comprises two bits of Distributed Switching Architecture (DSA) information for each port. The multi-bit digital signal SKIP_OCTET stores four bits of skip information for each port. The multi-bit digital signal PORT [3:0] indicates the port onto which the packet is received. In this example, the parse and checksum circuit supports twelve (12) ports.

The four parse64 circuits process the DATA[255:0] signal in parallel during a single cycle of clock signal CLK. Each of the parse64 circuits receives a 64-bit portion of the DATA[255:0] signal. Parse 64.0 circuit 40 receives the first 64-bits of data, DATA[255:192]. Parse 64.1 circuit 41 receives the next 64-bits of data, DATA[191:128]. Parse 64.2 circuit 42 receives the next 64-bits of data, DATA[127:64]. Parse 64.3 circuit 43 receives the last 64-bits of data, DATA[63:0]. The parsing of the DATA[255:0] signal begins on the most significant word.

The L3 start circuit 48 of the parse64.0 circuit 40 receives DATA[255:192] signal, 1-bit digital signal VLD, 4-bit digital signal SKIP_IN signal, 2-bit digital signal STAGE, 1-bit digital signal SOP, 1-bit digital signal VLAN_IN, 2-bit digital signal DSA_EN, 1-bit digital signal MPLS_IN, 1-bit digital signal IPV6_NEXT_IN, 1-bit digital signal IPV4_NEXT_IN, and 1-bit digital signal MPLS_LBL_EQZ_IN. From these received digital signals, the L3 start circuit 48 generates 1-bit digital signal V4_PROC_0, 1-bit digital signal V6_PROC_0, 1-bit digital signal V4_PROC_1, 1-bit digital signal V6_PROC_1, 1-bit digital signal VLAN_OUT, 2-bit digital signal DSA_OUT, 1-bit digital signal MPLS_OUT, 1-bit digital signal IPV6_NEXT, 1-bit digital signal IPV4_NEXT, and 1-bit digital signal MPLS_LBL_EQZ_OUT. The "_OUT" and "_NEXT" portion of the signal name indicates that the signal is to be supplied as an input onto an L3 start circuit of the next parse64 circuit. L3 start circuit 48 supplies the first 32-bits of the received data signal DATA[63:32] to the first parse32.0 circuit and supplies the next 32-bits of the received data signal DATA[31:0] to the second parse32.1 circuit 47.

Four state buses pass through each parse32 circuit. Each of the buses is also referred to as a "1-hot" bus. A V4 state bus 66 receives digital signal V4_STATE [15:0].

A V6 state bus 67 receives digital signal V6_STATE[9:0]. A TCP state bus 68 receives digital signal TCP_STATE[6:0]. A UDP state bus 69 receives digital signal UDP_STATE[2:0]. Each of the buses 66-69 passes through each of the parse32 circuits. In each parse32 circuit, the bits on each state bus are shifted such that state_out =state_in <<1. No digital logic is involved in this shifting operation. As such, the parsing is performed faster than if logic operations were involved. For the V4 state bits, the L3 start circuit generates a bit V4_PROC that is appended to the shifted bits. The result is that the next parse32 circuit receives V4_STATE [14:0], V4_PROC, and the next parse32 circuit performs the identical operation. For the V6 state bits, the L3 start circuit generates a bit V6_PROC that is appended to the shifted bits. The result is that the next parse32 circuit receives V6_STATE[8:0], V4_PROC, and the next parse32 circuit performs the identical operation. For the TCP state bits, an L3_HDR_END bit is appended to the shifted bits. The result is that the next parse32 circuit receives TCP_STATE[5:0], L3,HDR_END, and the next parse32 circuit performs the identical operation. For the UDP state bits, the L3_HDR_END bit is appended to the shifted bits. The result is that the next parse32 circuit receives UDP_STATE[1:0], L3,HDR_END, and the next parse32 circuit performs the identical operation. The incoming state information comes from the result of the previous cycle, from cache, or from twelve deep port state memory. In this fashion, the parser and checksum circuit can process data from a different port on every clock cycle.

Each of the parse32 circuits calculates the various checksums that may be present within the 32-bits of data that are provided to each of the parse32 circuits. In this example, each of the parse32 circuits includes L4 checksum circuitry and L3 checksum circuitry. The L3 and L4 checksum decoders use the state information to generate a multiplexer select signal that is supplied to the L3 and L4 checksum multiplexer circuits. In this fashion, the state information determines which of the 17-bit checksums is passed up to the parse64 block to be combined with the 17-bit checksum of the other parse32circuits and registered as a 34-bit meta-result. The 34-bit meta-result is passed to the checksum summer and compare circuit 56. As the parse32 circuits identify L3checksums and L4 checksums in the packet data stream, the L3 and L4 checksums are pushed up to the checksum summer and compare circuit 56 for saving in per-port memory. These L3 and L4 checksums are then compared to the calculated checksum value at the end of the data packet stream.

The checksum summer and compare circuit 56 receives the 34-bit meta result from the parse64 circuits and performs a sixteen bit 1's compliment summed to itself to produce an 18-bit result for each parse64 circuit registered on the next clock cycle. By performing 16-bit summing rather than 32-bit summing, processing speed of the circuit is increased. Next, four 18-bit result sums are paired for the next summing reduction. The pairs are summed together with the 18-bit registered sum that is stored in the twelve deep port memory stored from this "folded" stage. This results in a new 18-bit "folded" result that is registered in the port indexed memory. For the end of packet data cycle, the 18-bit "folded" data is temporarily summed ([16;0]+[2;16]) to produce a temporary 17-bit result. The temporary 17-bit result is summed ([16;0]+[1;16]) to fix the rollover case, and the result is notted and registered as the final 16-bit checksum result.

V6 extension processor 45 performs extension header processing. The IPV6 extension header processing is done with a single, dedicated block that processes portions of the 256-bit data word and identifies starts and ends of extension headers until L4 start boundary is identified and 1-hotted down to the appropriate parse32 circuit to start L4processing. The cycle-by-cycle state of extension header processing is stored per-port to provide processing for different ports on each clock cycle. All of the CDL code that describes and generates the V6 extension processor 45 is in a text file entitled "V6-extension-processor-circuit.txt" provided in the ASCII Text File Appendix.

The parse state context circuit 44 comprises a 12×2 register array 60, a 12×4 register array 61, a 12×79 register array 62, and multiplexer circuit 63. Each of the register arrays 60, 61, and 62 receive PORT[3:0] signal indicating which of the twelve ports received the DATA[255:0] signal. The 12×2 register array 60 receives the PORT[3:0] signal and outputs a 2-bit digital signal DSA_EN[1:0] that is supplied onto the L3 start circuit 48 of the first parse 32.0 circuit 40. The 12×4 register array 61 receives the PORT[3:0] signal and outputs a 4-bit digital signal SKIP_IN[3:0]. Bit one of the SKIP_IN[3:0] signal, also referred to as digital signal ODD_IN is supplied onto the L4 checksum decoder 52 of the first parse 32.0 circuit 40.

FIG. 4 is a detailed circuit diagram of the parse32.0 circuit 46 of FIG. 3. All of the CDL code that describes and generates the parse32 circuits is in a text file entitled "parse32-circuit.txt" provided in the ASCII Text File Appendix. For additional information on the structure and operation of the parse32.0 circuit 46, see U.S. Provisional Application Ser. No. 62/074,013, entitled "256-Bit Parallel Parser And Checksum Circuit With 1-Hot State Information Bus," filed on Nov. 1, 2014, the subject matter of which is incorporated herein by reference.

FIG. 5 is a detailed circuit diagram of the L3 start circuit 48 of the parse64.0 circuit 40 of FIG. 1. The parser and checksum circuit 12 has four L3 start circuits labeled first L3 start circuit 48, second L3 start circuit, third L3 start circuit, and fourth L3 start circuit. The structure and operation of the first L3 start circuit 48 is substantially identical to the structure and operation of the other second, third, and fourth L3 start circuits.

Figure 6:
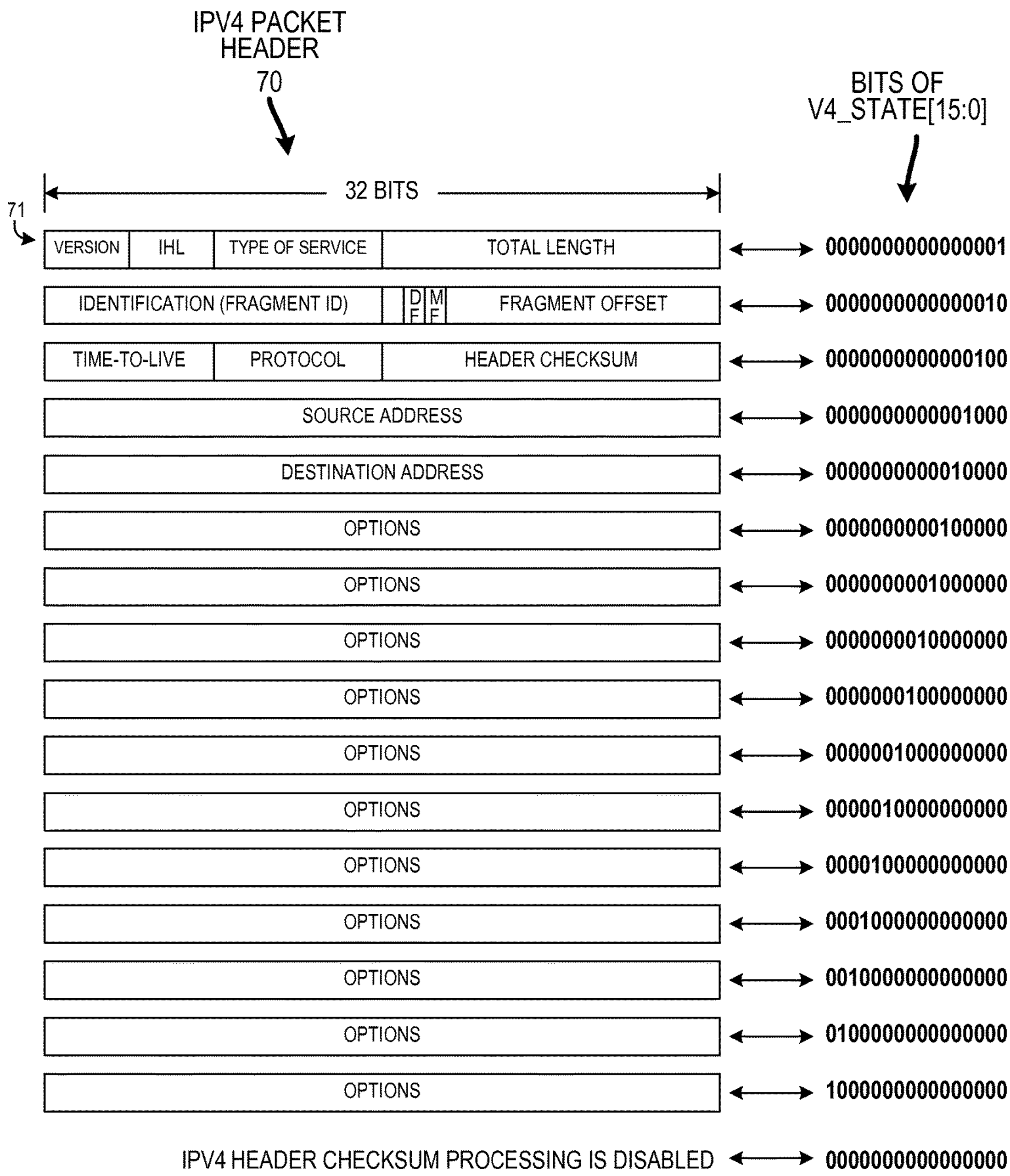
FIG. 6 is a diagram that shows how each of the one-hot states of the multi-bit digital IPV4 state signal V4_STATE [15:0] corresponds to a different 32-bit segment of an IPV4packet header 70.

FIG. 6 is a diagram that shows how each of the one-hot states of the multi-bit digital IPV4 state signal V4_STATE [15:0] corresponds to a different 32-bit segment of an IPV4 packet header 70. The IPV4 packet header 70 is separated into 32-bit segments. In this example, the IPV4 packet header 70 has sixteen 32-bit segments. The state signal V4_STATE[15:0] is a 16-bit digital signal that is configurable in one of sixteen one-hot states. Each one-hot state of the multi-bit digital state signal V4_STATE[15:0] corresponds to one of the sixteen segments of the IPV4 packet header 70 as shown in FIG. 6. For example, in FIG. 2, if parse32.0 circuit of parse64.0 circuit 40 receives V4_STATE [15:0] having a multi-bit digital value of "0000 0000 0000 0001", then the one-hot state of V4_STATE[15:0] indicates that the parse32.0 circuit has received segment 71 of the IPV4 packet header 70. Segment 71 includes version, internet header length ("IHL"), type of service, and total length. If all the bits of the multi-bit digital state signal V4_STATE [15:0] are at a digital logic low level ("0000 0000 0000 0000"), then this indicates that no IPV4 packet header is to be processed during the clock cycle.

In addition to receiving a thirty-two bit portion of the DATA[255:0] signal, each parse32 circuit in the chain receives, in parallel, a version of the state signal IPV4 shifted by 1-bit with respect to the state signal IPV4 received by the parse32 circuit to the left in the chain (the adjacent parse32 circuit). For example, if the received DATA[255:0] signal includes a starting portion of the IPV4 packet header 70, then each parse32 circuit in the chain will receive a 1-bit shifted version of the state signal V4_STATE[15:0] thereby indicating which portion of the IPV4 packet header the parse32 circuit has received. The first parse32 circuit in the chain, parse32.0 circuit of parse64.0 circuit 40, receives V4_STATE[15:0] having a multi-bit digital value of "0000 0000 0000 0001". The second parse32 circuit in the chain, parse 32.1 circuit of parse64.0 circuit 40, receives V4_STATE[15:0] having a multi-bit digital value of "0000 0000 0000 ". The third parse32 circuit in the chain, parse32.0 circuit of parse64.1 circuit 41, receives in parallel V4_STATE[15:0] having a multi-bit digital value of "0000 0000 0000 ". The fourth parse32 circuit in the chain, parse 32.1 circuit of parse64.1 circuit 41, receives V4_STATE[15:0] having a multi-bit digital value of "0000 0000 0000 1000". The fifth parse32 circuit in the chain, parse 32.0 circuit of parse64.2 circuit 42, receives V4_STATE[15:0] having a multi-bit digital value of "0000 0000 0001 0000". The sixth parse32 circuit in the chain, parse 32.1 circuit of parse64.2 circuit 42, receives V4_STATE[15:0] having a multi-bit digital value of "0000 0000 0010 0000". The seventh parse32 circuit in the chain, parse 32.0 circuit of parse64.3 circuit 43, receives V4_STATE[15:0] having a multi-bit digital value of "0000 0000 0100 0000". The eighth parse32 circuit in the chain, parse 32.1 circuit of parse64.3 circuit 43 receives V4_STATE[15:0] having a multi-bit digital value of "0000 0000 1000 0000". Because the IPV4 packet is being processed in the above example, each of the other state signals V6_STATE[9:0], TCP_STATE [6:0], and UDP_STATE[2:0] received by the parse32 circuits has a digital logic low level. Thus, in a single clock cycle, the chain of eight parse32 circuits can parse eight segments of the IPV4 packet header 70 in parallel.

Figure 7:
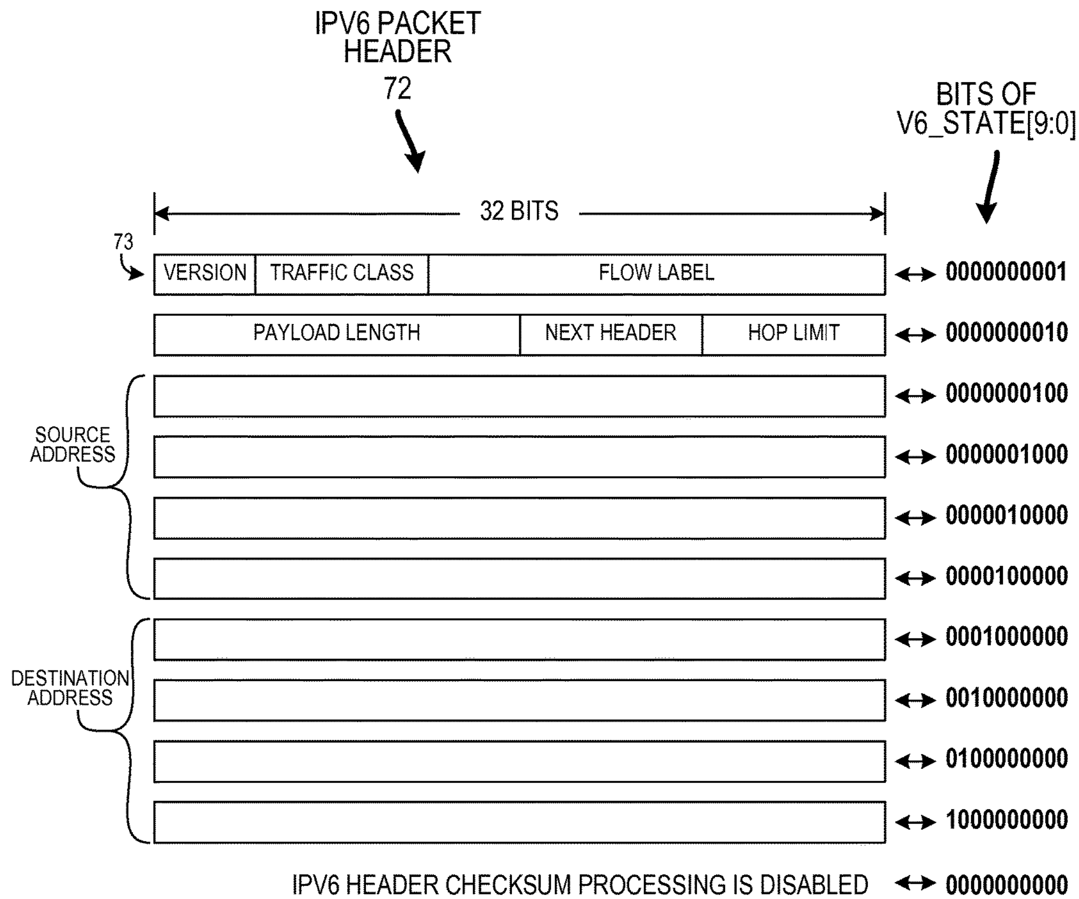
FIG. 7 is a diagram that shows how each of the one-hot states of the multi-bit digital IPV6 state signal V6_STATE [9:0] corresponds to a different 32-bit segment of an IPV6 packet header 72.

FIG. 7 is a diagram that shows how each of the one-hot states of the multi-bit digital IPV6 state signal V6_STATE [9:0] corresponds to a different 32-bit segment of an IPV6 packet header 72. The IPV6 packet header 72 is separated into 32-bit segments. In this example, the IPV6 packet header 72 has ten 32-bit segments. The state signal V6_STATE[9:0] is a 10-bit digital signal that is configurable in one of ten one-hot states. Each one-hot state of the multi-bit digital state signal V6_STATE[9:0] corresponds to one of the ten segments of the IPV6 packet header 72 as shown in FIG. 7. For example, in FIG. 2, if parse32.0 circuit of parse64.0 circuit 40 receives V6_STATE[9:0] having a multi-bit digital value of "00 0000 0001", then the one-hot state of V6_STATE[9:0] indicates that the parse32.0 circuit has received segment 73 of the IPV6 packet header 72. Segment 73 includes version, traffic class, and flow label information. If all the bits of the multi-bit digital state signal V6_STATE[9:0] are at a digital logic low level ("00 0000 0000"), then this indicates that no IPV6 packet header is to be processed during the clock cycle.

In addition to receiving a 32-two bit portion of the DATA[255:0] signal, each parse32 circuit in the chain receives, in parallel, a version of the state signal IPV6 shifted by 1-bit with respect to the state signal IPV6 received by the parse32 circuit to the left in the chain. For example, if the received DATA[255:0] signal includes a starting portion of the IPV6 packet header 72, then each parse32 circuit in the chain will receive a 1-bit shifted version of the state signal V6_STATE[9:0] thereby indicating which portion of the IPV6 packet header the parse32 circuit has received. The first parse32 circuit in the chain, parse32.0 circuit of parse64.0 circuit 40, receives V6_STATE[9:0] having a multi-bit digital value of "00 0000 0001". The second parse32 circuit in the chain, parse 32.1 circuit of parse64.0 circuit 40, receives V6_STATE[9:0] having a multi-bit digital value of "00 0000 0010". The third parse32 circuit in the chain, parse32.0 circuit of parse64.1 circuit 41, receives in parallel V6_STATE[9:0] having a multi-bit digital value of "00 0000 0100". The fourth parse32 circuit in the chain, parse 32.1 circuit of parse64.1 circuit 41, receives V6_STATE[9:0] having a multi-bit digital value of "00 0000 1000". The fifth parse32 circuit in the chain, parse 32.0 circuit of parse64.2 circuit 42, receives V6_STATE[9:0] having a multi-bit digital value of "00 0001 0000". The sixth parse32 circuit in the chain, parse 32.1 circuit of parse64.2 circuit 42, receives V6_STATE[9:0] having a multi-bit digital value of "00 0010 0000". The seventh parse32 circuit in the chain, parse 32.0 circuit of parse64.3 circuit 43, receives V6_STATE[9:0] having a multi-bit digital value of "00 0100 0000". The eighth parse32 circuit in the chain, parse 32.1 circuit of parse64.3 circuit 43 receives V6_STATE[9:0] having a multi-bit digital value of "00 1000 0000". Because the IPV6 packet is being processed in the above example, each of the other state signals V4_STATE[15:0], TCP_ STATE[6:0], and UDP_STATE[2:0] received by the parse32 circuits has a digital logic low level. Thus, in a single clock cycle, the chain of eight parse32 circuits can parse eight segments of the IPV6 packet header 72 in parallel.

Figure 8:
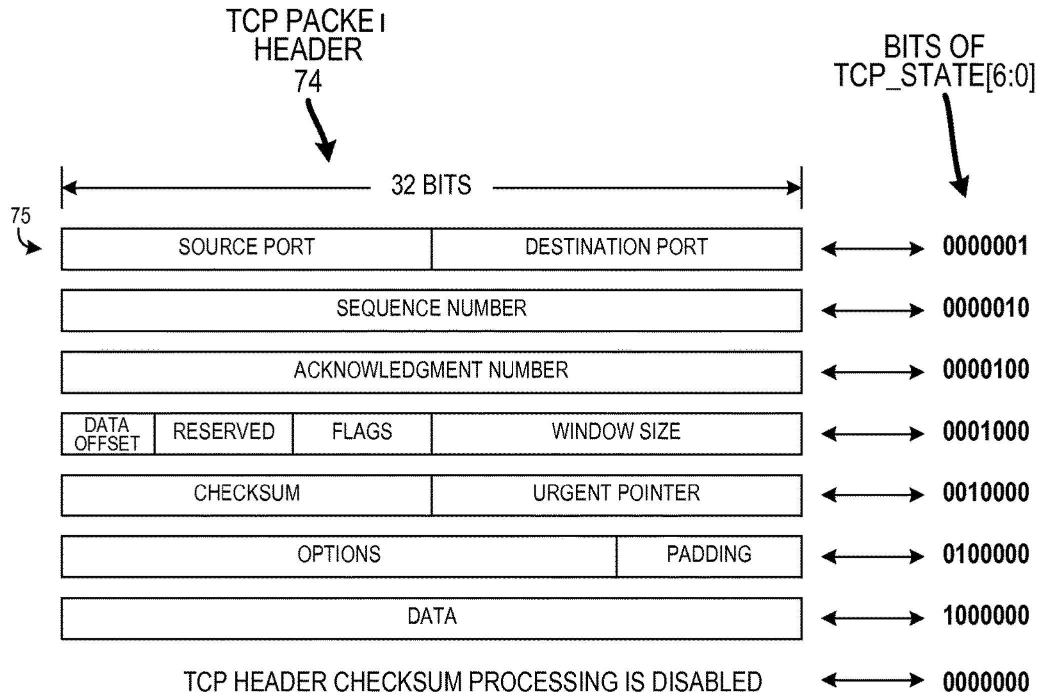
FIG. 8 is a diagram that shows how each of the one-hot states of the multi-bit digital TCP state signal TCP_STATE [6:0] corresponds to a different 32-bit segment of the TCP packet header 74.

FIG. 8 is a diagram that shows how each of the one-hot states of the multi-bit digital TCP state signal TCP_STATE [6:0] corresponds to a different 32-bit segment of the TCP packet header 74. The TCP packet header 74 is separated into 32-bit segments. In this example, the TCP packet header 74 has seven 32-bit segments. The TCP state signal TCP-_STATE[6:0] is a 7-bit digital signal that is configurable in one of seven one-hot states. Each one-hot state of the multi-bit digital TCP state signal TCP_STATE[6:0] corresponds to one of the seven segments of the TCP packet header 74 as shown in FIG. 8. For example, in FIG. 2, if parse32.0 circuit of parse64.0 circuit 40 receives TCP-_STATE[6:0] having a multi-bit digital value of "000 0001", then the one-hot state of TCP_STATE[6:0] indicates that the parse32.0 circuit has received segment 75 of the TCP packet header 74. Segment 75 includes source port and destination port information. If all the bits of the multi-bit digital TCP state signal TCP_STATE[6:0] are at a digital logic low level ("000 0000"), then this indicates that no TCP packet header is to be processed during the clock cycle.

In addition to receiving a 32-two bit portion of the DATA[255:0] signal, each parse32 circuit in the chain receives, in parallel, a version of the TCP state signal shifted by 1-bit with respect to the TCP state signal received by the parse32 circuit to the left in the chain. For example, if the received DATA[255:0] signal includes a starting portion of the TCP packet header 74, then each parse32 circuit in the chain will receive a 1-bit shifted version of the state signal TCP_STATE[6:0] thereby indicating which portion of the TCP packet header 74 the parse32 circuit has received. The first parse32 circuit in the chain, parse32.0 circuit of parse64.0 circuit 40, receives TCP_STATE[6:0] having a multi-bit digital value of "000 0001". The second parse32 circuit in the chain, parse 32.1 circuit of parse64.0 circuit 40, receives TCP_STATE[6:0] having a multi-bit digital value of "000 0010". The third parse32 circuit in the chain, parse32.0 circuit of parse64.1 circuit 41, receives in parallel TCP_STATE[6:0] having a multi-bit digital value of "000 0100". The fourth parse32 circuit in the chain, parse 32.1 circuit of parse64.1 circuit 41, receives TCP_STATE[6:0] having a multi-bit digital value of "000 1000". The fifth parse32 circuit in the chain, parse 32.0 circuit of parse64.2 circuit 42, receives TCP_STATE[6:0] having a multi-bit digital value of "001 0000". The sixth parse32 circuit in the chain, parse 32.1 circuit of parse64.2 circuit 42, receives TCP_STATE[6:0] having a multi-bit digital value of "010 0000". The seventh parse32 circuit in the chain, parse 32.0 circuit of parse64.3 circuit 43, receives TCP_STATE[6:0] having a multi-bit digital value of "100 0000". The eighth parse32 circuit in the chain, parse 32.1 circuit of parse64.3 circuit 43 receives TCP_STATE[6:0] having a multi-bit digital value of "000 0000". Because the TCP packet header is being processed in the above example, each of the other state signals V4_STATE[15:0], V6_STATE[9:0], and UDP_STATE[2:0] received by the parse32 circuits has a digital logic low level. Thus, in a single clock cycle, seven of the eight parse32 circuits can parse the seven segments of the TCP packet header 74 in parallel.

Figure 9:
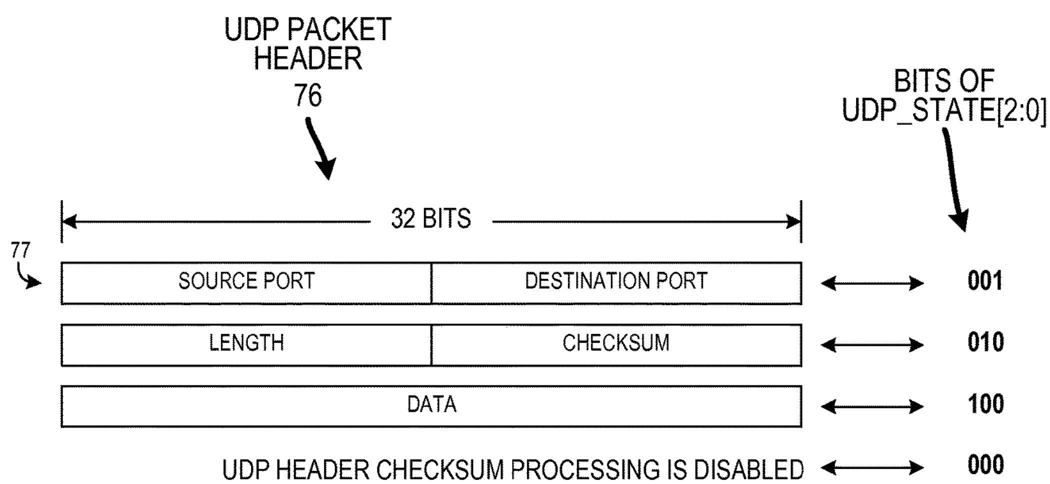
FIG. 9 is a diagram that shows how each of the one-hot states of the multi-bit digital UDP state signal UDP_STATE [2:0] corresponds to a different 32-bit segment of the UDP packet header 76.

FIG. 9 is a diagram that shows how each of the one-hot states of the multi-bit digital UDP state signal UDP_STATE [2:0] corresponds to a different 32-bit segment of the UDP packet header 76. The UDP packet header 76 is separated into 32-bit segments. In this example, the UDP packet header 76 has three 32-bit segments. The UDP state signal UDP_STATE[2:0] is a 3-bit digital signal that is configurable in one of three one-hot states. Each one-hot state of the multi-bit digital UDP state signal UDP_STATE[2:0] corresponds to one of the three segments of the UDP packet header 76 as shown in FIG. 9. For example, in FIG. 2, if parse32.0 circuit of parse64.0 circuit 40 receives UDP_STATE[2:0] having a multi-bit digital value of "001", then the one-hot state of UDP_STATE[2:0] indicates that the parse32.0 circuit has received segment 77 of the UDP packet header 76. Segment 77 includes source port and destination port information. If all the bits of the multi-bit digital UDP state signal UDP_STATE[2:0] are at a digital logic low level ("000"), then this indicates that no UDP packet header is to be processed during the clock cycle.

In addition to receiving a 32-two bit portion of the DATA[255:0] signal, each parse32 circuit in the chain receives, in parallel, a version of the UDP state signal shifted by 1-bit with respect to the UDP state signal received by the parse32 circuit to the left in the chain. For example, if the received DATA[255:0] signal includes a starting portion of the UDP packet header 76, then each parse32 circuit in the chain will receive a 1-bit shifted version of the state signal UDP_STATE[2:0] thereby indicating which portion of the UDP packet header 76 the parse32 circuit has received. The first parse32 circuit in the chain, parse32.0 circuit of parse64.0 circuit 40, receives UDP_STATE[2:0] having a multi-bit digital value of "001". The second parse32 circuit in the chain, parse 32.1 circuit of parse64.0 circuit 40, receives UDP_STATE[2:0] having a multi-bit digital value of "010". The third parse32 circuit in the chain, parse32.0 circuit of parse64.1 circuit 41, receives in parallel UDP_STATE[2:0] having a multi-bit digital value of "100". The remaining five parse32 circuits in the chain receive UDP_STATE[2:0] having a digital logic low level ("000"). Because the UDP packet header is being processed in the above example, each of the other state signals V4_STATE [15:0], V6_STATE[9:0], and TCP_STATE[6:0] received by the parse32 circuits has a digital logic low level. Thus, in a single clock cycle, three of the eight parse32 circuits can parse the three segments of the UDP packet header 76 in parallel.

Figure 10:
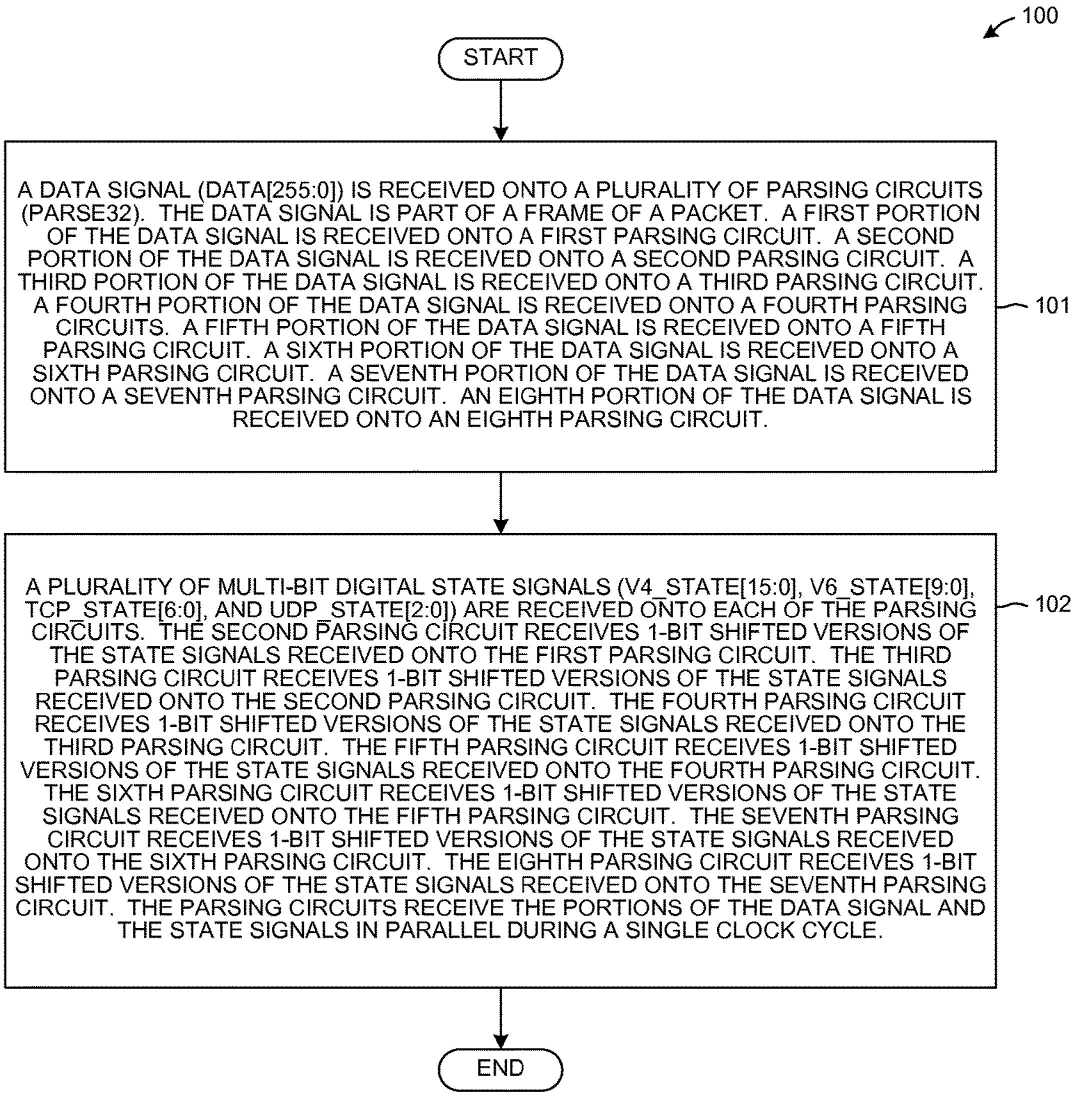
FIG. 10 is a flowchart of a method 100 in accordance with one novel aspect.

FIG. 10 is a flowchart of a method 100 in accordance with one novel aspect. In a first step (step 101), a data signal is received onto a plurality of parsing circuits. The data signal is part of a frame of a packet. For example, in FIG. 2, a first portion 80 of DATA[255:0] signal is received onto the first parse32 circuit (parse32.0 of parse 64.0). A second portion 81 of DATA[255:0] signal is received onto the second parse32 circuit (parse32.1 of parse 64.0). A third portion 82 of DATA[255:0] signal is received onto the third parse32 circuit (parse32.0 of parse 64.1). A fourth portion 83 of DATA[255:0] signal is received onto the fourth parse32 circuit (parse32.1 of parse 64.1). A fifth portion 84 of DATA[255:0] signal is received onto the fifth parse32 circuit (parse32.0 of parse 64.2). A sixth portion 85 of DATA[255:0] signal is received onto the sixth parse32 circuit (parse32.1 of parse 64.2). A seventh portion 86 of DATA[255:0] signal is received onto the seventh parse32 circuit (parse32.0 of parse 64.3). An eighth portion 87 of DATA[255:0] signal is received onto the eighth parse32 circuit (parse32.1 of parse 64.3).

In a second step (step 102), a plurality of multi-bit digital state signals are received onto each of the parsing circuits. For example, in FIG. 2, the state signals V4_STATE[15:0], V6_STATE[9:0], TCP_STATE[6:0], and UDP_STATE[2:0] are received onto each of the parse32 circuits. The second parsing circuit (parse32.1 of parse64.0) receives 1-bit shifted versions of the state signals received onto the first parsing circuit (parse32.0 of parse64.0). The third parsing circuit (parse32.0 of parse64.1) receives 1-bit shifted versions of the state signals received onto the second parsing circuit (parse32.1 of parse64.0). The fourth parsing circuit (parse32.1 of parse64.1) receives 1-bit shifted versions of the state signals received onto the third parsing circuit (parse32.0 of parse64.1). The fifth parsing circuit (parse32.0 of parse64.2) receives 1-bit shifted versions of the state signals received onto the fourth parsing circuit (parse32.1 of parse64.1). The sixth parsing circuit (parse32.1 of parse64.2) receives 1-bit shifted versions of the state signals received onto the fifth parsing circuit (parse32.0 of parse64.2). The seventh parsing circuit (parse32.0 of parse64.3) receives 1-bit shifted versions of the state signals received onto the sixth parsing circuit (parse32.1 of parse64.2). The eighth parsing circuit (parse32.1 of parse64.3) receives 1-bit shifted versions of the state signals received onto the seventh parsing circuit (parse32.0 of parse64.3). Each of the eight parse32 circuits receives the portions of the DATA signal and the state signals in parallel during a single clock cycle.

Although the present invention has been described in connection with certain specific embodiments for instructional purposes, the present invention is not limited thereto. Accordingly, various modifications, adaptations, and combinations of various features of the described embodiments can be practiced without departing from the scope of the invention as set forth in the claims.

What is claimed is:

1. An integrated circuit comprising:

a plurality of state buses, wherein each of the state buses receives state information for one of a plurality of protocols;

a multi-bit data bus that receives a DATA signal, wherein the DATA signal is part of a frame of a packet;

a first L3 start circuit that receives a first and second portion of the DATA signal;

a second L3 start circuit that receives a third and fourth portion of the DATA signal;

a third L3 start circuit that receives a fifth and sixth portion of the DATA signal;

a fourth L3 start circuit that receives a seventh and eighth portion of the DATA signal;

a first parse32 circuit that is coupled to receive the first portion of the DATA signal and the plurality of state buses, wherein in at least two of the state buses all the bits are left shifted by one bit with the most significant bit being discarded and with the new least significant bit being supplied by an output bit by the first L3 start circuit;

a second parse32 circuit that is coupled to receive the second portion of the DATA signal and the plurality of state buses from the first parse32 circuit, wherein in at least two of the state buses all the bits are left shifted by one bit with the most significant bit being discarded and with the new least significant bit being supplied by an output bit by the first L3 start circuit;

a third parse32 circuit that is coupled to receive the third portion of the DATA signal and the plurality of state buses from the second parse32 circuit, wherein in at least two of the state buses all the bits are left shifted by one bit with the most significant bit being discarded and with the new least significant bit being supplied by an output bit by the second L3 start circuit;

a fourth parse32 circuit that is coupled to receive the fourth portion of the DATA signal and the plurality of state buses from the third parse32 circuit, wherein in at least two of the state buses all the bits are left shifted by one bit with the most significant bit being discarded and with the new least significant bit being supplied by an output bit by the second L3 start circuit;

a fifth parse32 circuit that is coupled to receive the fifth portion of the DATA signal and the plurality of state buses from the fourth parse32 circuit, wherein in at least two of the state buses all the bits are left shifted by one bit with the most significant bit being discarded and with the new least significant bit being supplied by an output bit by the third L3 start circuit;

a sixth parse32 circuit that is coupled to receive the sixth portion of the DATA signal and the plurality of state buses from the fifth parse32 circuit, wherein in at least two of the state buses all the bits are left shifted by one bit with the most significant bit being discarded and with the new least significant bit being supplied by an output bit by the third L3 start circuit;

a seventh parse32 circuit that is coupled to receive the seventh portion of the DATA signal and the plurality of state buses from the sixth parse32 circuit, wherein at least two of the state buses all the bits are left shifted by one bit with the most significant bit being discarded and with the new least significant bit being supplied by an output bit by the fourth L3 start circuit;

a eighth parse32 circuit that is coupled to receive the eighth portion of the DATA signal and the plurality of state buses from the seventh parse32 circuit, wherein at least two of the state buses all the bits are left shifted by one bit with the most significant bit being discarded and with the new least significant bit being supplied by an output bit by the fourth L3 start circuit; and a first parse64 circuit comprising the first L3 start circuit, the first parse32 circuit, and the second parse32 circuit;

a second parse64 circuit comprising the second L3 start circuit, the third parse32 circuit, and the fourth parse32 circuit;

a third parse64 circuit comprising the third L3 start circuit, the fifth parse32 circuit, and the sixth parse32 circuit;

a fourth parse64 circuit comprising the fourth L3 start circuit, the seventh parse32 circuit, and the eighth parse32 circuit;

a checksum summer and compare circuit that receives a checksum from each of the parse64 circuits and determines a checksum for the packet from the received checksums, and wherein the checksum summer and compare circuit compares an extracted checksum from the packet to the determined checksum.

2. The integrated circuit of claim 1, wherein each of the parse32 circuits comprises:

an L3 header circuit;

a L4 checksum decoder that generates a L4 decoder signal;

a L4 summer and checksum multiplexer circuit that is coupled to receive the L4 decoder signal from the L4 checksum decoder;

a L3 checksum decoder that generates a L3 decoder signal; and a L3 summer and checksum multiplexer circuit that is coupled to receive the L3 decoder signal from the L3 checksum decoder.

3. The integrated circuit of claim 1, wherein the state buses receive state information selected from the group consisting of: UDP state information, TCP state information, IPV4 state information, and IPV6 state information.

4. The integrated circuit of claim 1, wherein the frame of the packet is received onto one of a plurality of ports, and wherein the integrated circuit parses checksum information from packets received onto each port in parallel across the parse32 circuits in a single clock cycle.

5. The integrated circuit of claim 1, wherein the left shift by one bit with the most significant bit being discarded and with the new least significant bit being supplied by an output bit by the third L3 start circuit occurs without any sequential logic structure.

6. The integrated circuit of claim 1, wherein a first of the state buses supplies a multi-bit digital IPV4 state signal onto the first parse32 circuit, wherein a second of the state buses supplies a multi-bit digital IPV6 state signal onto the first parse32 circuit, wherein a third of the state buses supplies a multi-bit digital TCP state signal onto the first parse32 circuit, wherein a fourth of the state buses supplies a multi-bit digital UDP state signal onto the first parse32 circuit, and wherein each of the IPV4, IPV6, TCP, and UDP state signals is configurable in one of a plurality of one-hot states such that at most 1-bit of the state signal has a digital logic high level.

7. The integrated circuit of claim 6, wherein each of the configurable one-hot states of the IPV4 state signal corresponds to a multi-bit segment of an IPV4 packet header, wherein each of the configurable one-hot states of the IPV6 state signal corresponds to a multi-bit segment of an IPV6 packet header, wherein each of the configurable one-hot states of the TCP state signal corresponds to a multi-bit segment of a TCP packet header, and wherein each of the configurable one-hot states of the UDP state signal corresponds to a multi-bit segment of a UDP packet header.

8. The integrated circuit of claim 6, wherein at most one of the IPV4, IPV6, TCP, and UDP state signals supplied to the first parse32 circuit has a digital logic high level.

9. The integrated circuit of claim 6, wherein the second parse32 circuit receives a 1-bit shifted version of the IPV4 state signal supplied onto the first parse32 circuit, wherein the second parse32 circuit also receives a 1-bit shifted version of the IPV6 state signal supplied onto the first parse32 circuit, wherein the second parse32 circuit also receives a 1-bit shifted version of the TCP state signal supplied onto the first parse32 circuit, and wherein the second parse32 circuit also receives a 1-bit shifted version of the UDP state signal supplied onto the first parse32 circuit.

10. A method comprising:

(a) receiving a DATA signal onto a plurality of parsing circuits, wherein the DATA signal is part of a frame of a packet, wherein a first portion of the DATA signal is received onto a first of the plurality of parsing circuits, wherein a second portion of the DATA signal is received onto a second of the plurality of parsing circuits, wherein a third portion of the DATA signal is received onto a third of the plurality of parsing circuits, wherein a fourth portion of the DATA signal is received onto a fourth of the plurality of parsing circuits, wherein a fifth portion of the DATA signal is received onto a fifth of the plurality of parsing circuits, wherein a sixth portion of the DATA signal is received onto a sixth of the plurality of parsing circuits, wherein a seventh portion of the DATA signal is received onto a seventh of the plurality of parsing circuits, wherein a eighth portion of the DATA signal is received onto a eighth of the plurality of parsing circuits; and (b) receiving a plurality of multi-bit digital state signals onto each of the plurality of parsing circuits, wherein each of the plurality of multi-bit digital state signals represents a network protocol, wherein only one bit of the multi-bit signal has digital logic high level, wherein the second parsing circuit receives 1-bit shifted versions of the multi-bit digital state signals received onto the first parsing circuit, wherein the third parsing circuit receives 1-bit shifted versions of the multi-bit digital state signals received onto the second parsing circuit, wherein the fourth parsing circuit receives 1-bit shifted versions of the multi-bit digital state signals received onto the third parsing circuit, wherein the fifth parsing circuit receives 1-bit shifted versions of the multi-bit digital state signals received onto the fourth parsing circuit, wherein the sixth parsing circuit receives 1-bit shifted versions of the multi-bit digital state signals received onto the fifth parsing circuit, wherein the seventh parsing circuit receives 1-bit shifted versions of the multi-bit digital state signals received onto the sixth parsing circuit, wherein the eighth parsing circuit receives 1-bit shifted versions of the multi-bit digital state signals received onto the seventh parsing circuit, and wherein the receiving of (a) and the receiving of (b) occur in parallel during a single clock cycle.

11. The method of claim 10, wherein the 1-bit shifted version of the multi-bit digital state signals is generated without any sequential logic structure.

12. The method of claim 10, wherein a first of the multi-bit digital state signals is an IPV4 state signal, wherein a second of the multi-bit digital state signals is an IPV6 state signal, wherein a third of the multi-bit digital state signals is a TCP state signal, wherein a fourth of the multi-bit digital state signals is a UDP state signal, and wherein each of the IPV4, IPV6, TCP, and UDP state signals is configurable in one of a plurality of one-hot states such that at most 1-bit of the state signal has a digital logic high level.

13. The method of claim 12, wherein each of the configurable one-hot states of the IPV4 state signal corresponds to a multi-bit segment of an IPV4 packet header, wherein each of the configurable one-hot states of the IPV6 state signal corresponds to a multi-bit segment of an IPV6 packet header, wherein each of the configurable one-hot states of the TCP state signal corresponds to a multi-bit segment of a TCP packet header, and wherein each of the configurable one-hot states of the UDP state signal corresponds to a multi-bit segment of a UDP packet header.

14. The method of claim 12, wherein at most one of the IPV4, IPV6, TCP, and UDP state signals that is received onto the first parsing circuit has a digital logic high level.

15. The method of claim 12, wherein the receiving of (a) and the receiving of (b) is performed by a parser and checksum circuit that extracts a checksum from the packet and compares the extracted checksum to the determined checksum, and wherein the parser and checksum circuit performs the extracting and comparing on a plurality of ports over a plurality of network protocols without involving any additional parser and checksum circuitry.

16. A network device comprising:

a plurality of parsing circuits, wherein each of the plurality of parsing circuits receives a portion of a DATA signal from a multi-bit data bus, and wherein the received DATA signal is part of a frame of a packet; and means for supplying a plurality of state signals onto each of the plurality of parsing circuits during a single cycle of a clock signal, wherein each of the plurality of state signals is network protocol state signal, wherein the at most one bit of each state signal has a digital logic high level, wherein each of the plurality of state signals is shifted by one-bit as each state signal passes through each of the plurality of parsing circuits, and wherein the plurality of parsing circuits receive the portions of the DATA signal and the state signals in parallel.

17. The network device of claim 16, wherein the means is a plurality of state buses that each receives state information for one of a plurality of protocols.

18. The network device of claim 16, wherein a first of the plurality of state signals is a multi-bit digital IPV4 state signal, wherein a second of the plurality of state signals is a multi-bit digital IPV6 state signal, wherein a third of the plurality of state signals is a multi-bit digital TCP state signal, wherein a fourth of the plurality of state signals is a multi-bit digital UDP state signal, and wherein each of the IPV4, IPV6, TCP, and UDP state signals is configurable in one of a plurality of one-hot states such that at most 1-bit of the state signal has a digital logic high level.

19. The network device of claim 18, wherein each of the configurable one-hot states of the IPV4 state signal corresponds to a segment of an IPV4 packet header, wherein each of the configurable one-hot states of the IPV6 state signal corresponds to a segment of an IPV6 packet header, wherein each of the configurable one-hot states of the TCP state signal corresponds to a segment of a TCP packet header, and wherein each of the configurable one-hot states of the UDP state signal corresponds to a segment of a UDP packet header.

20. The network device of claim 18, wherein at most one of the IPV4, IPV6, TCP, and UDP state signals supplied to any one of the plurality of parsing circuits has a digital logic high level.

* * * * *